US012740319B2

(12) United States Patent
Danz et al.

(10) Patent No.: US 12,740,319 B2
(45) Date of Patent: Sep. 15, 2026

(54) ORGANIC MOLECULES FOR OPTOELECTRONIC DEVICES

(71) Applicant: Samsung Display Co., Ltd., Yongin-si (KR)

(72) Inventors: Michael Danz, Eggenstein-Leopoldshafen (DE); Alhama Arjona Esteban, Karlsruhe (DE); Nico-Patrick Thöbes, Bruchsal (DE)

(73) Assignee: Samsung Display Co., Ltd., Yongin-si (KR)

( * ) Notice: Subject to any disclaimer, the term of this patent is extended or adjusted under 35 U.S.C. 154(b) by 282 days.

(21) Appl. No.: 18/556,874

(22) PCT Filed: Apr. 25, 2022

(86) PCT No.: PCT/EP2022/060902

§ 371 (c)(1),
(2) Date: Oct. 23, 2023

(87) PCT Pub. No.: WO2022/223839

PCT Pub. Date: Oct. 27, 2022

(65) Prior Publication Data

US 2024/0237533 A1 Jul. 11, 2024

(30) Foreign Application Priority Data

Apr. 23, 2021 (WO) ................. PCT/EP2021/060703
Jul. 13, 2021 (EP) .................................... 21185253

(51) Int. Cl.
*H10K 85/60* (2023.01)
*C07F 5/02* (2006.01)
(Continued)

(52) U.S. Cl.
CPC ............. *H10K 85/658* (2023.02); *C07F 5/02* (2013.01); *C07F 5/027* (2013.01); *C09K 11/06* (2013.01);
(Continued)

(58) Field of Classification Search
CPC ............... H10K 85/657; H10K 85/322; H10K 85/6572; H10K 85/658; H10K 50/12; C09K 2211/1055
See application file for complete search history.

(56) References Cited

U.S. PATENT DOCUMENTS 12,167,683 B2 12/2024 Hayano
2003/0157366 A1 8/2003 Matsuura et al.
(Continued)

FOREIGN PATENT DOCUMENTS

CN 109422770 A 3/2019
CN 111471061 A 7/2020
(Continued)

OTHER PUBLICATIONS

International Search Report and Written Opinion of PCT/EP2022/060902, Oct. 11, 2022, 11 pp.
(Continued)

*Primary Examiner* — Alexander G Ghyka
(74) *Attorney, Agent, or Firm* — Womble Bond Dickinson (US) LLP

(57) ABSTRACT

The invention relates to an organic molecule, in particular for the application in optoelectronic devices. According to the invention, the organic molecule has a structure of Formula I Formula I

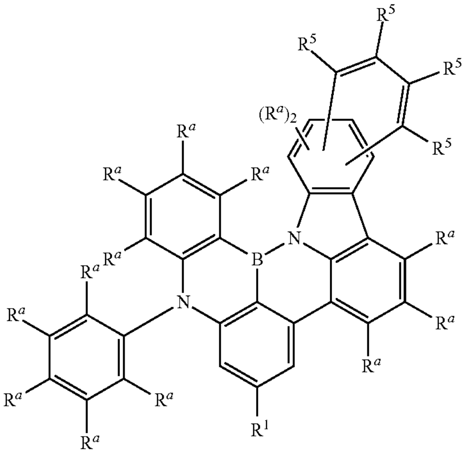

$R^1$ is selected from the group consisting of hydrogen and $C_6$-$C_{12}$-aryl, which is optionally substituted with one or more $C_1$-$C_6$-alkyl substituents which optionally form a monocyclic aliphatic ring system;

$R^a$ is at each occurrence independently selected from the group consisting of: hydrogen, deuterium, $N(R^5)_2$, $OR^5$, $Si(R^5)_3$, $B(OR^5)_2$, $B(R^5)_2$, $OSO_2R^5$, $CF_3$, CN, F, Cl, Br, I, $C_1$-$C_{40}$-alkyl, $C_1$-$C_{40}$-alkoxy, $C_1$-$C_{40}$-thioalkoxy, $C_2$-$C_{40}$-alkenyl, $C_2$-$C_{40}$-alkynyl, $C_6$-$C_{60}$-aryl, and $C_2$-$C_{57}$-heteroaryl; and $R^5$ is at each occurrence independently selected from the group consisting of: hydrogen, deuterium, $N(R^6)_2$, $OR_6$, $Si(R^6)_3$, $B(OR^6)_2$, $B(R^6)_2$, $OSO_2R^6$, $CF_3$, CN, F, Br, I, $C_1$-$C_{40}$-alkyl, $C_1$-$C_{40}$-alkoxy, $C_1$-$C_{40}$-thioalkoxy, $C_2$-$C_{40}$-alkenyl, $C_2$-$C_{40}$-alkynyl, $C_6$-$C_{60}$-aryl, and $C_2$-$C_{57}$-heteroaryl.

17 Claims, No Drawings

(51) Int. Cl.
*C09K 11/06* (2006.01)
*H10K 50/11* (2023.01)
*H10K 101/20* (2023.01)

(52) U.S. Cl.
CPC ...... *C09K 2211/1018* (2013.01); *H10K 50/11* (2023.02); *H10K 2101/20* (2023.02)

(56) References Cited

U.S. PATENT DOCUMENTS

| | | | |
|---|---|---|---|
| 2005/0123789 | A1 | 6/2005 | Vargas et al. |
| 2011/0285274 | A1 | 11/2011 | Hamada et al. |
| 2014/0005399 | A1 | 1/2014 | Hatakeyama et al. |
| 2014/0027734 | A1 | 1/2014 | Kwong |
| 2015/0097162 | A1 | 4/2015 | Ono et al. |
| 2017/0222191 | A1 | 8/2017 | Hamada et al. |
| 2018/0047912 | A1 | 2/2018 | Kwong et al. |
| 2019/0067577 | A1 | 2/2019 | Xia |
| 2020/0203652 | A1 | 6/2020 | Duan et al. |
| 2020/0259097 | A1 | 8/2020 | Zink et al. |
| 2022/0052265 | A1 | 2/2022 | Duck |
| 2023/0137925 | A1 | 5/2023 | Schaefer et al. |
| 2023/0167135 | A1 | 6/2023 | Duck |
| 2023/0174558 | A1 | 6/2023 | Zink et al. |
| 2023/0320214 | A1 | 10/2023 | Kim et al. |
| 2024/0114789 | A1 | 4/2024 | Seifermann et al. |
| 2024/0215448 | A1 | 6/2024 | Dück |
| 2024/0224802 | A1 | 7/2024 | Seifermann et al. |
| 2024/0228516 | A1 | 7/2024 | Seifermann |
| 2024/0389458 | A1 | 11/2024 | Seifermann |
| 2025/0059216 | A1 | 2/2025 | Zink et al. |
| 2025/0101048 | A1 | 3/2025 | Dück et al. |
| 2025/0127058 | A1 | 4/2025 | Dück |
| 2025/0197426 | A9 | 6/2025 | Seifermann |
| 2025/0261501 | A1 | 8/2025 | Bando et al. |
| 2025/0268015 | A1 | 8/2025 | Kim et al. |

FOREIGN PATENT DOCUMENTS

| | | | |
|---|---|---|---|
| CN | 111471449 | A | 7/2020 |
| CN | 111560030 | A | 8/2020 |
| CN | 115443280 | A | 12/2022 |
| CN | 115715293 | A | 2/2023 |
| CN | 115968592 | A | 4/2023 |
| CN | 115989725 | A | 4/2023 |
| CN | 117083284 | A | 11/2023 |
| CN | 117203213 | A | 12/2023 |
| JP | 2014/24845 | A | 2/2014 |
| JP | 2023-526758 | A | 6/2023 |
| JP | 2023-526759 | A | 6/2023 |
| JP | 2023-526760 | A | 6/2023 |
| JP | 2023-526761 | A | 6/2023 |
| JP | 2023-531421 | A | 7/2023 |
| JP | 2023-537928 | A | 9/2023 |
| JP | 2023-140012 | A | 10/2023 |
| JP | 2024-516964 | A | 4/2024 |
| JP | 2024-517649 | A | 4/2024 |
| JP | 2025-505116 | A | 2/2025 |
| JP | 2025-506369 | A | 3/2025 |
| JP | 7771083 | B9 | 11/2025 |
| KR | 10-2822247 | B1 | 6/2025 |
| WO | 2012/121398 | A1 | 9/2012 |
| WO | 2014/042197 | A1 | 3/2014 |
| WO | WO 2020-135953 | A1 | 7/2020 |
| WO | 2021/126593 | A1 | 6/2021 |
| WO | 2021/214309 | A1 | 10/2021 |
| WO | 2021/214310 | A1 | 10/2021 |
| WO | WO 2021-214308 | A1 | 10/2021 |
| WO | WO 2021-255698 | A1 | 12/2021 |

OTHER PUBLICATIONS

Kondakov, "Triplet-triplet annihilation in highly efficient fluorescent organic light-emitting diodes: current state and future outlook," Phil. Trans. R. Soc. A 373: Mar. 21, 2014, The Royal Society Publishing, 2015, 16 pages (On Order).

US Office Action dated Nov. 26, 2025, issued in U.S. Appl. No. 17/997,022 (17 pages).

Japanese Office Action corresponding to JP Application No. 2023-564249, dated Jan. 27, 2026 (6 pages).

Chinese Office Action corresponding to CN Application No. 202280030421.1, dated Apr. 4, 2026 (11 pages).

ORGANIC MOLECULES FOR OPTOELECTRONIC DEVICES

CROSS-REFERENCE TO RELATED APPLICATIONS

This application is a U.S. National Phase Patent Application of International Patent Application Number PCT/EP2022/060902, filed on Apr. 25, 2022, which claims priority to International Patent Application Number PCT/EP2021/060703, filed on Apr. 23, 2021, and European Patent Application Number 21185253.8, filed on Jul. 13, 2021, the entire content of each of which is incorporated herein by reference.

The invention relates to light-emitting organic molecules and their use in organic light-emitting diodes (OLEDs) and in other optoelectronic devices.

DESCRIPTION

The object of the present invention is to provide molecules which are suitable for use in optoelectronic devices.

This object is achieved by the invention which provides a new class of organic molecules.

According to the invention the organic molecules are purely organic molecules, i.e., they do not contain any metal ions in contrast to metal complexes known for use in optoelectronic devices.

According to the present invention, the organic molecules exhibit emission maxima in the blue or sky-blue spectral range. The organic molecules exhibit in particular emission maxima between 420 nm and 520 nm, preferably between 440 nm and 495 nm, more preferably between 450 nm and 470 nm. The photoluminescence quantum yields of the organic molecules according to the invention are, in particular, 50% or more. The use of the molecules according to the invention in an optoelectronic device, for example an organic light-emitting diode (OLED), leads to higher efficiencies or higher color purity, expressed by the full width at half maximum (FWHM) of emission, of the device. Corresponding OLEDs have a higher stability than OLEDs with known emitter materials and comparable color.

The organic light-emitting molecule of the invention includes or consists of a structure of Formula I Formula I

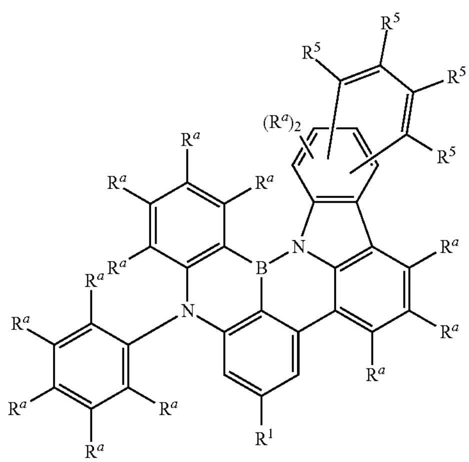

wherein $R^1$ is $C_6$-$C_{12}$-aryl, which is optionally substituted with one or more $C_1$-$C_6$-alkyl substituents, which optionally form a monocyclic aliphatic ring system at the $C_6$-$C_{12}$-aryl (such that, for example, structures shown as Formula I-5 or I-6 are formed);

$R^a$ is at each occurrence independently selected from the group consisting of: hydrogen; deuterium; $N(R^5)_2$; $OR^5$; $Si(R^5)_3$; $B(OR^5)_2$; $B(R^5)_2$; $OR^5$; $CF_3$; CN; F; Br; I; Cl;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$;

$R^5$ is at each occurrence independently from each other selected from the group consisting of: hydrogen; deuterium; $N(R^6)_2$; $OR^6$; $Si(R^6)_3$; $B(OR^6)_2$; $B(R^6)_2$; $OSO_2R^6$; $CF_3$; CN; F; Br, I;

$C_1$-$C_{40}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C=O, C=S, C=Se, $C{=}NR^6$, $P({=}O)(R^6)$, SO, $SO_2$, $NR^6$, O, S, or $CONR^6$;

$C_1$-$C_{40}$-alkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^B)_2$, $Sn(R^6)_2$, C═O, C═S, C═Se, $C═NR^6$, $P(═O)(R^6)$, SO, $SO_2$, $NR^6$, O, S, or $CONR^6$;

$C_1$-$C_{40}$-thioalkoxy, which is optionally substituted with one or more substituents $R^6$ and wherein one or more non-adjacent $CH_2$-groups are optionally substituted by $R^6C═CR^6$, C≡C, $Si(R^6)_2$, $Ge(R^6)_2$, $Sn(R^6)_2$, C═O, C═S, C═Se, $C═NR^6$, $P(═O)(R^6)$, SO, $SO_2$, $NR^6$, O, S, or $CONR^6$;

$C_2$-$C_{40}$-alkenyl, which is optionally substituted with one or more substituents $R^6$ and wherein one or more non-adjacent $CH_2$-groups are optionally substituted by $R^6C═CR^6$, C≡C, $Si(R^6)_2$, $Ge(R^B)_2$, $Sn(R^6)_2$, C═O, C═S, C═Se, $C═NR^6$, $P(═O)(R^6)$, SO, $SO_2$, $NR^6$, O, S, or $CONR^6$;

$C_2$-$C_{40}$-alkynyl, which is optionally substituted with one or more substituents $R^6$ and wherein one or more non-adjacent $CH_2$-groups are optionally substituted by $R^6C═CR^6$, C≡C, $Si(R^6)_2$, $Ge(R^6)_2$, $Sn(R^6)_2$, C═O, C═S, C═Se, $C═NR^6$, $P(═O)(R^6)$, SO, $SO_2$, $NR^6$, O, S, or $CONR^6$;

$C_6$-$C_{60}$-aryl, which is optionally substituted with one or more substituents $R^6$; and $C_2$-$C_{57}$-heteroaryl, which is optionally substituted with one or more substituents $R^6$;

$R^6$ is at each occurrence independently from each other selected from the group consisting of: hydrogen; deuterium; OPh (Ph═phenyl); $CF_3$; CN; F;

$C_1$-$C_5$-alkyl, wherein one or more hydrogen atoms are optionally, independently substituted by deuterium, CN, $CF_3$, or F;

$C_1$-$C_5$-alkoxy, wherein one or more hydrogen atoms are optionally, independently substituted by deuterium, CN, $CF_3$, or F;

$C_1$-$C_5$-thioalkoxy, wherein one or more hydrogen atoms are optionally, independently substituted by deuterium, CN, $CF_3$, or F;

$C_2$-$C_5$-alkenyl, wherein one or more hydrogen atoms are optionally, independently substituted by deuterium, CN, $CF_3$, or F;

$C_2$-$C_5$-alkynyl, wherein one or more hydrogen atoms are optionally, independently substituted by deuterium, CN, $CF_3$, or F;

$C_6$-$C_{18}$-aryl, which is optionally substituted with one or more $C_1$-$C_5$-alkyl substituents;

$C_2$-$C_{17}$-heteroaryl, which is optionally substituted with one or more $C_1$-$C_5$-alkyl substituents;

$N(C_6$-$C_{18}$-aryl$)_2$;

$N(C_2$-$C_{17}$-heteroaryl$)_2$; and $N(C_2$-$C_{17}$-heteroaryl$)(C_6$-$C_{18}$-aryl$)$;

wherein any of the substituents $R^a$, $R^5$, and $R^6$ may independently form a mono- or polycyclic, aliphatic, aromatic, heteroaromatic and/or benzo-fused ring system with one or more other substituent $R^a$, $R^5$, and/or $R^6$. For example, one substituent $R^a$ may form a ring system with another substituent $R^a$, or one substituent $R^5$ may form a ring system with a substituent $R^a$.

In certain embodiments, the organic molecules of the invention include or consist of a structure of Formula Ia, Ib, or Ic:

Formula Ia

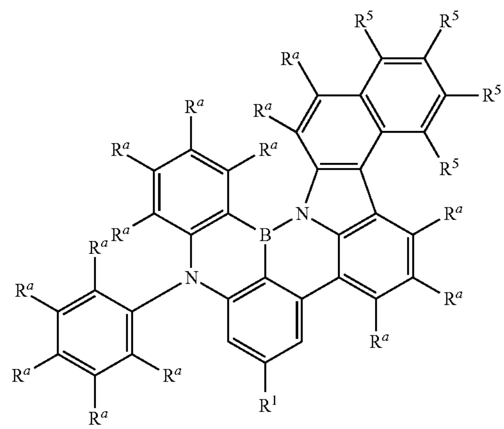

Formula Ib

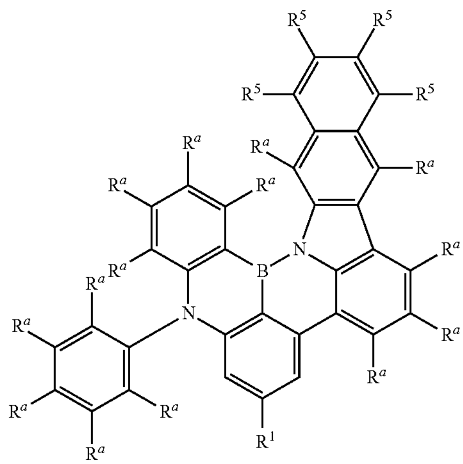

Formula Ic

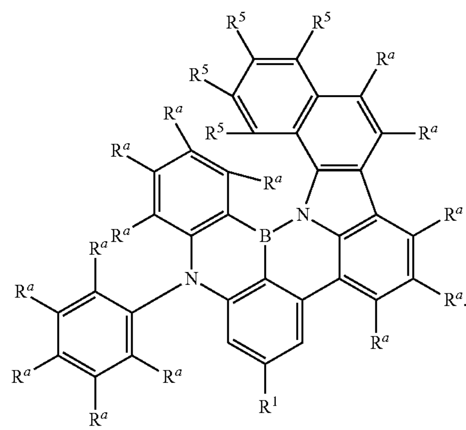

In a preferred embodiment, the organic molecules of the invention include or consist of a structure of Formula Ia.

In one embodiment, $R^1$ is phenyl, which is optionally substituted with one or more $C_1$-$C_6$-alkyl substituents.

In one embodiment, $R^1$ is phenyl, which is optionally substituted with one or more substituents selected from methyl, $^i$propyl, cyclo-hexyl, and $^t$butyl.

In one embodiment, $R^1$ is phenyl, which is optionally substituted with one or more substituents selected from methyl, $^i$propyl, and $^t$butyl.

In one embodiment, $R^1$ is hydrogen.

In a preferred embodiment, the organic molecules include or consist of a structure of Formula I-1, Formula I-2, Formula I-3, Formula I-4, Formula I-5, Formula I-6, Formula I-7, Formula I-8, Formula I-9, or Formula I-10:
Formula I-1
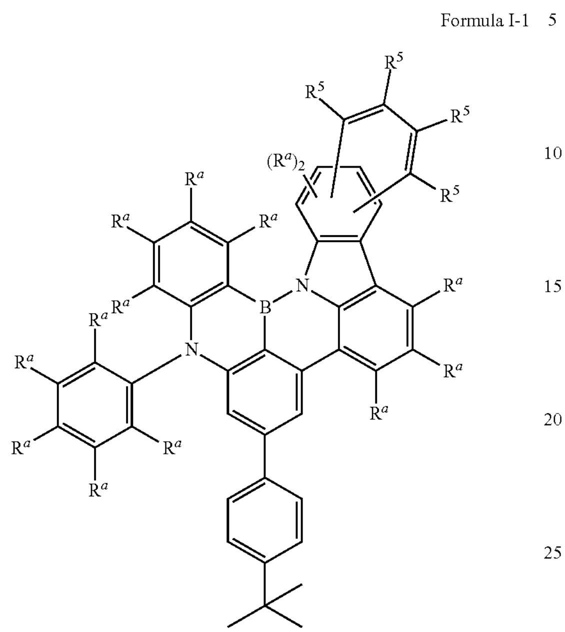
Formula I-2
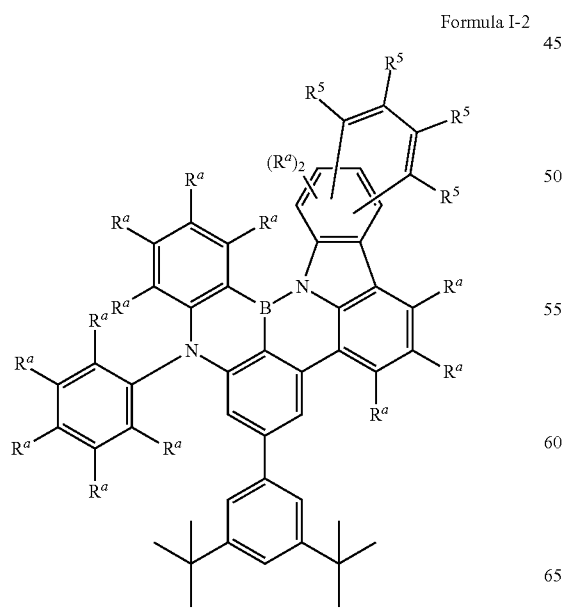
-continued
Formula I-3
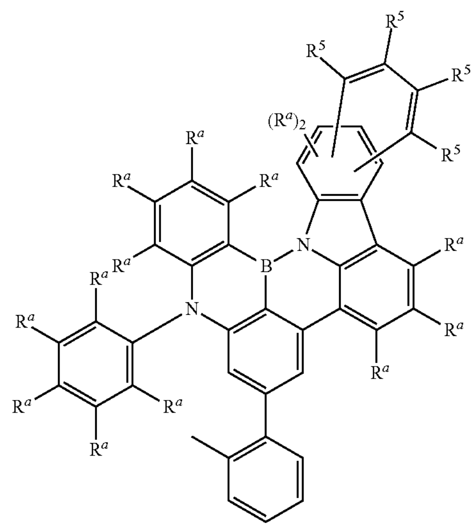
Formula I-4
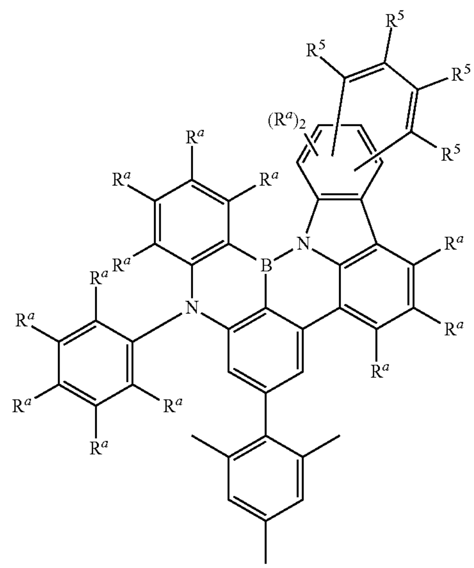

Formula I-5
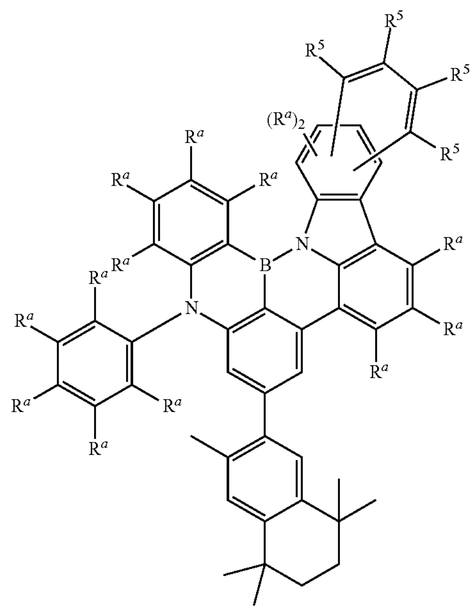
Formula I-6
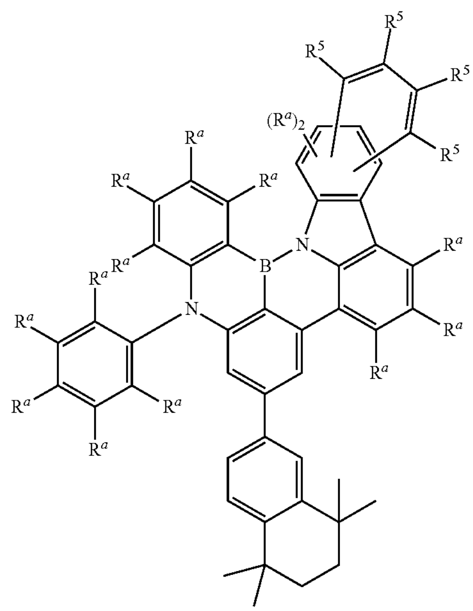
Formula I-7
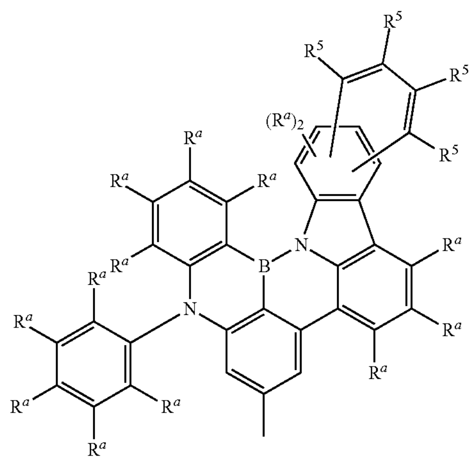
Formula I-8
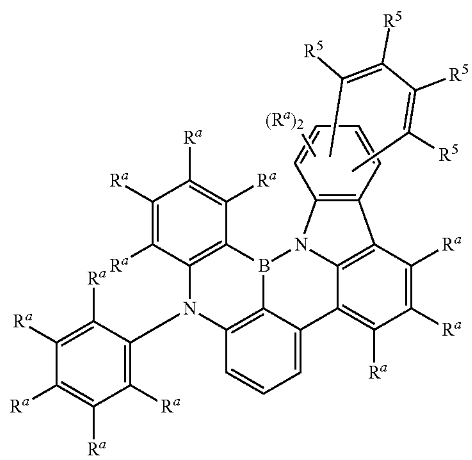
Formula I-9
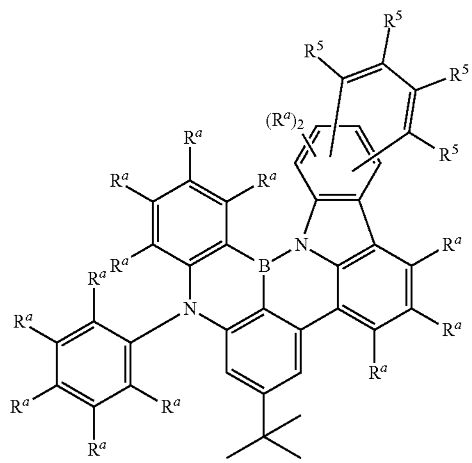

-continued

Formula I-10

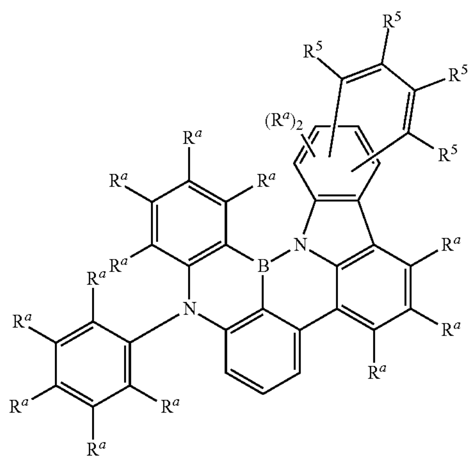

In one embodiment, the organic molecules include or consist of a structure Formula II:

Formula II

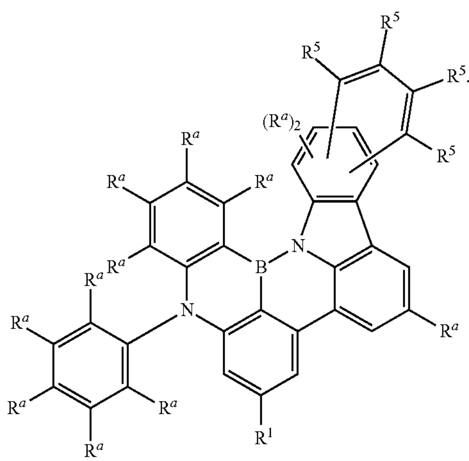

In a preferred embodiment, the organic molecules include or consist of a structure Formula IIa:

Formula IIa

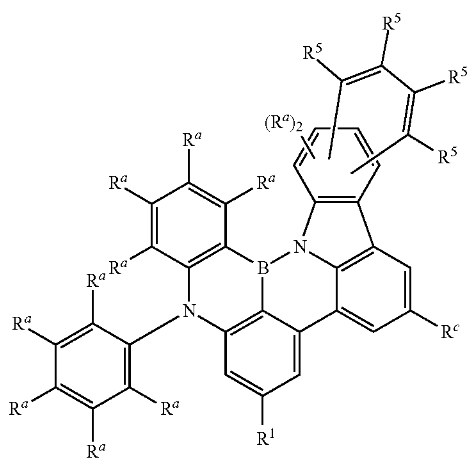

wherein $R^C$ is at each occurrence independently from each other selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a preferred embodiment, the organic molecules include or consist of a structure Formula IIa-1 or Formula IIa-2:

Formula IIa-1

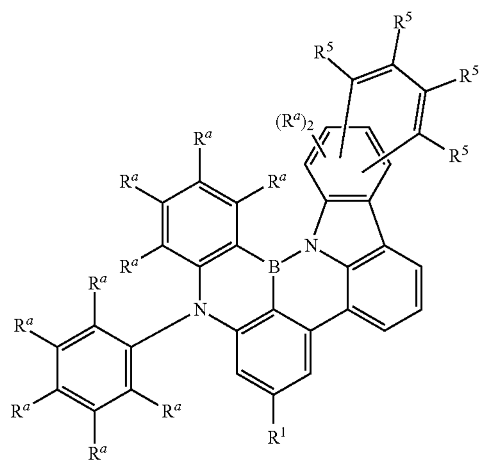

-continued

Formula IIa-2

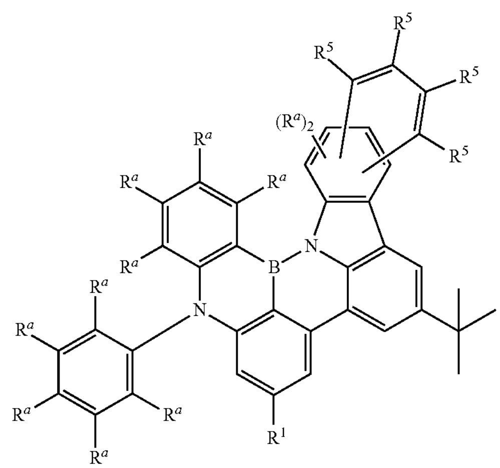

In one embodiment, the organic molecules include or consist of a structure Formula III:

Formula III

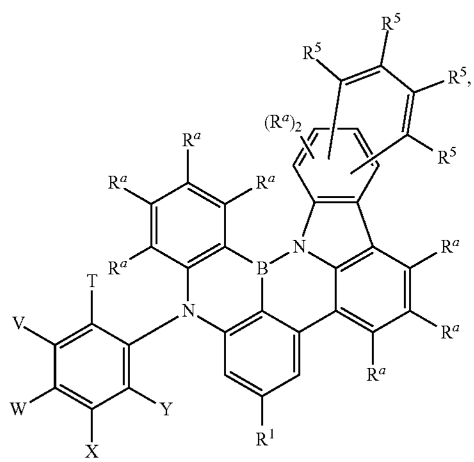

wherein T, V, W, X, and Y is selected from the group consisting of hydrogen,

Me, $^i$Pr, $^t$Bu, and

Ph, which is optionally substituted with one or more substituents independently from each other selected from the group consisting of Me, $^i$Pr, $^t$Bu, CN, $CF_3$, and Ph.

In a preferred embodiment, the organic molecules include or consist of a structure Formula IIIa or Formula IIIb:

Formula IIIa

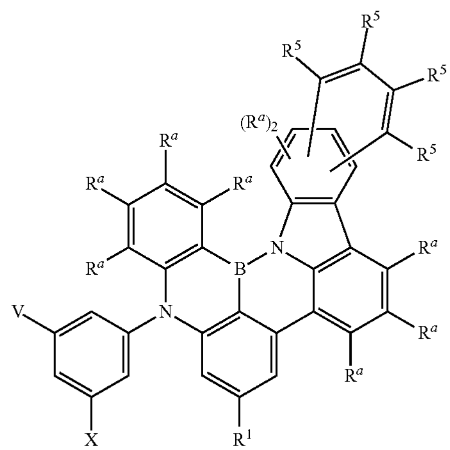

Formula IIIb

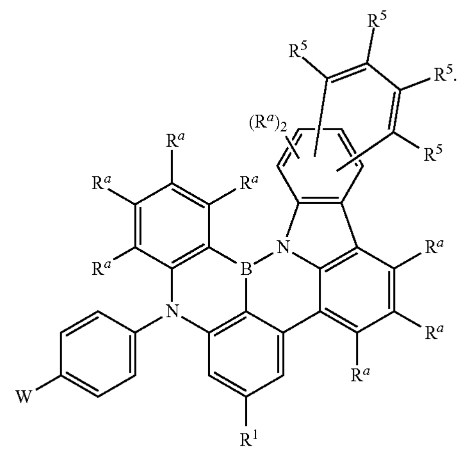

In a preferred embodiment, the organic molecules include or consist of a structure Formula III-1, Formula III-2, Formula III-3, Formula III-4, Formula III-5, Formula III-6 Formula III-7 or Formula III-8:

Formula III-1

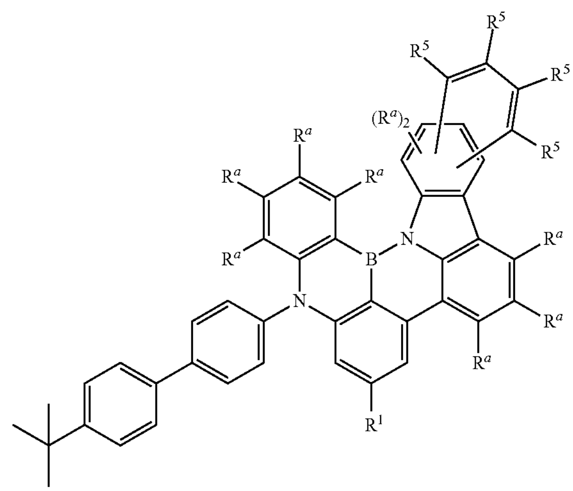

-continued
Formula III-2
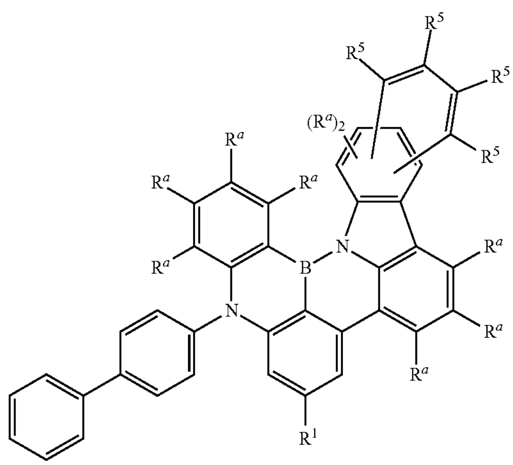
Formula III-3
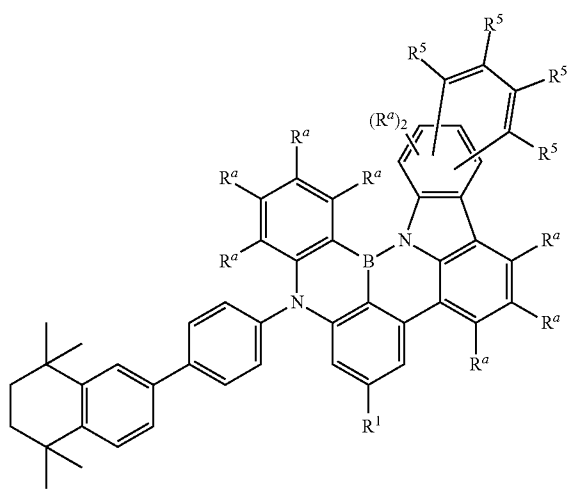
Formula III-4
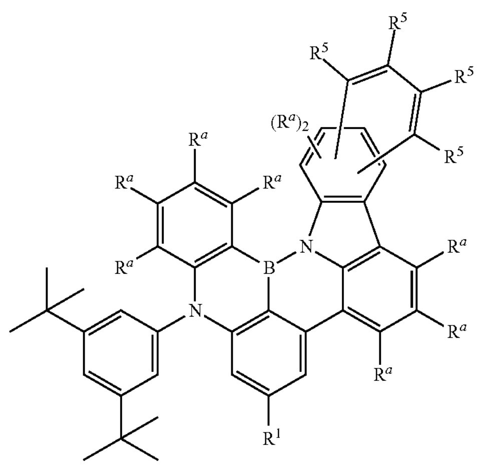
-continued
Formula III-5
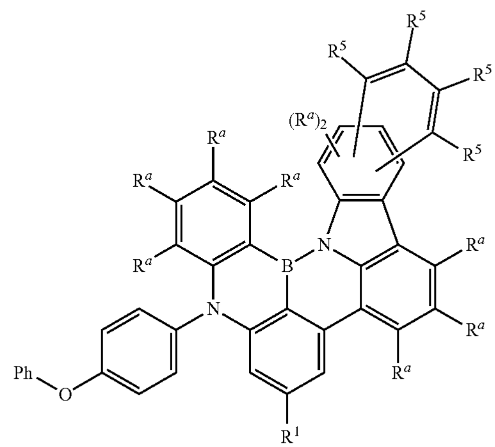
Formula III-6
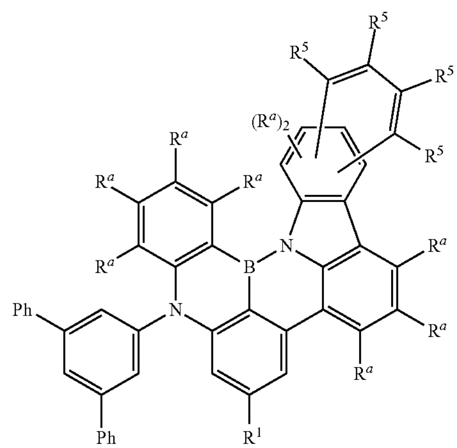
Formula III-7
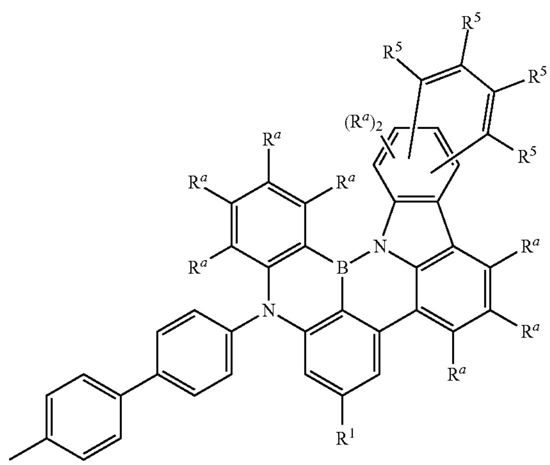

-continued

Formula III-8

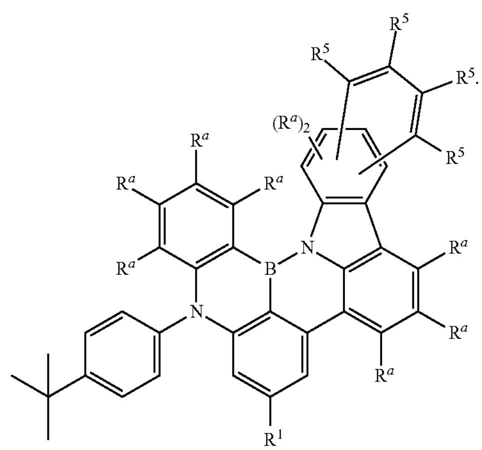

In one embodiment, the organic molecules include or consist of a structure of Formula IV Formula IV

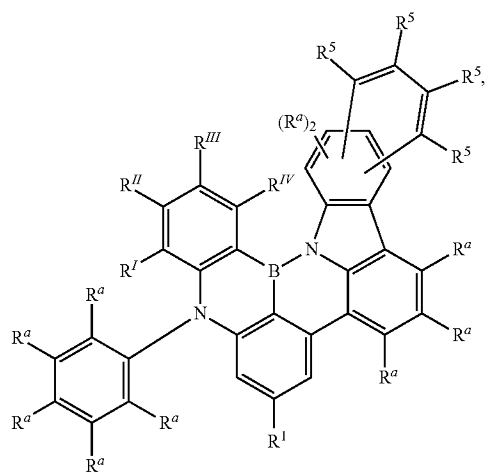

wherein $R^I$, $R^{II}$, $R^{III}$, and $R^{IV}$ is selected from the group consisting of hydrogen, Me, $^i$Pr, $^t$Bu, and Ph, which is optionally substituted with one or more substituents independently from each other selected from the group consisting of Me, $^i$Pr, $^t$Bu, CN, $CF_3$, and Ph.

In one embodiment, the organic molecules include or consist of a structure of Formula IVa, Formula IVb, or Formula IVc:

Formula IVa

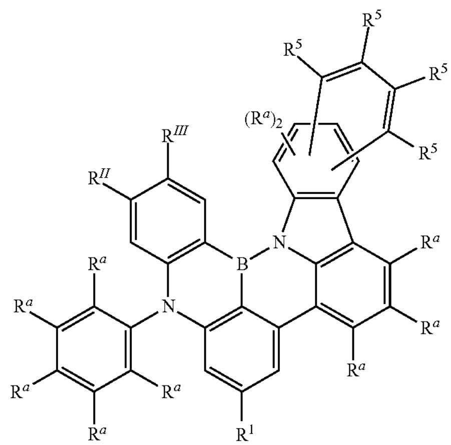

Formula IVb

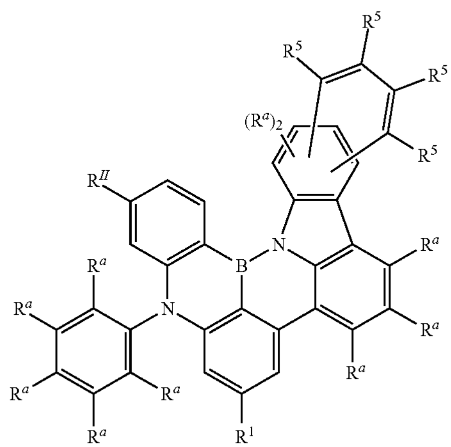

Formula IVc

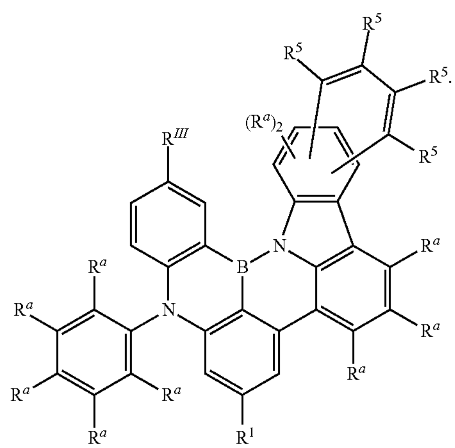

In a preferred embodiment, the organic molecules include or consist of a structure of Formula IVc:

In a preferred embodiment, the organic molecules include or consist of a structure Formula IV-1, Formula IV-2, Formula IV-3, Formula IV-4, Formula IV-5, Formula IV-6, Formula IV-7, Formula IV-8, Formula IV-9, or Formula IV-10:

-continued
Formula IV-1
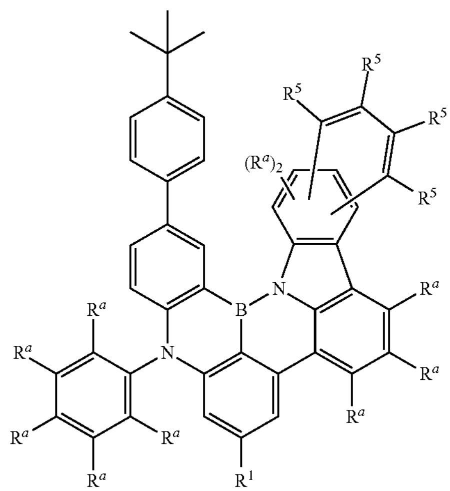
Formula IV-4
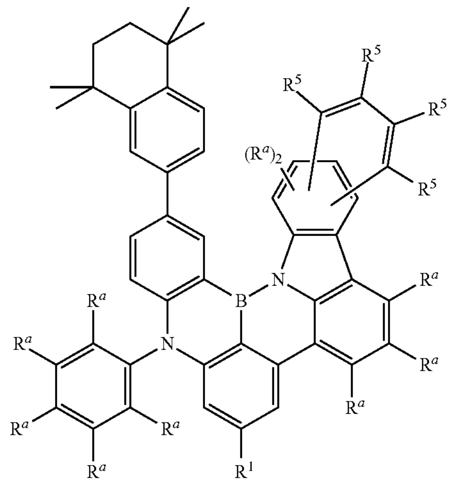
Formula IV-2
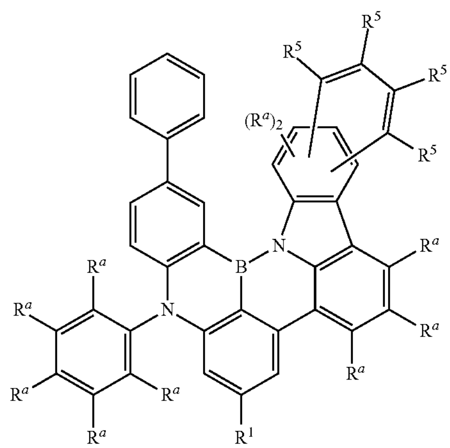
Formula IV-5
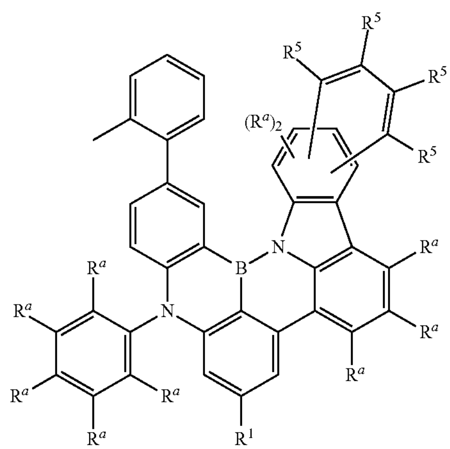
Formula IV-3
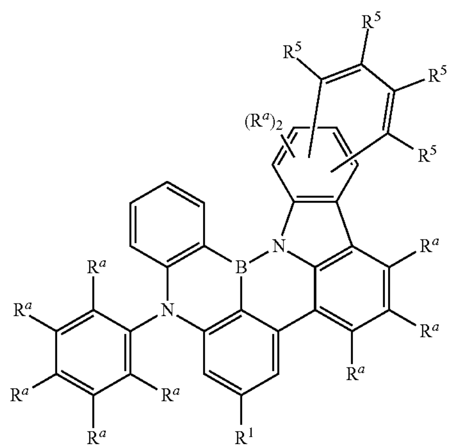
Formula IV-6
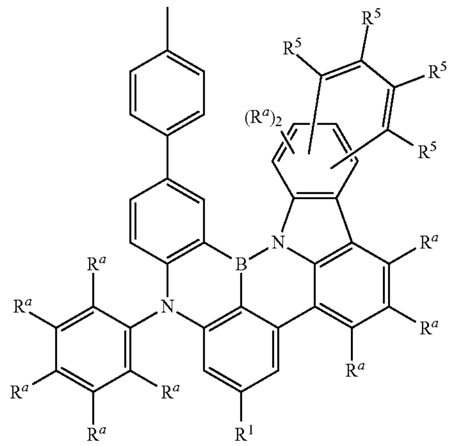

-continued

Formula IV-7

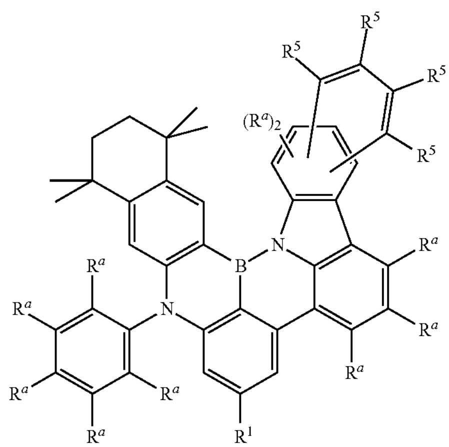

Formula IV-8

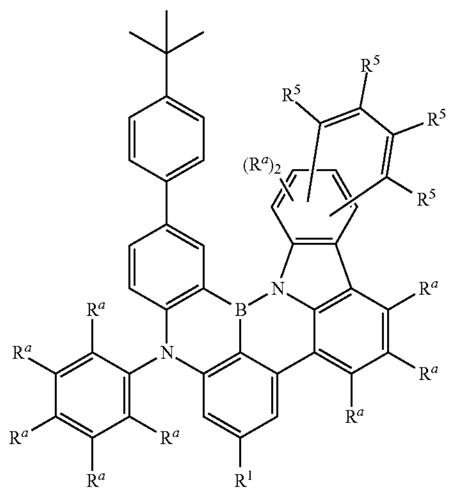

Formula IV-9

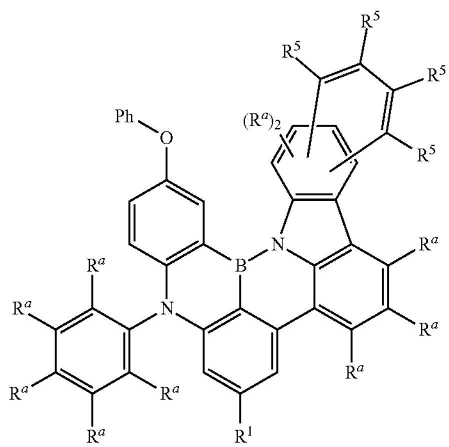

-continued

Formula IV-10

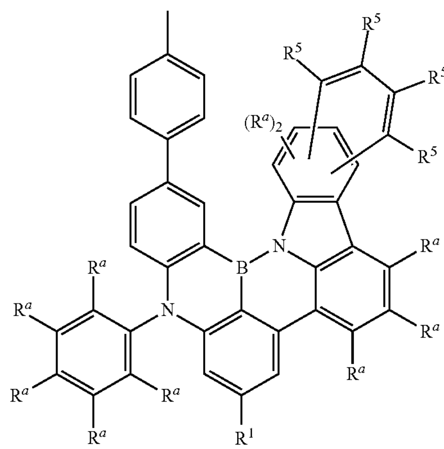

In one embodiment, the organic molecules include or consist of a structure of Formula V Formula V

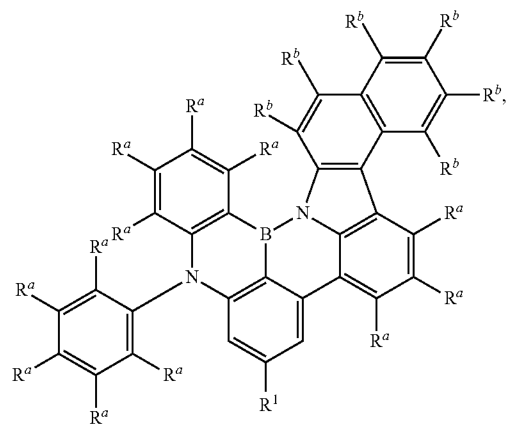

wherein $R^b$ is at each occurrence independently from each other selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment, the organic molecules include or consist of a structure of Formula Va:

Formula Va

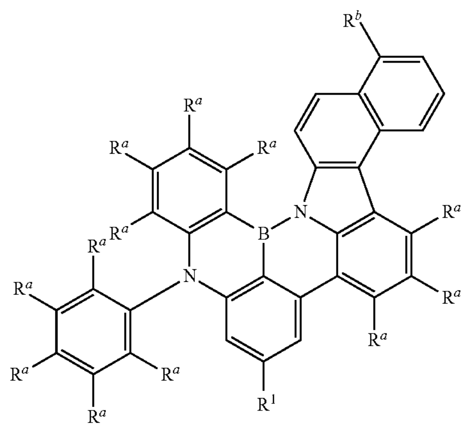

In a preferred embodiment, the organic molecules include or consist of a structure Formula V-1 Formula V-2.

Formula V-1

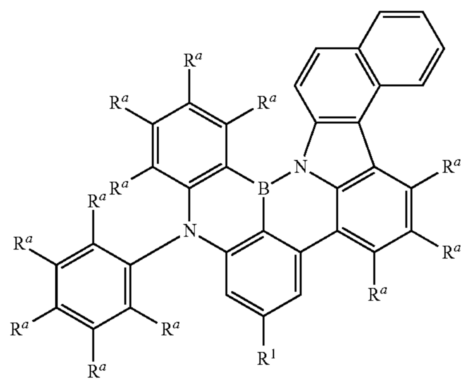

Formula V-2

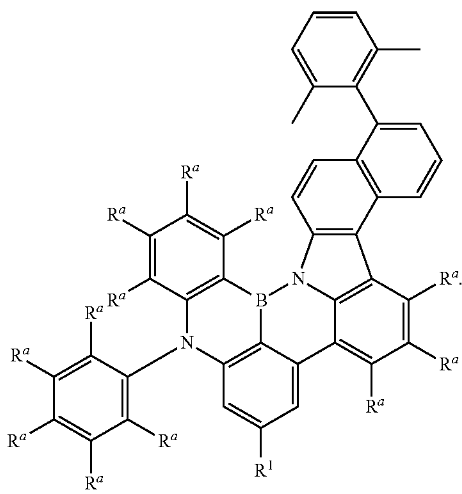

In one embodiment of the invention, $R^a$ is at each occurrence independently from each other selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a preferred embodiment, the organic light-emitting molecules of the invention includes or consists of a structure of Formula VI Formula VI

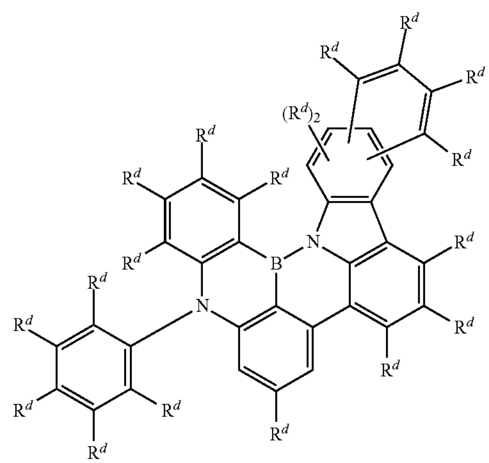

wherein $R^d$ is at each occurrence selected from the group of hydrogen and $R^e$, wherein $R^e$ is at each occurrence selected from the group consisting of Me, $^i$Pr, $^t$Bu, and Ph, which is optionally substituted with one or more substituents independently from each other selected from the group consisting of Me, $^i$Pr, $^t$Bu, CN, $CF_3$, and Ph.

In a preferred embodiment, the organic light-emitting molecules of the invention includes or consists of a structure of Formula VI, wherein exactly 2, 3, 4, 5, or 6 substituents $R^d$ are at each occurrence independently from each other selected from $R^e$.

Definitions

Herein, the term "layer" refers to a body that bears an extensively planar geometry. It forms part of the common knowledge of those skilled in that optoelectronic devices may be composed of several layers.

A light-emitting layer (EML) in the context of the present invention is a layer of an optoelectronic device, wherein light emission from said layer is observed when applying a voltage and electrical current to the device. The person skilled in the art understands that light emission from optoelectronic devices is attributed to light emission from at least one EML. The skilled artisan understands that light emission from an EML is typically not (mainly) attributed to all materials included in said EML, to specific emitter materials.

An "emitter material" (also referred to as "emitter") in the context of the present invention is a material that emits light when it is included in a light-emitting layer (EML) of an optoelectronic device (vide infra), given that a voltage and electrical current are applied to said device. The person skilled in the art knows that an emitter material usually is an "emissive dopant" material, and the skilled artisan understands that a dopant material (may it be emissive or not) is a material that is embedded in a matrix material that is usually (and herein) referred to as host material. Herein, host materials are also in general referred to as $H^B$ when they are included in an optoelectronic device (preferably an OLED) including at least one organic molecule according to the present invention.

In the context of the present invention, the term "cyclic group" may be understood in the broadest sense as any mono-, bi- or polycyclic moiety.

In the context of the present invention, the term "ring" when referring to chemical structures may be understood in the broadest sense as any monocyclic moiety. Along the same lines, the term "rings" when referring to chemical structures may be understood in the broadest sense as any bi- or polycyclic moiety.

In the context of the present invention, the term "ring system" may be understood in the broadest sense as any mono-, bi- or polycyclic moiety.

In the context of the present invention, the term "ring atom" refers to any atom which is part of the cyclic core of a ring or a ring system, and not part of a non-cyclic substituent optionally attached to the cyclic core.

In the context of the present invention, the term "carbocycle" may be understood in the broadest sense as any cyclic group in which the cyclic core structure includes only carbon atoms that may of course be substituted with hydrogen or any other substituents defined in the specific embodiments of the invention. It is understood that the term "carbocyclic" as adjective refers to cyclic groups in which the cyclic core structure includes only carbon atoms that may of course be substituted with hydrogen or any other substituents defined in the specific embodiments of the invention.

In the context of the present invention, the term "heterocycle" may be understood in the broadest sense as any cyclic group in which the cyclic core structure includes not just carbon atoms, but also at least one heteroatom. It is understood that the term "heterocyclic" as adjective refers to cyclic groups in which the cyclic core structure includes not just carbon atoms, but also at least one heteroatom. The heteroatoms may, unless stated otherwise in specific embodiments, at each occurrence be the same or different and preferably be individually selected from the group consisting of B, Si, N, O, S, and Se, more preferably B, N, O and S, most preferably N, O, S. All carbon atoms or heteroatoms included in a heterocycle in the context of the invention may of course be substituted with hydrogen or any other substituents defined in the specific embodiments of the invention.

The person skilled in the art understands that any cyclic group (i.e., any carbocycle and heterocycle) may be aliphatic or aromatic or heteroaromatic.

In the context of the present invention, the term aliphatic when referring to a cyclic group (i.e., to a ring, to rings, to a ring system, to a carbocycle, to a heterocycle) means that the cyclic core structure (not counting substituents that are optionally attached to it) contains at least one ring atom that is not part of an aromatic or heteroaromatic ring or ring system. Preferably, the majority of ring atoms and more preferably all ring atoms within an aliphatic cyclic group are not part of an aromatic or heteroaromatic ring or ring system (such as in cyclohexane or in piperidine for example). Herein, no differentiation is made between carbocyclic and heterocyclic groups when referring to aliphatic rings or ring systems in general, whereas the term "aliphatic" may be used as adjective to describe a carbocycle or heterocycle in order to indicate whether or not a heteroatom is included in the aliphatic cyclic group.

As understood by the skilled artisan, the terms "aryl" and "aromatic" may be understood in the broadest sense as any mono-, bi- or polycyclic aromatic moieties, i.e., cyclic groups in which all ring atoms are part of an aromatic ring system, preferably part of the same aromatic ring system. However, throughout the present application, the terms "aryl" and "aromatic" are restricted to mono-, bi- or polycyclic aromatic moieties wherein all aromatic ring atoms are carbon atoms. In contrast, the terms "heteroaryl" and "heteroaromatic" herein refer to any mono-, bi- or polycyclic aromatic moieties, wherein at least one aromatic carbon ring atom is replaced by a heteroatom (i.e., not carbon). Unless stated otherwise in specific embodiments of the invention, the at least one heteroatom within a "heteroaryl" or "heteroaromatic" may at each occurrence be the same or different and be individually selected from the group consisting of N, O, S, and Se, more preferably N, O, and S. The person skilled in the art understands that the adjectives "aromatic" and "heteroaromatic" may be used to describe any cyclic group (i.e., any ring system). This is to say that an aromatic cyclic group (i.e., an aromatic ring system) is an aryl group and a heteroaromatic cyclic group (i.e., a heteroaromatic ring system) is a heteroaryl group.

Unless indicated differently in specific embodiments of the invention, an aryl group herein preferably contains 6 to 60 aromatic ring atoms, more preferably 6 to 40 aromatic ring atoms, and even more preferably 6 to 18 aromatic ring atoms. Unless indicated differently in specific embodiments of the invention, a heteroaryl group herein preferably contains 5 to 60 aromatic ring atoms, preferably 5 to 40 aromatic ring atoms, more preferably 5 to 20 aromatic ring atoms, out of which at least one is a heteroatom, preferably selected from N, O, S, and Se, more preferably from N, O, and S. If more than one heteroatom is included an a heteroaromatic group, all heteroatoms are preferably independently of each other selected from N, O, S, and Se, more preferably from N, O, and S.

In the context of the present invention, for both aromatic and heteroaromatic groups (for example aryl or heteroaryl substituents), the number of aromatic ring carbon atoms may be given as subscripted number in the definition of certain substituents, for example in the form of "$C_6$-$C_{60}$-aryl", which means that the respective aryl substituent includes 6 to 60 aromatic carbon ring atoms. The same subscripted numbers are herein also used to indicate the allowable number of carbon atoms in all other kinds of substituents, regardless of whether they are aliphatic, aromatic or heteroaromatic substituents. For example, the expression "$C_1$-$C_{40}$-alkyl" refers to an alkyl substituent including 1 to 40 carbon atoms.

Preferred examples of aryl groups include groups derived from benzene, naphthalene, anthracene, phenanthrene, pyrene, dihydropyrene, chrysene, perylene, fluoranthene, benzanthracene, benzophenanthrene, tetracene, pentacene, benzopyrene, or combinations of these groups.

Preferred examples of heteroaryl groups include groups derived from furan, benzofuran, isobenzofuran, dibenzofuran, thiophene, benzothiophene, isobenzothiophene, dibenzothiophene; pyrrole, indole, isoindole, carbazole, indolocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, 1,3,5-triazine, 1,2,4-triazine, 1,2,3-triazine, quinoxaline, pyrazine, phenazine, naphthyridine, carboline, benzocarboline, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, 1,2,4,5-tetrazine, purine, pteridine, indolizine, and benzothiadiazole, or combinations of these groups.

As used throughout the present application, the term "arylene" refers to a divalent aryl substituent that bears two binding sites to other molecular structures, thereby serving as a linker structure. Along the same lines, the term "heteroarylene" refers to a divalent aryl substituent that bears two binding sites to other molecular structures, thereby serving as a linker structure.

In the context of the present invention, the term "fused" when referring to aromatic or heteroaromatic ring systems means that the aromatic or heteroaromatic rings that are "fused" share at least one bond that is part of both ring systems. For example, naphthalene (or naphthyl when referred to as substituent) or benzothiophene (or benzothiophenyl when referred to as substituent) are considered fused aromatic ring systems in the context of the present invention, in which two benzene rings (for naphthalene) or a thiophene and a benzene (for benzothiophene) share one bond. It is also understood that sharing a bond in this context includes sharing the two atoms that build up the respective bond and that fused aromatic or heteroaromatic ring systems can be understood as one aromatic or heteroaromatic ring system. Additionally, it is understood, that more than one bond may be shared by the aromatic or heteroaromatic rings building up a fused aromatic or heteroaromatic ring system (e.g., in pyrene). Furthermore, it will be understood that aliphatic ring systems may also be fused and that this has the same meaning as for aromatic or heteroaromatic ring systems, with the exception of course, that fused aliphatic ring systems are not aromatic. Furthermore, it is understood that an aromatic or heteroaromatic ring system may also be fused to (in other words: share at least one bond with) an aliphatic ring system.

In the context of the present invention, the term "condensed" ring system has the same meaning as "fused" ring system.

In certain embodiments of the invention, adjacent substituents bonded to a ring or a ring system may together form an additional mono- or polycyclic, aliphatic, aromatic or heteroaromatic ring system which is fused to the aromatic or heteroaromatic ring or ring system to which the substituents are bonded. It is understood that the optionally so formed fused ring system will be larger (meaning it includes more ring atoms) than the aromatic or heteroaromatic ring or ring system to which the adjacent substituents are bonded. In these cases (and if such a number is provided), the "total" amount of ring atoms included in the fused ring system is to be understood as the sum of ring atoms included in the aromatic or heteroaromatic ring or ring system to which the adjacent substituents are bonded and the ring atoms of the additional ring system formed by the adjacent substituents, wherein, however, the ring atoms that are shared by fused rings are counted once and not twice. For example, a benzene ring may have two adjacent substituents that together form another benzene ring so that a naphthalene core is built. This naphthalene core then includes 10 ring atoms as two carbon atoms are shared by the two benzene rings and are thus only counted once and not twice.

In general, in the context of the present invention, the terms "adjacent substituents" or "adjacent groups" refer to substituents or groups bonded to either the same or to neighboring atoms.

In the context of the present invention, the term "alkyl group" may be understood in the broadest sense as any linear, branched, or cyclic alkyl substituent. Preferred examples of alkyl groups as substituents include methyl (Me), ethyl (Et), n-propyl ($^n$Pr), i-propyl ($^i$Pr), cyclopropyl, n-butyl ($^n$Bu), i-butyl ($^i$Bu), s-butyl ($^s$Bu), t-butyl ($^t$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl, and 1-(n-decyl)-cyclohex-1-yl.

The "s" in for example s-butyl, s-pentyl and s-hexyl refers to "secondary"; or in other words: s-butyl, s-pentyl and s-hexyl are equal to sec-butyl, sec-pentyl and sec-hexyl, respectively. The "t" in for example t-butyl, t-pentyl and t-hexyl refers to "tertiary"; or in other words: t-butyl, t-pentyl and t-hexyl are equal to tert-butyl, tert-pentyl and tert-hexyl, respectively.

As used herein, the term "alkenyl" includes linear, branched, or cyclic alkenyl substituents. The term alkenyl group exemplarily includes the substituents ethenyl, propenyl, butenyl, pentenyl, cyclopentenyl, hexenyl, cyclohexenyl, heptenyl, cycloheptenyl, octenyl, cyclooctenyl, or cyclooctadienyl.

As used herein, the term "alkynyl" includes linear, branched, or cyclic alkynyl substituents. The term alkynyl group exemplarily includes ethynyl, propynyl, butynyl, pentynyl, hexynyl, heptynyl, or octynyl.

As used herein, the term "alkoxy" includes linear, branched, or cyclic alkoxy substituents. The term alkoxy group exemplarily includes methoxy, ethoxy, n-propoxy, i-propoxy, n-butoxy, i-butoxy, s-butoxy, t-butoxy, and 2-methylbutoxy.

As used herein, the term "thioalkoxy" includes linear, branched, or cyclic thioalkoxy substituents, in which the oxygen atom O of the corresponding alkoxy groups is replaced by sulfur, S.

As used herein, the terms "halogen" (or "halo" when referred to as substituent in chemical nomenclature) may be understood in the broadest sense as any atom of an element of the $7^{th}$ main group (in other words: group 17) of the periodic table of elements, preferably fluorine, chlorine, bromine, or iodine.

It is understood that when a molecular fragment is described as being a substituent or otherwise attached to another moiety, its name may be written as if it was a fragment (e.g., naphthyl, dibenzofuryl) or as if it was the intact group (e.g., naphthalene, dibenzofuran). As used herein, these different ways of designating a substituent or attached fragment are considered to be equivalent.

Furthermore, herein, whenever a substituent such as "$C_6$-$C_{60}$-aryl" or "$C_1$-$C_{40}$-alkyl" is referred to without the name indicating the binding site within that substituent, this is to mean that the respective substituent may bond via any atom. For example, a "$C_6$-$C_{60}$-aryl"-substituent may bond via any of the 6 to 60 aromatic carbon atoms and a "$C_1$-$C_{40}$-alkyl"-substituent may bond via any of the 1 to 40 aliphatic carbon atoms. On the other hand, a "2-cyanophenyl"-substituent can only be bonded in such a way that its CN-group is adjacent to the binding site as to allow for the chemical nomenclature to be correct.

In the context of the present invention, whenever a substituent such as "butyl", "biphenyl" or "terphenyl" is referred to without further detail, this is to mean that any isomer of the respective substituent is allowable as the specific substituent. In this regard, for example the term "butyl" as substituent includes n-butyl, s-butyl, t-butyl, and iso-butyl as substituents. Along the same lines, the term "biphenyl" as substituent includes ortho-biphenyl, meta-biphenyl, or para-biphenyl, wherein ortho, meta and para are defined with regard to the binding site of the biphenyl substituent to the respective chemical moiety that bears the biphenyl substituent. Similarly, the term "terphenyl" as substituent includes 3-ortho-terphenyl, 4-ortho-terphenyl, 4-meta-terphenyl, 5-meta-terphenyl, 2-para-terphenyl or 3-para-terphenyl, wherein, as known to the skilled artisan, ortho, meta and para indicate the position of the two Ph-moieties within the terphenyl-group to each other and "2-", "3-", "4-" and "5-" denotes the binding site of the terphenyl substituent to the respective chemical moiety that bears the terphenyl substituent.

It is understood that all groups defined above and indeed all chemical moieties, regardless of whether they are cyclic or non-cyclic, aliphatic, aromatic or heteroaromatic, may be further substituted in accordance with the specific embodiments described herein.

All hydrogen atoms (H) included in any structure referred to herein may at each occurrence independently and, be replaced by deuterium (D) without this being indicated specifically. The replacement of hydrogen by deuterium is common practice for the person skilled in the art. Thus, there are numerous known methods by which this can be achieved and several review articles describing them.

If experimental or calculated data are compared, the values have to be determined by the same methodology. For example, if an experimental $\Delta E_{ST}$ is determined to be below 0.4 eV by a specific method, a comparison is only valid using the same specific method including the same conditions. To give a specific example, the comparison of the photoluminescence quantum yield (PLQY) of different compounds is only valid if the determination of the PLQY value was performed under the same reaction conditions (measurement in a 10% PMMA film at room temperature). Similarly, calculated energy values need to be determined by the same calculation method (using the same functional and the same basis set).

An optoelectronic device including at least one organic molecule according to the invention A further aspect of the invention relates to an optoelectronic device including at least one organic molecule according to the present invention.

In one embodiment, the optoelectronic device including at least one organic molecule according to the present invention is selected from the group consisting of:

organic light-emitting diodes (OLEDs),
light-emitting electrochemical cells,
OLED sensors, especially in gas and vapor sensors not hermetically externally shielded,
organic diodes,
organic solar cells,
organic transistors,
organic field-effect transistors,
organic lasers, and
down-conversion elements.

A light-emitting electrochemical cell consists of three layers, namely a cathode, an anode, and an active layer, which may contain the organic molecule according to the invention.

In a preferred embodiment, the optoelectronic device including at least one organic molecule according to the present invention is selected from the group consisting of an organic light emitting diode (OLED), a light emitting electrochemical cell (LEC), an organic laser, and a light-emitting transistor.

In an even more preferred embodiment, the optoelectronic device including at least one organic molecule according to the present invention is an organic light-emitting diode (OLED).

In one embodiment, the optoelectronic device including at least one organic molecule according to the present invention is an OLED that may exhibit the following layer structure:

1. substrate
2. anode layer A
3. hole injection layer, HIL
4. hole transport layer, HTL
5. electron blocking layer, EBL
6. light-emitting layer (also referred to as emission layer), EML
7. hole blocking layer, HBL
8. electron transport layer, ETL
9. electron injection layer, EIL
10. cathode layer C, wherein the OLED includes each layer, except for an anode layer A, a cathode layer C, and an EML, only optionally, and wherein different layers may be merged and the OLED may include more than one layer of each layer type defined above.

Furthermore, the optoelectronic device including at least one organic molecule according to the present invention may optionally include one or more protective layers protecting the device from damaging exposure to harmful species in the environment including, exemplarily moisture, vapor, and/or gases.

In one embodiment, the optoelectronic device including at least one organic molecule according to the present invention is an OLED, that may exhibit the following (inverted) layer structure:

1. substrate
2. cathode layer C
3. electron injection layer, EIL
4. electron transport layer, ETL
5. hole blocking layer, HBL
6. light-emitting layer (also referred to as emission layer), EML
7. electron blocking layer, EBL
8. hole transport layer, HTL
9. hole injection layer, HIL
10. anode layer A wherein the OLED (with an inverted layer structure) includes each layer, except for an anode layer A, a cathode layer C, and an EML, only optionally, and wherein different layers may be merged and the OLED may include more than one layer of each layer types defined above.

The organic molecules according to the invention (in accordance with the embodiments indicated above) can be employed in various layers, depending on the precise structure and on the substitution. In the case of the use, the fraction of the organic molecule according to the invention in the respective layer in an optoelectronic device, more particularly in an OLED, is 0.1% to 99% by weight, more particularly 1% to 80% by weight. In an alternative embodiment, the proportion of the organic molecule in the respective layer is 100% by weight.

In one embodiment, of the optoelectronic device including at least one organic molecule according to the present invention is an OLED which may exhibit stacked architecture. In this architecture, contrary to the typical arrangement, where the OLEDs are placed side by side, the individual units are stacked on top of each other. Blended light may be generated with OLEDs exhibiting a stacked architecture, in particular white light may be generated by stacking blue, green, and red OLEDs. Furthermore, the OLED exhibiting a stacked architecture may optionally include a charge generation layer (CGL), which is typically located between two OLED subunits and typically consists of a n-doped and p-doped layer with the n-doped layer of one CGL being typically located closer to the anode layer.

In one embodiment, the optoelectronic device including at least one organic molecule according to the present invention is an OLED, which includes two or more emission layers between anode and cathode. In particular, this so-called tandem OLED includes three emission layers, wherein one emission layer emits red light, one emission layer emits green light and one emission layer emits blue light, and optionally may include further layers such as charge generation layers, blocking or transporting layers between the individual emission layers. In a further embodiment, the emission layers are adjacently stacked. In a further embodiment, the tandem OLED includes a charge generation layer between each two emission layers. In addition, adjacent emission layers or emission layers separated by a charge generation layer may be merged.

In one embodiment, the optoelectronic device including at least one organic molecule according to the present invention may be an essentially white optoelectronic device, which is to say that the device emits white light. Exemplarily, such a white light-emitting optoelectronic device may include at least one (deep) blue emitter molecule and one or more emitter molecules emitting green and/or red light. Then, there may also optionally be energy transmittance between two or more molecules as described in a later section of this text (vide infra).

In the case of the optoelectronic device including at least one organic molecule according to the present invention, it is preferred that the at least one organic molecule according to the present invention is included in a light-emitting layer (EML) of the optoelectronic device, most preferably in an EML of an OLED. However, the organic molecules according to the invention may for example also be employed in an electron transport layer (ETL) and/or in an electron blocking layer (EBL) or exciton-blocking layer and/or in a hole transport layer (HTL) and/or in a hole blocking layer (HBL). In the case of the use, the fraction of the organic molecule according to the invention in the respective layer in an optoelectronic device, more particularly in an OLED, is 0.1% to 99% by weight, more particularly 0.5% to 80% by weight, in particular 0.5% to 10% by weight. In an alternative embodiment, the proportion of the organic molecule in the respective layer is 100% by weight.

The selection criteria for suitable materials for the individual layers of optoelectronic devices, in particular OLEDs, are common knowledge of those skilled in the art. The state of the art describes plenty of materials to be used in the individual layers and also teaches which materials are suitable to be used alongside each other. It is understood that any materials used in the state of the art may also be used in optoelectronic devices including the organic molecule according to the present invention. In the following, preferred examples of materials for the individual layers will be given. It is understood that this does not imply that all types of layers listed below must be present in an optoelectronic device including at least one organic molecule according to the present invention. Additionally, it is understood that an optoelectronic device including at least one organic molecule according to the present invention may include more than one of each of the layers listed in the following, for example two or more light-emitting layers (EMLs). It is also understood that two or more layers of the same type (e.g., two or more EMLs or two or more HTLs) do not necessarily include the same materials or even the same materials in the same ratios. Furthermore, it is understood that an optoelectronic device including at least one organic molecule according to the present invention does not have to include all the layer types listed in the following, wherein an anode layer, a cathode layer, and a light-emitting layer will usually be present in all cases.

The substrate may be formed by any material or composition of materials. Most frequently, glass slides are used as substrates. Alternatively, thin metal layers (e.g., copper, gold, silver, or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is usually transparent. Preferably, the anode layer A includes a large content or even consists of transparent conductive oxides (TCOs). Such an anode layer A may, for example, include indium tin oxide, aluminum zinc oxide, fluorine doped tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrole, and/or doped polythiophene.

Preferably, an anode layer A (essentially) consists of indium tin oxide (ITO) (e.g., $(In_2O_3)_{0.9}(SnO_2)_{0.1}$). The roughness of an anode layer A caused by the transparent conductive oxides (TCOs) may be compensated by using a hole injection layer (HIL). Further, a HIL may facilitate the injection of quasi charge carriers (i.e., holes) in that the transport of the quasi charge carriers from the TCO to the hole transport layer (HTL) is facilitated. A hole injection layer (HIL) may include poly-3,4-ethylenedioxy thiophene (PEDOT), polystyrene sulfonate (PSS), $MoO_2$, $V_2O_5$, CuPC, or CuI, in particular a mixture of PEDOT and PSS. A hole injection layer (HIL) may also prevent the diffusion of metals from an anode layer A into a hole transport layer (HTL). A HIL may for example include PEDOT:PSS (poly-3,4-ethylenedioxy thiophene: polystyrene sulfonate), PEDOT (poly-3,4-ethylenedioxy thiophene), mMTDATA (4,4',4"-trs[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-bis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile), and/or Spiro-NPD (N,N'-diphenyl-N,N'-bis-(1-naphthyl)-9,9'-spirobifluorene-2,7-diamine).

Adjacent to an anode layer A or a hole injection layer (HIL), a hole transport layer (HTL) is typically located. Herein, any hole transport material may be used. Exemplarily, electron-rich heteroaromatic compounds such as triarylamines and/or carbazoles may be used as hole transport compound. A HTL may decrease the energy barrier between an anode layer A and a light-emitting layer EML. A hole transport layer (HTL) may also be an electron blocking layer (EBL). Preferably, hole transport compounds bear comparably high energy levels of their lowermost excited triplet states T1. Exemplarily, a hole transport layer (HTL) may include a star-shaped heterocyclic compound such as tris(4-carbazol-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-bis-(1-naphthalenyl)-N,N'-bis-phenyl-(1,1'-biphenyl)-4,4'-diamine)), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile) and/or TrisPcz (9,9'-diphenyl-6-(9-phenyl-9H-carbazol-3-yl)-9H,9'H-3,3'-bicarbazole). In addition, a HTL may include a p-doped layer, which may be composed of an inorganic or organic dopant in an organic hole-transporting matrix. Transition metal oxides such as vanadium oxide, molybdenum oxide or tungsten oxide may be used as inorganic dopant. Tetrafluorotetracyanoquinodimethane (F4-TCNQ), copper-pentafluorobenzoate (Cu(I)pFBz) or transition metal complexes may be used as organic dopant.

An EBL may for example include mCP (1,3-bis(carbazol-9-yl)benzene), TCTA (tris(4-carbazol-9-ylphenyl)amine), 2-TNATA (4,4',4"-tris[2-naphthyl(phenyl)amino]triphenylamine), mCBP (3,3-di(9H-carbazol-9-yl)biphenyl), tris-Pcz (9-Phenyl-3,6-bis(9-phenyl-9H-carbazol-3-yl)-9H-carbazole), CzSi(9-(4-tert-Butylphenyl)-3,6-bis(triphenylsilyl)-9H-carbazole), and/or DCB (N,N'-dicarbazolyl-1,4-dimethylbenzene).

Adjacent to a hole transport layer (HTL) or (if present) an electron blocking layer (EBL), typically, a light-emitting layer (EML) is located. A light-emitting layer (EML) includes at least one light-emitting molecule (i.e., emitter material). Typically, an EML additionally includes one or more host materials (also referred to as matrix materials). Exemplarily, the host material may be selected from CBP (4,4'-Bis-(N-carbazolyl)-biphenyl), mCP (1,3-bis(carbazol-9-yl)benzene), mCBP (3,3-di(9H-carbazol-9-yl)biphenyl), Sif87 (dibenzo[b,d]thiophen-2-yltriphenylsilane), CzSi(9-(4-tert-Butylphenyl)-3,6-bis(triphenylsilyl)-9H-carbazole), Sif88 (dibenzo[b,d]thiophen-2-yl)diphenylsilane), DPEPO (bis[2-(diphenylphosphino)phenyl]ether oxide), 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluoren-2-yl)-1,3,5-triazine). As known to the person skilled in the art, a host material typically should be selected to exhibit first (i.e., lowermost) excited triplet state (T1) and first (i.e., lowermost) excited singlet (S1) energy levels, which are energetically higher than the first (i.e., lowermost) excited triplet state (T1) and first (i.e., lowermost) excited singlet state (S1) energy levels of the at least one light-emitting molecule that is embedded in the respective host material(s).

As stated previously, it is preferred that at least one EML of the optoelectronic device in the context of the invention includes at least one molecule according to the present invention. The preferred compositions of an EML of an optoelectronic device including at least one organic molecule according to the present invention are described in more detail in a later section of this text (vide infra).

Adjacent to a light-emitting layer (EML), an electron transport layer (ETL) may be located. Herein, any electron transport material may be used. Exemplarily, compounds bearing electron-deficient groups, such as for example benzimidazoles, pyridines, triazoles, triazines, oxadiazoles (e.g., 1,3,4-oxadiazole), phosphine oxides and sulfones, may be used. An electron transport material may also be a star-shaped heterocyclic compound such as 1,3,5-tri(1-phenyl-1H-benzo[d]imidazol-2-yl)phenyl (TPBi). An ETL may for example include NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphine oxide), BPyTP2 (2,7-di(2,2'-bipyridin-5-yl) triphenylene), Sif87 (dibenzo[b,d]thiophen-2-yltriphenylsilane), Sif88 (dibenzo[b,d]thiophen-2-yl) diphenylsilane), BmPyPhB (1,3-bis[3,5-di(pyridin-3-yl) phenyl]benzene), and/or BTB (4,4'-bis-[2-(4,6-diphenyl-1,3,5-triazinyl)]-1,1'-biphenyl). Optionally, an ETL may be doped with materials such as Liq ((8-hydroxyquinolinato) lithium). An electron transport layer (ETL) may also block holes or a hole blocking layer (HBL) is introduced, typically between an EML and an ETL.

A hole blocking layer (HBL) may for example include BCP (2,9-dimethyl-4,7-diphenyl-1,10-phenanthroline=bathocuproine), 4,6-diphenyl-2-(3-(triphenylsilyl)phenyl)-1,3,5-triazine, 9,9'-(5-(6-([1,1'-biphenyl]-3-yl)-2-phenylpyrimidin-4-yl)-1,3-phenylene)bis(9H-carbazole), BAlq (bis (8-hydroxy-2-methylquinoline)-(4-phenylphenoxy) aluminum), NBphen (2,9-bis(naphthalen-2-yl)-4,7-diphenyl-1,10-phenanthroline), Alq3 (aluminum-tris(8-hydroxyquinoline)), TSPO1 (diphenyl-4-triphenylsilylphenyl-phosphine oxide), T2T (2,4,6-tris (biphenyl-3-yl)-1,3,5-triazine), T3T (2,4,6-tris(triphenyl-3-yl)-1,3,5-triazine), TST (2,4,6-tris(9,9'-spirobifluoren-2-yl)-1,3,5-triazine), and/or TCB/TCP (1,3,5-tris(N-carbazolyl) benzene/1,3,5-tris(carbazol)-9-yl)benzene).

A cathode layer C may be located adjacent to the electron transport layer (ETL). For example, the cathode layer C may include or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may consist of (essentially) non-transparent metals such as Mg, Ca or Al. Alternatively or additionally, the cathode layer C may also include graphite and/or carbon nanotubes (CNTs). Alternatively, the cathode layer C may also include or consist of nanoscale silver wires.

An OLED including at least one organic molecule according to the present invention may further, optionally include a protection layer between an electron transport layer (ETL) and a cathode layer C (which may be designated as electron injection layer (EIL)). This layer may include lithium fluoride, cesium fluoride, silver, Liq ((8-hydroxyquinolinato) lithium), $Li_2O$, $BaF_2$, MgO, and/or NaF.

Optionally, an electron transport layer (ETL) and/or a hole blocking layer (HBL) may also include one or more host materials.

As used herein, if not defined more specifically in the particular context, the designation of the colors of emitted and/or absorbed light is as follows:

| | |
|---|---|
| violet: | wavelength range of >380-420 nm; |
| deep blue: | wavelength range of >420-480 nm; |
| sky blue: | wavelength range of >480-500 nm; |
| green: | wavelength range of >500-560 nm; |
| yellow: | wavelength range of >560-580 nm; |
| orange: | wavelength range of >580-620 nm; |
| red: | wavelength range of >620-800 nm. |

With respect to light-emitting molecules (in other words: emitter materials), such colors refer to the emission maximum of the main emission peak. Therefore, exemplarily, a deep blue emitter has an emission maximum in the range of from >420 to 480 nm, a sky-blue emitter has an emission maximum in the range of from >480 to 500 nm, a green emitter has an emission maximum in a range of from >500 to 560 nm, and a red emitter has an emission maximum in a range of from >620 to 800 nm.

A deep blue emitter may preferably have an emission maximum of below 475 nm, more preferably below 470 nm, even more preferably below 465 nm or even below 460 nm. It will typically be above 420 nm, preferably above 430 nm, more preferably above 440 nm or even above 450 nm. In a preferred embodiment, the organic molecules according to the present invention exhibit emission maxima between 420 and 500 nm, more preferably between 430 and 490 nm, even more preferably between 440 and 480 nm, and most preferably between 450 and 470 nm, typically measured at room temperature (i.e., (approximately) 20° C.) from a spin-coated film with 1-5%, preferably 2% by weight of the organic molecule according to the invention in poly(methyl methacrylate), PMMA, mCBP or alternatively in an organic solvent, preferably DCM or toluene, with 0.001 mg/mL of organic molecule according to the invention.

A further embodiment relates to an OLED including at least one organic molecule according to the present invention and emitting light with CIEx and CIEy color coordinates close to the CIEx (=0.131) and CIEy (=0.046) color coordinates of the primary color blue (CIEx=0.131 and CIEy=0.046) as defined by the ITU-R Recommendation BT.2020 (Rec. 2020) and thus is suited for the use in Ultra High Definition (UHD) displays, e.g., UHD-Vs. Accordingly, a further aspect of the present invention relates to an OLED including at least one organic molecule according to the present invention, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

A further embodiment relates to an OLED including at least one organic molecule according to the present invention and exhibiting an external quantum efficiency at 1000 $cd/m^2$ of more than 8%, more preferably of more than 10%, more preferably of more than 13%, even more preferably of more than 15% or even more than 20% and/or exhibits an emission maximum 420 and 500 nm, more preferably between 430 and 490 nm, even more preferably between 440 and 480 nm, and most preferably between 450 and 470 nm or still and/or exhibits an LT80 value at 500 $cd/m^2$ of more than 100 h, preferably more than 200 h, more preferably more than 400 h, even more preferably more than 750 h or even more than 1000 h.

A green emitter material may preferably have an emission maximum between 500 and 560 nm, more preferably between 510 and 550 nm, and even more preferably between 520 and 540 nm.

A further preferred embodiment relates to an OLED including at least one organic molecule according to the present invention and emitting light at a distinct color point. Preferably, the OLED emits light with a narrow emission band (a small full width at half maximum (FWHM)). In a preferred embodiment, the OLED including at least one organic molecule according to the invention emits light with an FWHM of the main emission peak of less than 0.30 eV, preferably less than 0.25 eV, more preferably less than 0.20 eV, even more preferably less than 0.1 eV, or even less than 0.17 eV.

In accordance with the invention, the optoelectronic devices including at least one organic molecule according to the present invention can for example be employed in displays, as light sources in lighting applications and as light sources in medical and/or cosmetic applications (for example light therapy).

Combination of the organic molecules according to the invention with further materials It forms part of the common knowledge of those skilled in the art that any layer within an optoelectronic device (herein preferably an OLED), and in particular the light-emitting layer (EML), may be composed of a single material or a combination of different materials.

For example, the person skilled in the art understands that an EML may be composed of a single material that is capable of emitting light when a voltage (and electrical current) is applied to said device. However, the skilled artisan also understands that it may be beneficial to combine different materials in an EML of an optoelectronic device (herein preferably an OLED), in particular one or more host material(s)(in other words: matrix material(s); herein designated host material(s) $H^B$ when included in an optoelectronic device that includes at least one organic molecule according to the invention) and one or more dopant materials out of which at least one is emissive (i.e., an emitter material) when applying a voltage and electrical current to the device.

In a preferred embodiment of the use of an organic molecule according to the invention in an optoelectronic device, said optoelectronic device includes at least one organic molecule according to the invention in an EML or in a layer that is directly adjacent to an EML or in more than one of these layers.

In a preferred embodiment of the use of an organic molecule according to the invention in an optoelectronic device, said optoelectronic device is an OLED and includes at least one organic molecule according to the invention in an EML or in a layer that is directly adjacent to an EML or in more than one of these layers.

In an even more preferred embodiment of the use of an organic molecule according to the invention in an optoelectronic device, said optoelectronic device is an OLED and includes at least one organic molecule according to the invention in an EML.

In one embodiment relating to the optoelectronic device, preferably the OLED, including at least one organic molecule according to the invention, the at least one, preferably each, organic molecule according to the invention is used as emitter material in a light-emitting layer EML, which is to say that it emits light when a voltage (and electrical current) is applied to said device.

As known to the person skilled in the art, light emission from emitter materials (i.e., emissive dopants), for example in organic light-emitting diodes (OLEDs), may include fluorescence from excited singlet states (typically the lowermost excited singlet state S1) and phosphorescence from excited triplet states (typically the lowermost excited triplet state T1).

A fluorescence emitter F is capable of emitting light at room temperature (i.e., (approximately) 20° C.) upon electronic excitation (for example in an optoelectronic device), wherein the emissive excited state is a singlet state. Fluorescence emitters usually display prompt (i.e., direct) fluorescence on a timescale of nanoseconds, when the initial electronic excitation (for example by electron hole recombination) affords an excited singlet state of the emitter.

In the context of the invention, a delayed fluorescence material is a material that is capable of reaching an excited singlet state (typically the lowermost excited singlet state S1) by means of reverse intersystem crossing (RISC; in other words: up intersystem crossing or inverse intersystem crossing) from an excited triplet state (typically from the lowermost excited triplet state T1) and that is furthermore capable of emitting light when returning from the so-reached excited singlet state (typically S1) to its electronic ground state. The fluorescence emission observed after RISC from an excited triplet state (typically T1) to the emissive excited singlet state (typically S1) occurs on a timescale (typically in the range of microseconds) that is slower than the timescale on which direct (i.e., prompt) fluorescence occurs (typically in the range of nanoseconds) and is thus referred to as delayed fluorescence (DF). When RISC from an excited triplet state (typically from T1) to an excited singlet state (typically to S1), occurs through thermal activation, and if the so populated excited singlet state emits light (delayed fluorescence emission), the process is referred to as thermally activated delayed fluorescence (TADF). Accordingly, a TADF material is a material that is capable of emitting thermally activated delayed fluorescence (TADF) as explained above. It is known to the person skilled in the art that, when the energy difference $\Delta E_{ST}$ between the lowermost excited singlet state energy level $E(S1^E)$ and the lowermost excited triplet state energy level $E(T1^E)$ of a fluorescence emitter F is reduced, population of the lowermost excited singlet state from the lowermost excited triplet state by means of RISC may occur with high efficiency. Thus, it forms part of the common knowledge of those skilled in the art that a TADF material will typically have a small $\Delta E_{ST}$ value (vide infra). As known to the person skilled in the art, a TADF material may not just be a material that is on its own capable of RISC from an excited triplet state to an excited singlet state with subsequent emission of TADF as laid out above. It is known to those skilled in the art that a TADF material may in fact also be an exciplex that is formed from two kinds of materials, preferably from two host materials $H^B$, more preferably from a p-host material $H^P$ and an n-host material $H^N$ (vide infra).

The occurrence of (thermally activated) delayed fluorescence may for example be analyzed based on the decay curve obtained from time-resolved (i.e., transient) photoluminescence (PL) measurements. For this purpose, a spin-coated film of the respective emitter (i.e., the assumed TADF material) in poly(methyl methacrylate)(PMMA) with 1-10% by weight, in particular 10% by weight of the respective emitter may be used as sample. The analysis may for example be performed using an FS5 fluorescence spectrometer from Edinburgh instruments. The sample PMMA film may be placed in a cuvette and kept under nitrogen atmosphere during the measurement. Data acquisition may be performed using the well-established technique of time correlated single photon counting (TCSPC, vide infra). To gather the full decay dynamics over several orders of magnitude in time and signal intensity, measurements in four time windows (200 ns, 1 μs, and 20 μs, and a longer measurement spanning >80 μs) may be carried out and combined (vide infra).

TADF materials preferably fulfill the following two conditions regarding the aforementioned full decay dynamics:

(i) the decay dynamics exhibit two time regimes, one in the nanosecond (ns) range and the other in the microsecond (μs) range; and (ii) the shapes of the emission spectra in both time regimes coincide;

wherein, the fraction of light emitted in the first decay regime is taken as prompt fluorescence and the fraction emitted in the second decay regime is taken as delayed fluorescence.

The ratio of delayed and prompt fluorescence may be expressed in form of a so-called n-value that may be calculated by the integration of respective photoluminescence decays in time according to the following equation:

$$\frac{\int I_{DF}(t)dt}{\int I_{PF}(t)dt} = n$$

In the context of the present invention, a TADF material preferably exhibits an n-value (ratio of delayed to prompt fluorescence) larger than 0.05 (n>0.05), more preferably larger than 0.1 (n>0.1), even more preferably larger than 0.15 (n>0.15), particularly preferably larger than 0.2 (n>0.20), or even larger than 0.25 (n>0.25).

In a preferred embodiment, the organic molecules according to the invention exhibit an n-value (ratio of delayed to prompt fluorescence) larger than 0.05 (n>0.05).

In the context of the present invention, a TADF material $E^B$ is characterized by exhibiting a $\Delta E_{ST}$ value, which corresponds to the energy difference between the lowermost excited singlet state energy level $E(S1^E)$ and the lowermost excited triplet state energy level $E(T1^E)$, of less than 0.4 eV, preferably of less than 0.3 eV, more preferably of less than 0.2 eV, even more preferably of less than 0.1 eV, or even of less than 0.05 eV. The means of determining the $\Delta E_{ST}$ value of TADF materials $E^B$ are laid out in a later subchapter of this text.

One approach for the design of TADF materials in general is to covalently attach one or more (electron) donor moieties on which the HOMO is distributed and one or more (electron) acceptor moieties on which the LUMO is distributed to the same bridge, herein referred to as linker group. A TADF material $E^B$ may, for example, also include two or three linker groups which are bonded to the same acceptor moiety and additional donor and acceptor moieties may be bonded to each of these two or three linker groups.

One or more donor moieties and one or more acceptor moieties may also be bonded directly to each other (without the presence of a linker group).

Typical donor moieties are derivatives of diphenyl amine, indole, carbazole, acridine, phenoxazine, and related structures. In particular, aliphatic, aromatic or heteroaromatic ring systems may be fused to the aforementioned donor motifs to arrive at for example indolocarbazoles.

Benzene-, biphenyl-, and to some extend also terphenyl-derivatives are common linker groups.

Nitrile groups are common acceptor moieties in TADF materials and known examples thereof include:

(i) Carbazolyl Dicyanobenzene Compounds
 such as 2CzPN (4,5-di(9H-carbazol-9-yl)phthalonitrile), DCzIPN (4,6-di(9H-carbazol-9-yl)isophthalonitrile), 4CzPN (3,4,5,6-tetra(9H-carbazol-9-yl)phthalonitrile), 4CzIPN (2,4,5,6-Tetra(9H-carbazol-9-yl)isophthalonitrile), 4CzTPN (2,4,5,6-tetra(9H-carbazol-9-yl)terephthalonitrile), and derivatives thereof;

(ii) Carbazolyl Cyanopyridine Compounds
 such as 4CzCNPy (2,3,5,6-tetra(9H-carbazol-9-yl)-4-cyanopyridine) and derivatives thereof;

(iii) Carbazolyl Cyanobiphenyl Compounds
 such as CNBPCz (4,4',5,5'-tetra(9H-carbazol-9-yl)-[1,1'-biphenyl]-2,2'-dicarbonitrile), CzBPCN (4,4',6,6'-tetra(9H-carbazol-9-yl)-[1,1'-biphenyl]-3,3'-dicarbonitrile), DDCzIPN (3,3',5,5'-tetra(9H-carbazol-9-yl)-[1,1'-biphenyl]-2,2',6,6'-tetracarbonitrile) and derivatives thereof;

wherein in these materials, one or more of the nitrile groups may be replaced by fluorine (F) or trifluoromethyl ($CF_3$) as acceptor moieties.

Nitrogen-heterocycles such as triazine-, pyrimidine-, triazole-, oxadiazole-, thiadiazole-, heptazine-, 1,4-diazatriphenylene-, benzothiazole-, benzoxazole-, quinoxaline-, and diazafluorene-derivatives are also well-known acceptor moieties used for the construction of TADF molecules. Known examples of TADF molecules, including for example a triazine acceptor include PIC-TRZ (7,7'-(6-([1,1'-biphenyl]-4-yl)-1,3,5-triazine-2,4-diyl)bis(5-phenyl-5,7-dihydroindolo[2,3-b]carbazole)), mBFCzTrz (5-(3-(4,6-diphenyl-1,3,5-triazin-2-yl)phenyl)-5H-benzofuro[3,2-c]carbazole), and DCzTrz (9,9'-(5-(4,6-diphenyl-1,3,5-triazin-2-yl)-1,3-phenylene)bis(9H-carbazole)).

Another group of TADF molecules (materials) includes diaryl ketones such as benzophenone or (heteroaryl)aryl ketones such as 4-benzoylpyridine, 9,10-anthraquinone, 9H-xanthen-9-one, and derivatives thereof as acceptor moieties to which the donor moieties (usually carbazolyl substituents) are bonded. Examples of such TADF molecules include BPBCz (bis(4-(9'-phenyl-9H,9'H-[3,3'-bicarbazol]-9-yl)phenyl)methanone), mDCBP ((3,5-di(9H-carbazol-9-yl)phenyl)(pyridin-4-yl)methanone), AQ-DTBu-Cz (2,6-bis(4-(3,6-di-tert-butyl-9H-carbazol-9-yl)phenyl)anthracene-9,10-dione), and MCz-XT (3-(1,3,6,8-tetramethyl-9H-carbazol-9-yl)-9H-xanthen-9-one), respectively.

Sulfoxides, in particular diphenyl sulfoxides, are also commonly used as acceptor moieties for the construction of TADF materials and known examples include 4-PC-DPS (9-phenyl-3-(4-(phenylsulfonyl)phenyl)-9H-carbazole), DitBu-DPS (9,9'-(sulfonylbis(4,1-phenylene))bis(9H-carbazole)), and TXO-PhCz (2-(9-phenyl-9H-carbazol-3-yl)-9H-thioxanthen-9-one 10,10-dioxide).

It is understood that a fluorescence emitter F may also display TADF as defined herein and even be a TADF material $E^B$ as defined herein. In consequence, a small FWHM emitter $S^B$ as defined herein may or may not also be a TADF material $E^B$ as defined herein.

Phosphorescence, i.e., light emission from excited triplet states (typically from the lowermost excited triplet state T1) is a spin-forbidden process. As known to the person skilled in the art, phosphorescence may be facilitated (enhanced) by exploiting the (intramolecular) spin-orbit interaction (so called (internal) heavy atom effect). A phosphorescence material $P^B$ in the context of the invention is a phosphorescence emitter capable of emitting phosphorescence at room temperature (i.e., at approximately 20° C.).

Herein, it is preferred that a phosphorescence material $P^B$ includes at least one atom of an element having a standard atomic weight larger than the standard atomic weight of calcium (Ca). Even more preferably, a phosphorescence material $P^B$ in the context of the invention includes a transition metal atom, in particular a transition metal atom of an element having a standard atomic weight larger than the standard atomic weight of zinc (Zn). The transition metal atom preferably included in the phosphorescence material $P^B$ may be present in any oxidation state (and may also be present as ion of the respective element).

It is common knowledge to those skilled in the art that phosphorescence materials $P^B$ used in organic electroluminescent devices are oftentimes complexes of Ir, Pd, Pt, Au, Os, Eu, Ru, Re, Ag, and Cu, in the context of this invention preferably of Ir, Pt, and Pd, more preferably of Ir and Pt. The skilled artisan knows which materials are suitable as phosphorescence materials $P^B$ in optoelectronic devices and how to synthesize them. Furthermore, the skilled artisan is familiar with the design principles of phosphorescent complexes for use as phosphorescence materials in optoelectronic devices and knows how to tune the emission of the complexes by means of structural variations.

The skilled artisan knows which materials are suitable as phosphorescence materials $P^B$ to be used in optoelectronic devices and how to synthesize them. In this regard, the skilled artisan is in particular familiar with the design principles of phosphorescent complexes for use as phosphorescence materials $P^B$ in optoelectronic devices and knows how to tune the emission of the complexes by means of structural variations.

Examples of phosphorescence materials $P^B$ that may be used alongside the organic molecules according to the present invention (for example in form of a composition or in an EML of an optoelectronic device, vide infra) are disclosed in the state of the art. For example, the following metal complexes are phosphorescence materials $P^B$ that may be used alongside the organic molecules according to the present invention:

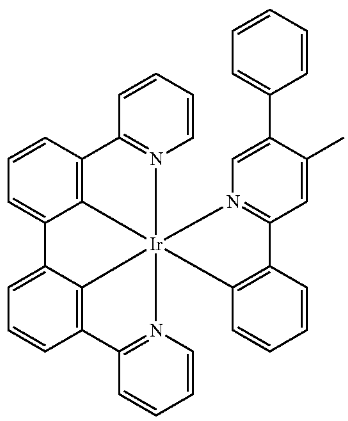

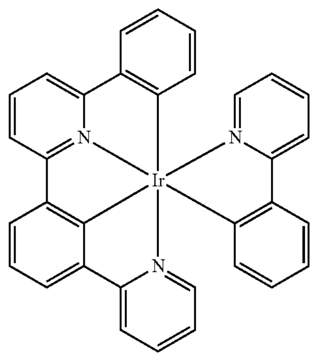

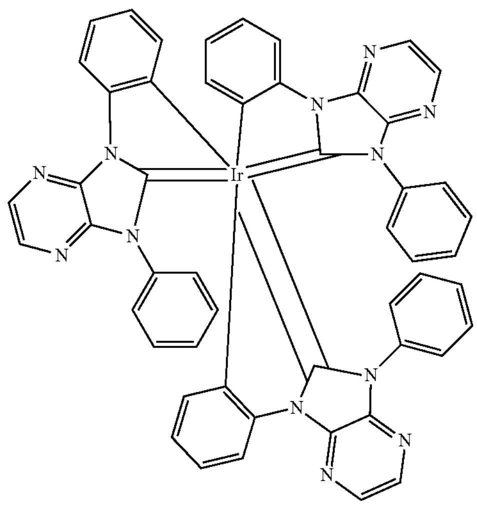

-continued

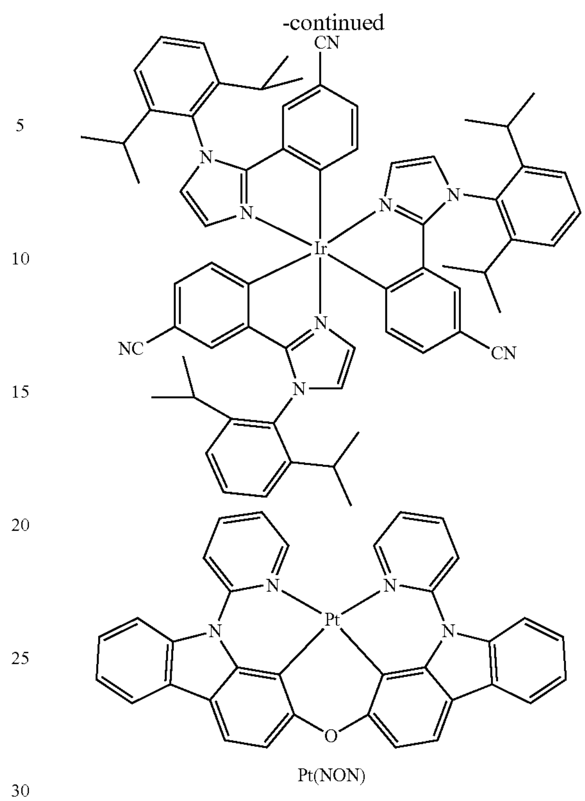

Pt(NON)

A small full width at half maximum (FWHM) emitter $S^B$ in the context of the invention is any emitter (i.e., emitter material) that has an emission spectrum, which exhibits an FWHM of less than or equal to 0.35 eV (≤ 0.35 eV), preferably of less than or equal to 0.30 eV (≤ 0.30 eV), in particular of less than or equal to 0.25 eV (≤ 0.25 eV). Unless stated otherwise, this is judged based on an emission spectrum of the respective emitter at room temperature (i.e., (approximately) 20° C.), typically measured with 1 to 5% by weight, in particular with 2% by weight, of the emitter in poly(methyl methacrylate) PMMA or mCBP. Alternatively, emission spectra of small FWHM emitters $S^B$ may be measured in a solution, typically with 0.001-0.2 mg/mL of the emitter $S^B$ in dichloromethane or toluene at room temperature (i.e., (approximately) 20° C.).

A small FWHM emitter $S^B$ may be a fluorescence emitter F, a phosphorescence emitter (for example a phosphorescence material $P^B$) and/or a TADF emitter (for example a TADF material $E^B$). For TADF materials $E^B$ and for phosphorescence materials $P^B$ as laid out above, the emission spectrum is recorded at room temperature (i.e., approximately 20° C.) from a spin-coated film of the respective material in poly(methyl methacrylate) PMMA, with 10% by weight of the respective molecule of the invention, $E^B$ or $P^B$.

As known to the person skilled in the art, the full width at half maximum (FWHM) of an emitter (for example a small FWHM emitter $S^B$) is readily determined from the respective emission spectrum (fluorescence spectrum for fluorescence emitters and phosphorescence spectrum for phosphorescence emitters). All reported FWHM values typically refer to the main emission peak (i.e., the peak with the highest intensity). The means of determining the FWHM (herein preferably reported in electron volts, eV) are part of the common knowledge of those skilled in the art. Given for example that the main emission peak of an emission spectrum reaches its half maximum emission (i.e., 50% of the maximum emission intensity) at the two wavelengths $\lambda_1$ and $\lambda_2$, both obtained in nanometers (nm) from the emission spectrum, the FWHM in electron volts (eV) is commonly (and herein) determined using the following equation:

$$FWHM\,[\mathrm{eV}] = \left|\frac{1239.84[\mathrm{eV}\cdot\mathrm{nm}]}{\lambda_2[\mathrm{nm}]} - \frac{1239.84[\mathrm{eV}\cdot\mathrm{nm}]}{\lambda_1[\mathrm{nm}]}\right|$$

In the context of the invention, a small FWHM emitter $S^B$ is an organic emitter, which, in the context of the invention, means that it does not contain any transition metals. Preferably, a small FWHM emitter $S^B$ in the context of the invention predominantly consists of the elements hydrogen (H), carbon (C), nitrogen (N), and boron (B), but may for example also include oxygen (O), silicon (Si), fluorine (F), and bromine (Br).

Furthermore, it is preferred that a small FWHM emitter $S^B$ in the context of the invention is a fluorescence emitter F that may or may not additionally exhibit TADF.

Preferably, a small FWHM emitter $S^B$ in the context of the invention preferably fulfills at least one of the following requirements:

(i) it is a boron (B)-containing emitter, which means that at least one atom within the respective small FWHM emitter $S^B$ is boron (B);

(ii) it includes a polycyclic aromatic or heteroaromatic core structure, wherein at least two aromatic rings are fused together (e.g., anthracene, pyrene, or aza-derivatives thereof).

As known to person skilled in the art, a host material $H^B$ of an EML may transport electrons or positive charges through said EML and may also transfer excitation energy to the at least one emitter material doped in the host material(s) $H^B$. The skilled artisan understands that a host material $H^B$ included in an EML of an optoelectronic device (e.g., an OLED) is typically not significantly involved in light emission from said device upon applying a voltage and electrical current. The person skilled in the art is also familiar with the fact that any host material $H^B$ may be a p-host $H^P$ exhibiting high hole mobility, an n-host $H^N$ exhibiting high electron mobility, or a bipolar host material $H^B$P exhibiting both, high hole mobility and high electron mobility.

As known to person skilled in the art, an EML may also include a so-called mixed-host system with at least one p-host $H^P$ and one n-host $H^N$. In particular, the EML may include exactly one emitter material according to the invention and a mixed-host system including T2T (2,4,6-tris (biphenyl-3-yl)-1,3,5-triazine) as n-host $H^N$ and a host selected from CBP, mCP, mCBP, 4,6-diphenyl-2-(3-(triphenylsilyl)phenyl)-1,3,5-triazine, 9-[3-(dibenzofuran-2-yl) phenyl]-9H-carbazole, 9-[3-(dibenzothiophen-2-yl)phenyl]-9H-carbazole, 9-[3,5-bis(2-dibenzofuranyl)phenyl]-9H-carbazole, and 9-[3,5-bis(2-dibenzothiophenyl)phenyl]-9H-carbazole as p-host $H^P$.

An EML may include a so-called mixed-host system with at least one p-host $H^P$ and one n-host $H^N$; wherein the n-host $H^N$ includes groups derived from pyridine, pyrimidine, benzopyrimidine, 1,3,5-triazine, 1,2,4-triazine, and 1,2,3-triazine, while the p-host $H^P$ includes groups derived from indole, isoindole, and preferably carbazole.

The person skilled in the art knows which materials are suitable host materials for use in organic electroluminescent devices. It is understood that any host materials that are used in the state of the art may be suitable host materials $H^B$ in the context of the invention.

Examples of materials $H^B$ that are p-host materials $H^P$ in the context of the invention are listed below:

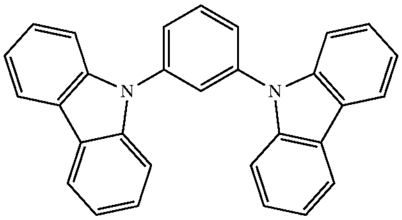

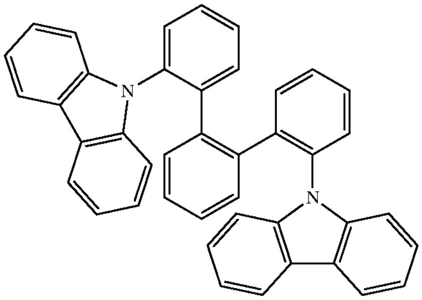

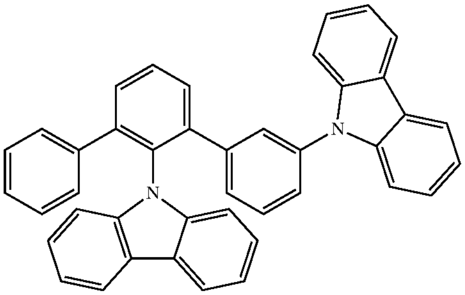

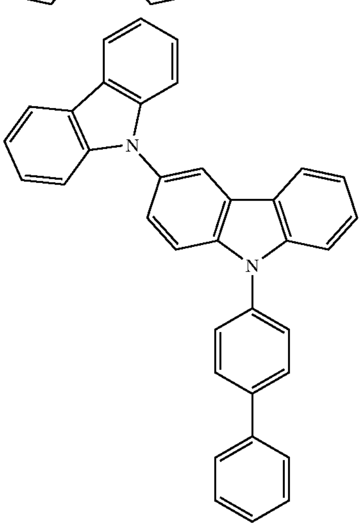

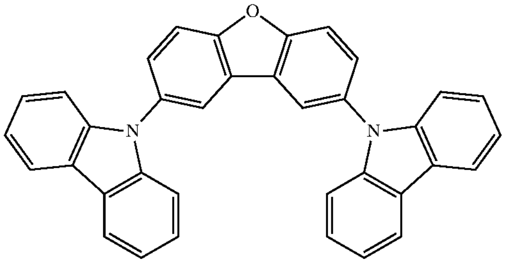

-continued
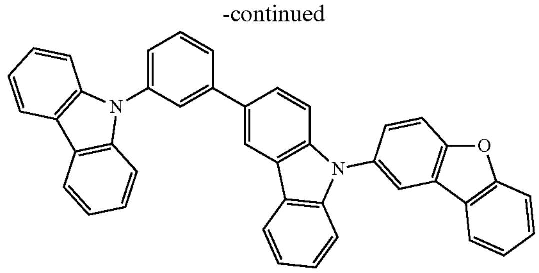
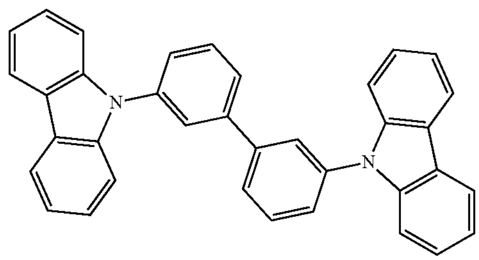
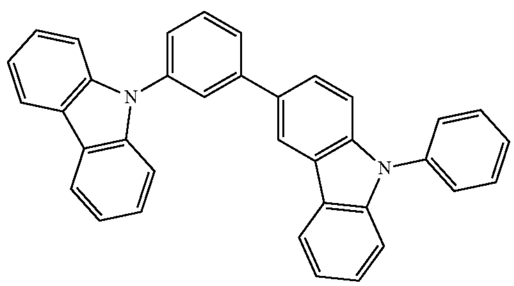
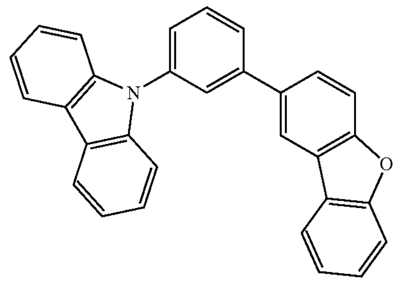
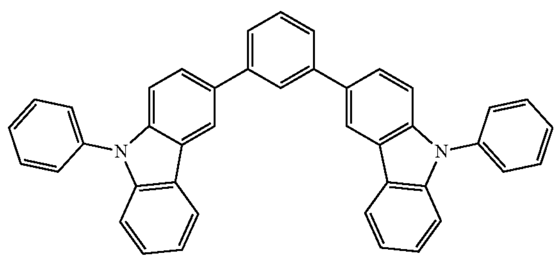
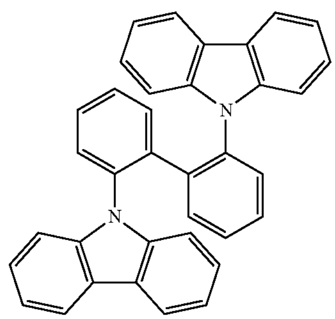
-continued
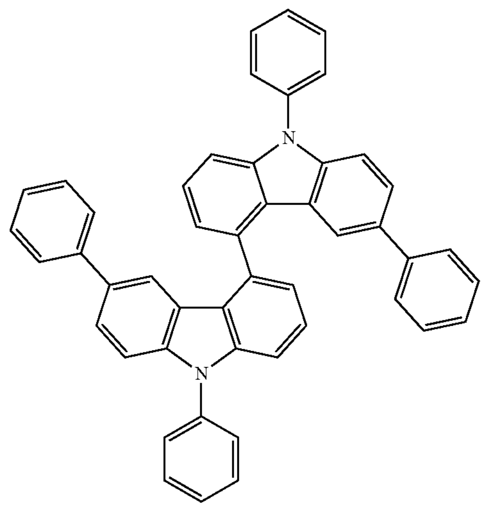
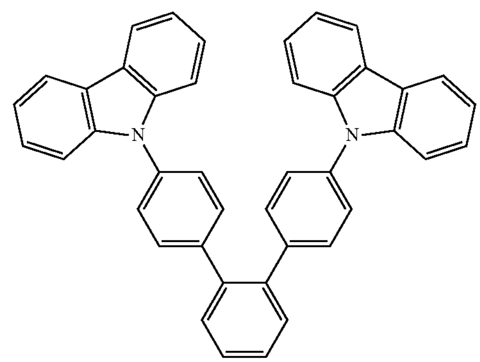
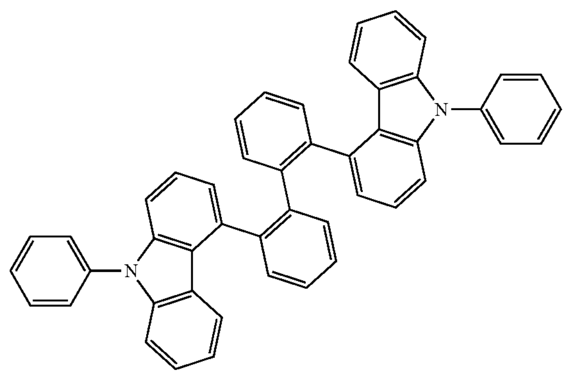
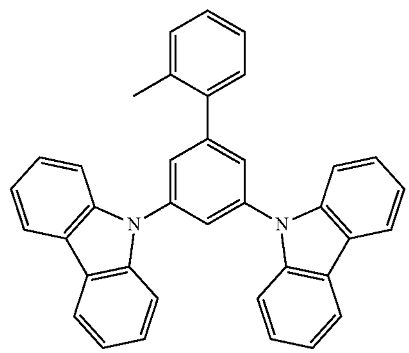

-continued
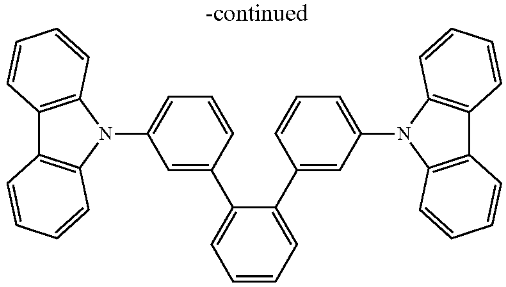
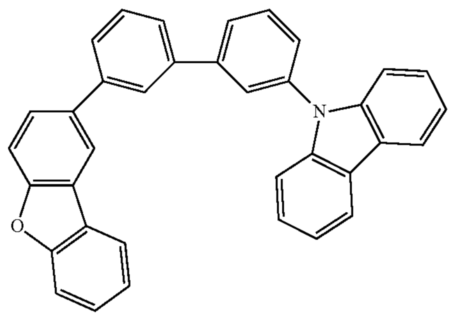
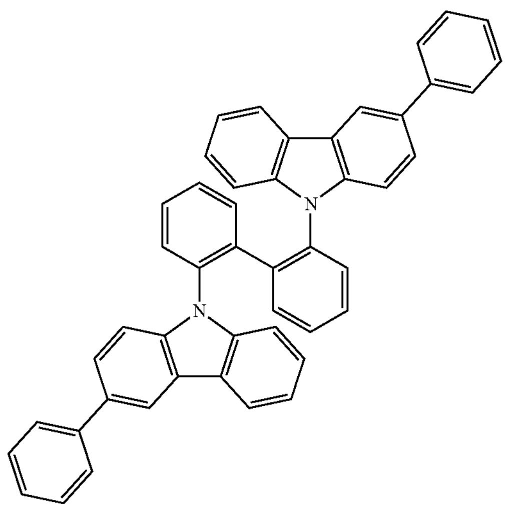
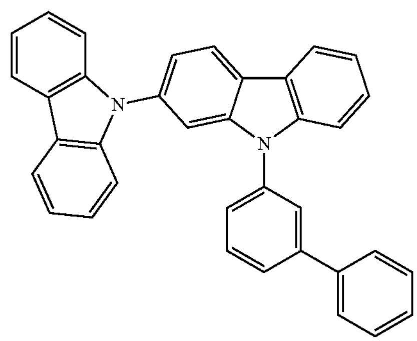
-continued
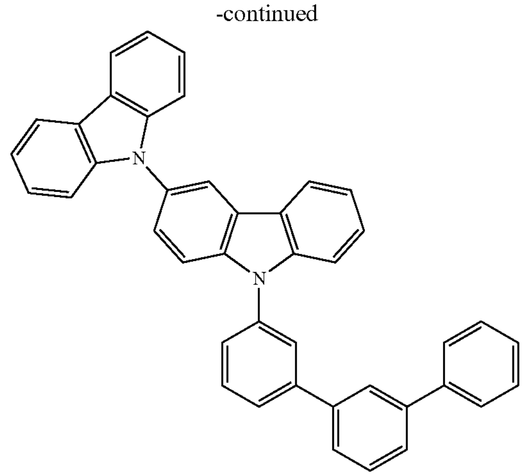
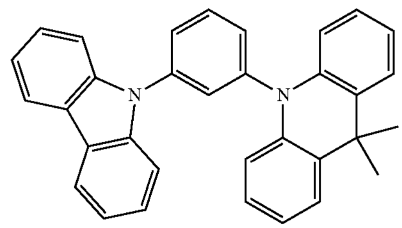
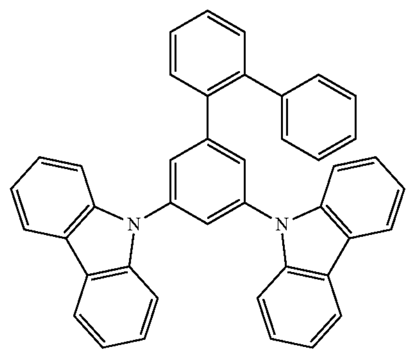
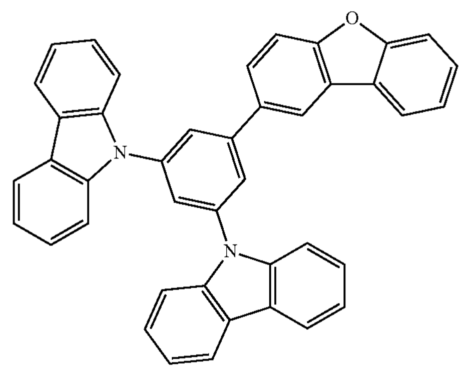

-continued
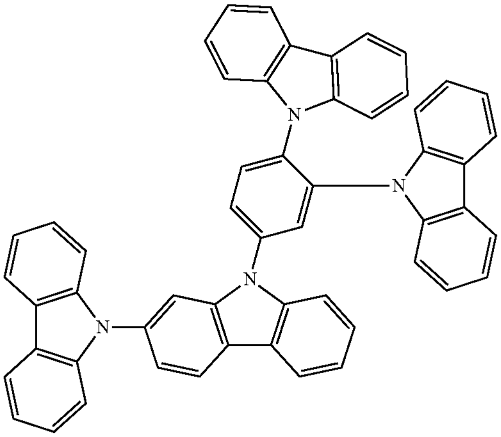
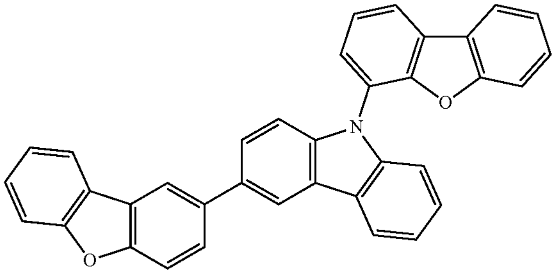
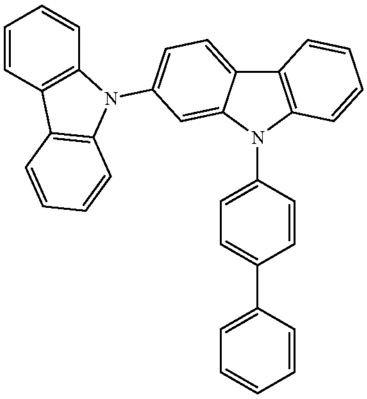
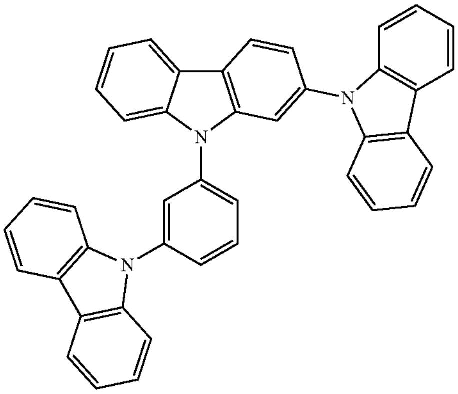
-continued
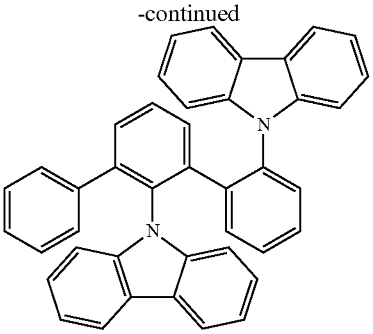
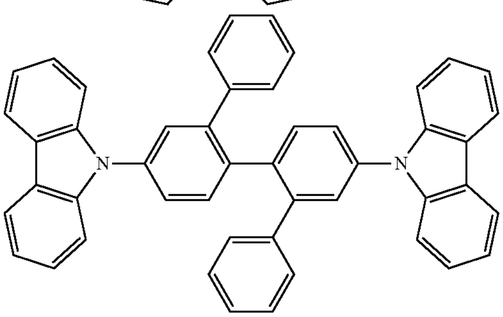
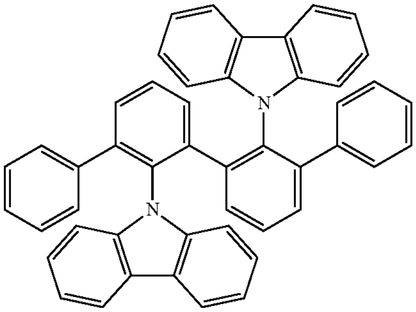
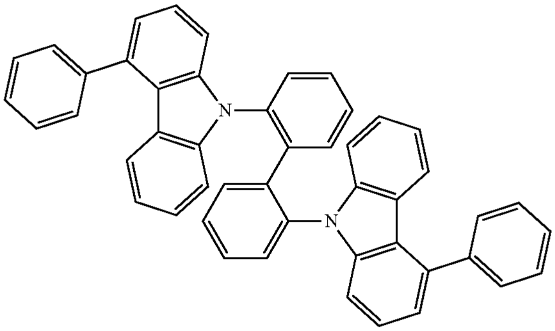
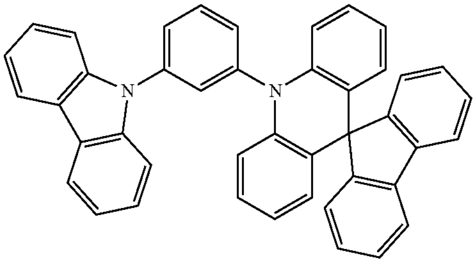

-continued
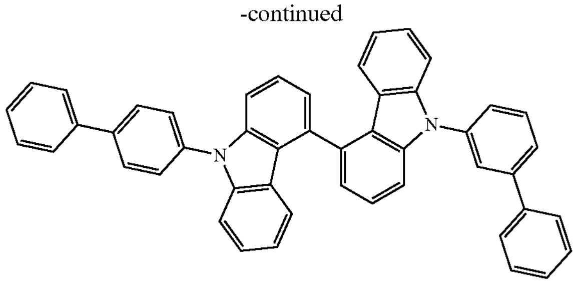
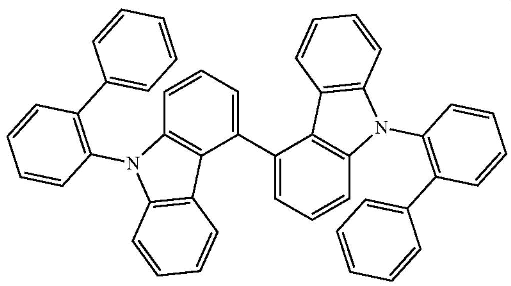
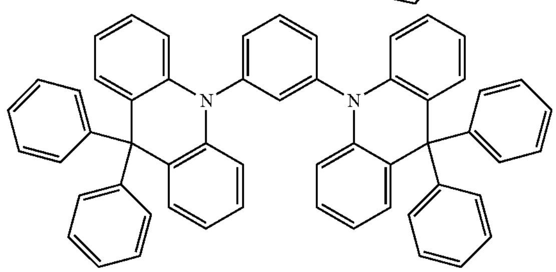
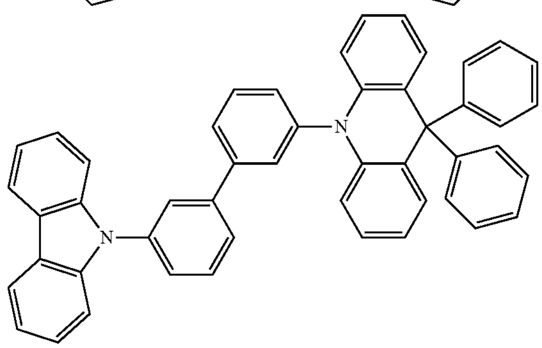
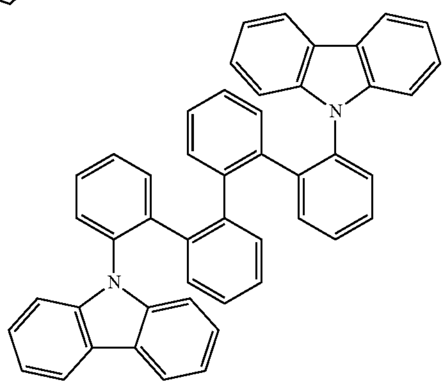
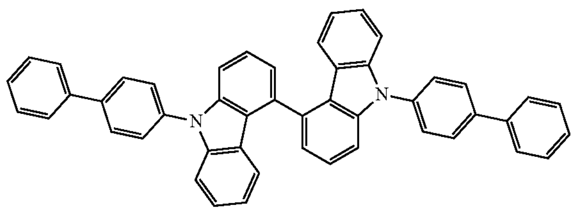
-continued
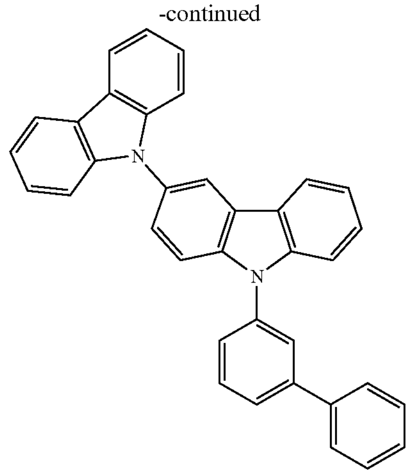
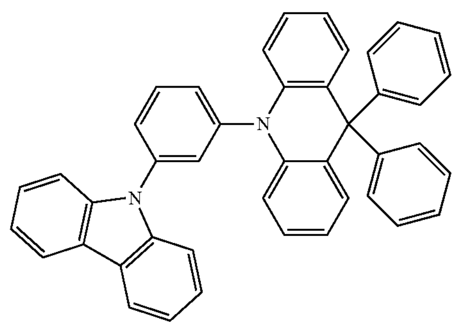
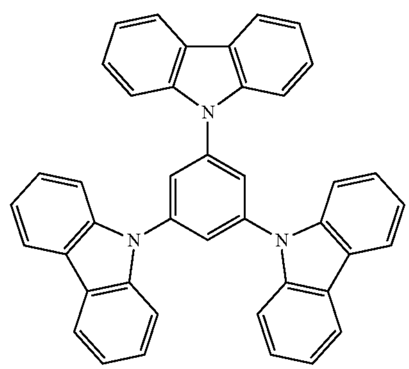
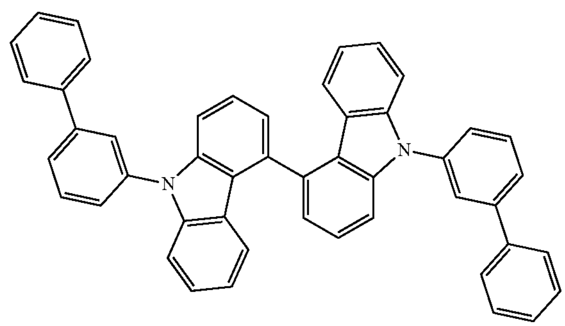

-continued
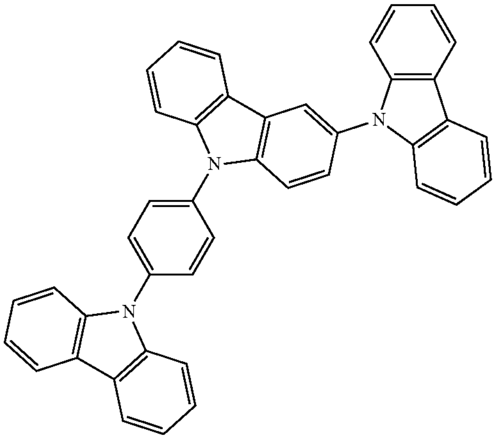
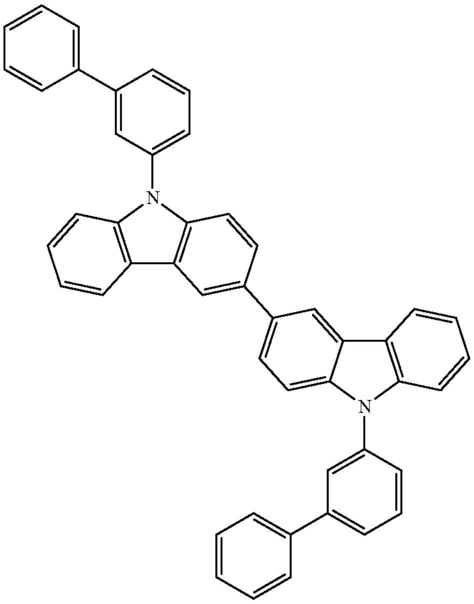
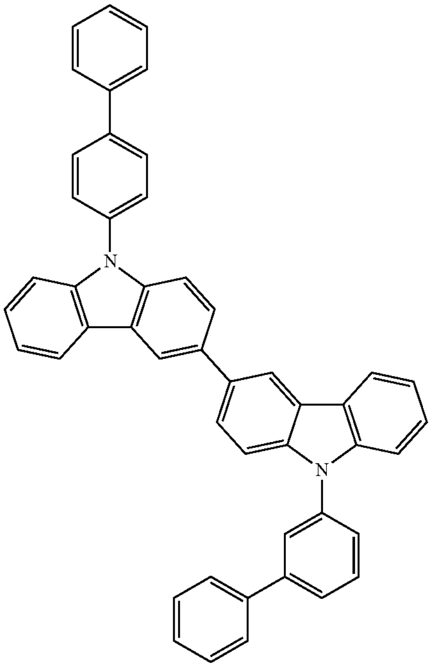
-continued
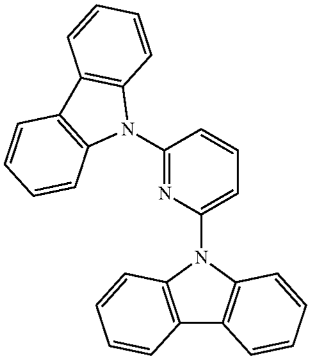
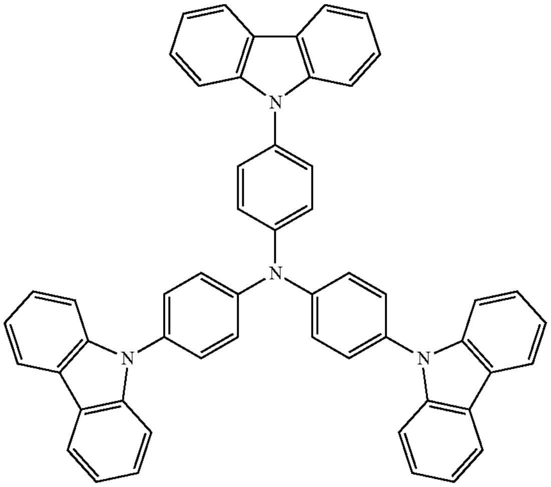
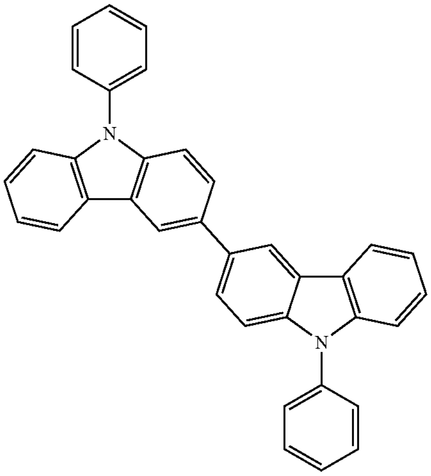
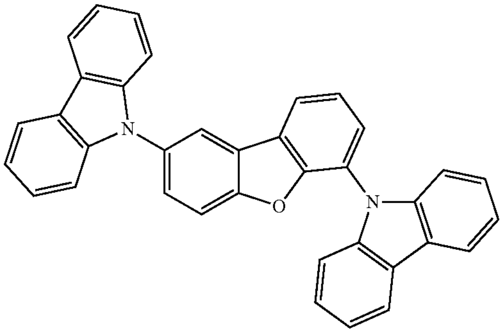

-continued
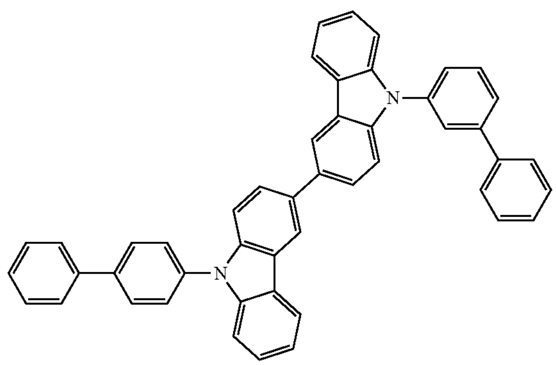
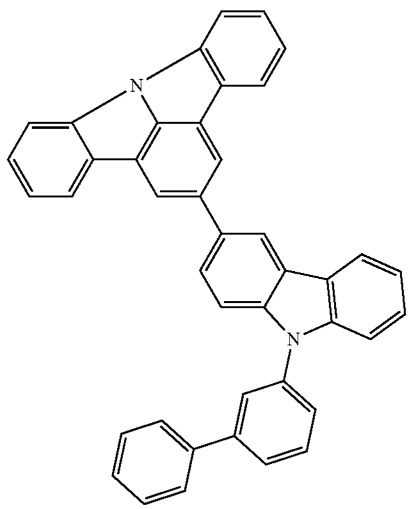
Examples of materials $H^B$ that are n-host materials $H^N$ in the context of the invention are listed below:
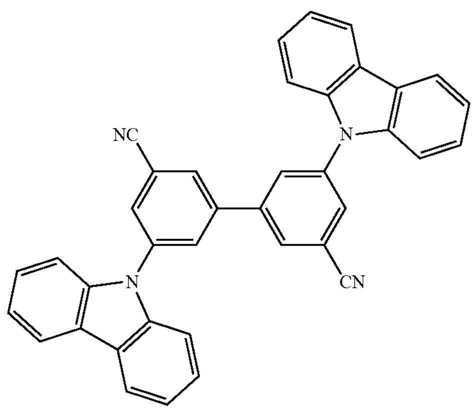
-continued
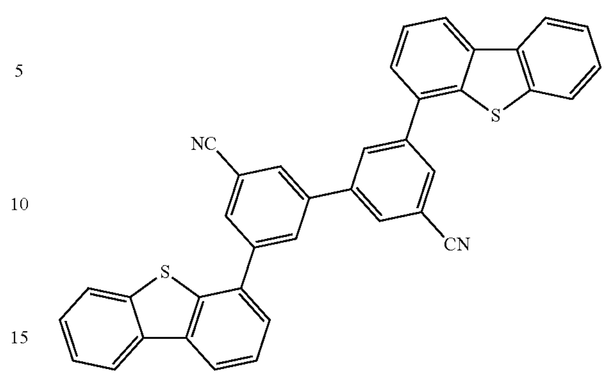
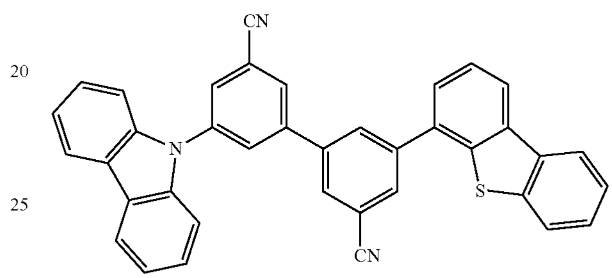
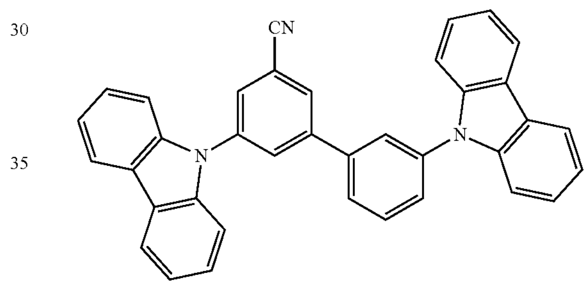
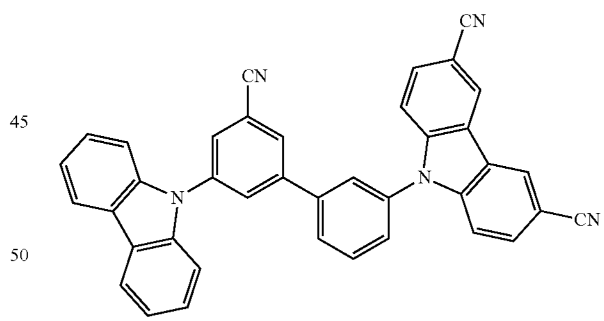
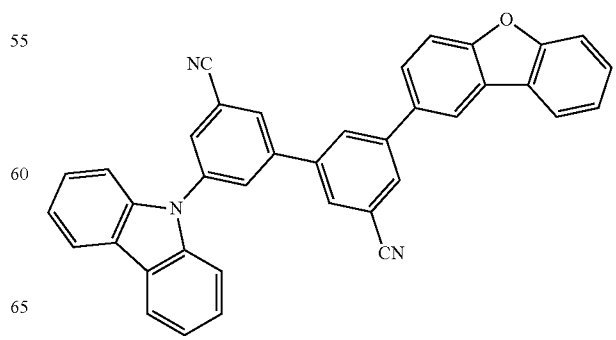

-continued
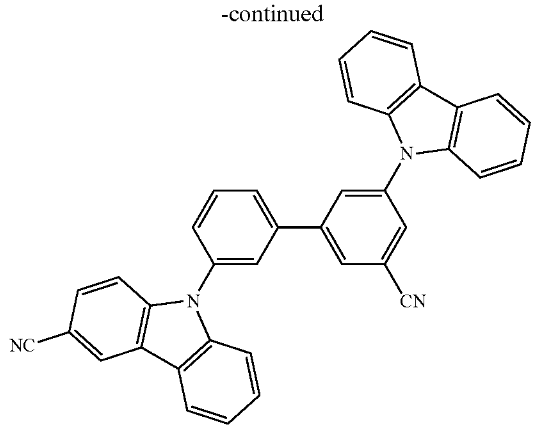
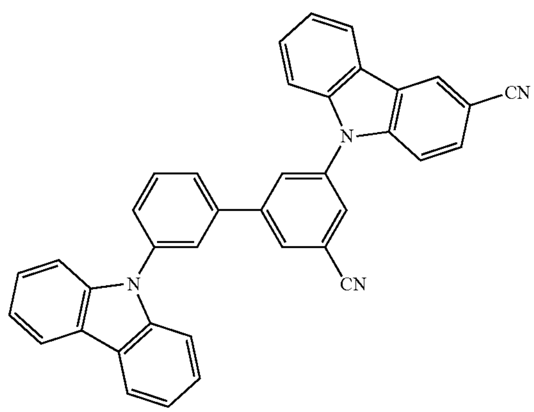
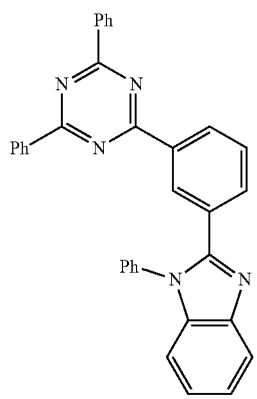
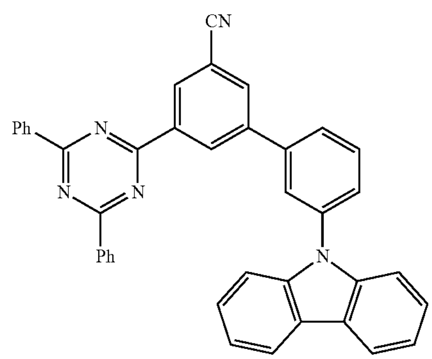
-continued
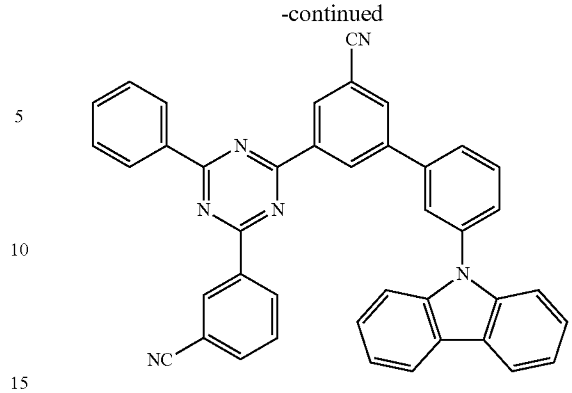
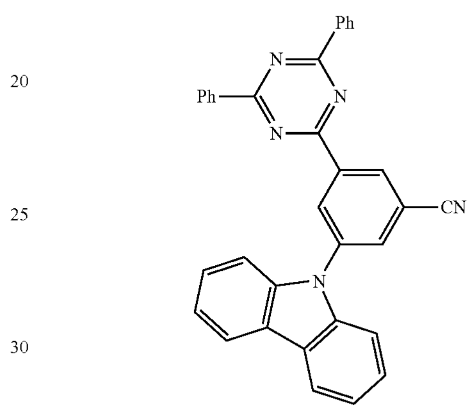
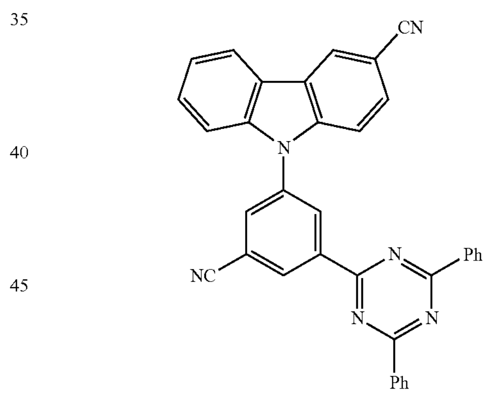
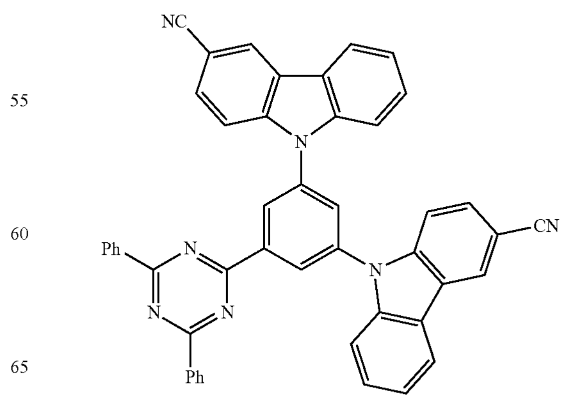

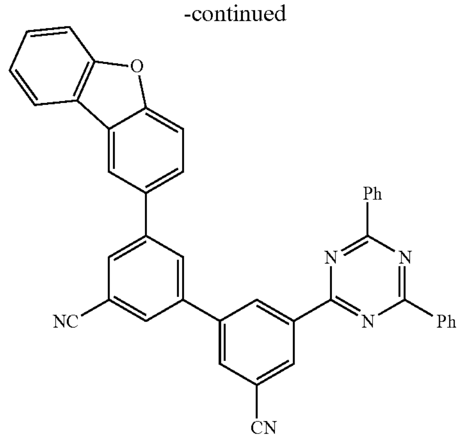
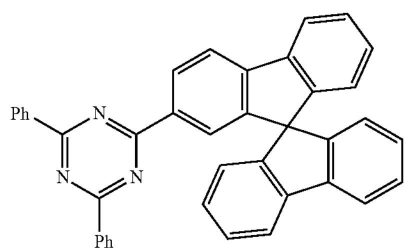
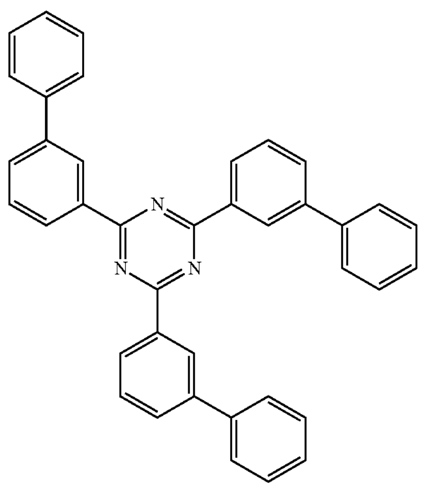
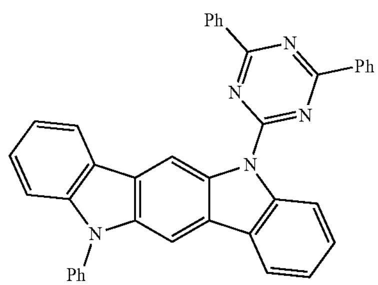
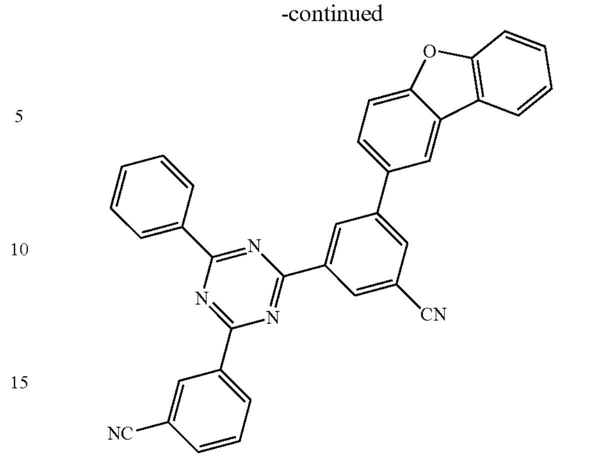
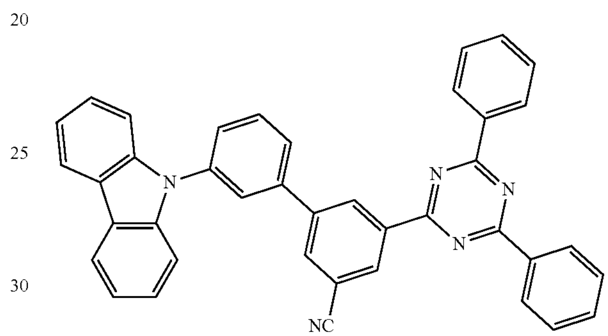
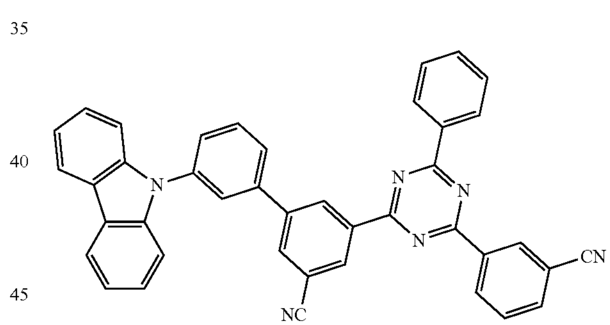
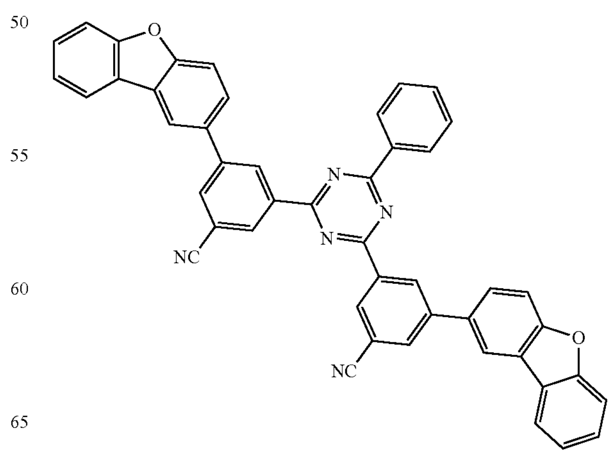

-continued

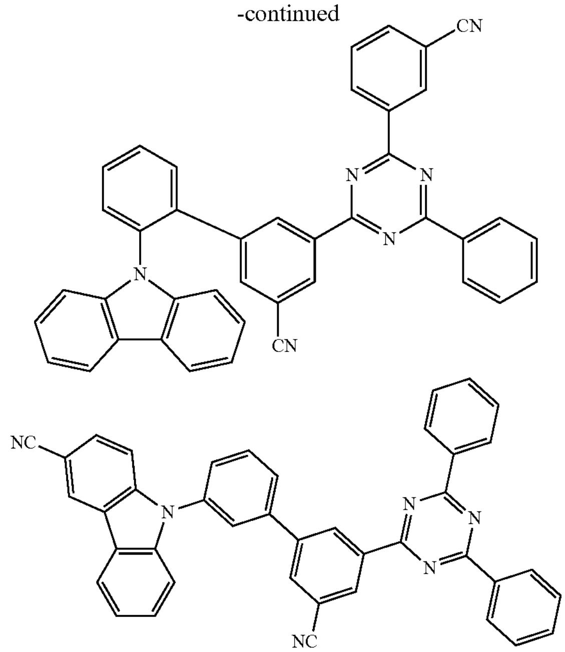

The person skilled in the art understands that any materials that are included in the same layer, in particular in the same EML, but also materials that are in adjacent layers and get in close proximity at the interface between these adjacent layers, may together form an exciplex. The person skilled in the art knows how to choose pairs of materials, in particular pairs of a p-host $H^P$ and an n-host $H^N$, which form an exciplex and the selection criteria for the two components of said pair of materials, including HOMO- and/or LUMO-energy level requirements. This is to say that, in case exciplex formation may be aspired, the highest occupied molecular orbital (HOMO) of the one component, e.g., the p-host material $H^P$, may be at least 0.20 eV higher in energy than the HOMO of the other component, e.g., the n-host material $H^N$, and the lowest unoccupied molecular orbital (LUMO) of the one component, e.g., the p-host material $H^P$, may be at least 0.20 eV higher in energy than the LUMO of the other component, e.g., the n-host material $H^N$. It belongs to the common knowledge of those skilled in the art that, if present in an EML of an optoelectronic device, in particular an OLED, an exciplex may have the function of an emitter material and emit light when a voltage and electrical current are applied to said device. As also commonly known from the state of the art, an exciplex may also be non-emissive and may for example transfer excitation energy to an emitter material, if included in an EML of an optoelectronic device.

As known to person skilled in the art, triplet-triplet annihilation (TTA) materials can be used as host materials $H^B$. The TTA material enables triplet-triplet annihilation. Triplet-triplet annihilation may preferably result in a photon up-conversion. Accordingly, two, three or even more photons may facilitate photon up-conversion from the lowermost excited triplet state ($T1^{TTA}$) to the first excited singlet state $S1^{TTA}$ of the TTA material $H^{TTA}$. In a preferred embodiment, two photons facilitate photon up-conversion from $T1^{TTA}$ to $S1^{TTA}$. Triplet-triplet annihilation may thus be a process that through a number of energy transfer steps, may combine two (or optionally more than two) low frequency photons into one photon of higher frequency.

Optionally, the TTA material may include an absorbing moiety, the sensitizer moiety, and an emitting moiety (or annihilator moiety). In this context, an emitter moiety may, for example, be a polycyclic aromatic moiety such as, benzene, biphenyl, triphenyl, triphenylene, naphthalene, anthracene, phenalene, phenanthrene, fluorene, pyrene, chrysene, perylene, azulene. In a preferred embodiment, the polycyclic aromatic moiety includes an anthracene moiety or a derivative thereof. A sensitizer moiety and an emitting moiety may be located in two different chemical compounds (i.e., separated chemical entities) or may be both moieties embraced by one chemical compound.

According to the invention, a triplet-triplet annihilation (TTA) material converts energy from first excited triplet states T1N to first excited singlet states $S1^N$ by triplet-triplet annihilation.

According to the present invention, a TTA material is characterized in that it exhibits triplet-triplet annihilation from the lowermost excited triplet state (T1N) resulting in a triplet-triplet annihilated first excited singlet state $S1^N$, having an energy of up to two times the energy of $T1^N$.

In one embodiment of the present invention, a TTA material is characterized in that it exhibits triplet-triplet annihilation from T1N resulting in $S1^N$, having an energy of 1.01 to 2 fold, 1.1 to 1.9 fold, 1.2 to 1.5 fold, 1.4 to 1.6 fold, or 1.5 to 2 fold times the energy of $T1^N$.

As used herein, the terms "TTA material" and "TTA compound" may be understood interchangeably.

Typical "TTA material" can be found in the state of the art related to blue fluorescent OLEDs, as described by Kondakov (Philosophical Transactions of the Royal Society A: Mathematical, Physical and Engineering Sciences, 2015, 373:20140321). Such blue fluorescent OLEDs employ aromatic hydrocarbons such as anthracene derivatives as the main component (host) in the EML.

In a preferred embodiment, the TTA material enables sensitized triplet-triplet annihilation. Optionally, the TTA material may include one or more polycyclic aromatic structures. In a preferred embodiment, the TTA material includes at least one polycyclic aromatic structure and at least one further aromatic residue.

In a preferred embodiment, the TTA material bears larger singlet-triplet energy splitting, i.e., an energy difference between its first excited singlet state S1N and its lowermost excited triplet state $T1^N$ of at least 1.1 fold, at least 1.2 fold, at least 1.3 fold, at least 1.5 fold and preferably not more than 2 fold.

In a preferred embodiment of the invention, the TTA material $H^{TTA}$ is an anthracene derivative.

In one embodiment, the TTA material $H^{TTA}$ is an anthracene derivate of the following Formula 4

Formula 4

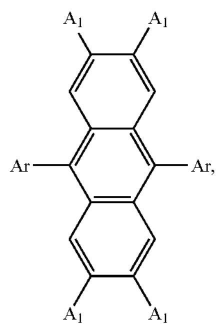

wherein each Ar is independently from each other selected from the group consisting of $C_6$-$C_{60}$-aryl, which is optionally substituted with one or more residues selected from the group consisting of $C_5$-$C_{60}$-aryl, $C_3$-$C_{57}$-heteroaryl, halogen, and $C_1$-$C_{40}$-(hetero)alkyl;

and $C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and each $A_1$ is independently from each other selected from the group consisting of consisting of hydrogen;

deuterium;

$C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; $C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and $C_1$-$C_{40}$-(hetero)alkyl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In one embodiment, the TTA material $H^{TTA}$ is an anthracene derivate of the following Formula 4, wherein each Ar is independently from each other selected from the group consisting of $C_6$-$C_{20}$-aryl, which is optionally substituted with one or more residues selected from the group consisting of $C_5$-$C_{20}$-aryl, $C_3$-$C_{20}$-heteroaryl, halogen, and $C_1$-$C_{210}$-(hetero)alkyl;

and $C_3$-$C_{20}$-heteroaryl, which is optionally substituted with one or more residues selected from the group consisting of $C_6$-$C_{20}$-aryl, $C_3$-$C_{20}$-heteroaryl, halogen, and $C_1$-$C_{10}$-(hetero)alkyl; and each $A_1$ is independently from each other selected from the group consisting of consisting of hydrogen, deuterium, $C_6$-$C_{20}$-aryl, which is optionally substituted with one or more residues selected from the group consisting of $C_6$-$C_{20}$-aryl, $C_3$-$C_{20}$-heteroaryl, halogen, and $C_1$-$C_{10}$-(hetero)alkyl, $C_3$-$C_{20}$-heteroaryl, which is optionally substituted with one or more residues selected from the group consisting of $C_6$-$C_{20}$-aryl, $C_3$-$C_{20}$-heteroaryl, halogen, and $C_1$-$C_{10}$-(hetero)alkyl, and $C_1$-$C_{10}$-(hetero)alkyl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In one embodiment, $H^{TTA}$ is an anthracene derivate of the following Formula 4, wherein at least one of $A_1$ is hydrogen. In one embodiment, $H^{TTA}$ is an anthracene derivate of the following Formula 4, wherein at least two of $A_1$ are hydrogen. In one embodiment, $H^{TTA}$ is an anthracene derivate of the following Formula 4, wherein at least three of $A_1$ are hydrogen. In one embodiment, $H^{TTA}$ is an anthracene derivate of the following Formula 4, wherein all of $A_1$ are each hydrogen.

In one embodiment, $H^{TTA}$ is an anthracene derivate of the following Formula 4, wherein one of Ar is a residue selected from the group consisting of phenyl, naphthyl, phenanthryl, pyrenyl, triphenylenyl, dibenzoanthracenyl, fluorenyl, benzofluorenyl, anthracenyl, phenanthrenyl, benzonaphthofuranyl, benzonaphthothiophenyl, dibenzofuranyl, and dibenzothiophenyl, which may be each optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In one embodiment, $H^{TTA}$ is an anthracene derivate of the following Formula 4, wherein both Ar are residues each independently from each other selected from the group consisting of phenyl, naphthyl, phenanthryl, pyrenyl, triphenylenyl, dibenzoanthracenyl, fluorenyl, benzofluorenyl, anthracenyl, phenanthrenyl, benzonaphthofuranyl, benzonaphthothiophenyl, dibenzofuranyl, dibenzothiophenyl, which may be each optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In one embodiment, the TTA material $H^{TTA}$ is an anthracene derivate selected from the following:

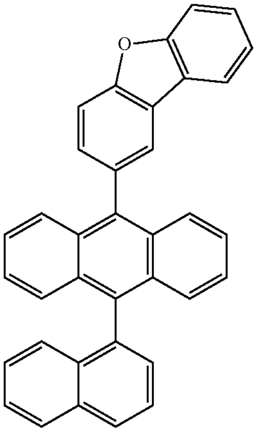

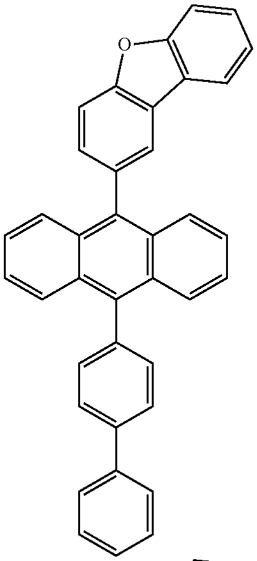

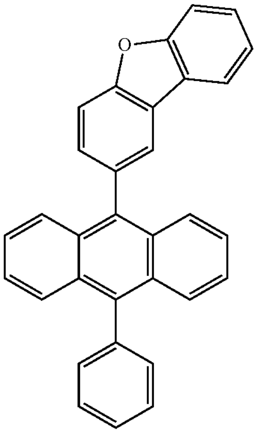

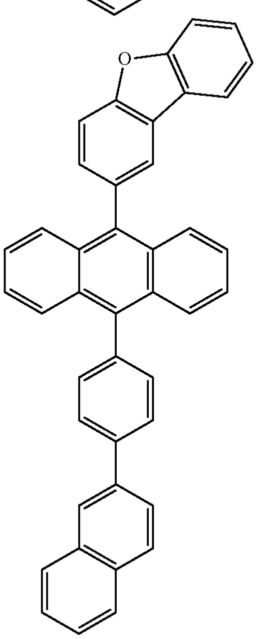

-continued
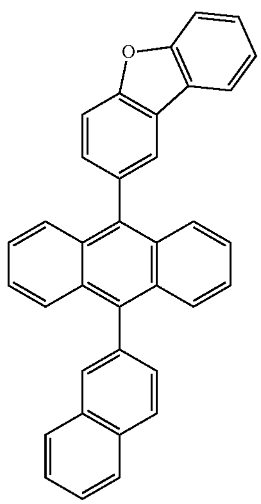
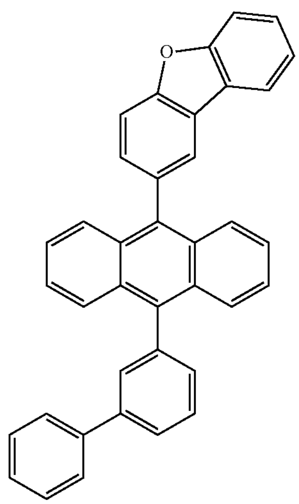
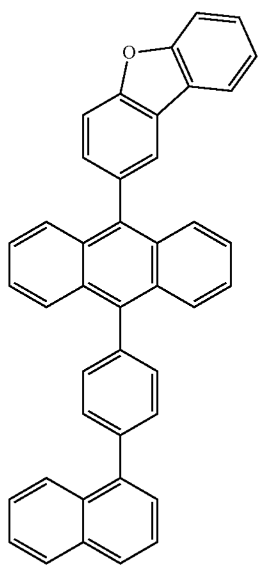
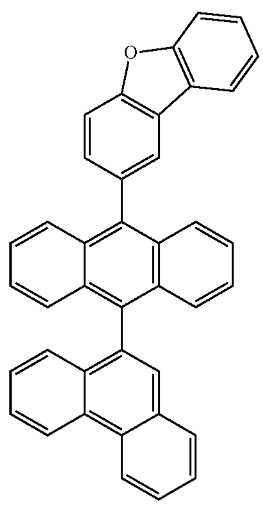
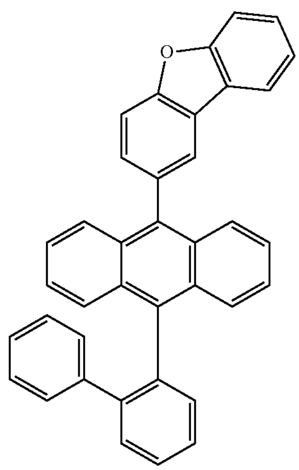
-continued
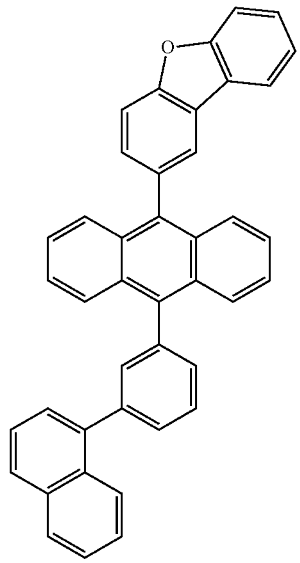
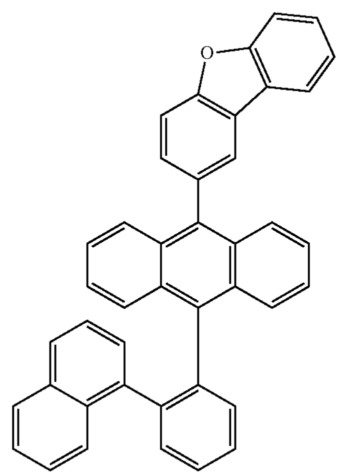
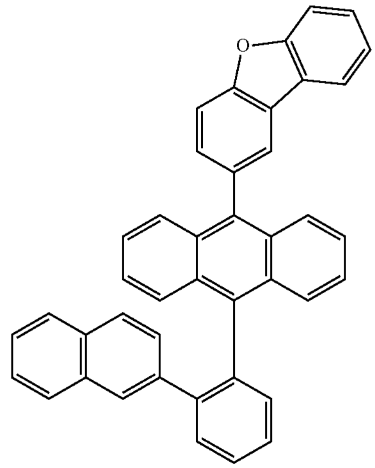

-continued
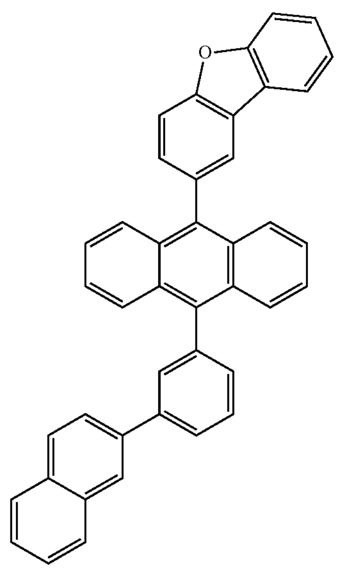
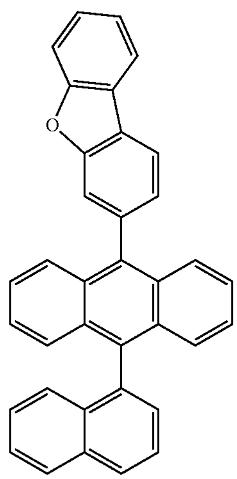
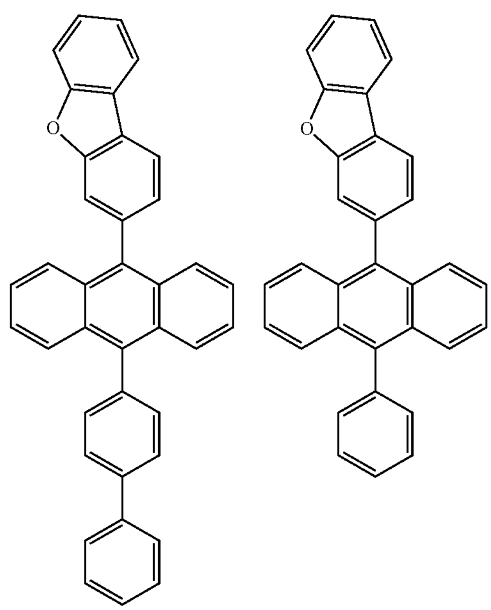
-continued
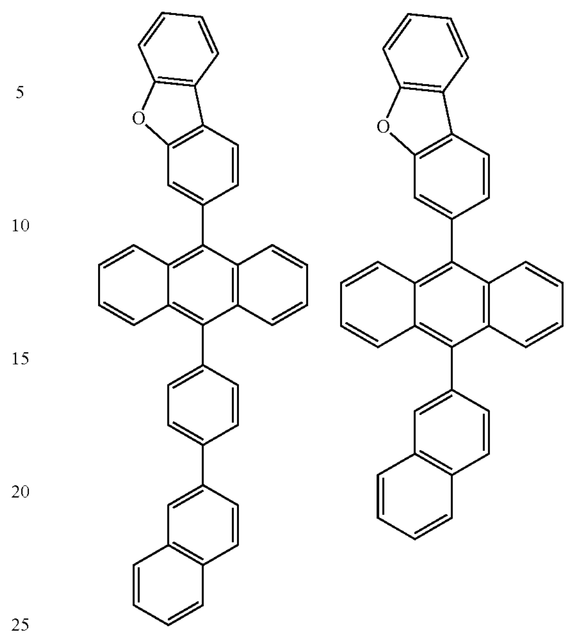
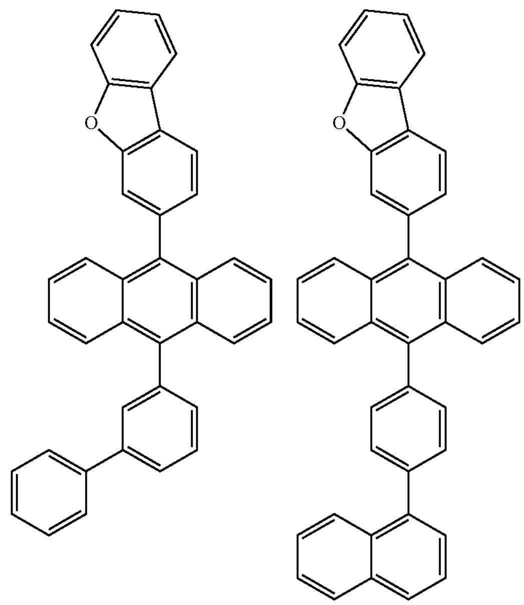

-continued
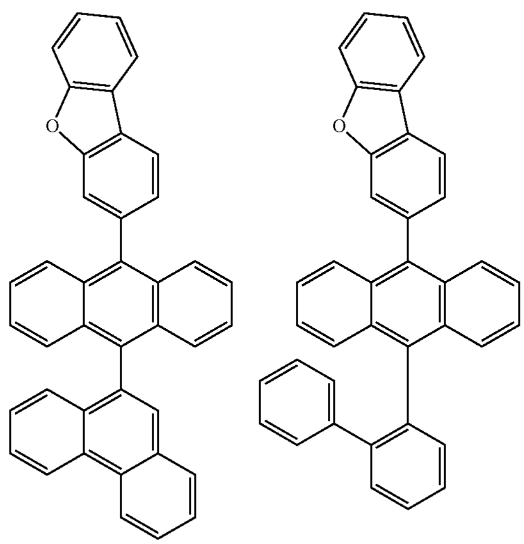
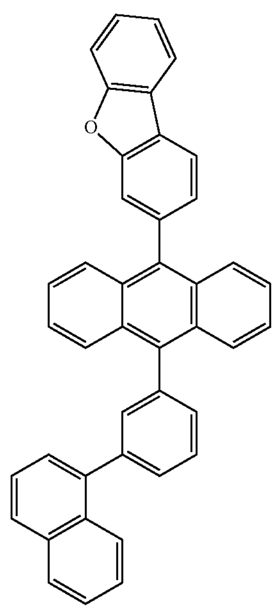
-continued
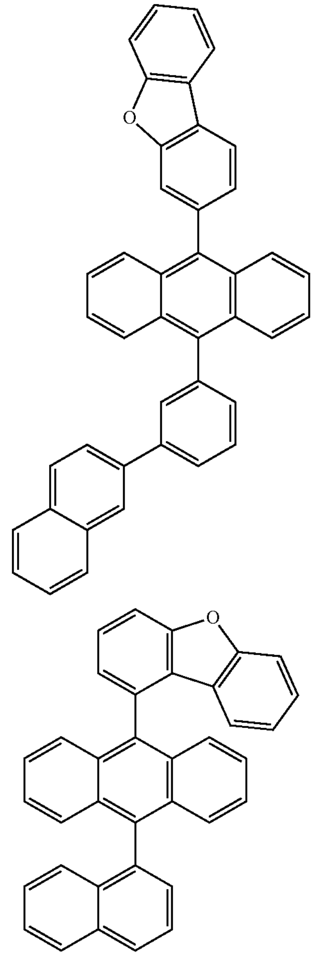
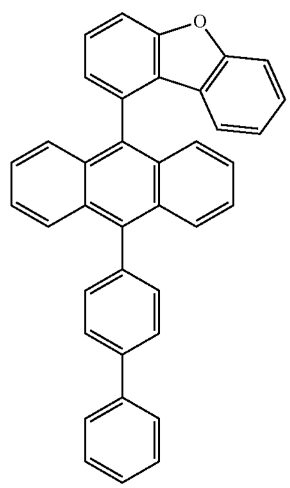

-continued
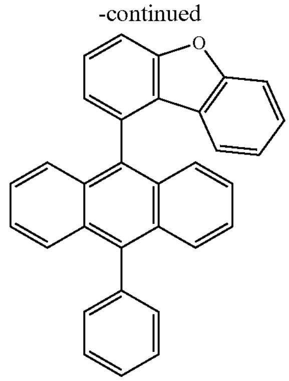
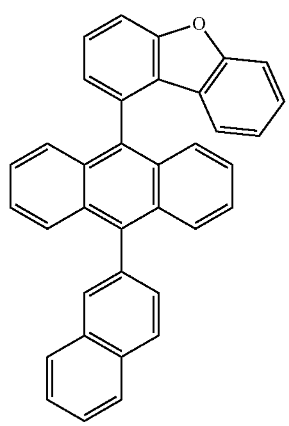
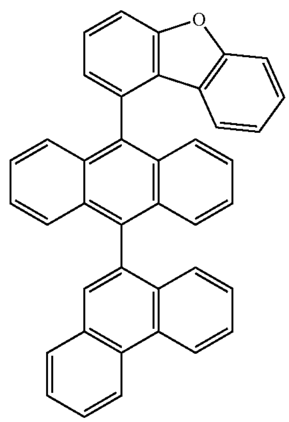
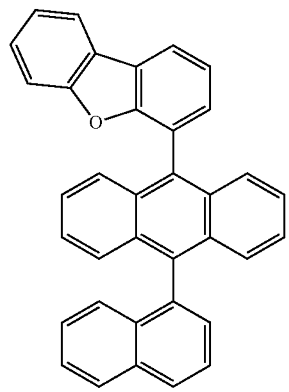
-continued
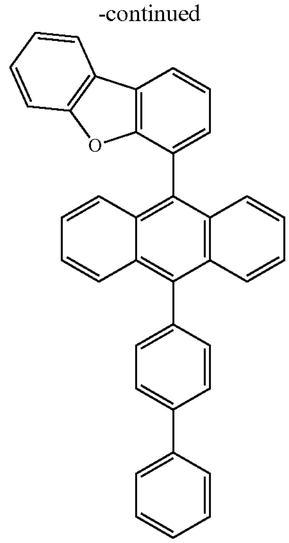
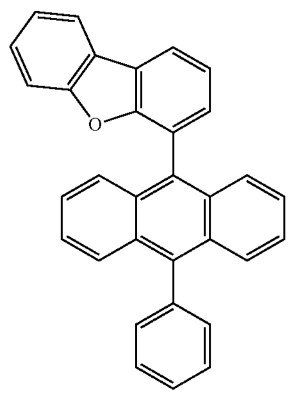
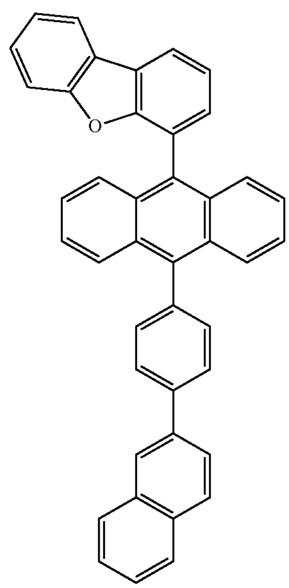

-continued
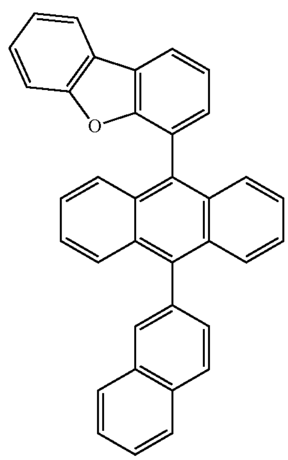
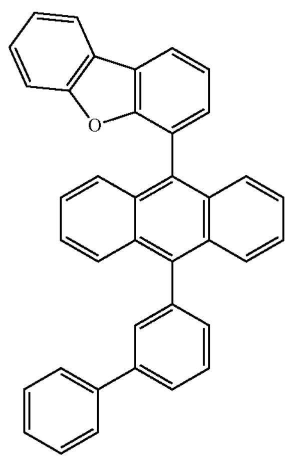
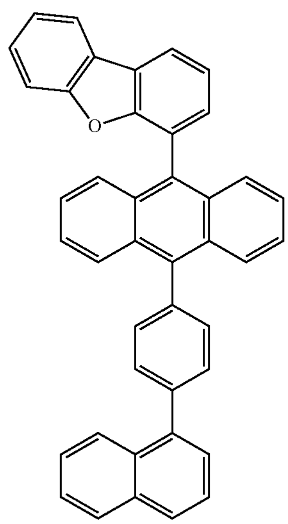
-continued
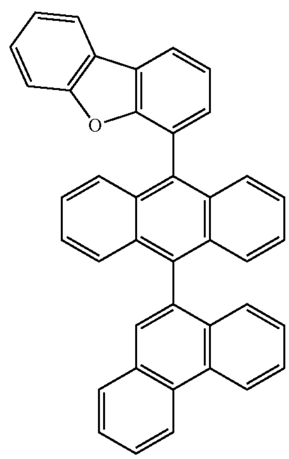
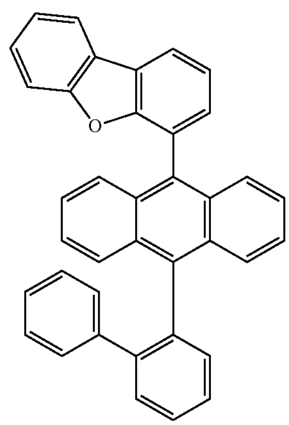
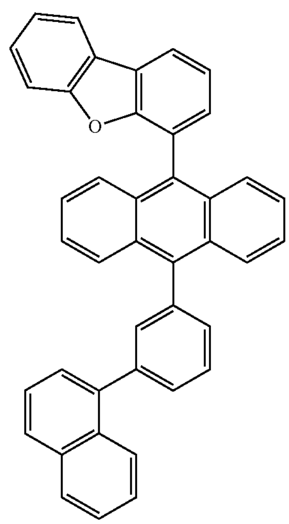

-continued
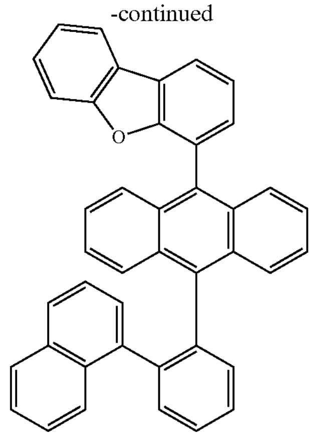
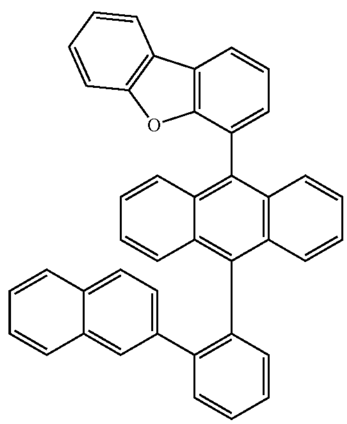
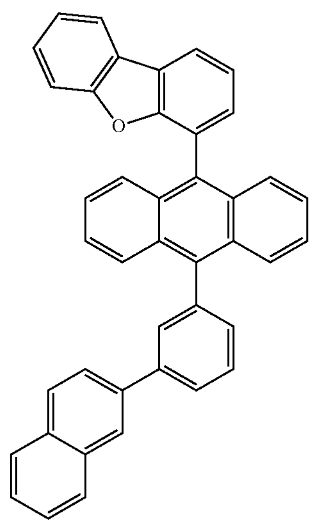
-continued
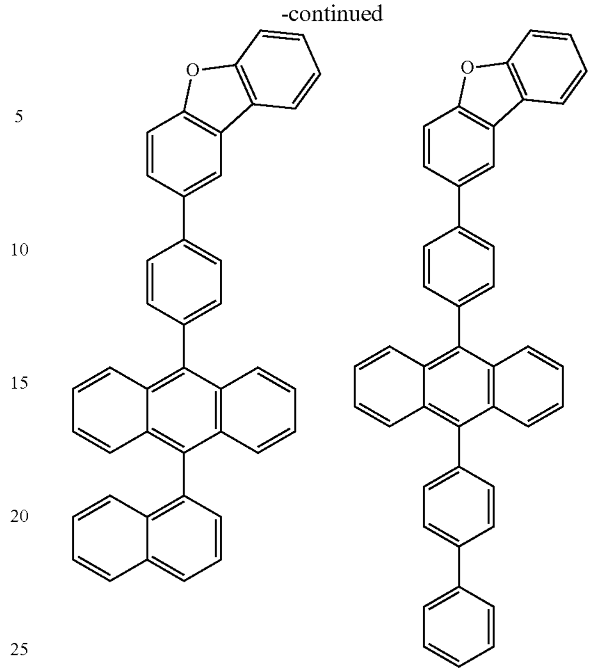
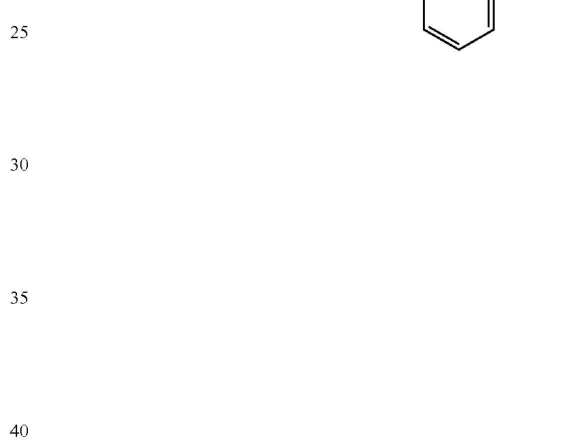
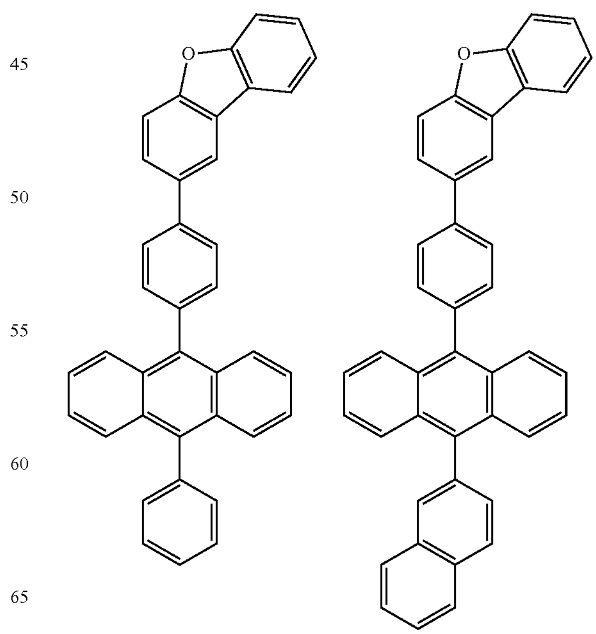

-continued
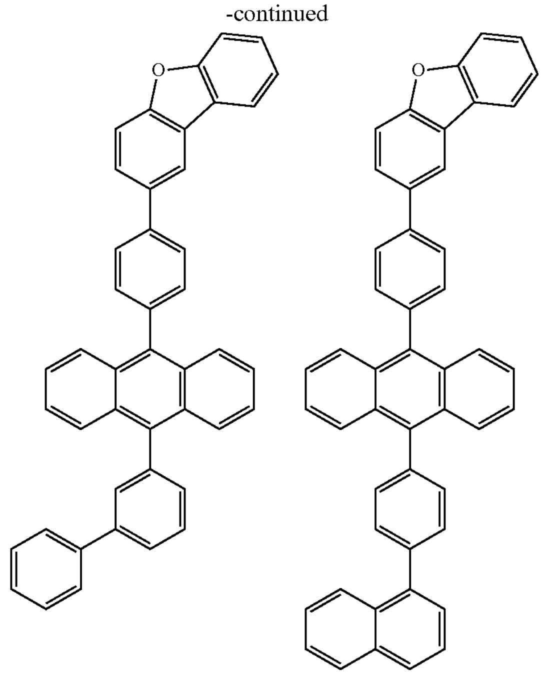
-continued
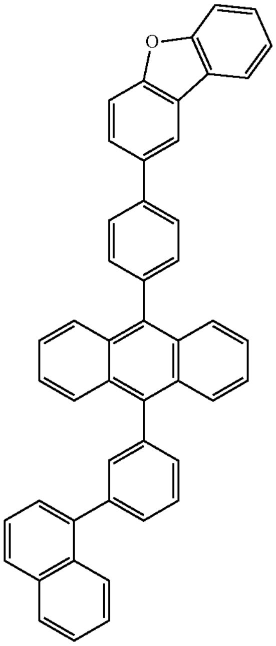
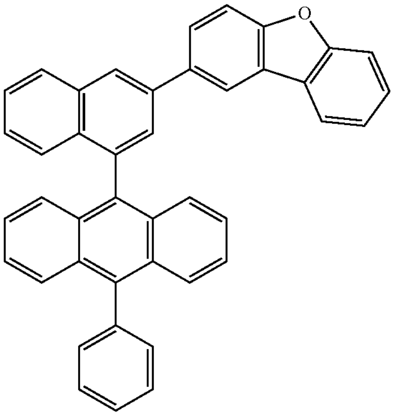
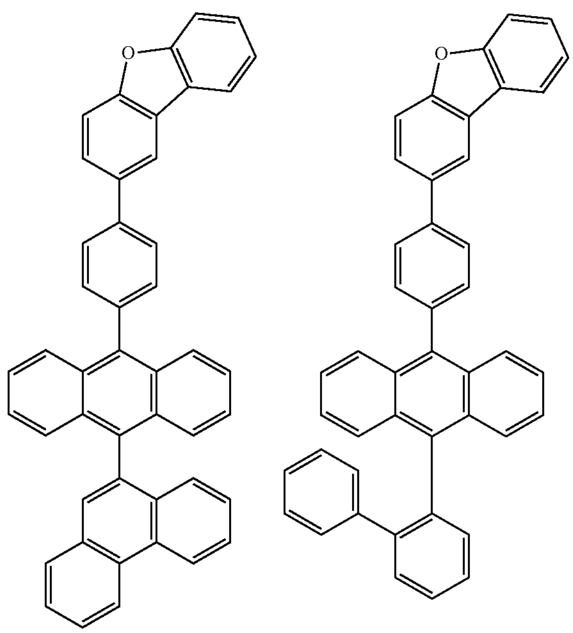
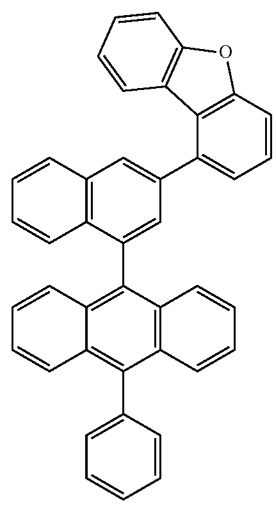

-continued
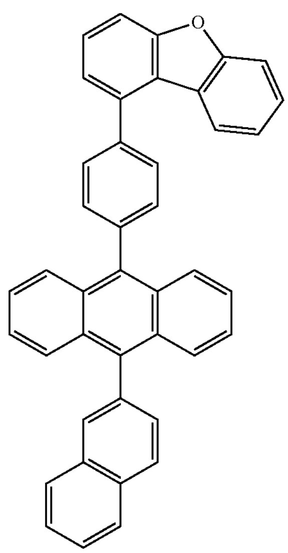
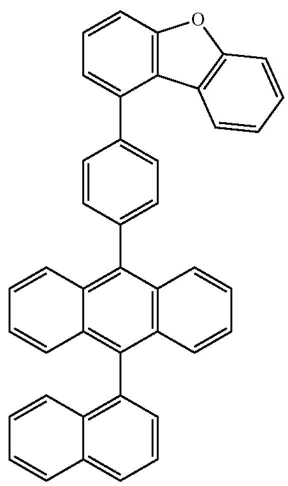
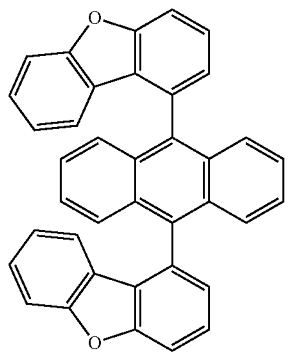
-continued
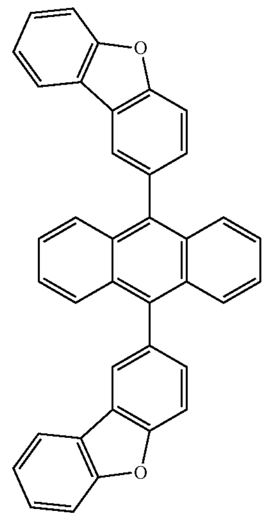
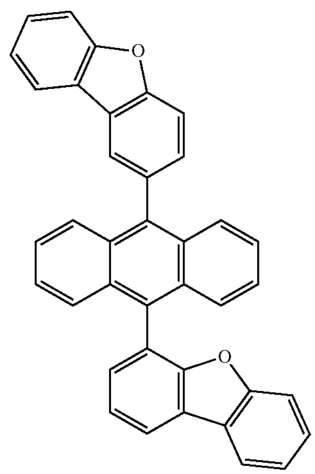
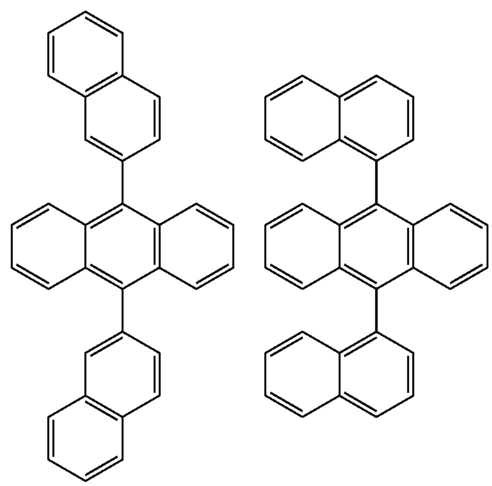

-continued
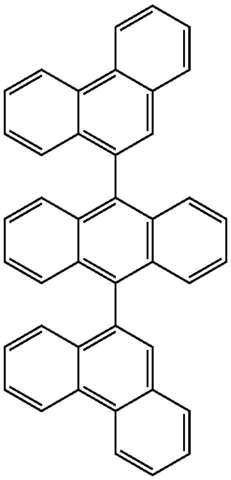
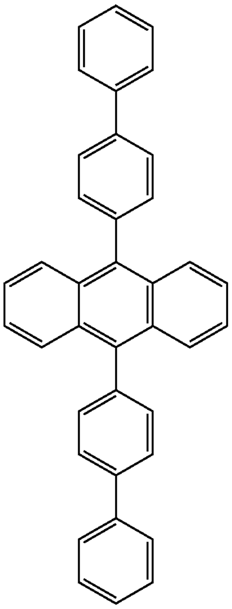
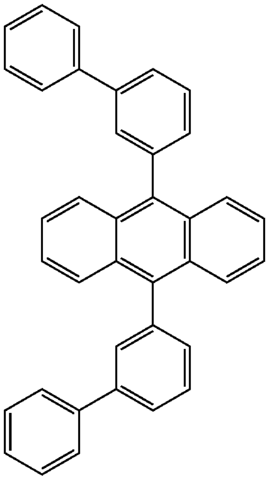
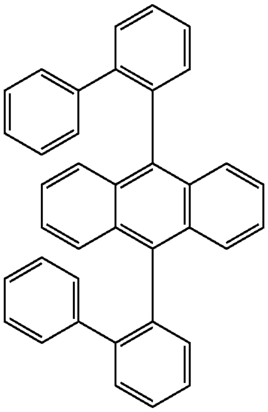
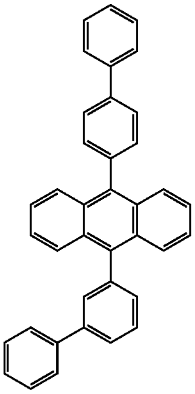
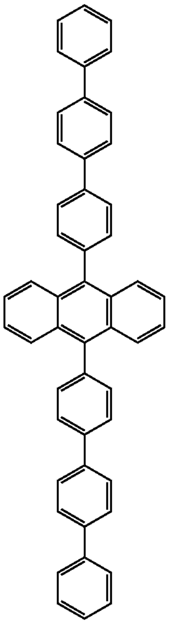
-continued
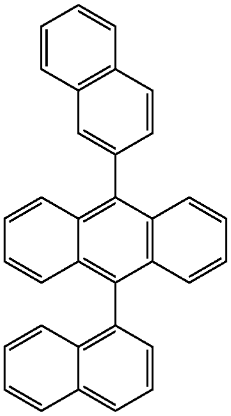
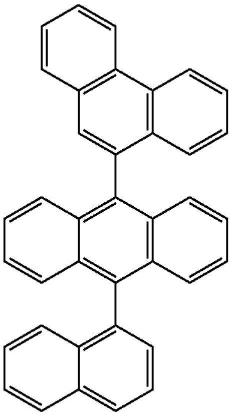
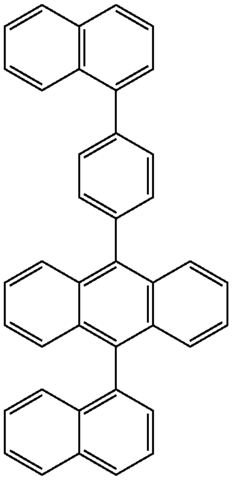
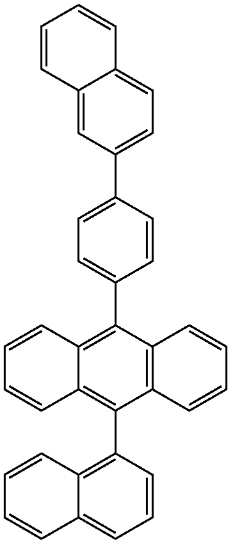
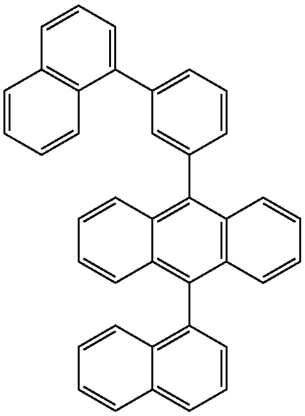

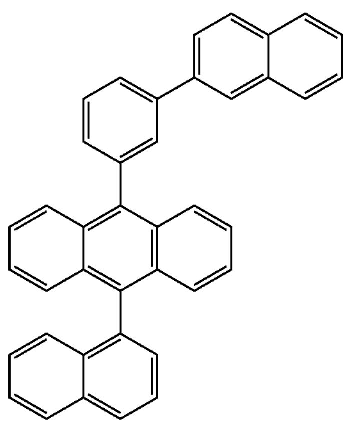
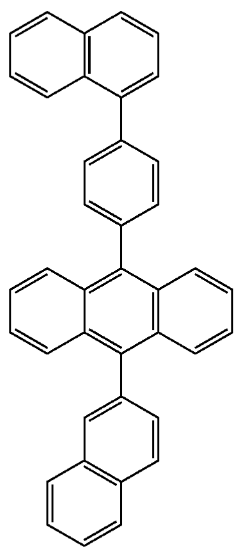
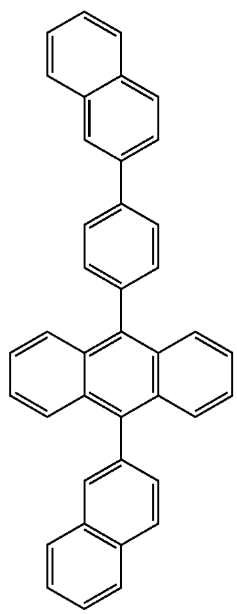
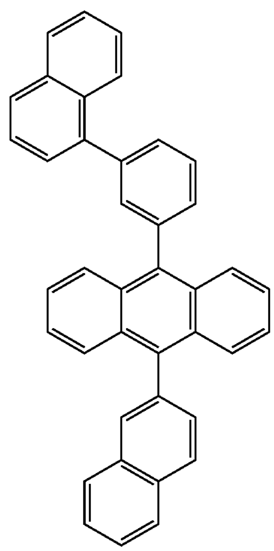
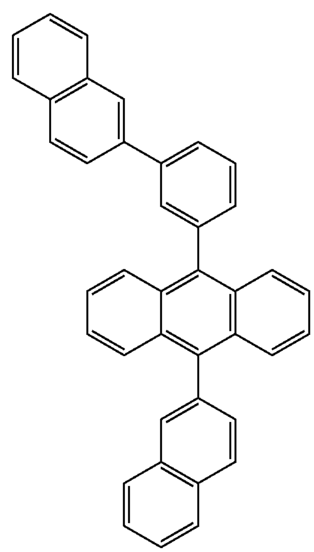
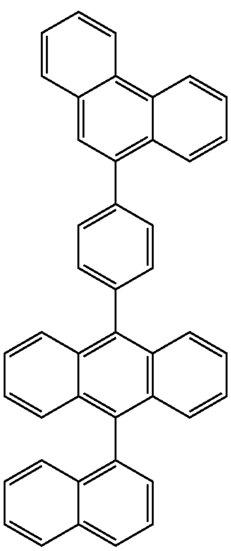

-continued
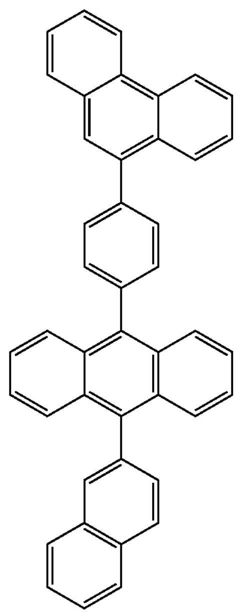
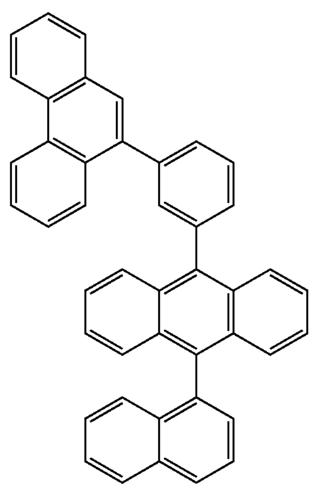
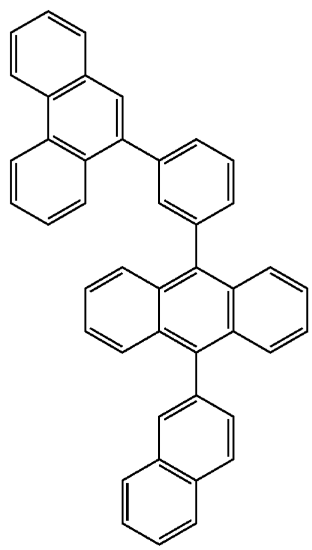
-continued
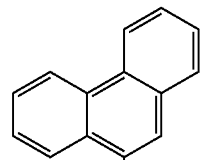
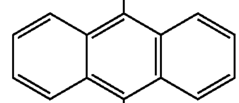
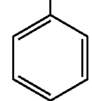
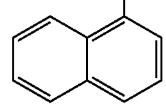
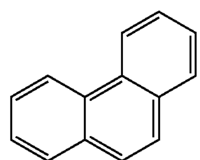
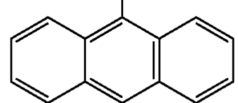
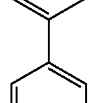
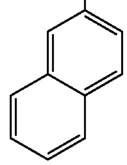
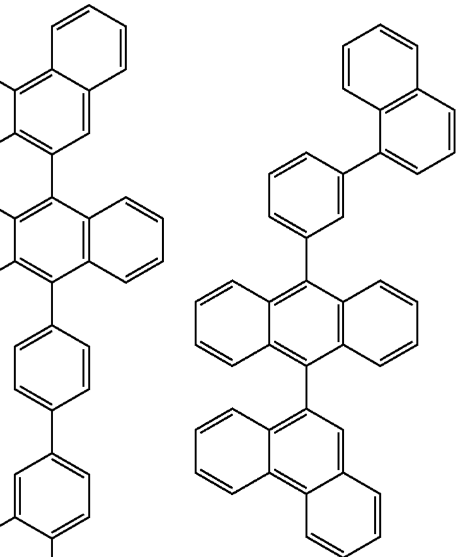
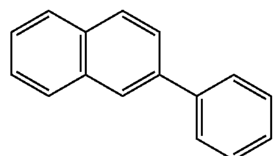
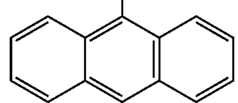
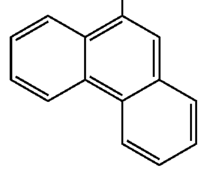

-continued
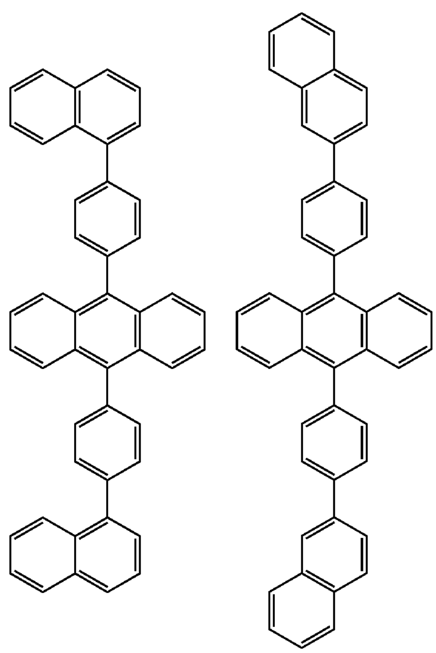
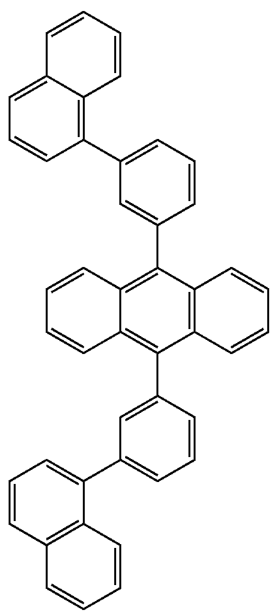
-continued
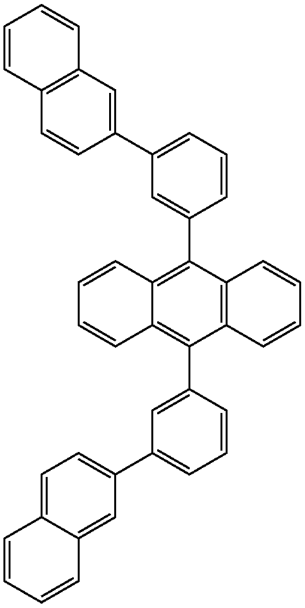
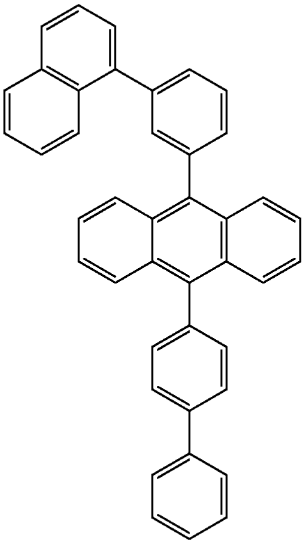
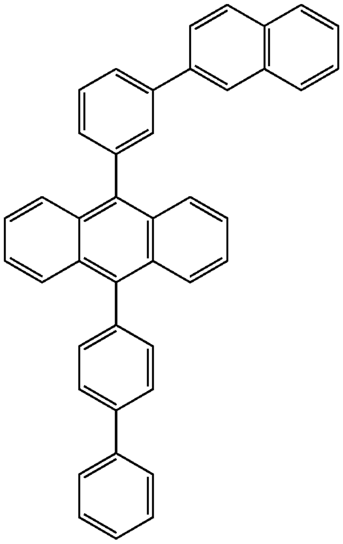

-continued
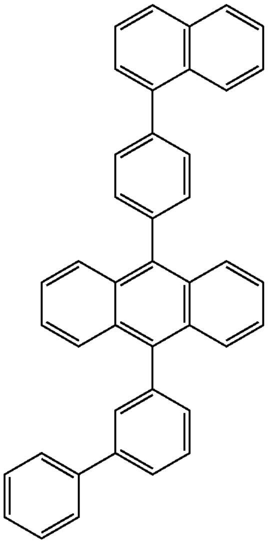
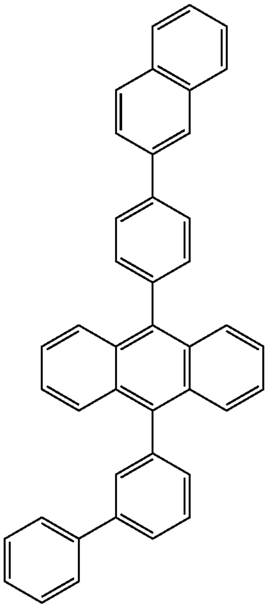
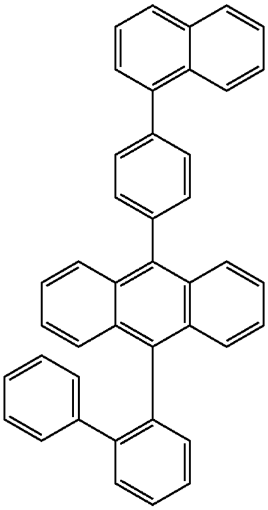
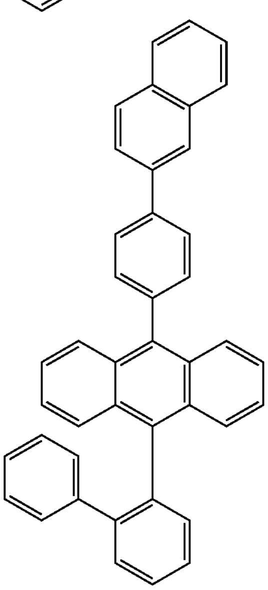
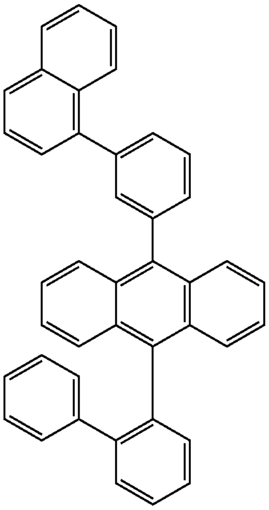
-continued
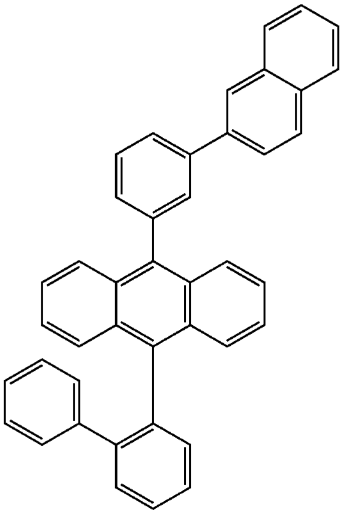
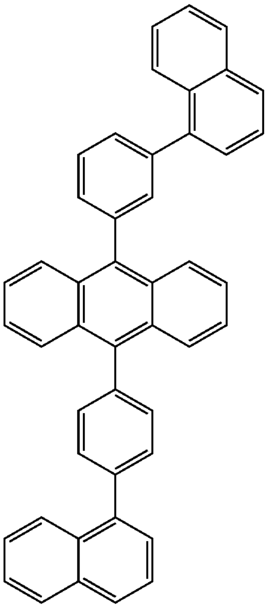

-continued
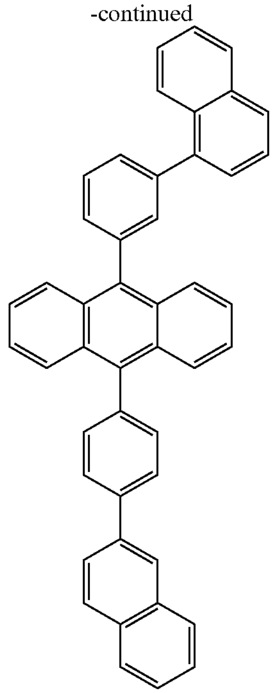
-continued
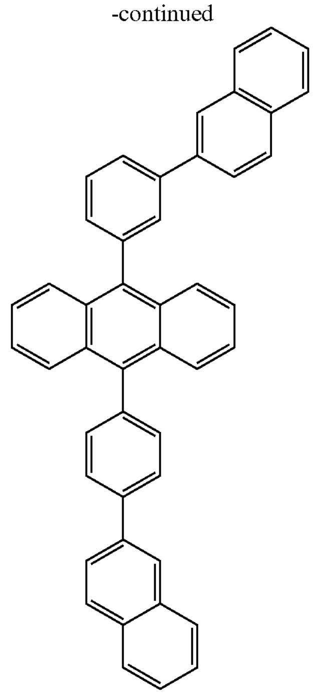
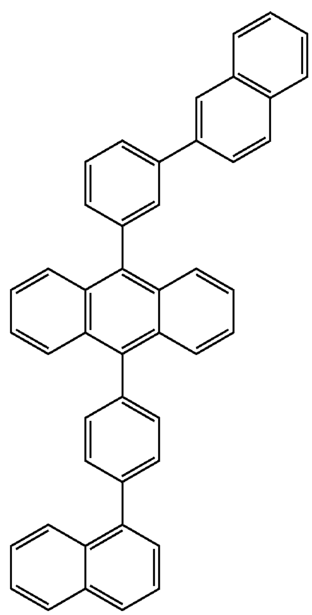
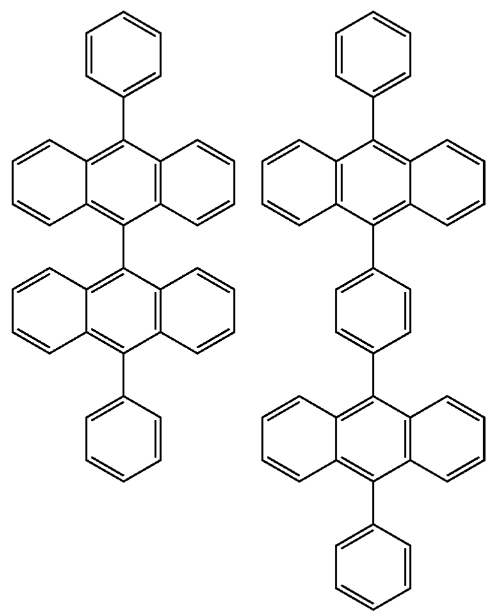

-continued
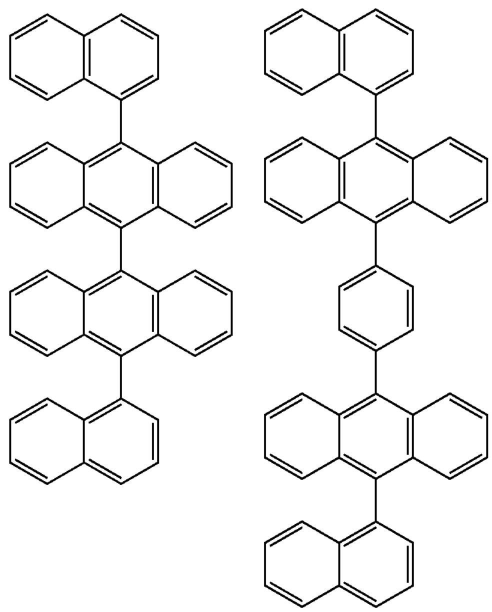
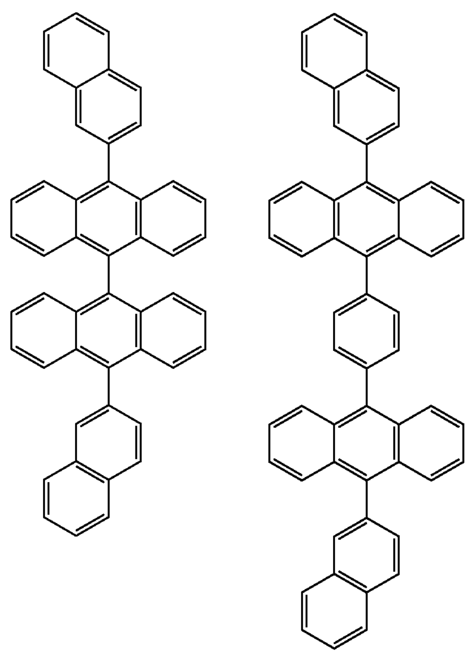
-continued
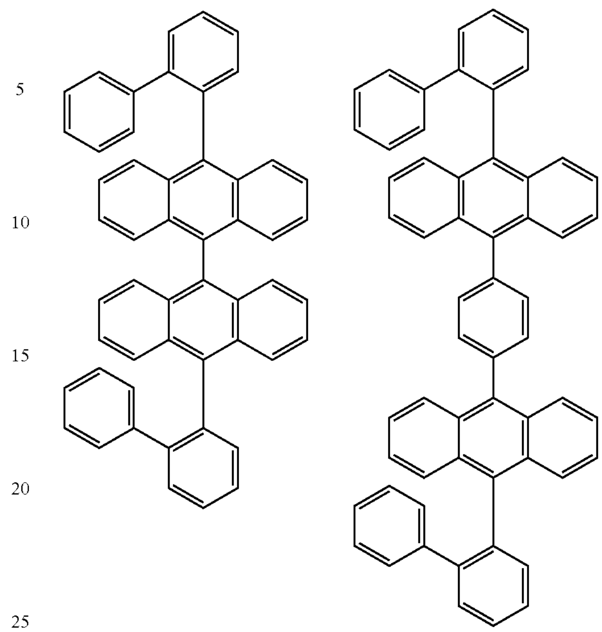
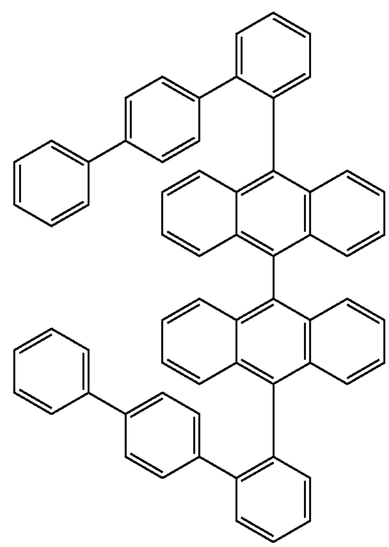

-continued
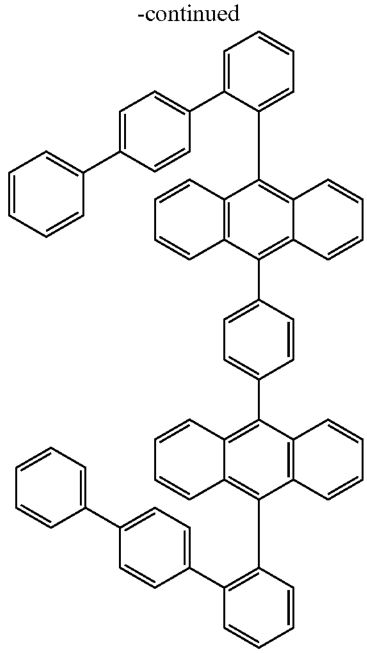
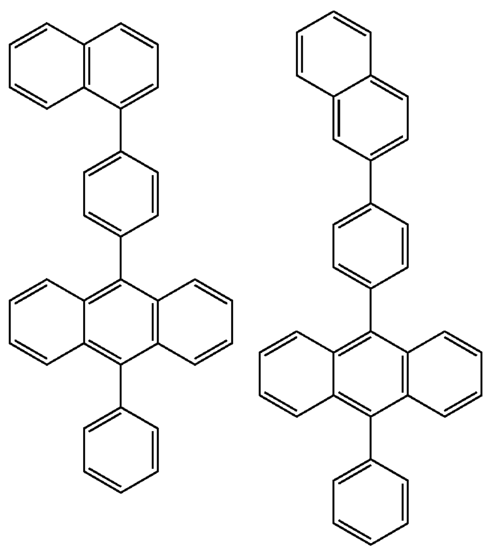
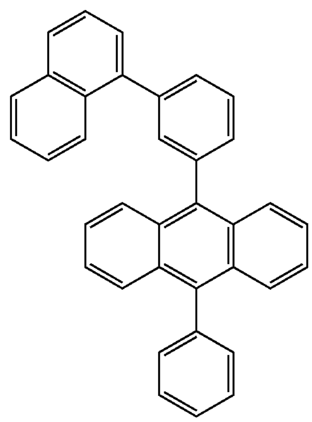
-continued
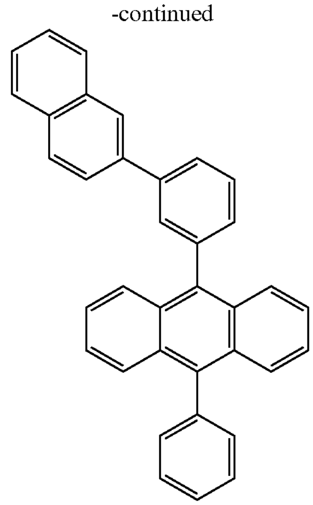
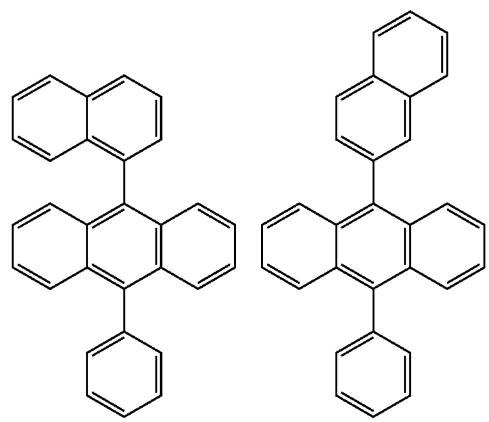
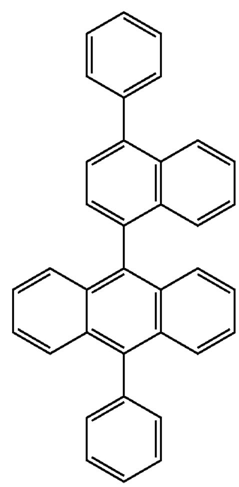

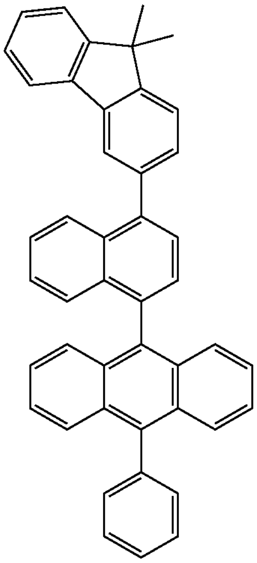
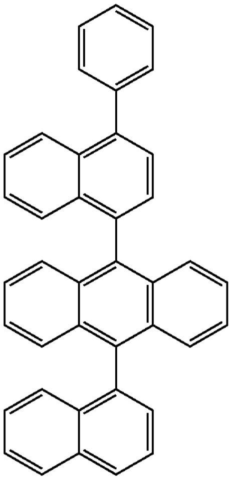
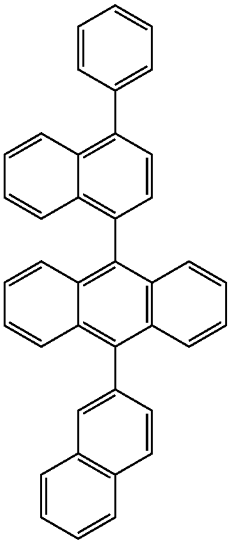
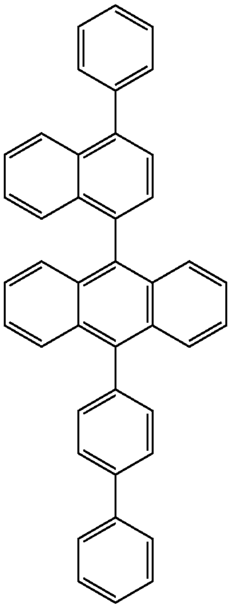
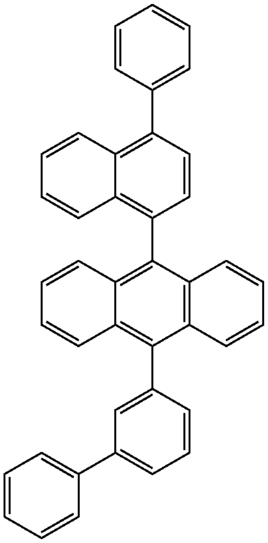
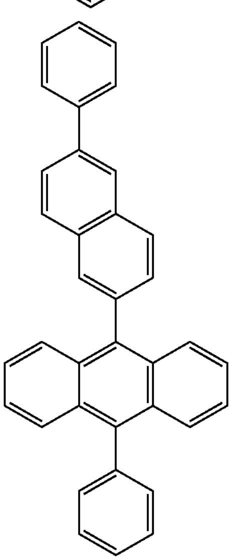
-continued
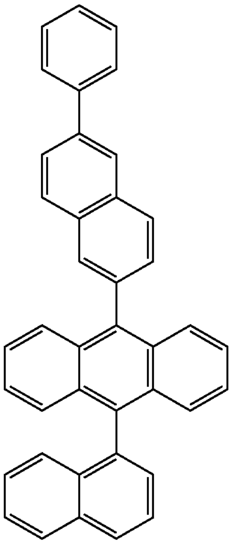
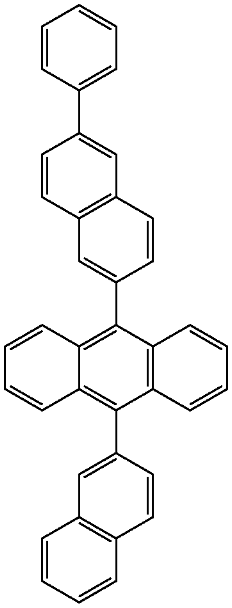
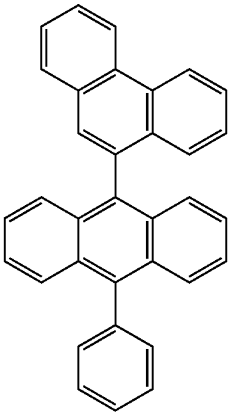
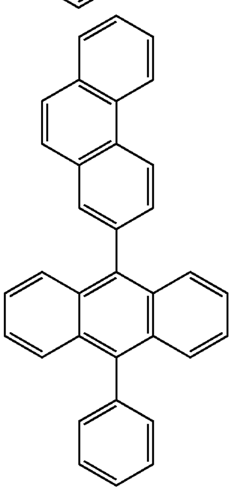
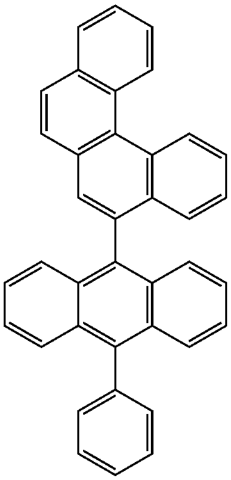
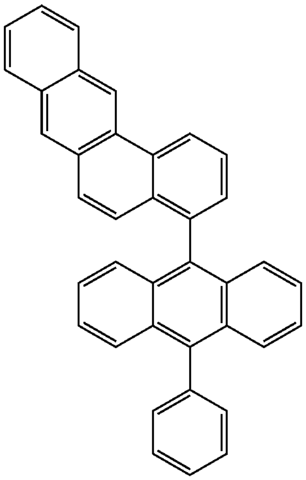

-continued
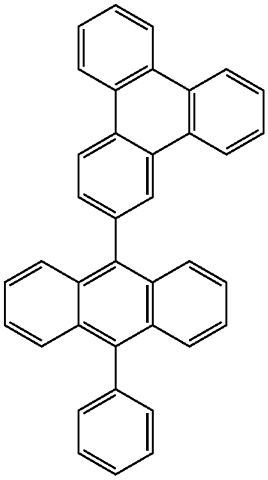
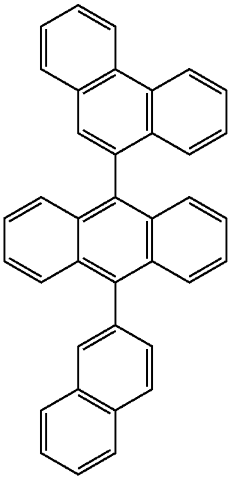
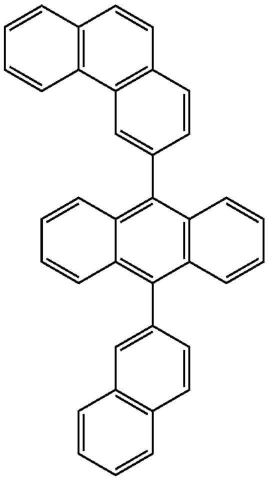
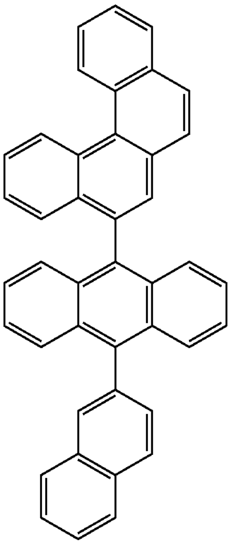
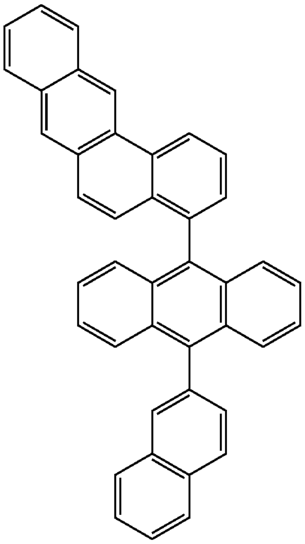
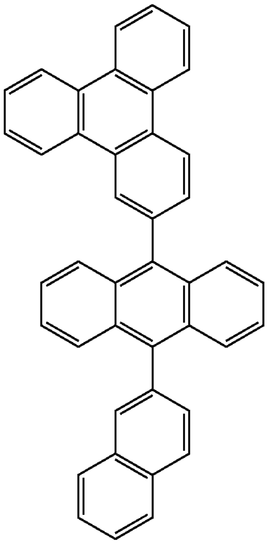
-continued
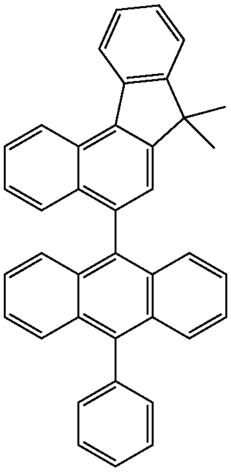
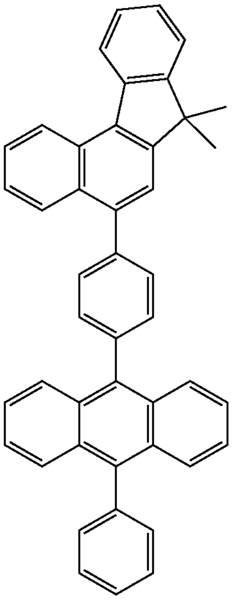
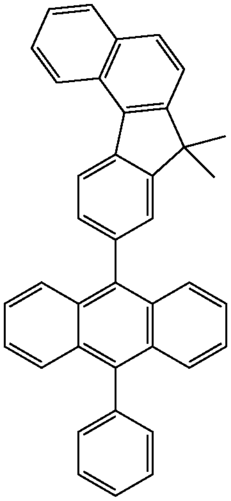
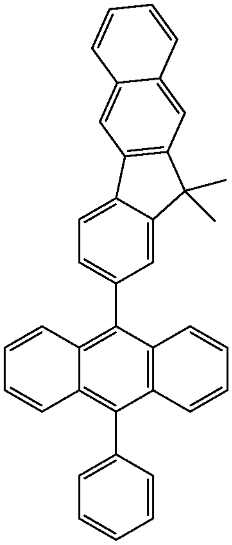
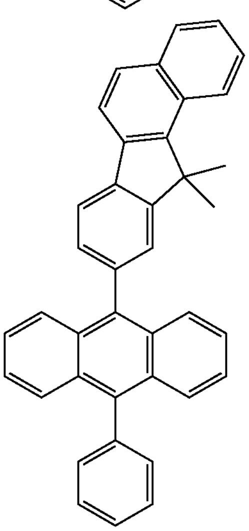
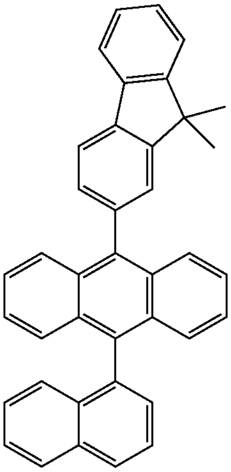

-continued
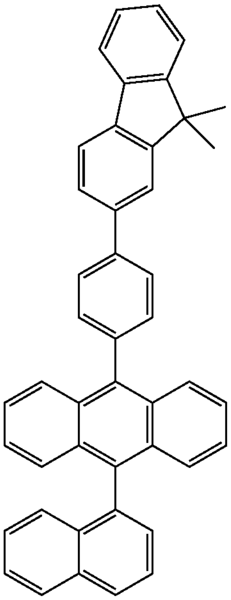
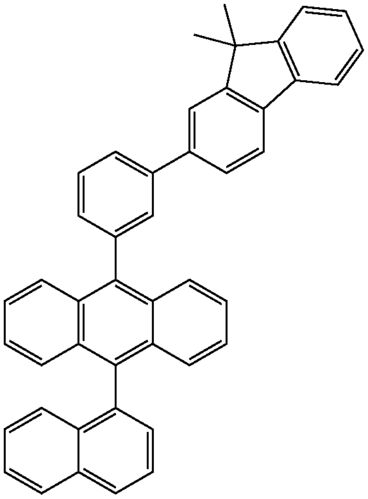
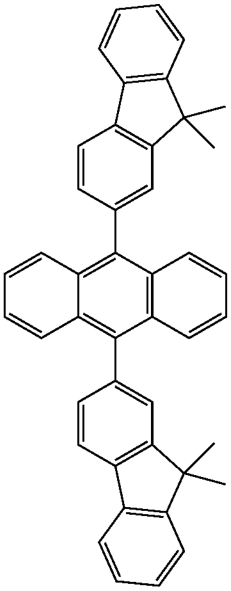
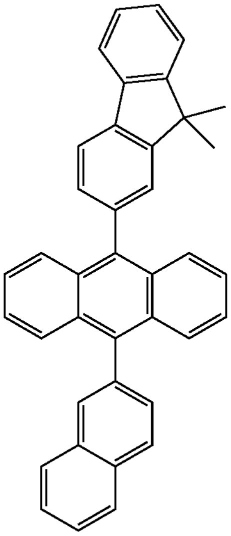
-continued
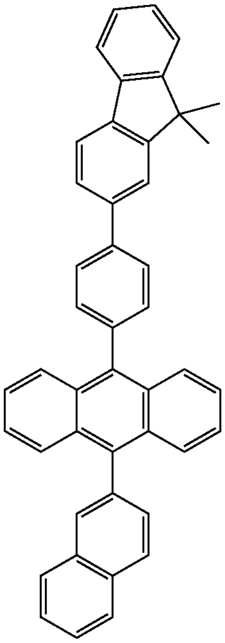
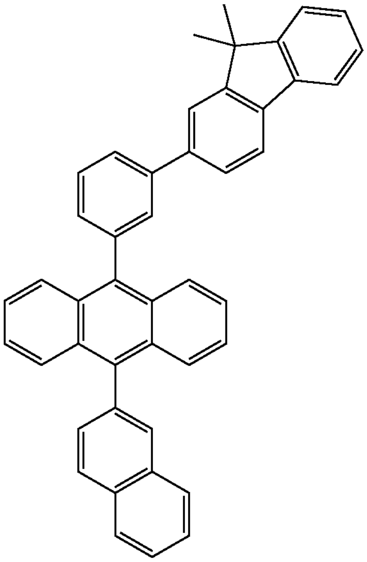
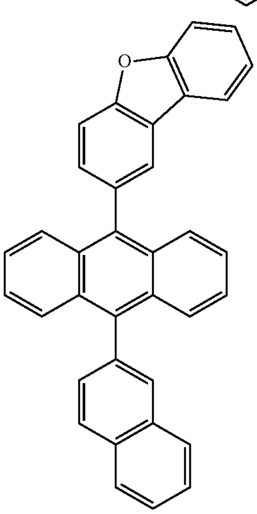
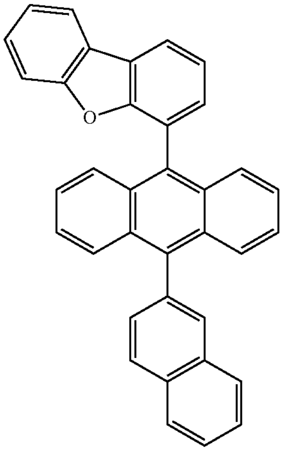

-continued
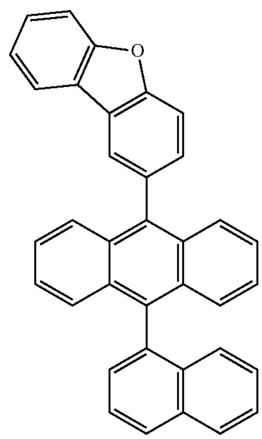
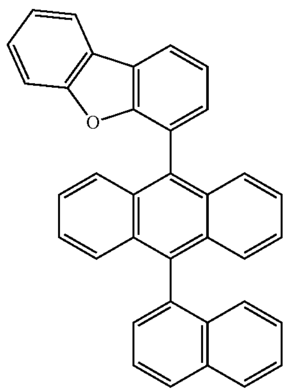
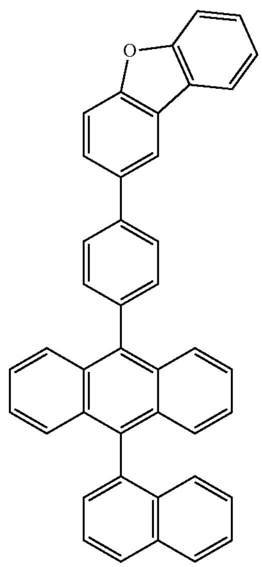
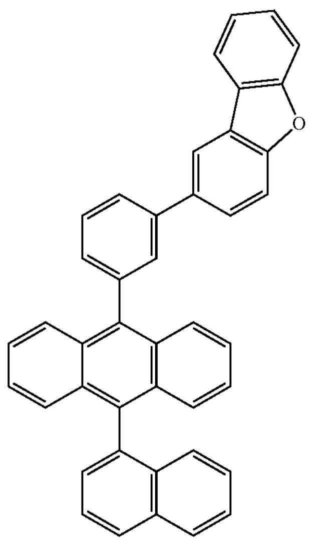
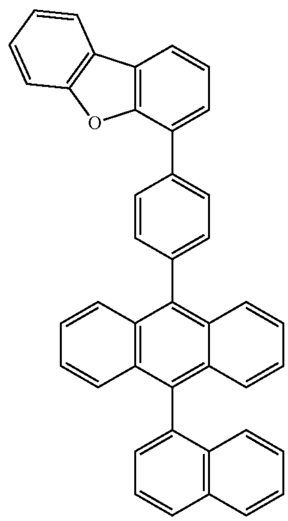
-continued
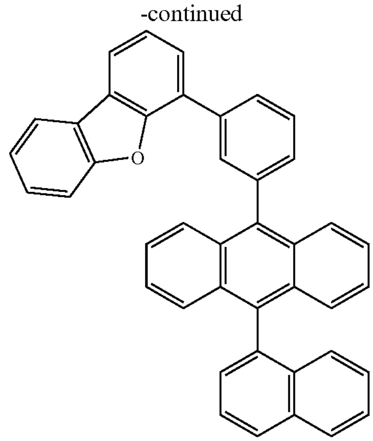
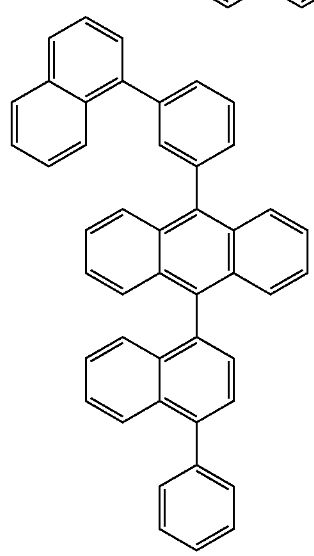
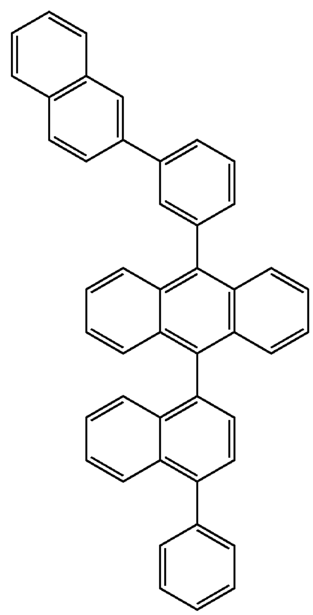

-continued
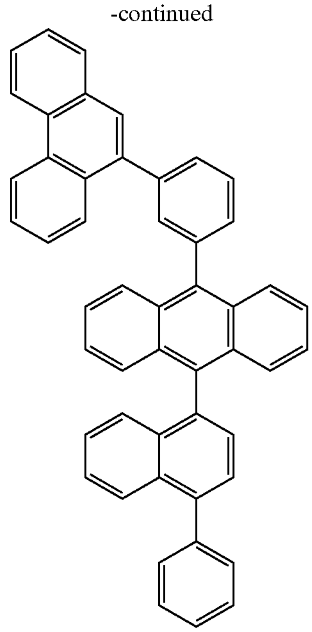
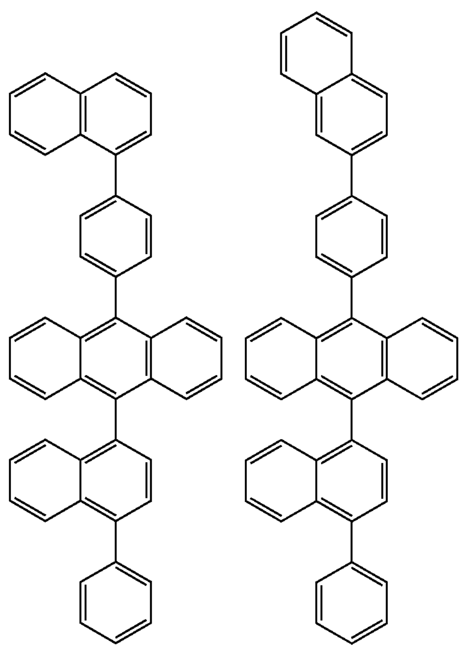
-continued
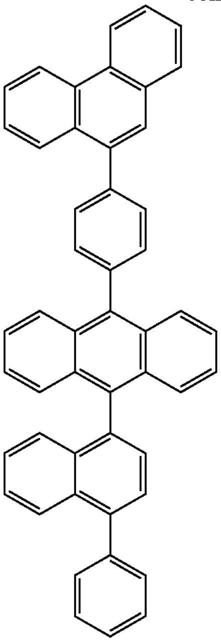
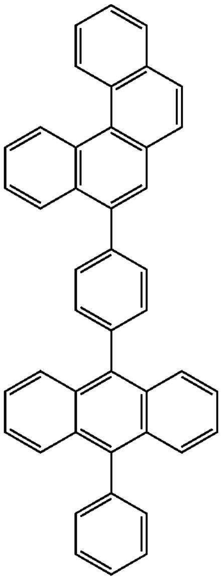
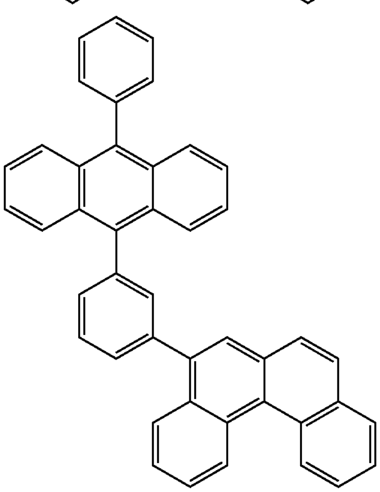
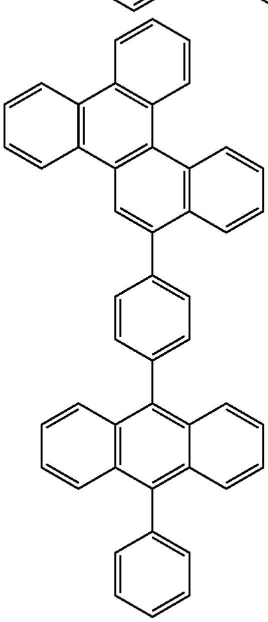

-continued
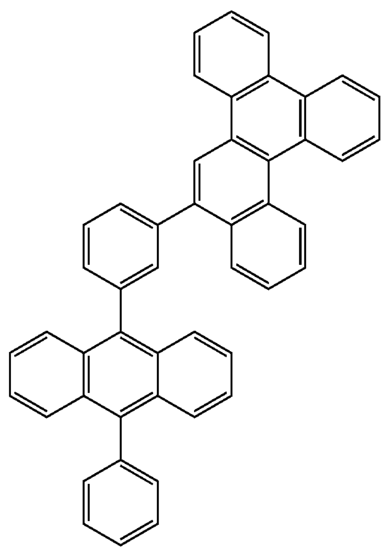
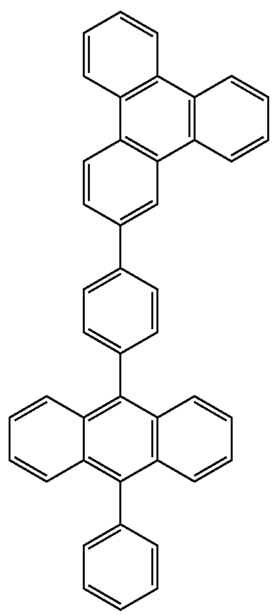
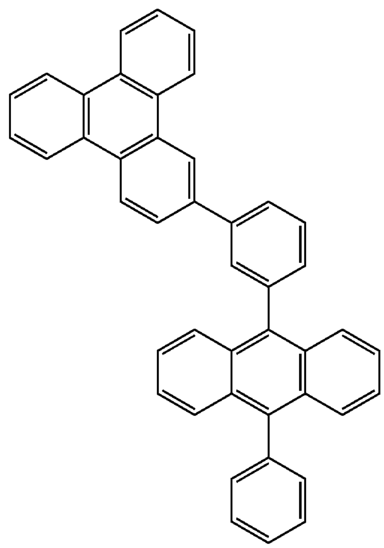
-continued
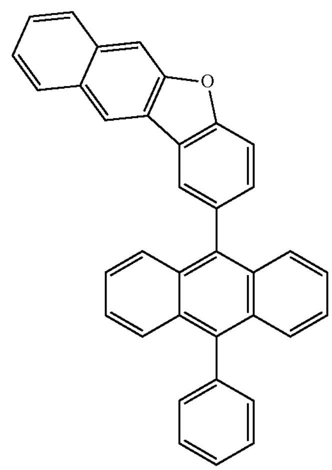
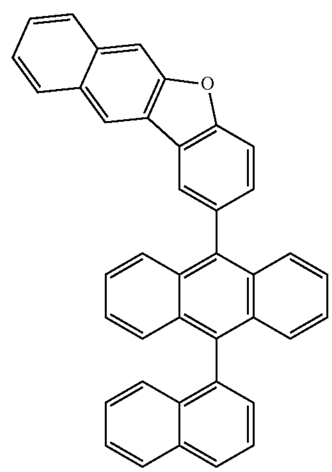
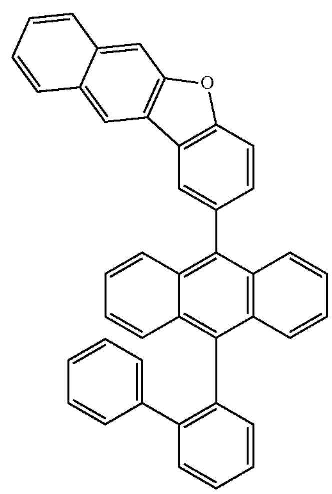

-continued
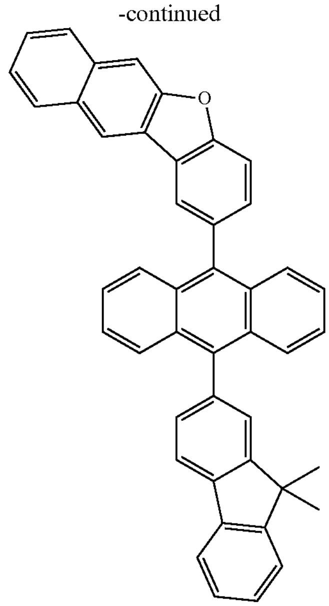
-continued
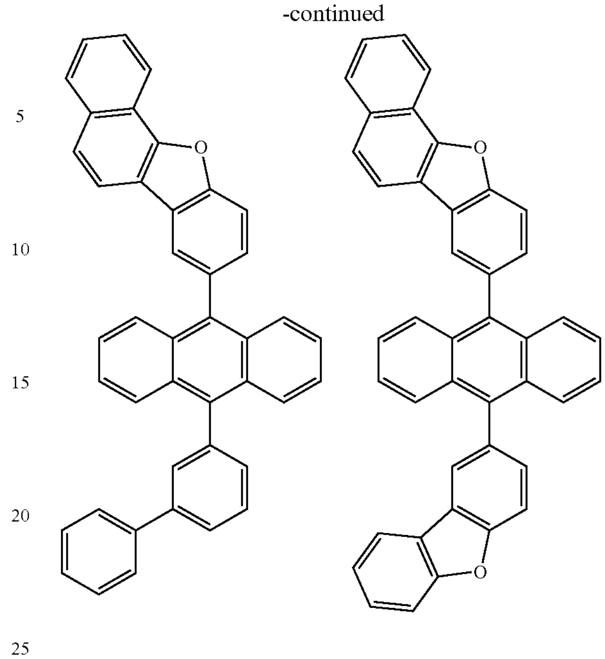
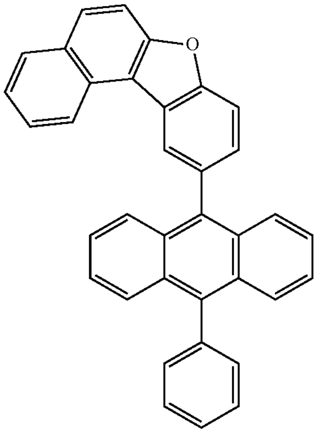
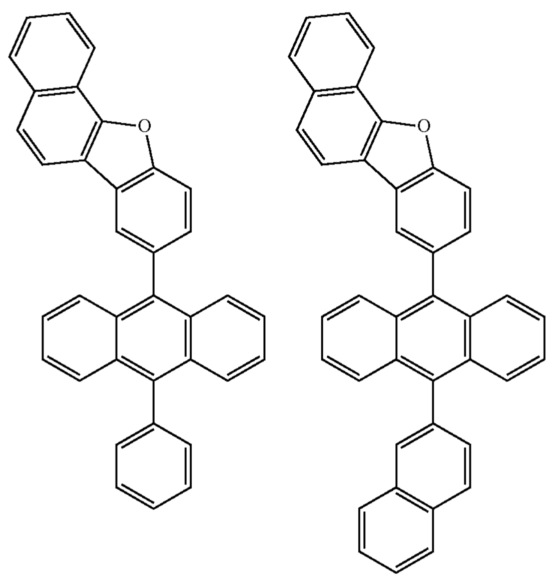
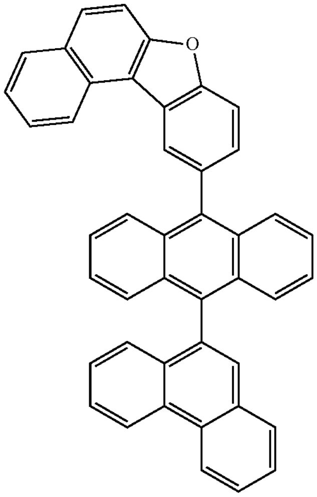

-continued
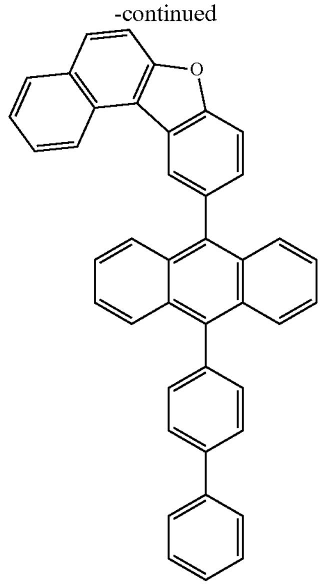
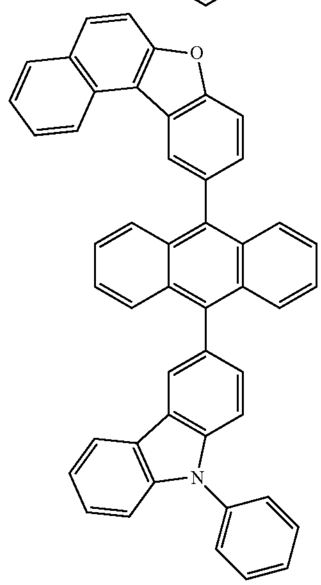
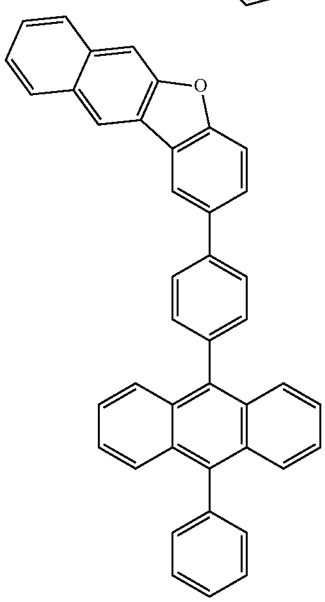
-continued
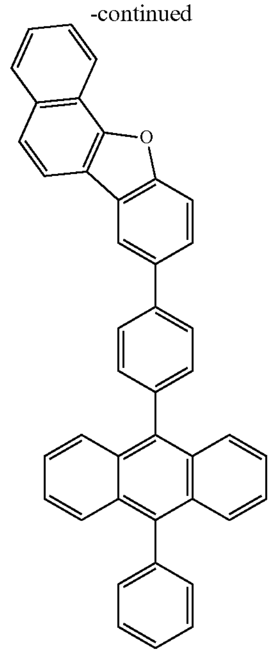
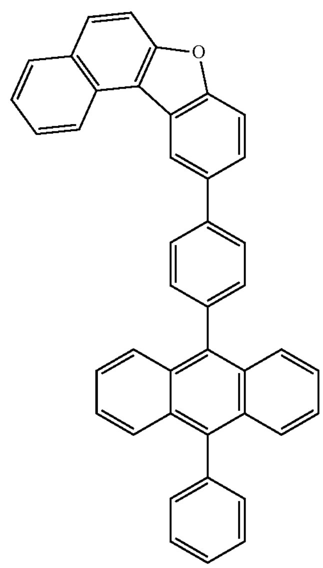

-continued
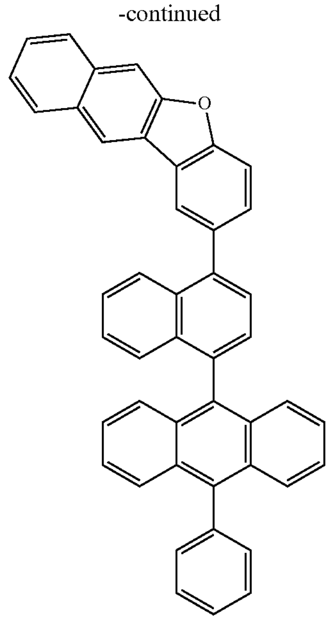
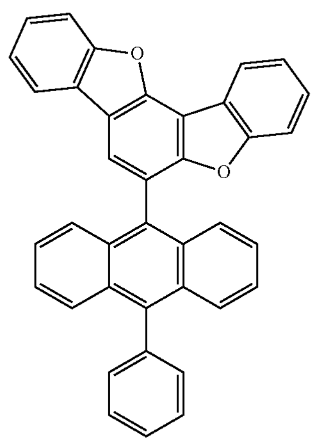
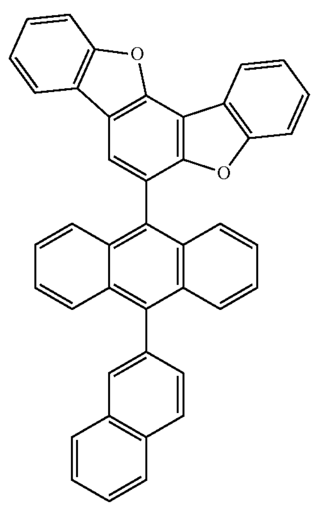
-continued
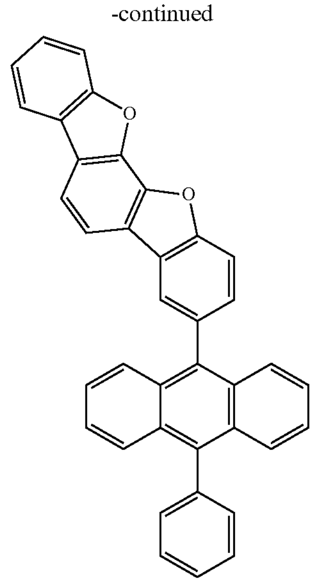
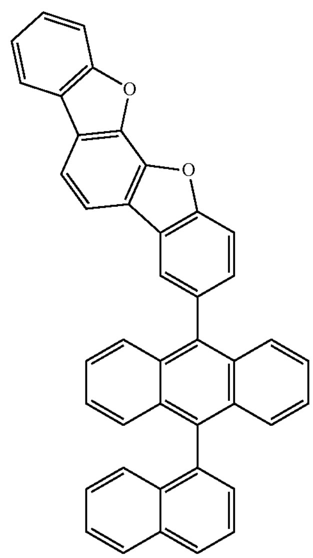
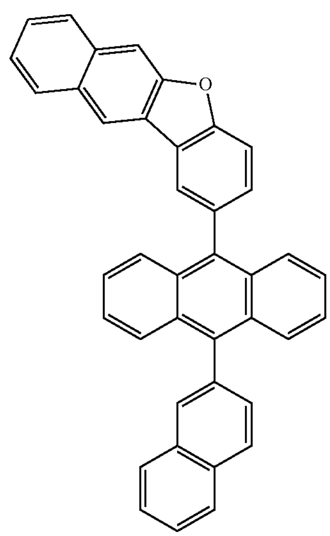

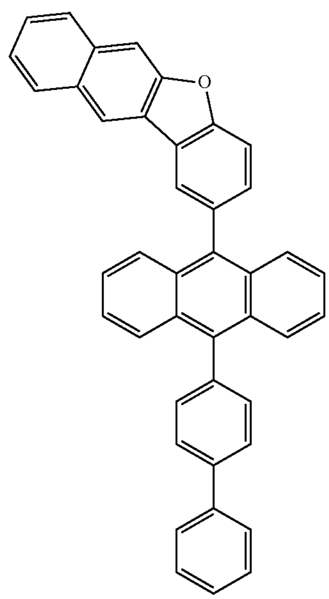
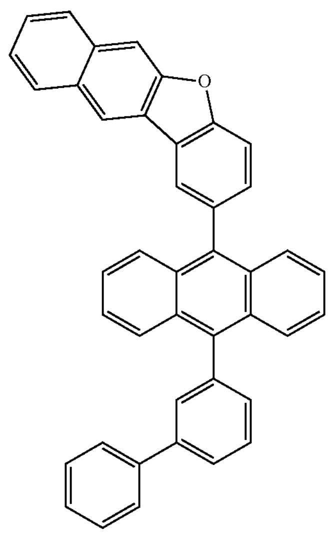
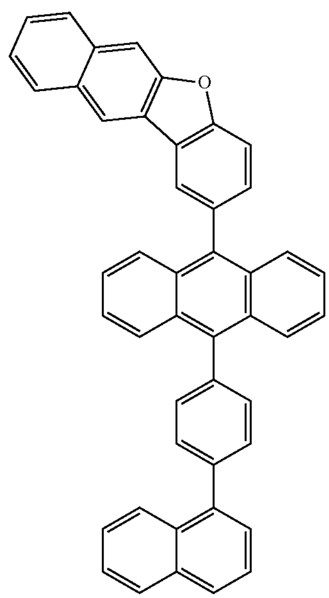
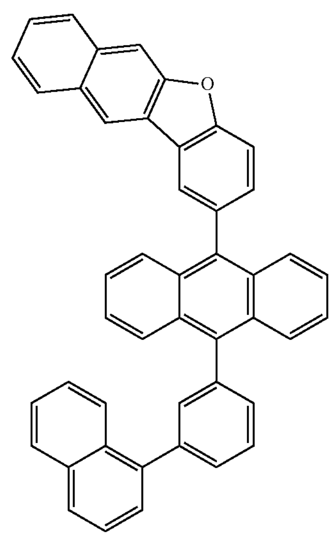
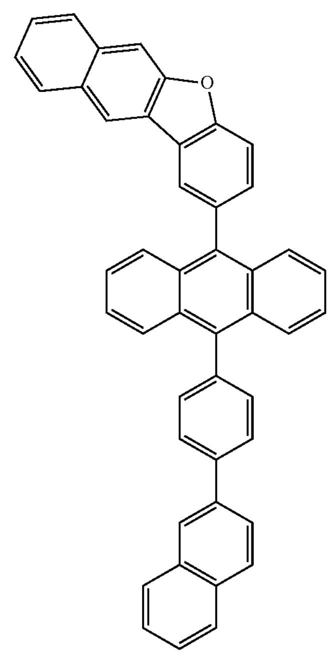
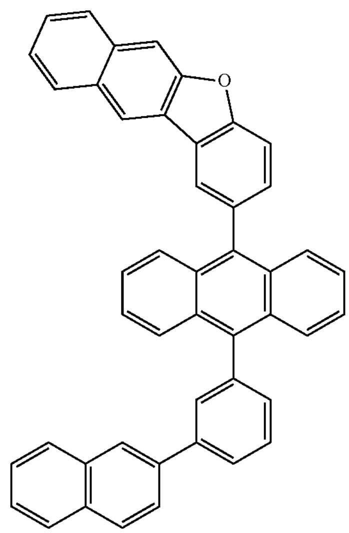

-continued
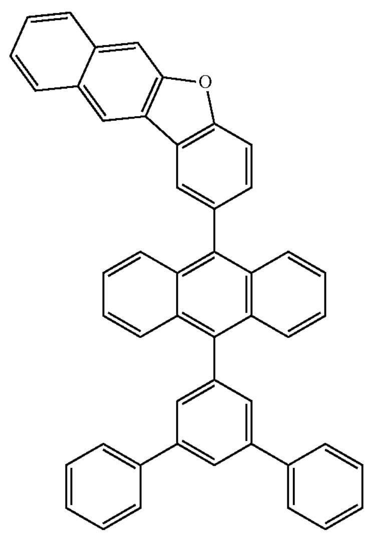
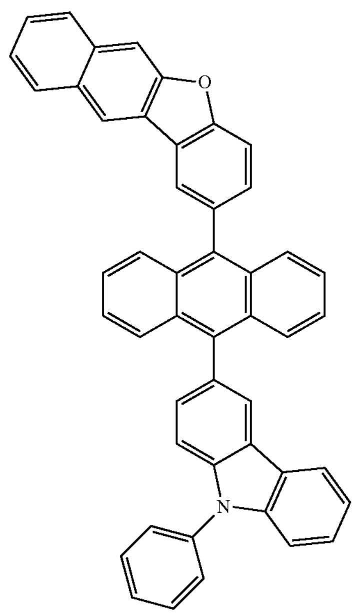
-continued
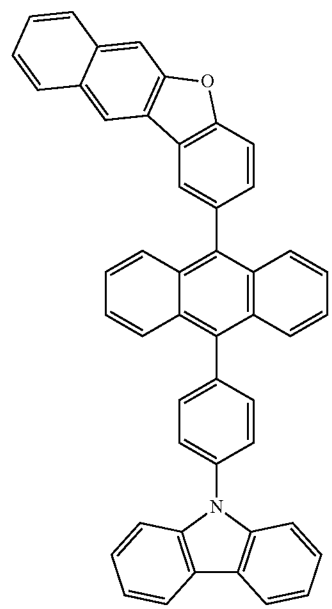
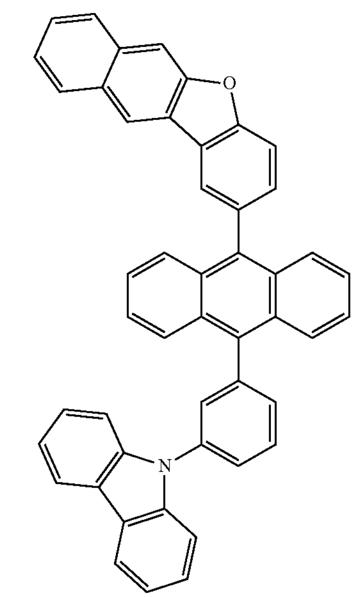
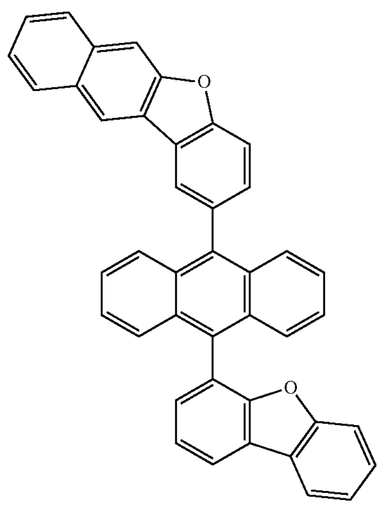

-continued
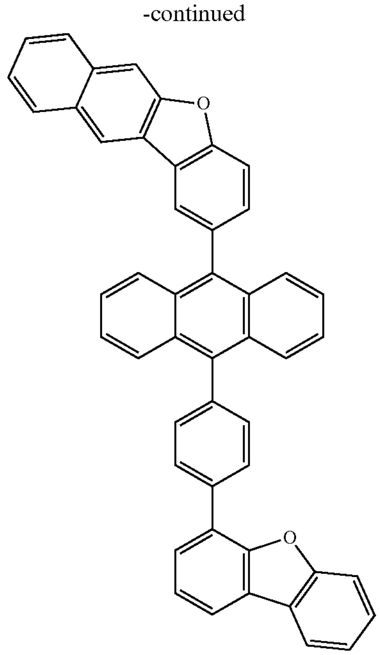
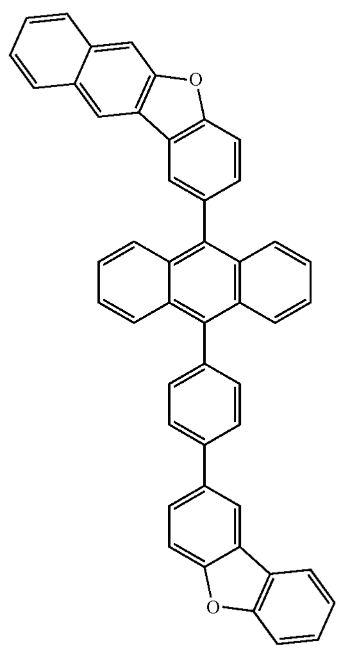
-continued
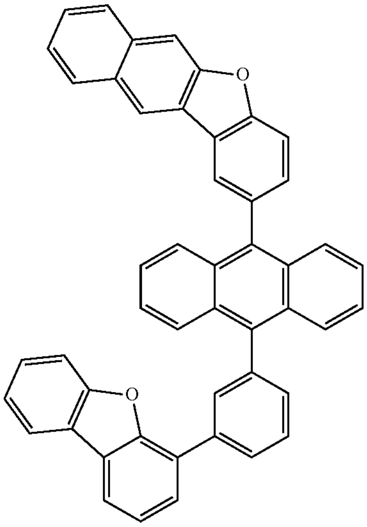
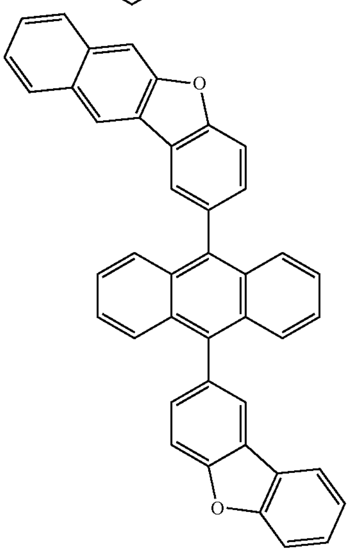
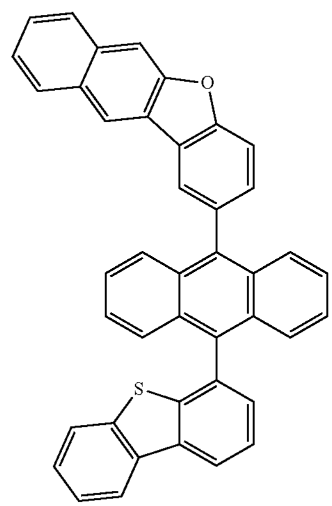

-continued
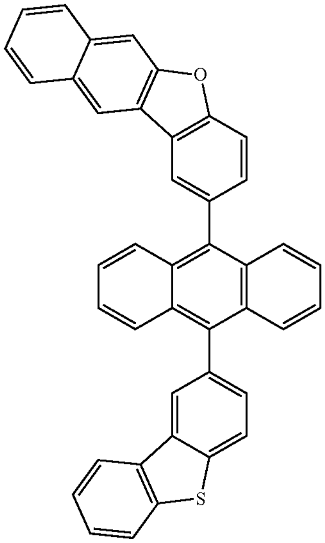
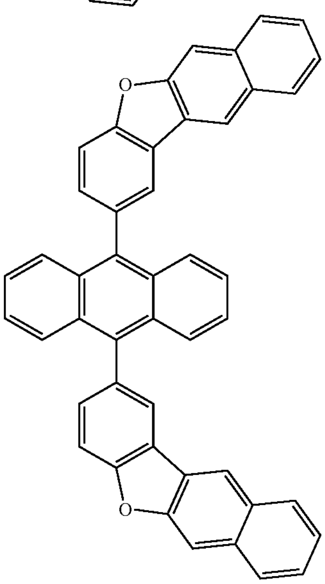
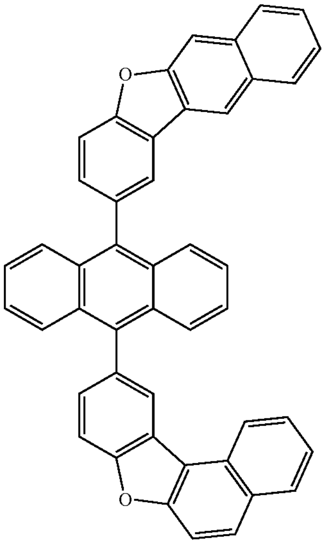
-continued
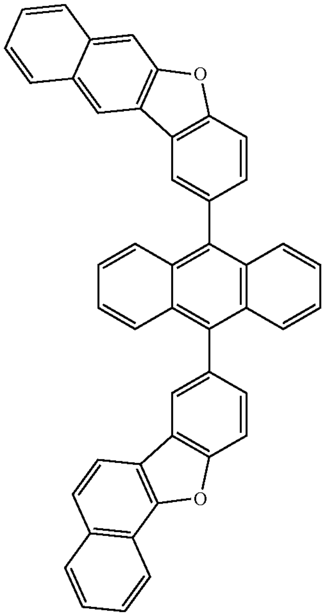
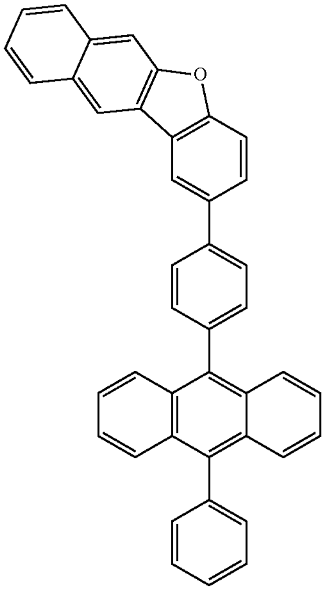

-continued
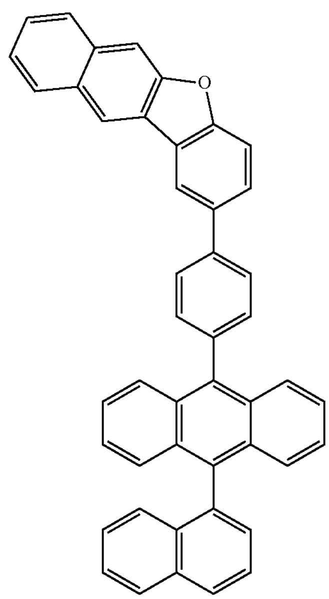
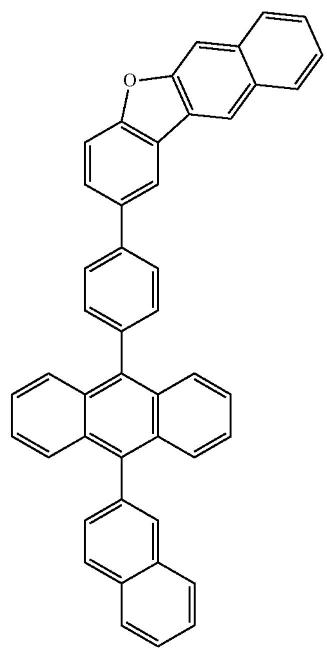
-continued
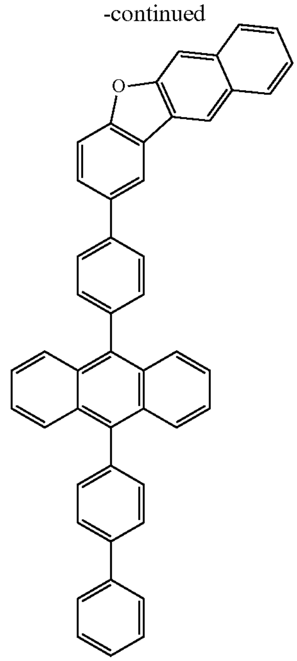
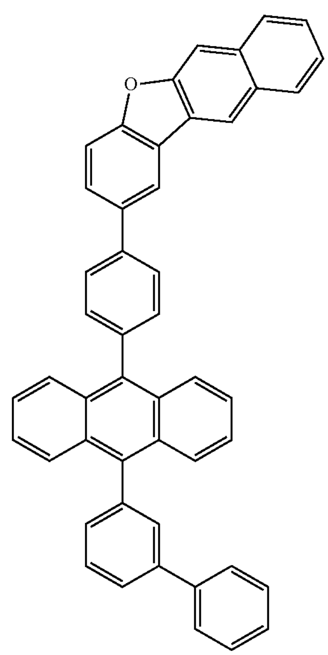

-continued
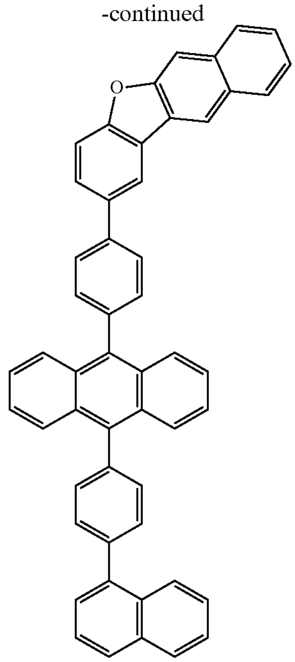
-continued
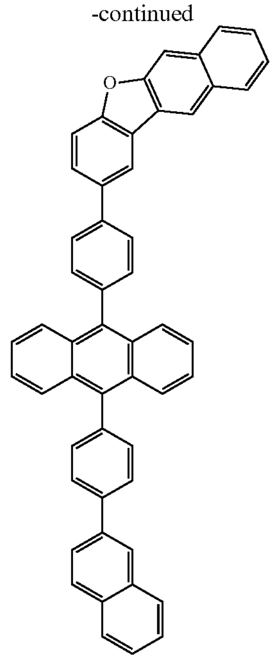
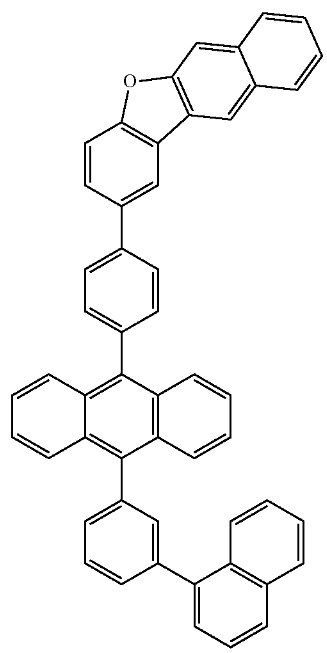
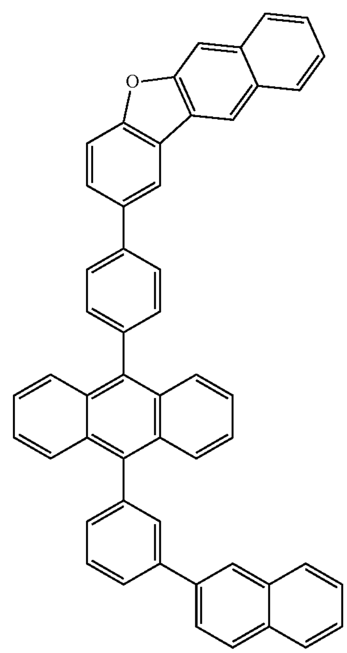

-continued
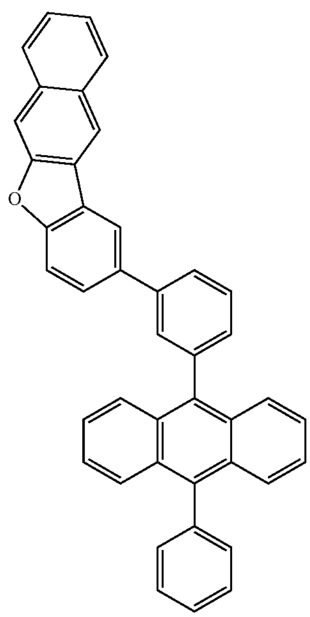
-continued
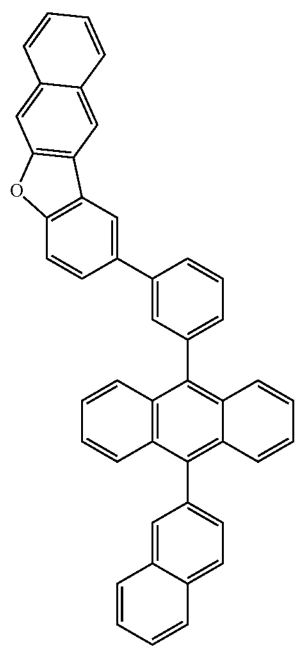
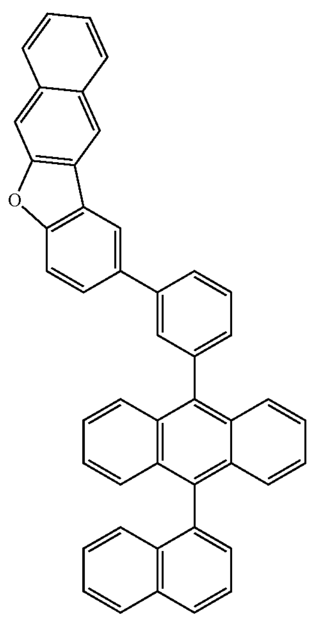
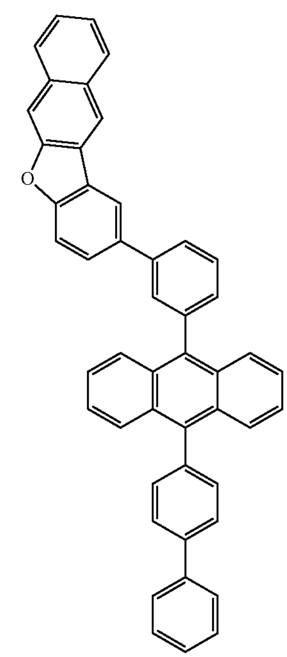

-continued
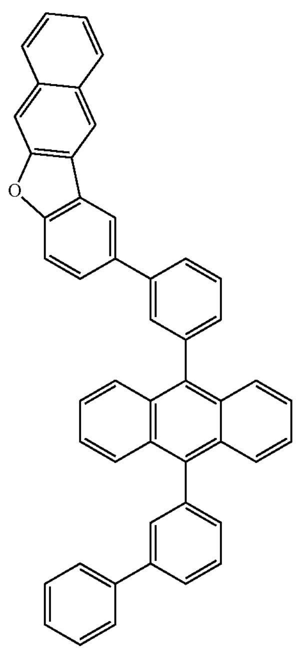
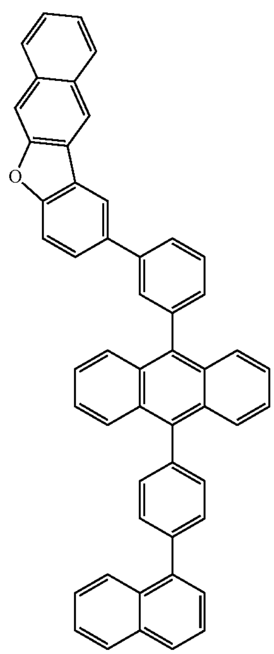
-continued
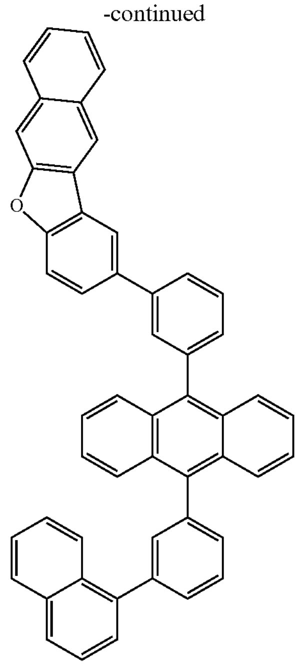
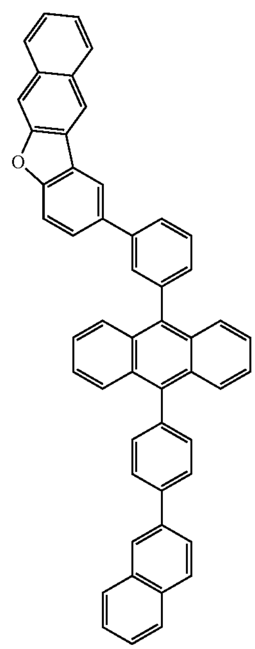

-continued
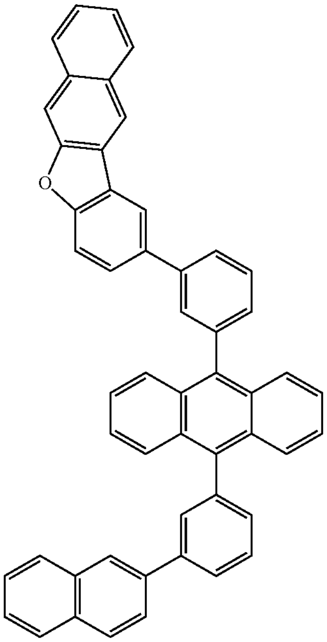
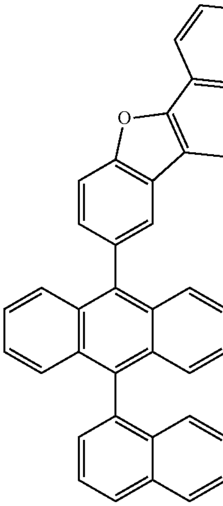
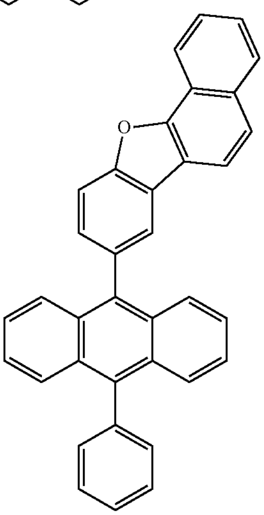
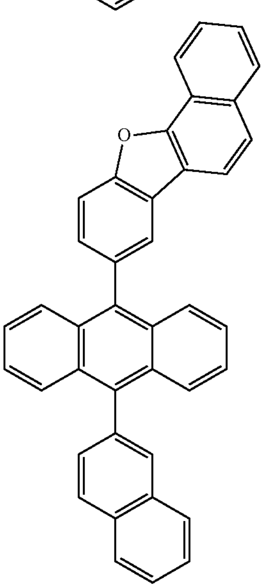
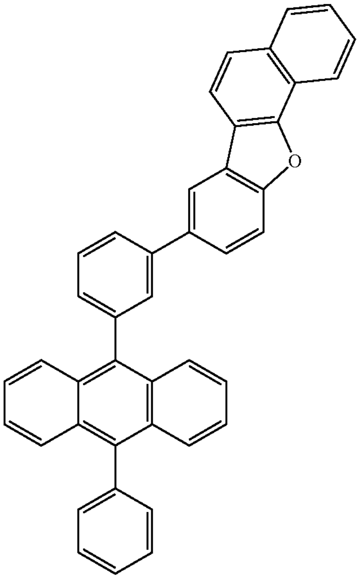

-continued
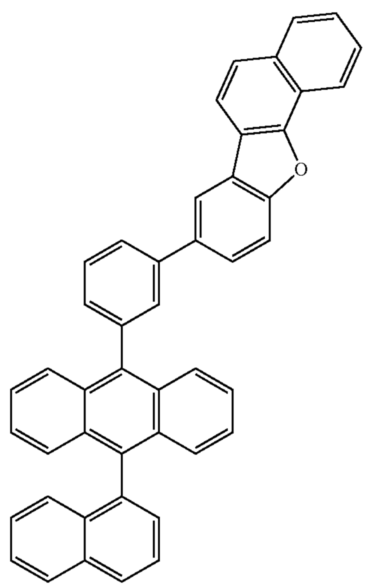
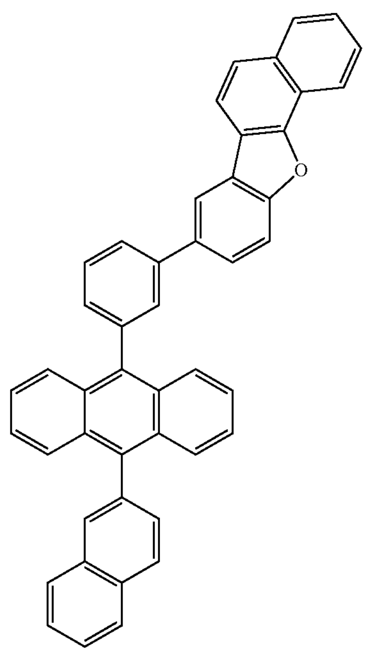
-continued
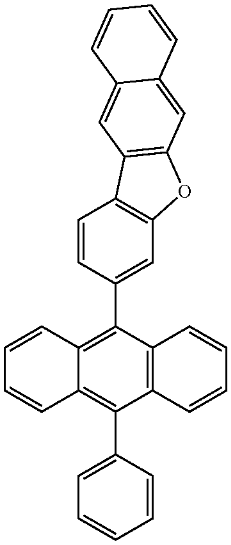
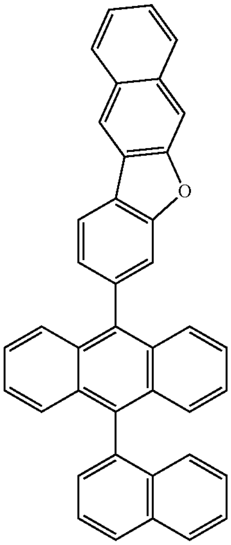
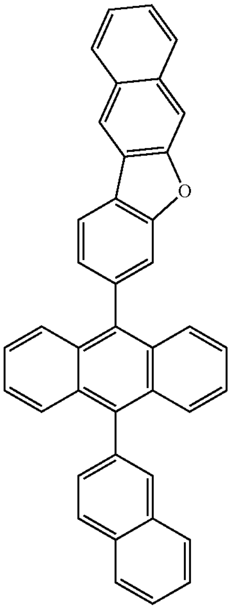

-continued
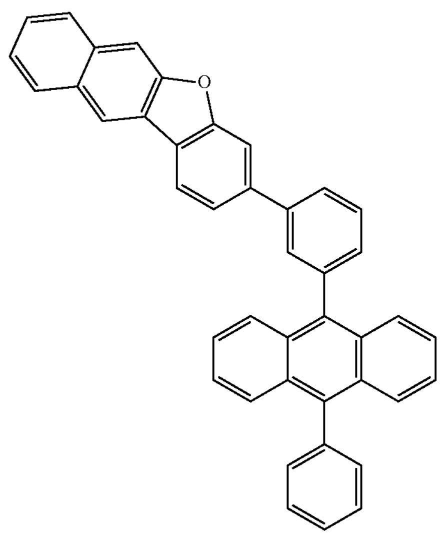
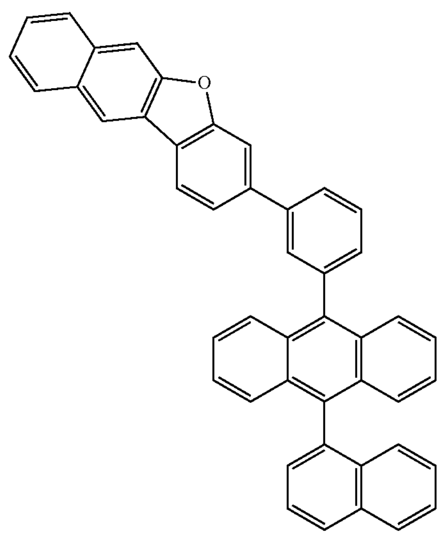
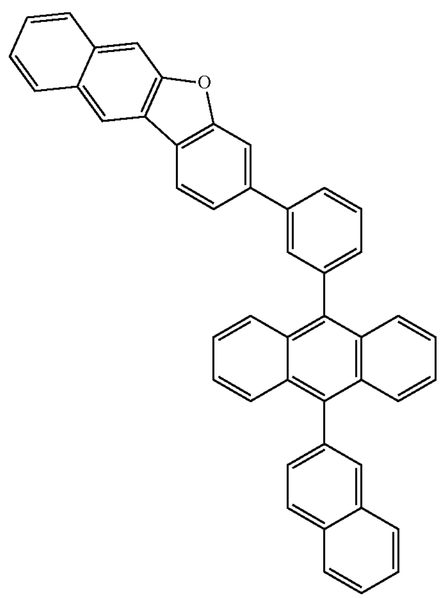
-continued
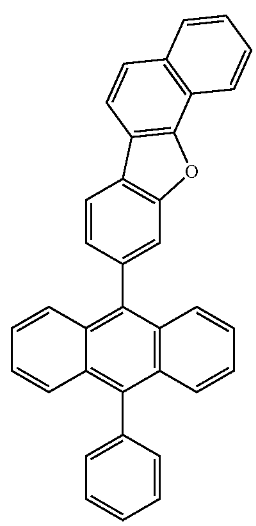
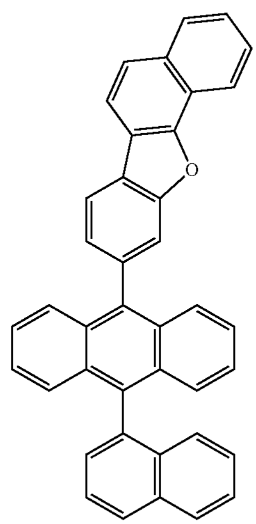
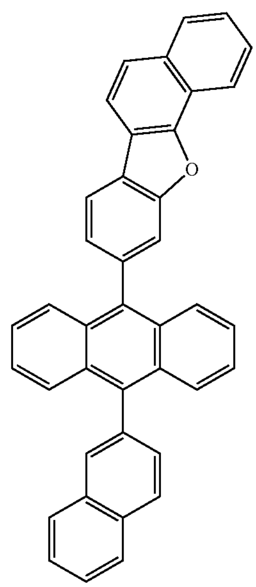

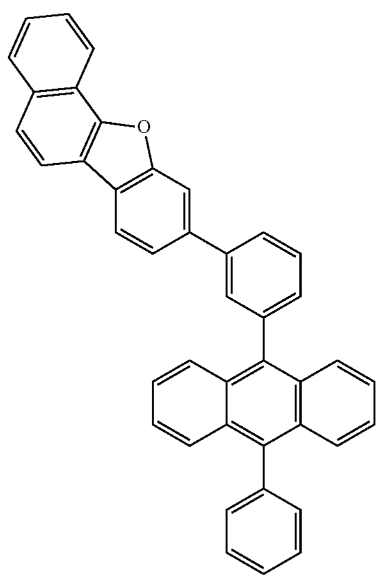
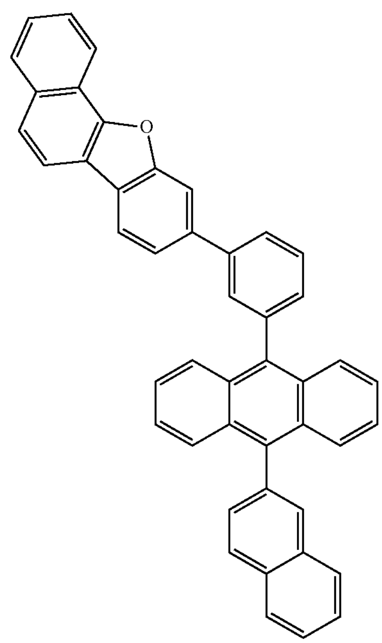
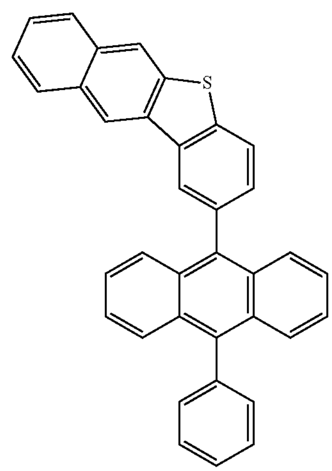
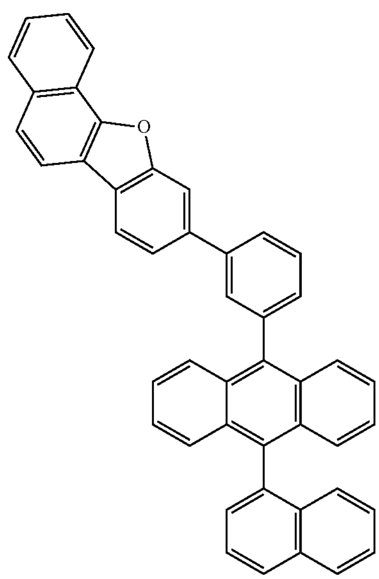
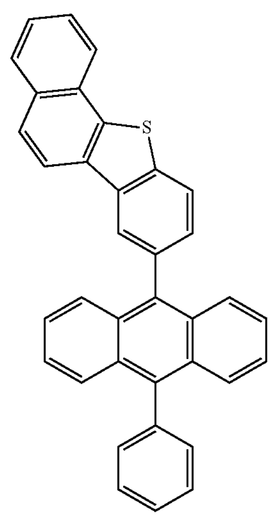

-continued
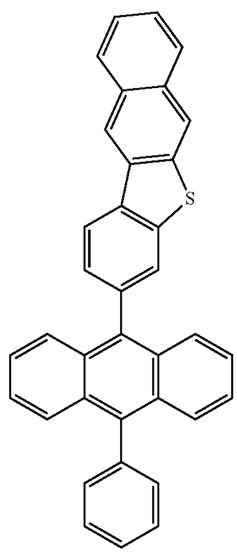
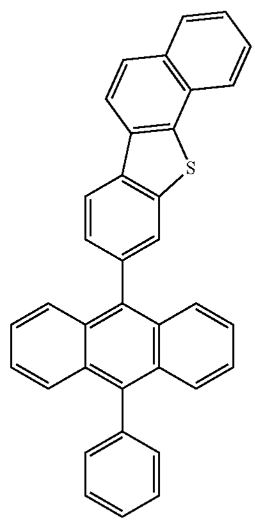
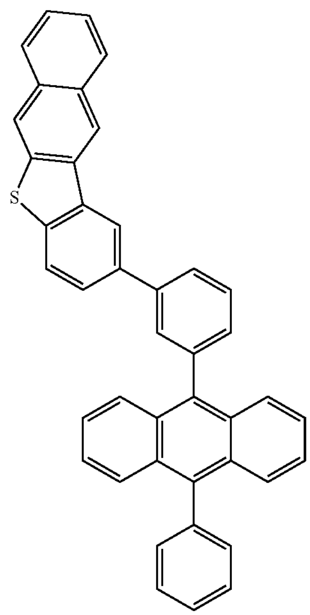
-continued
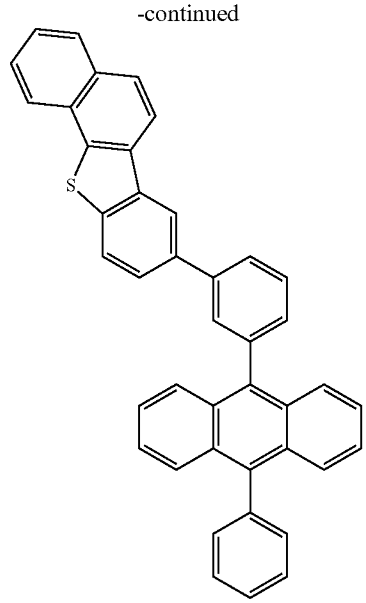
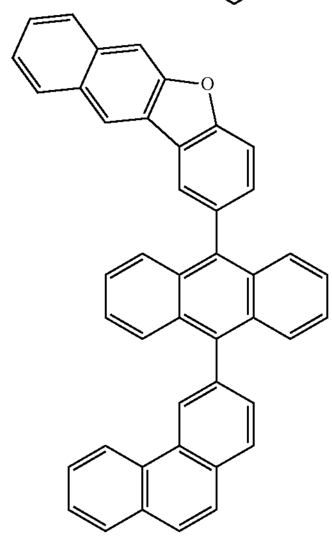
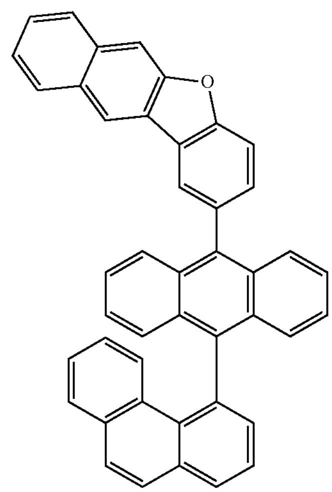

-continued
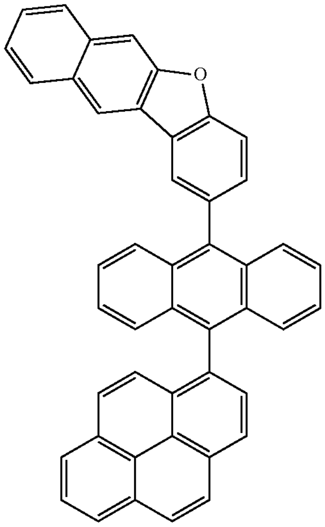
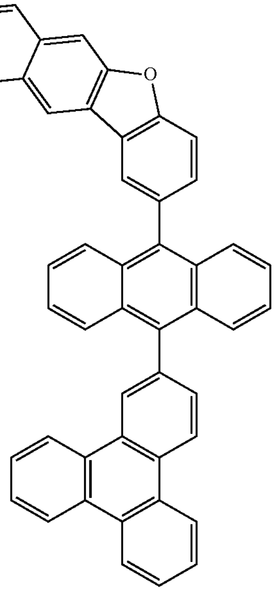
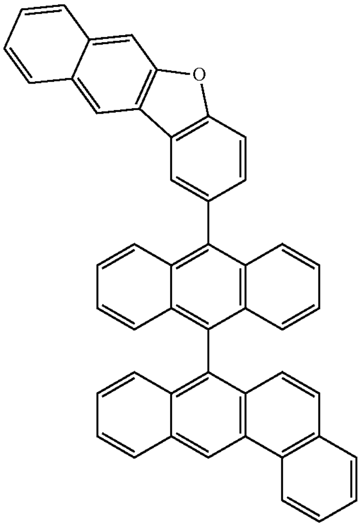
-continued
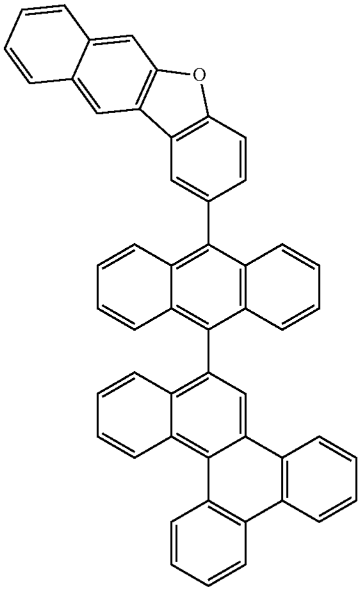
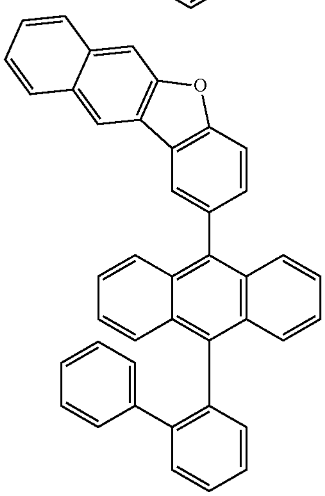
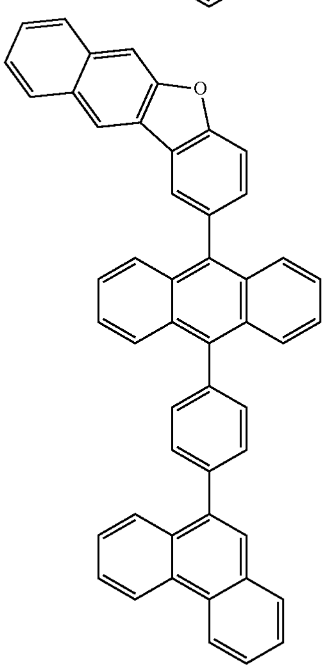

-continued
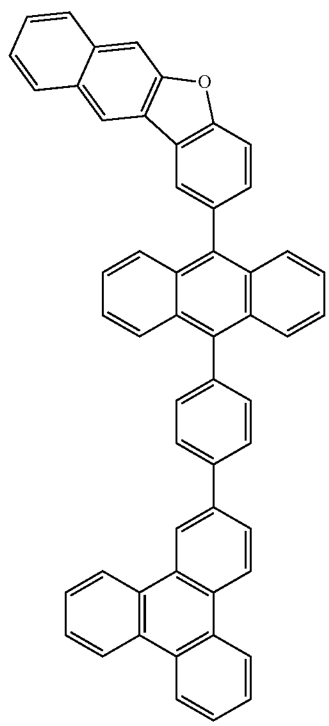
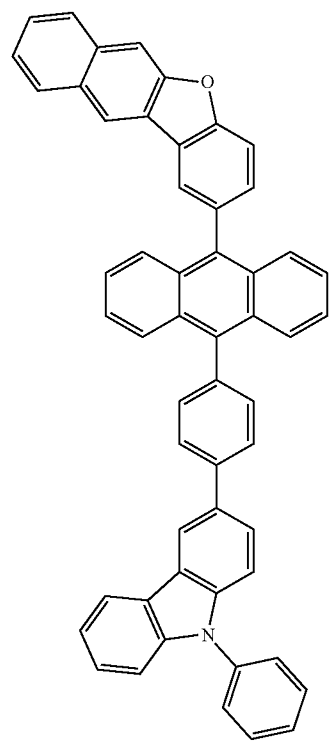
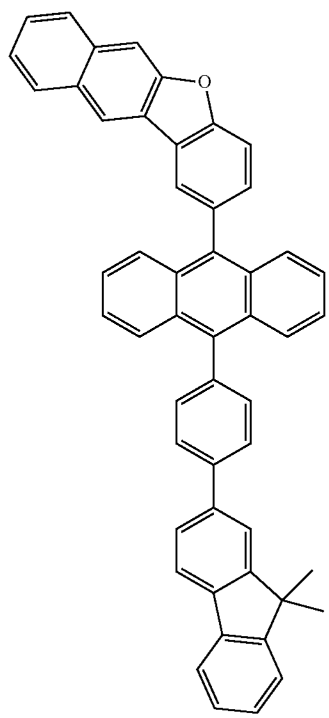
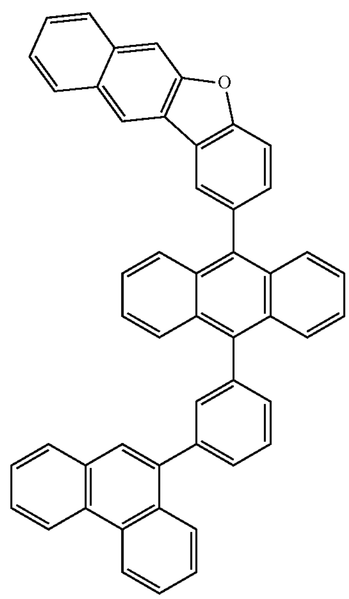
-continued

-continued
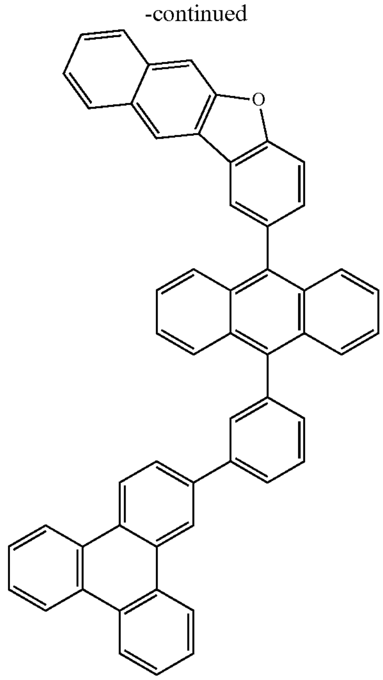
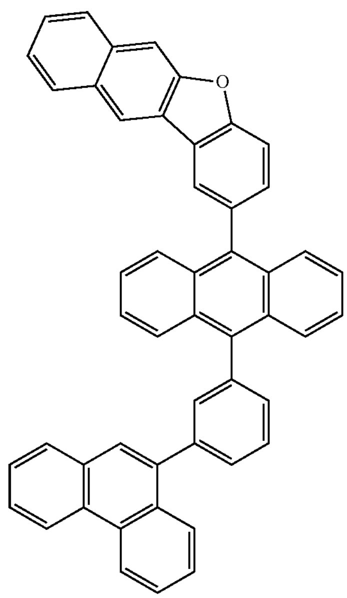
-continued
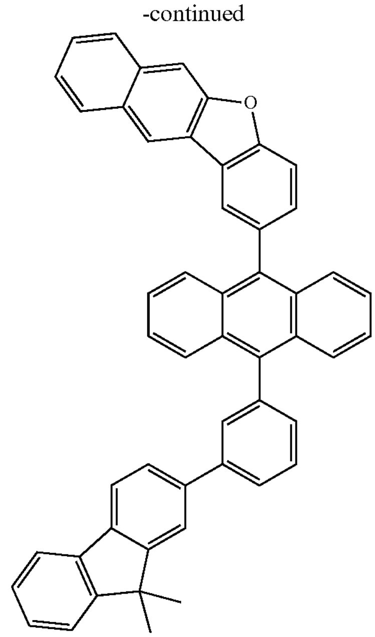
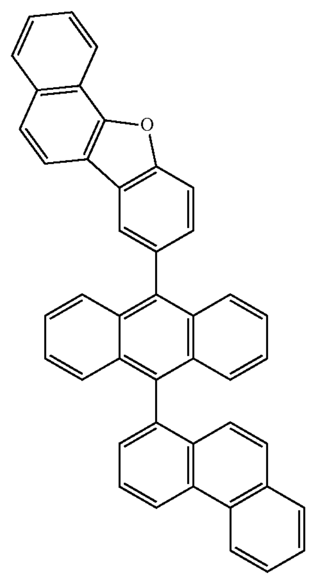

-continued
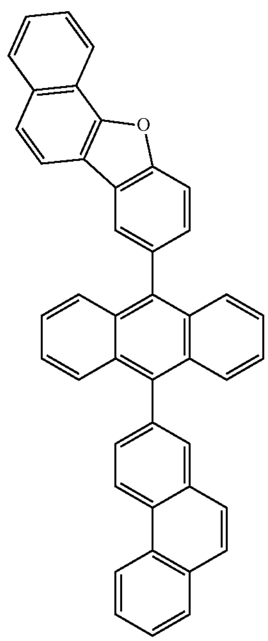
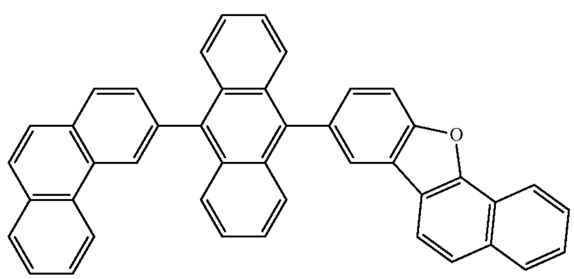
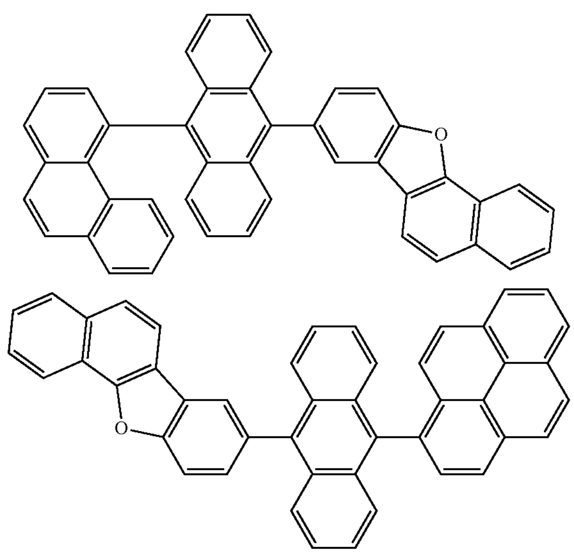
-continued
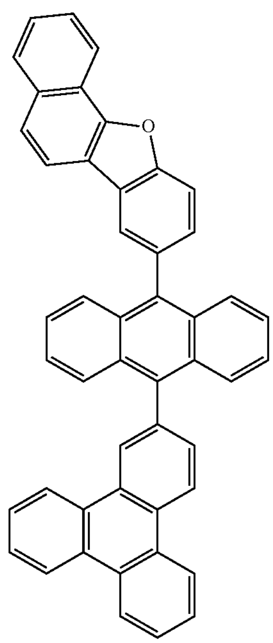
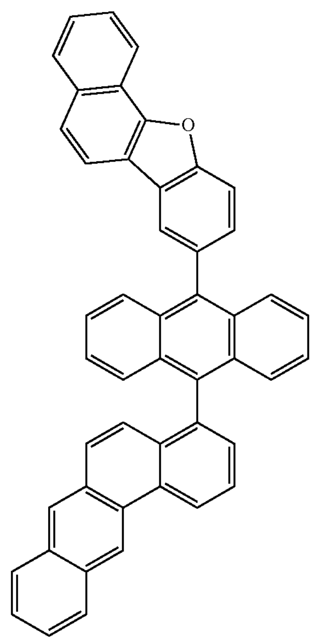

-continued
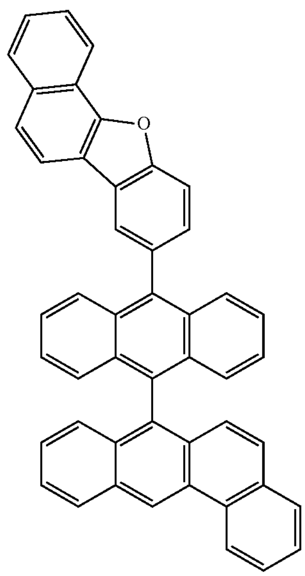
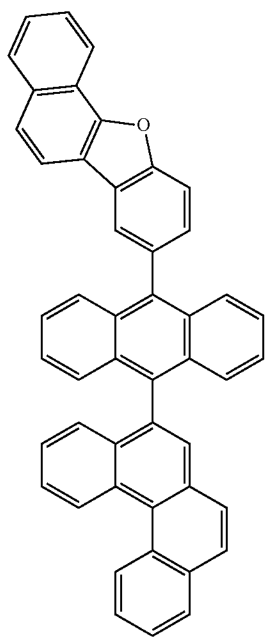
-continued
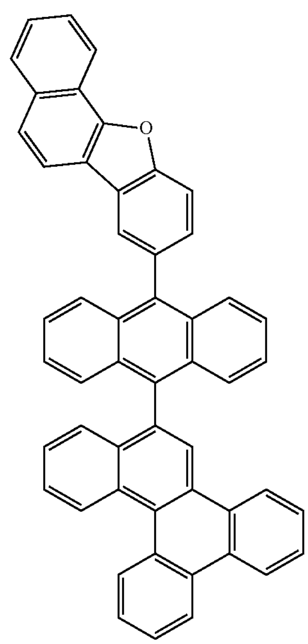
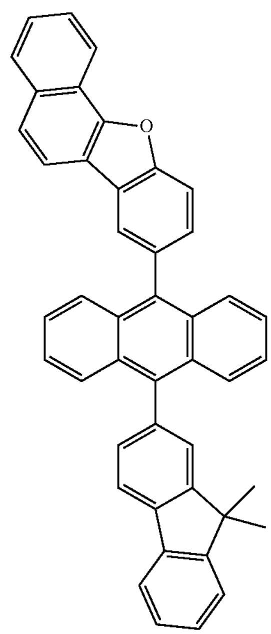

-continued
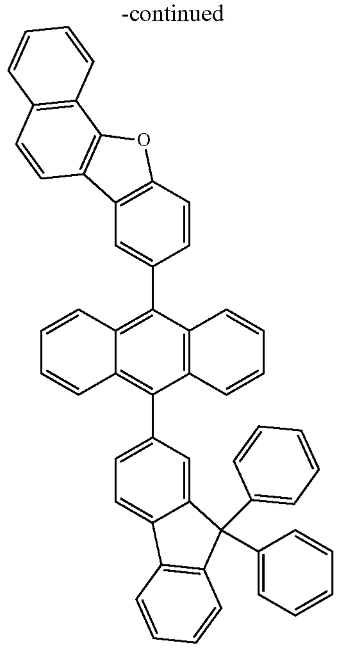
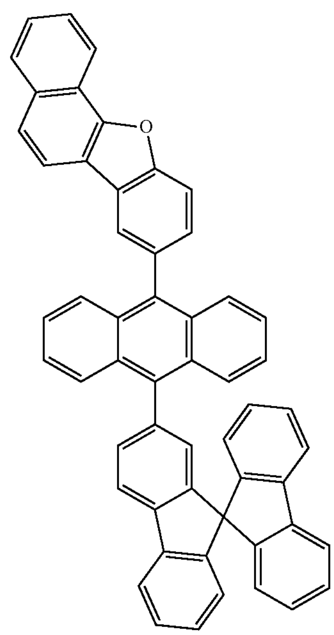
-continued
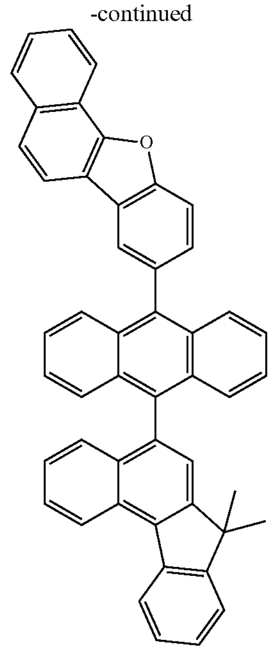
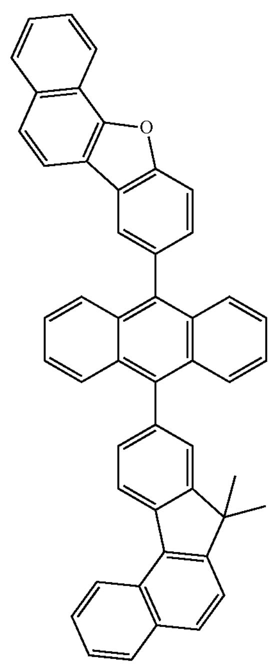

-continued
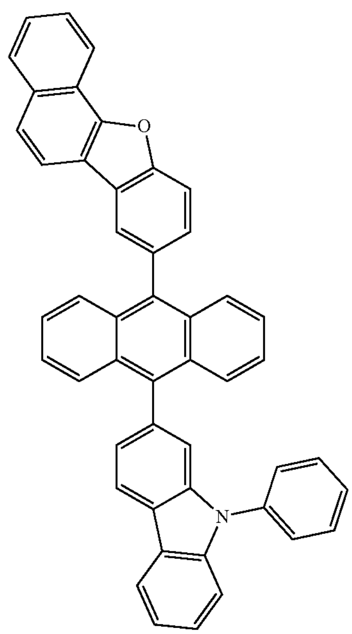
-continued
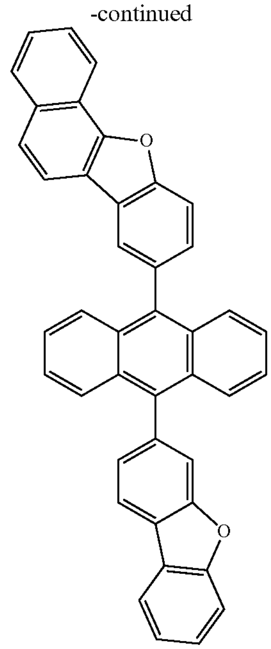
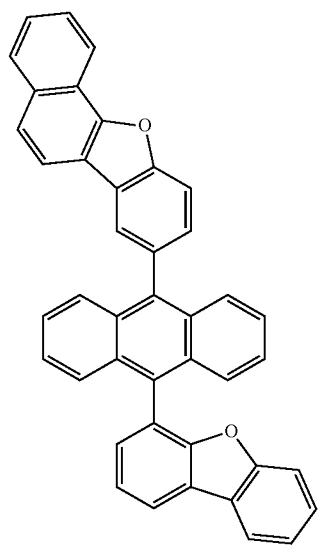
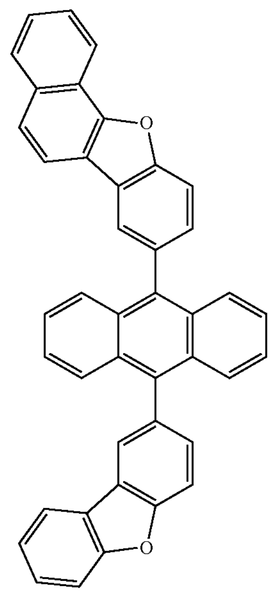

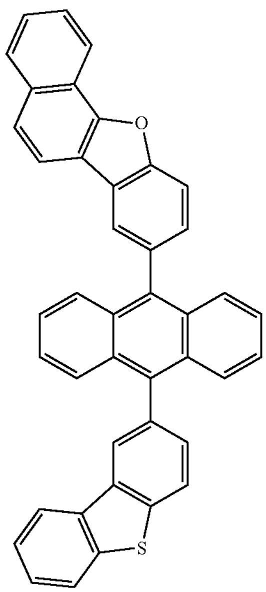
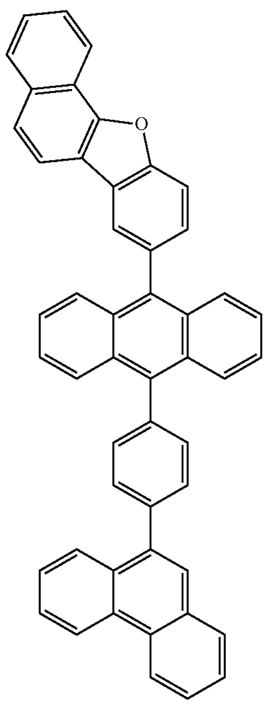
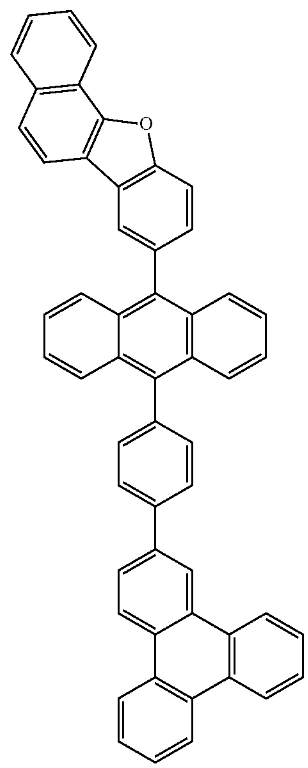
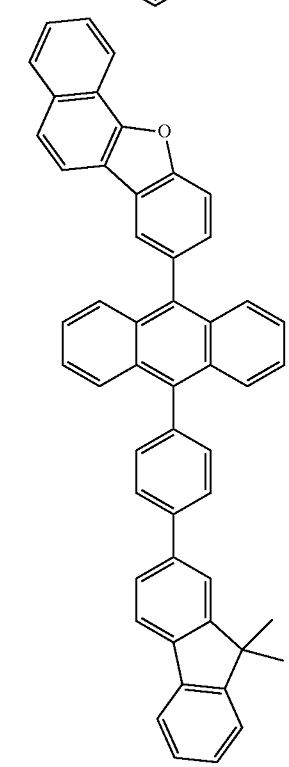
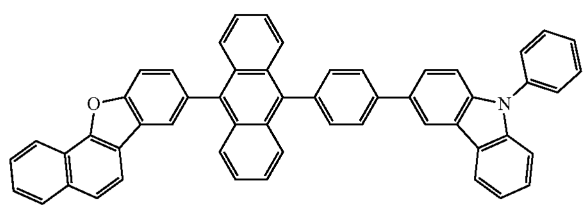

-continued
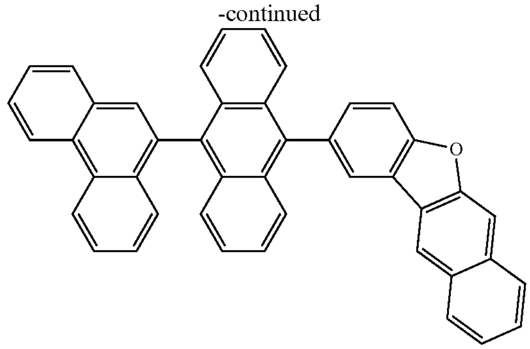
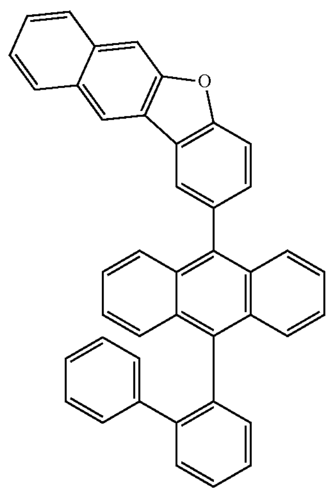
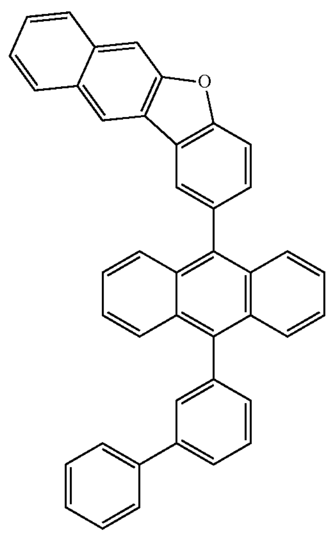
-continued
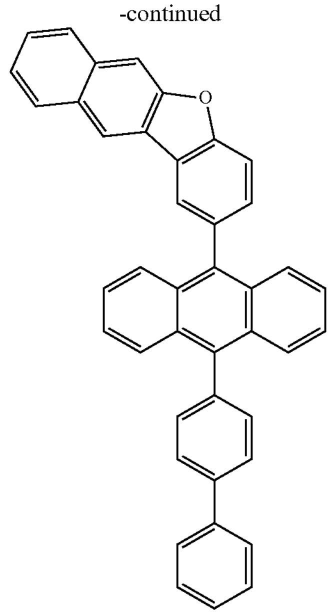
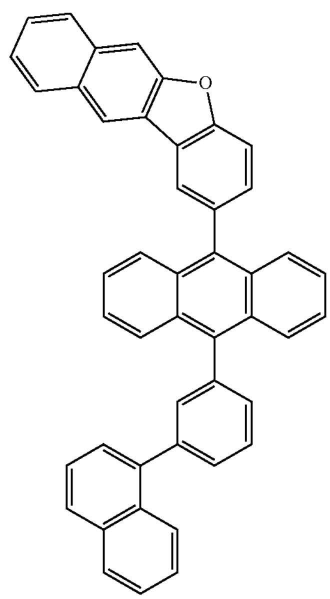

-continued
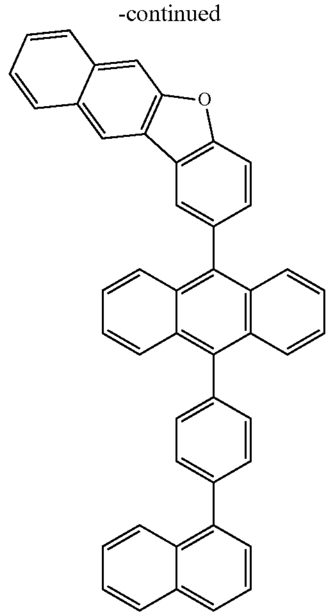
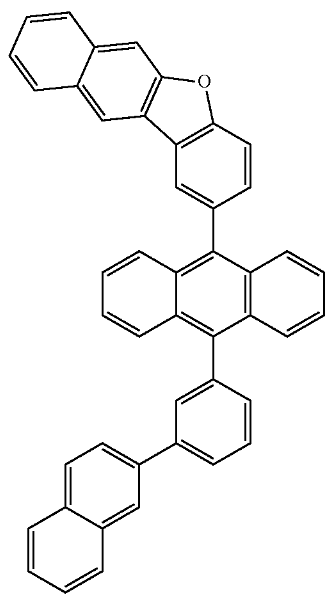
-continued
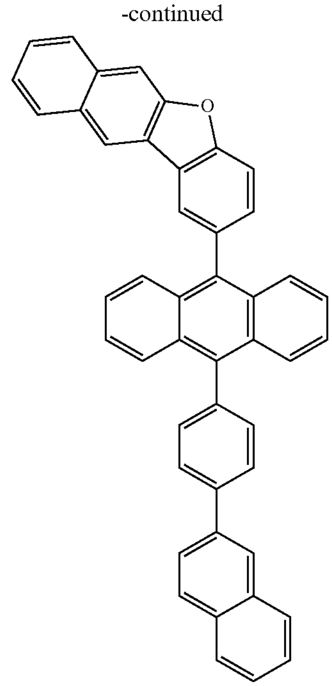
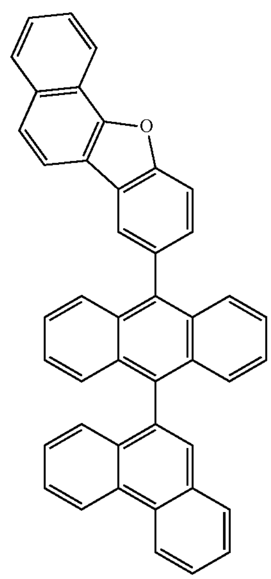

-continued
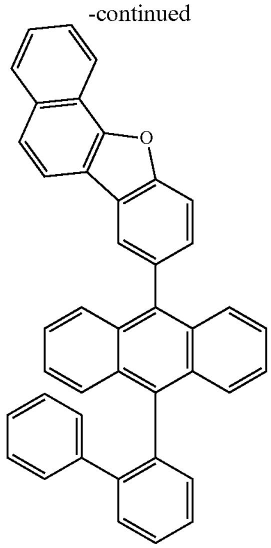
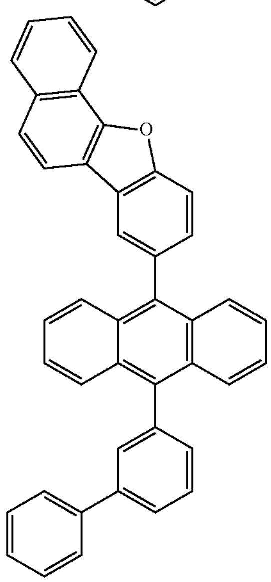
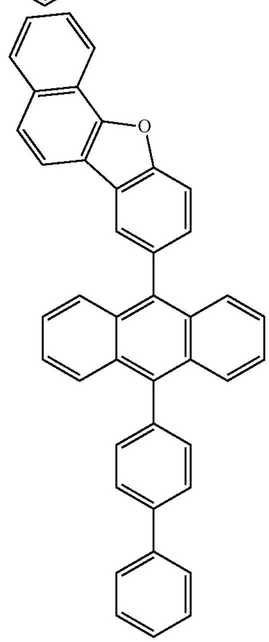
-continued
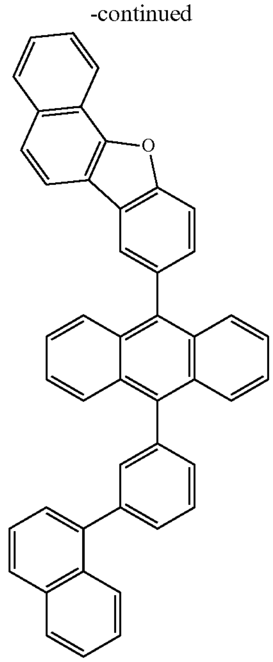
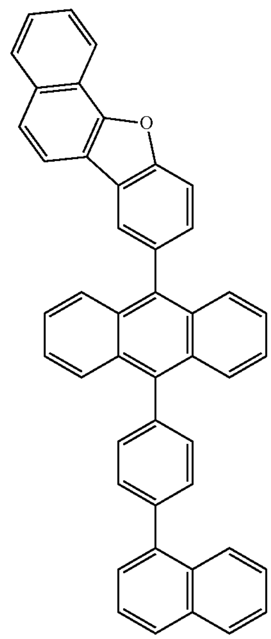

-continued
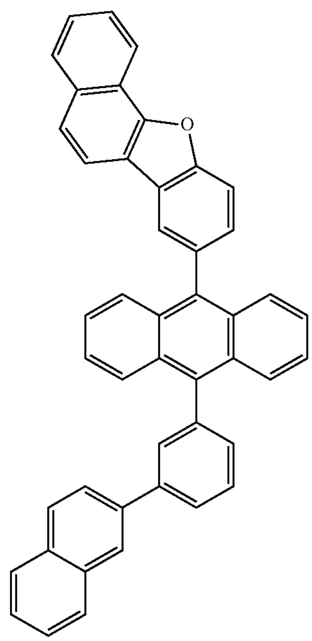
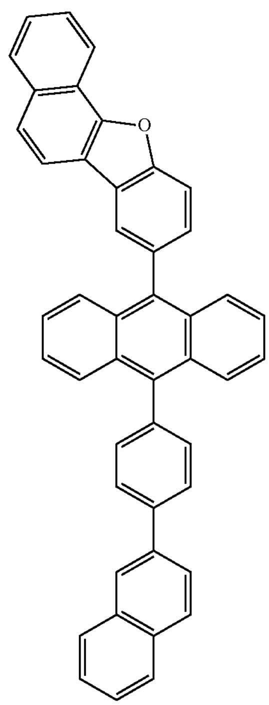
-continued
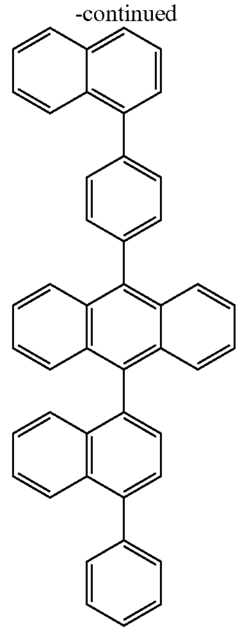
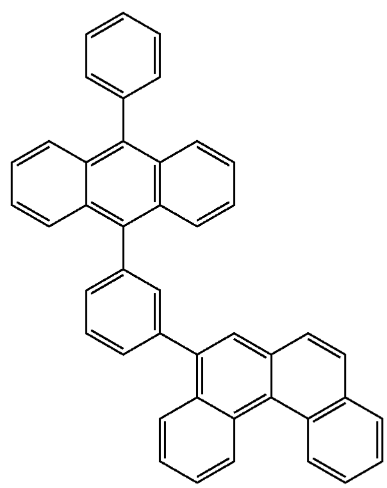
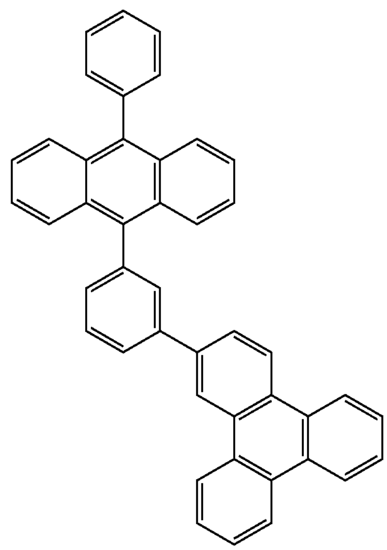

-continued
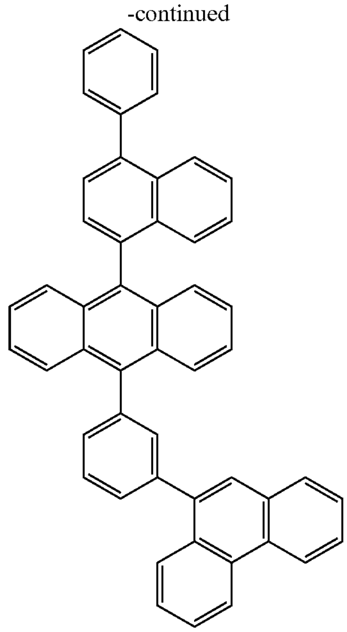
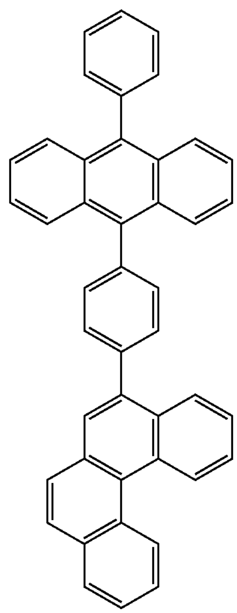
-continued
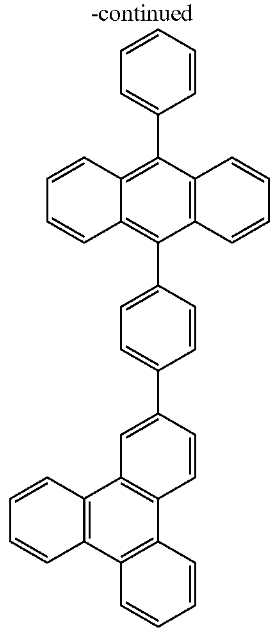
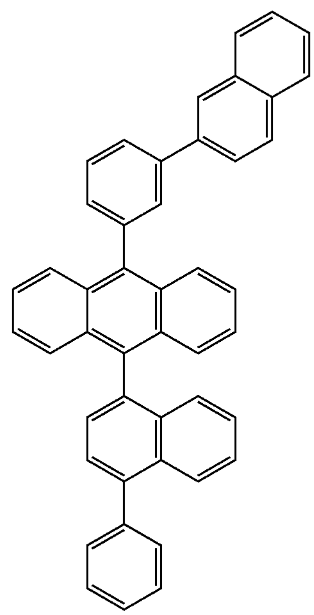

-continued
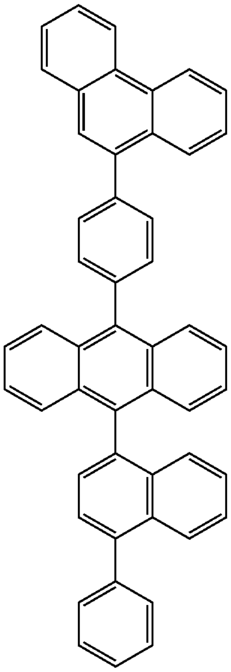
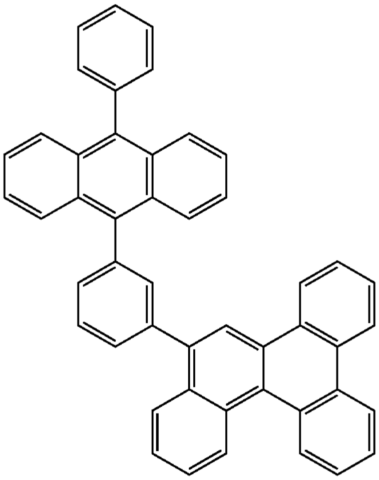
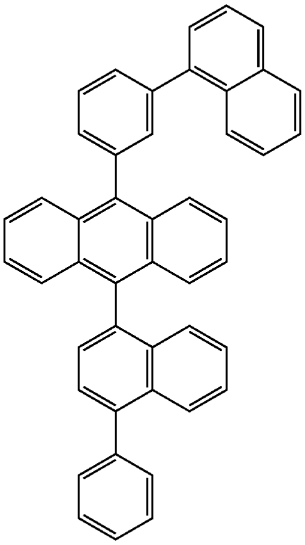
-continued
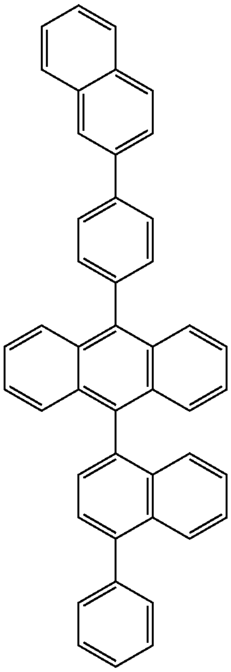
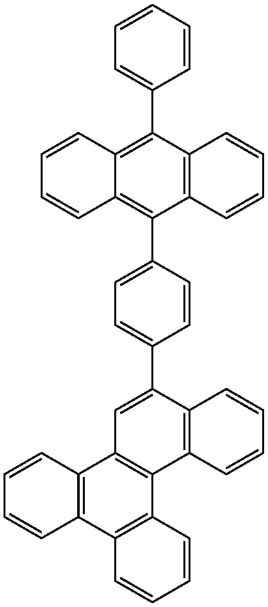
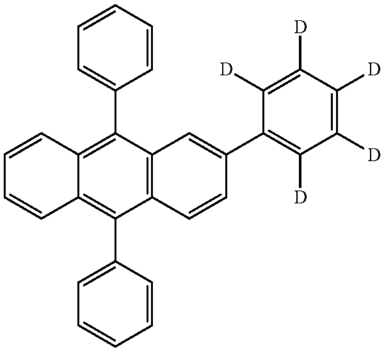

-continued
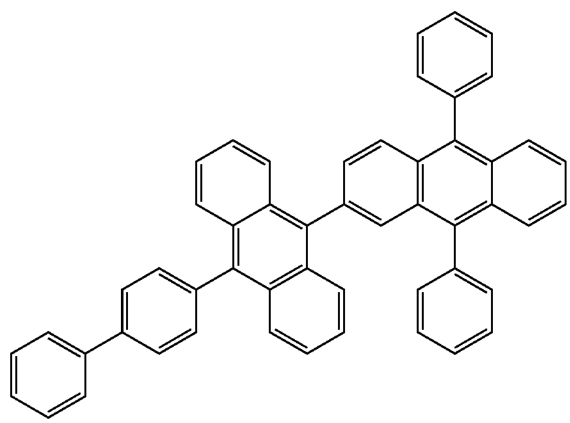
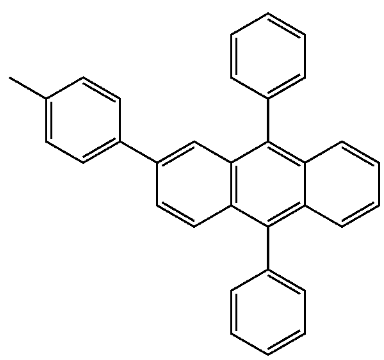
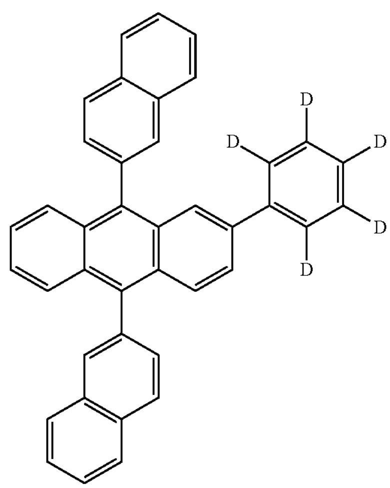
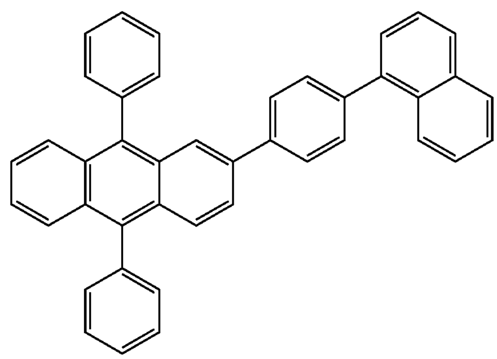
-continued
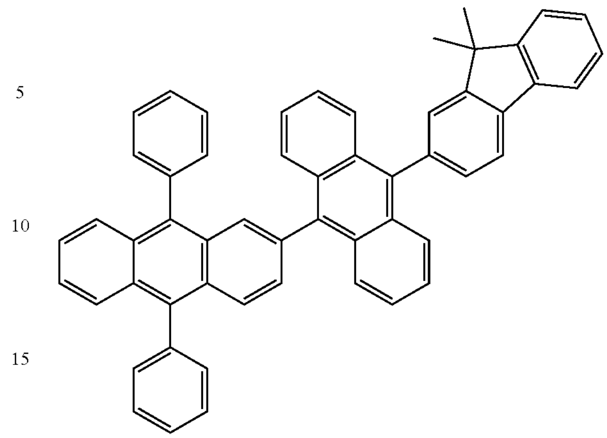
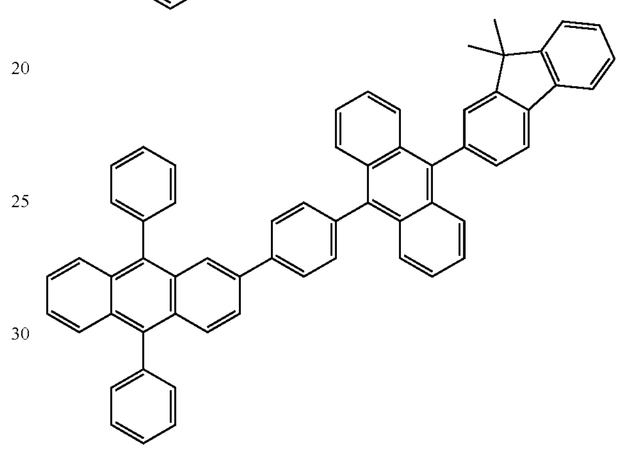
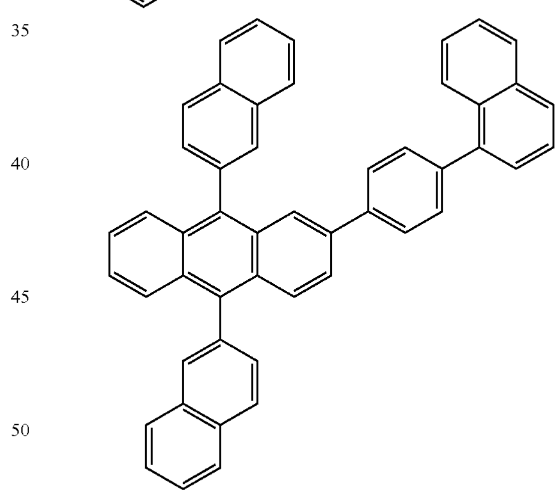
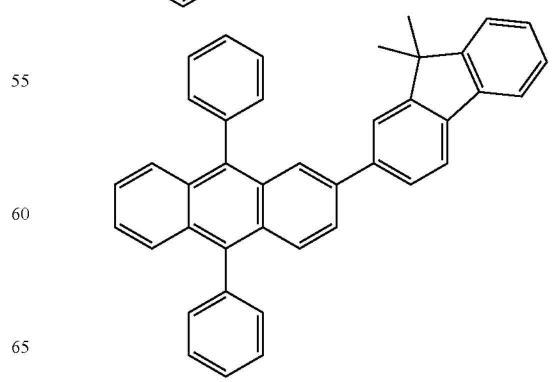

-continued
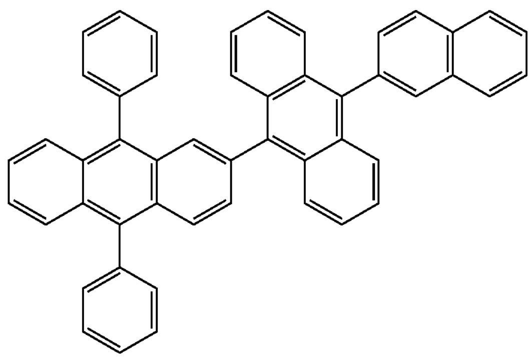
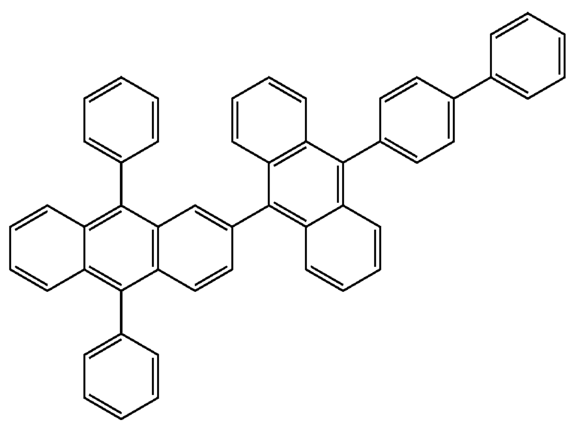
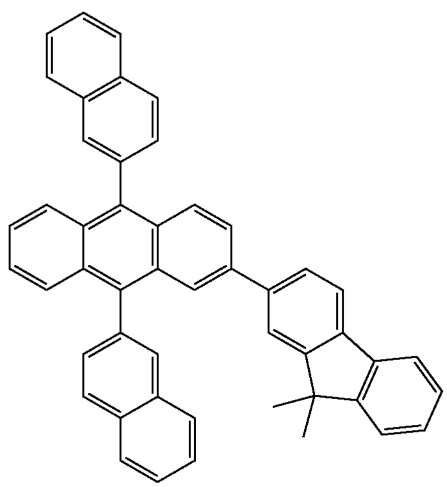
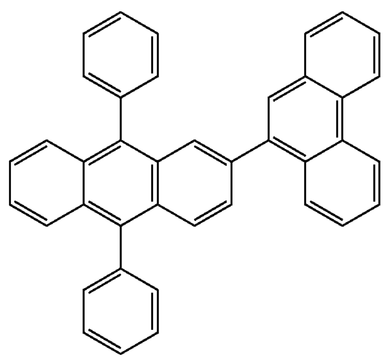
-continued
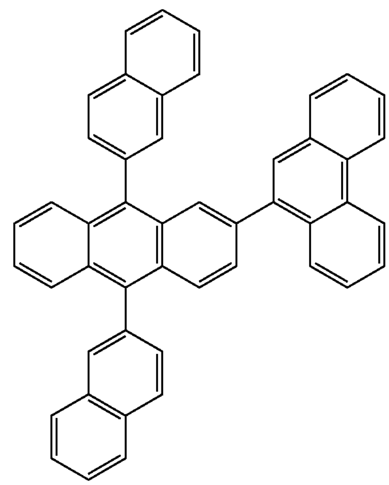
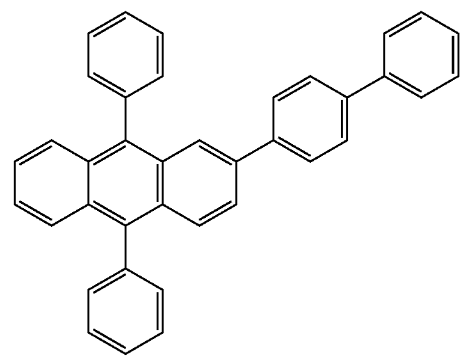
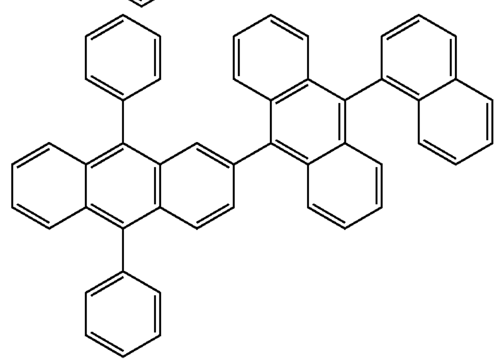
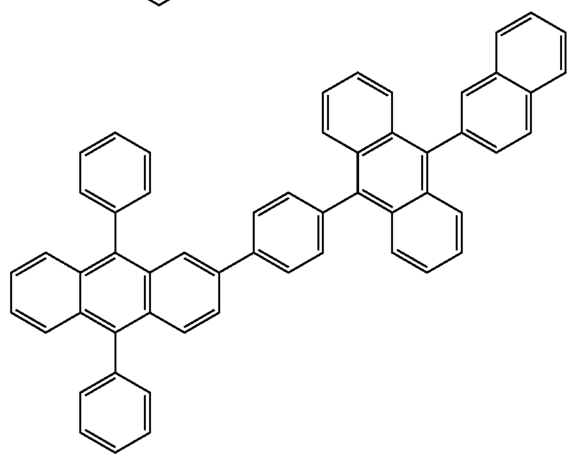

-continued
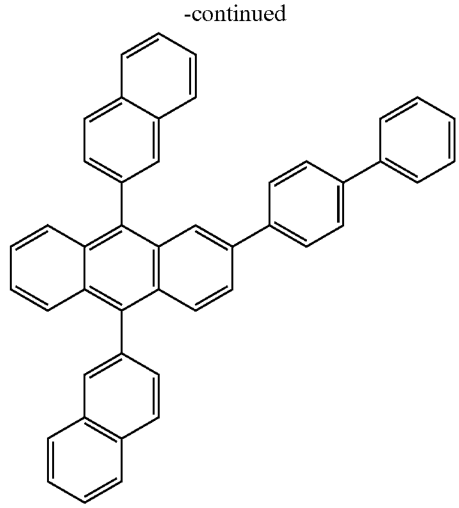
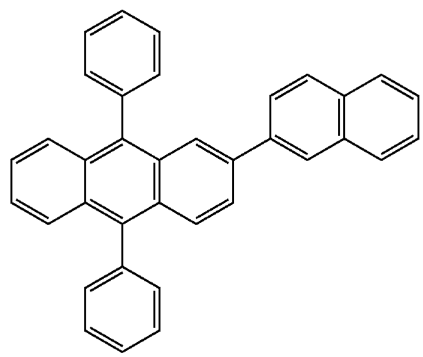
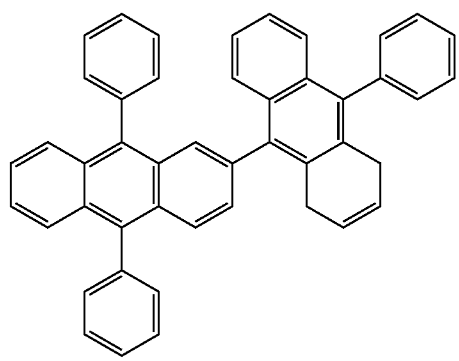
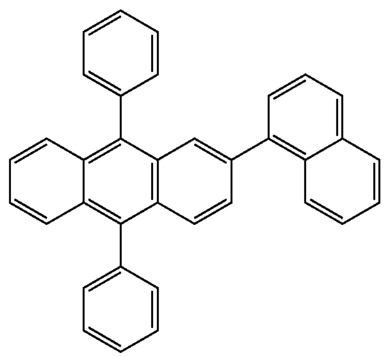
-continued
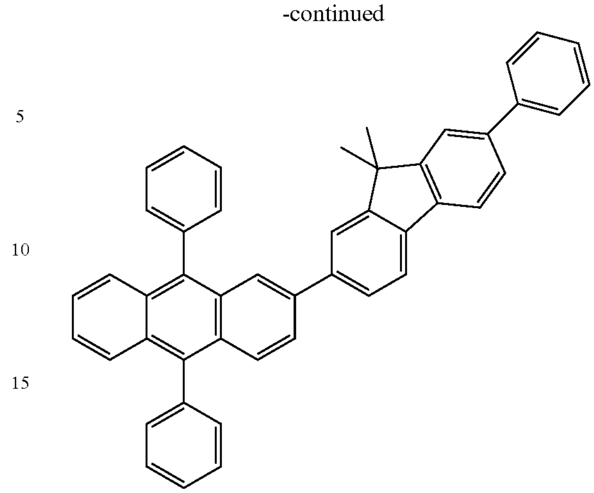
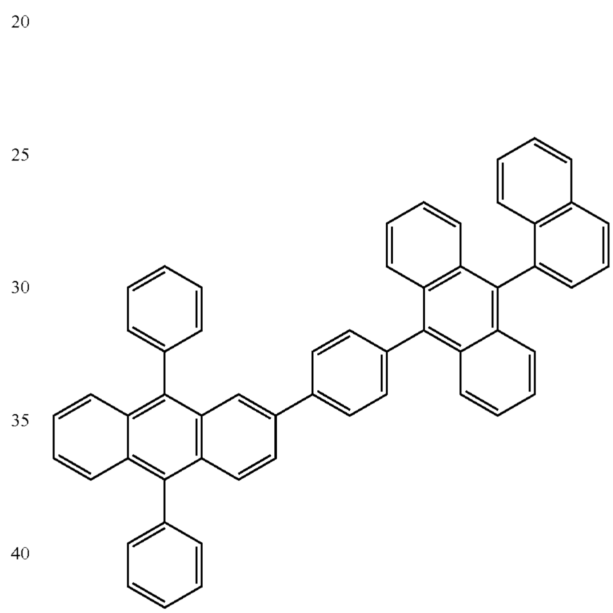
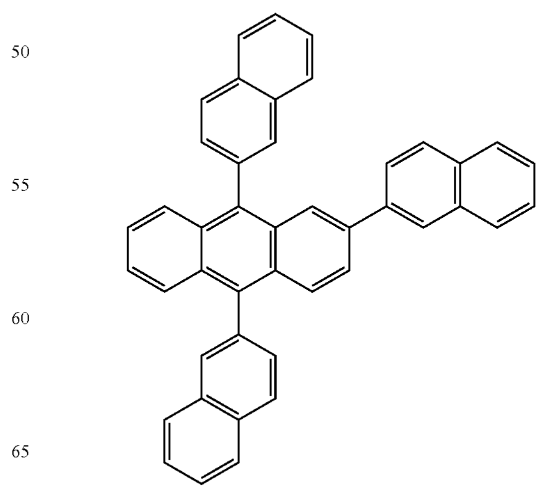

-continued
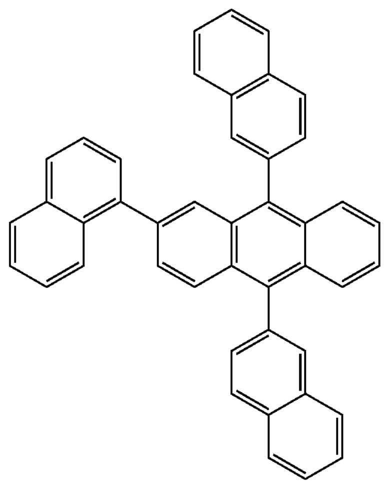
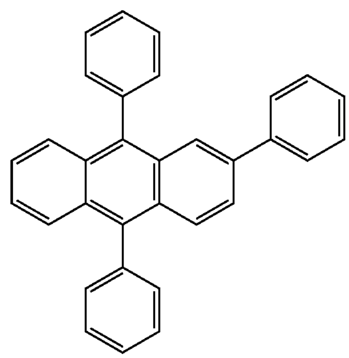
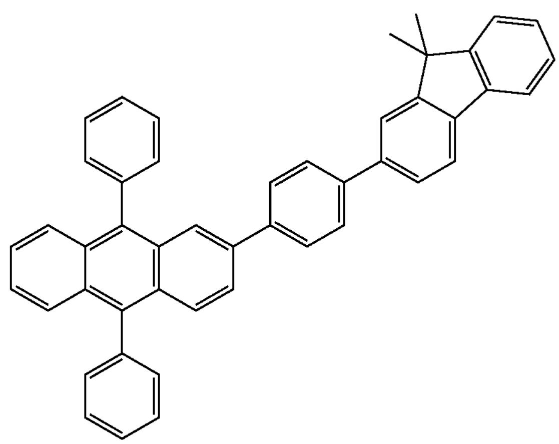
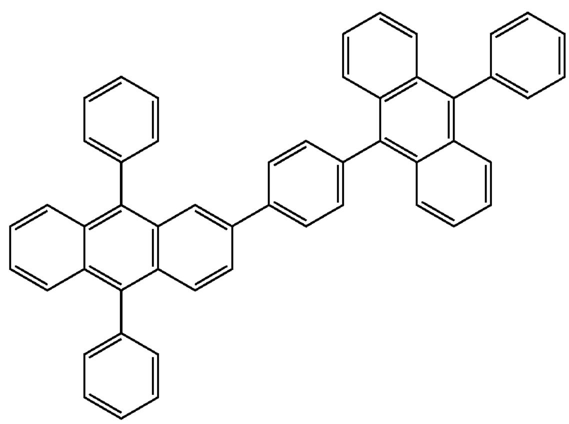
-continued
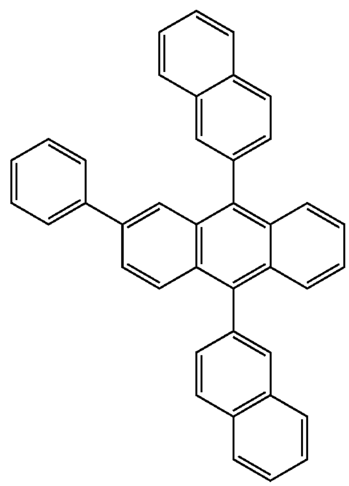
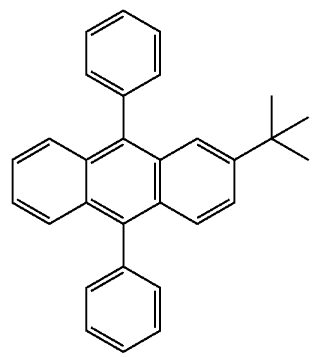
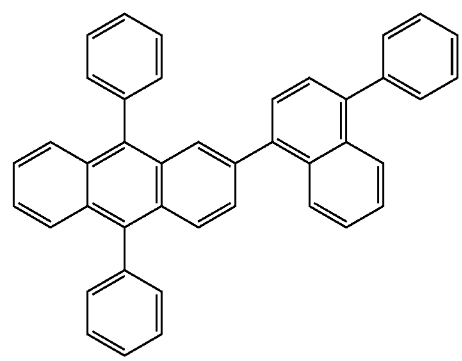
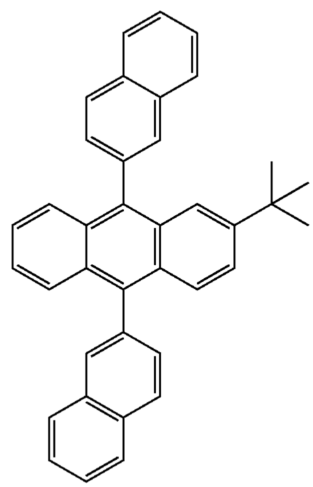

-continued
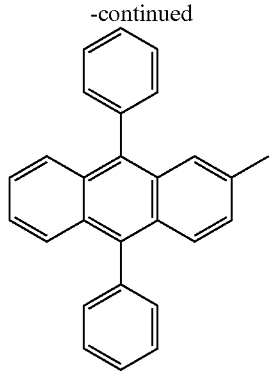
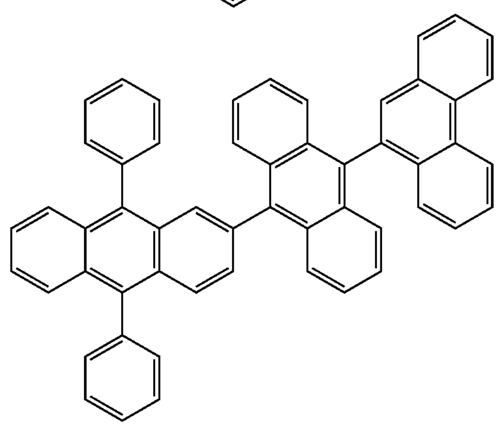
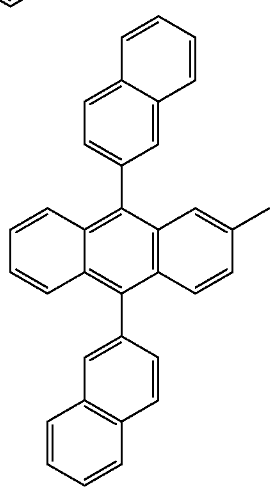
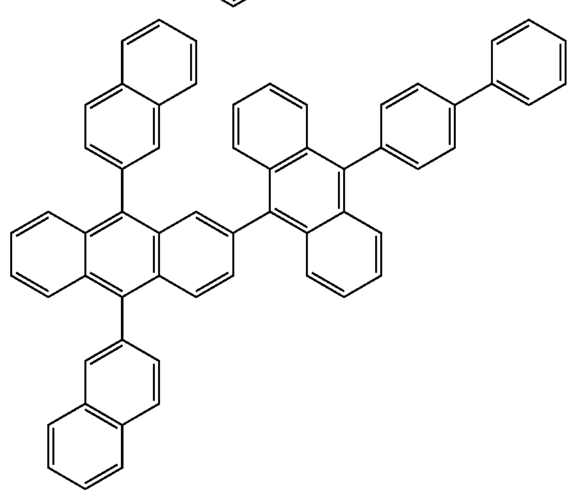
-continued
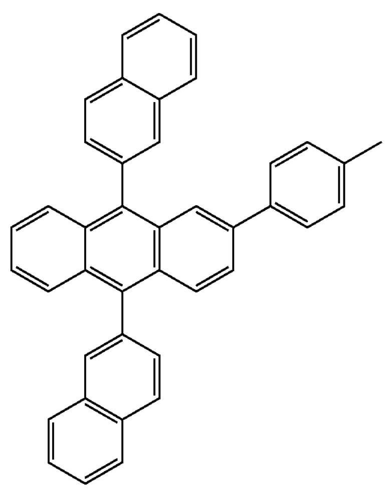
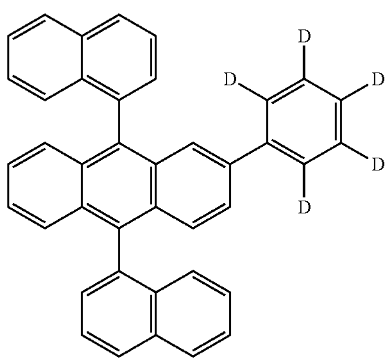
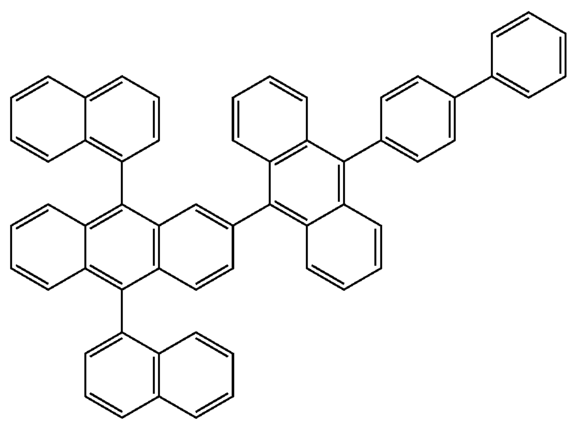

-continued
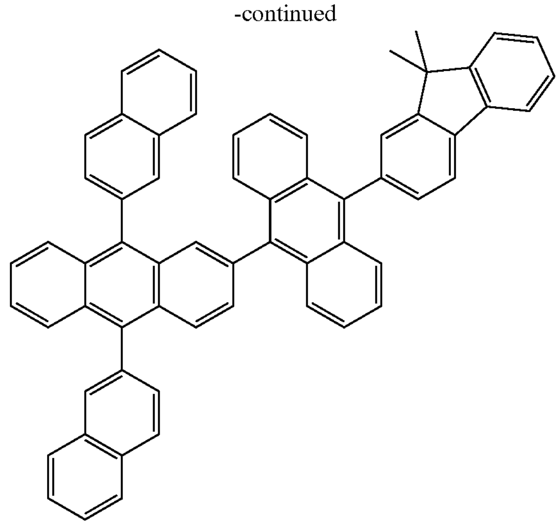
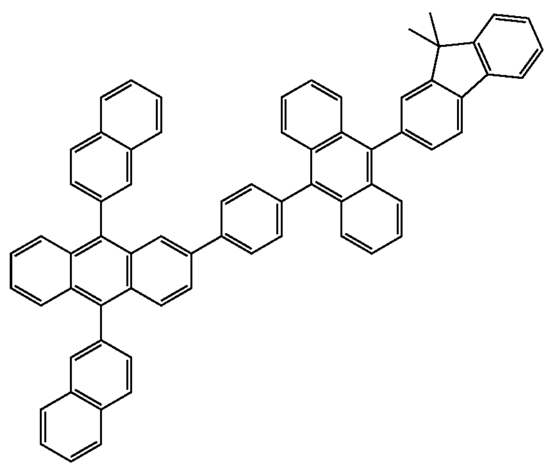
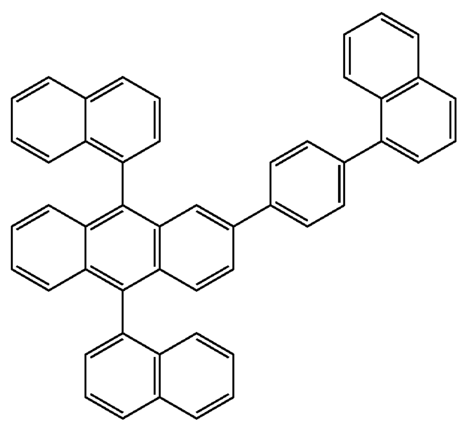
-continued
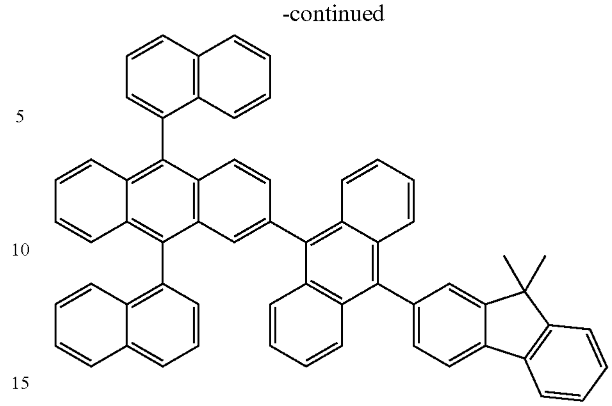
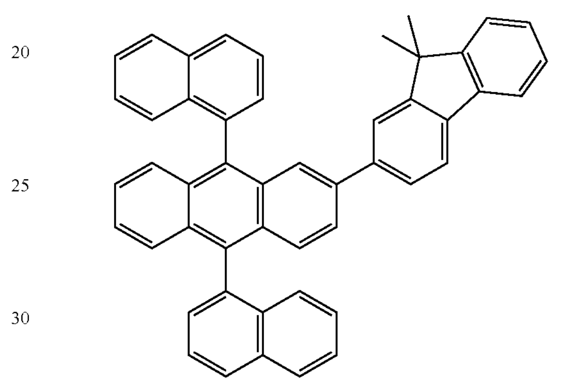
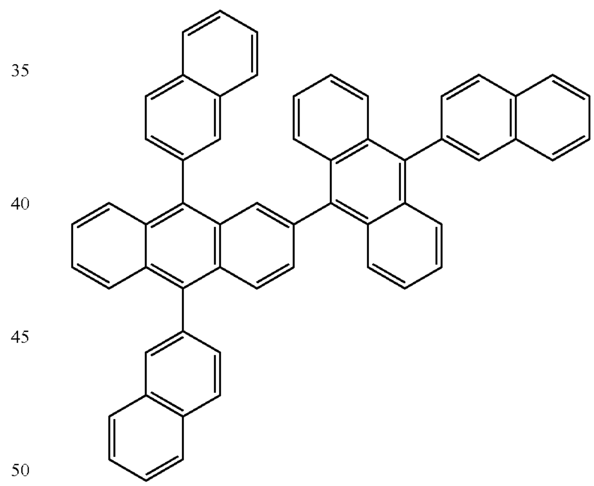
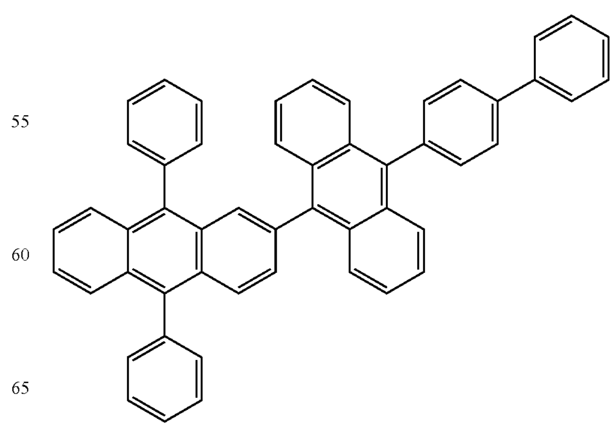

-continued
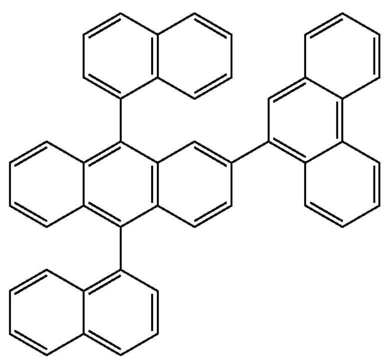
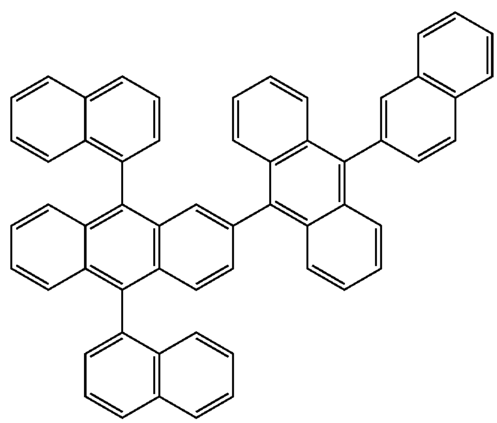
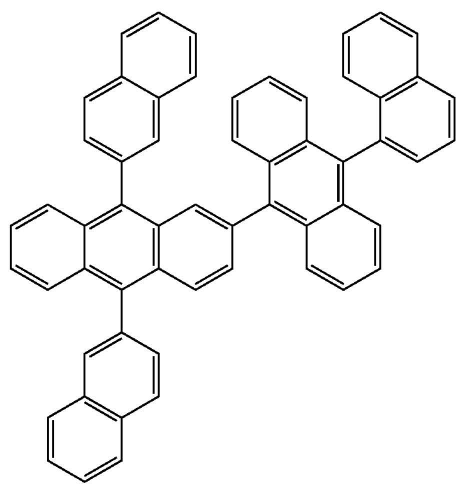
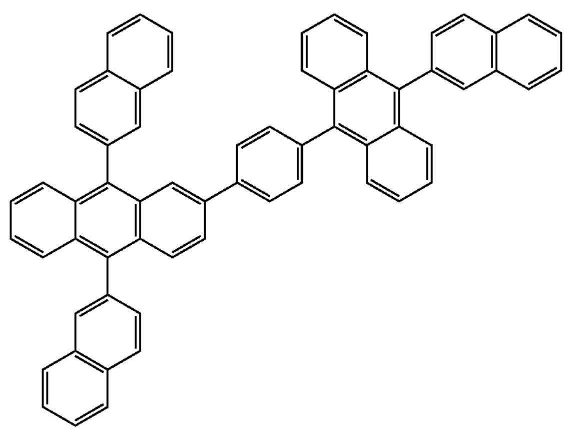
-continued
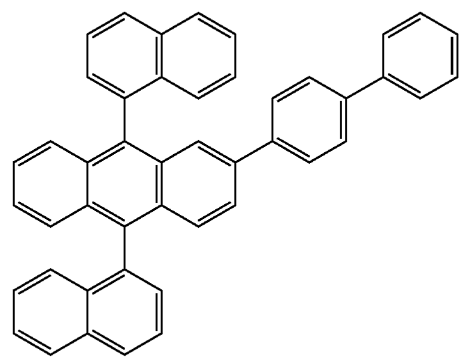
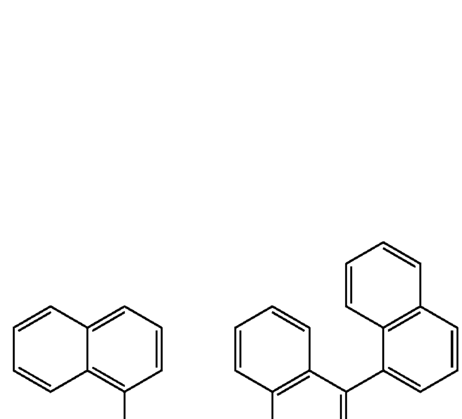
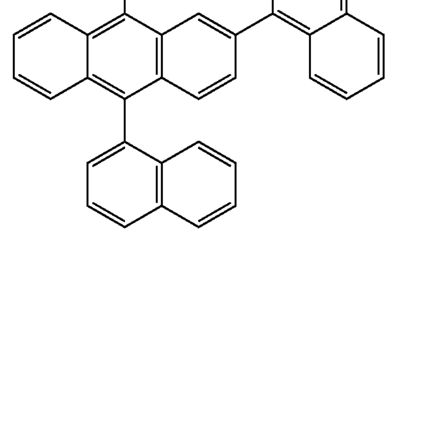
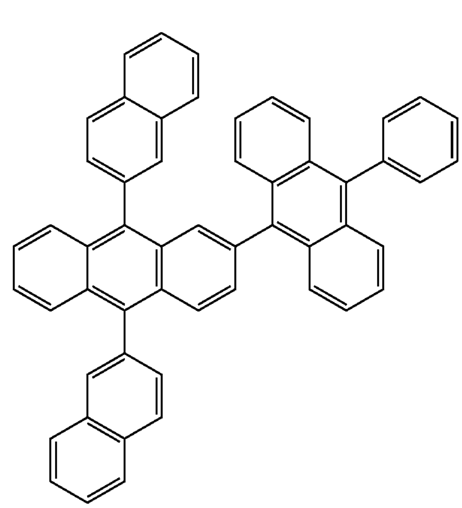

-continued
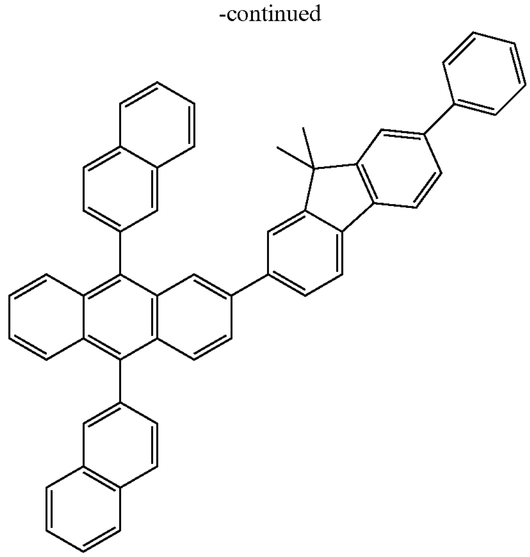
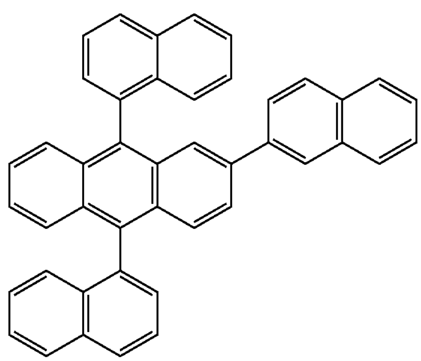
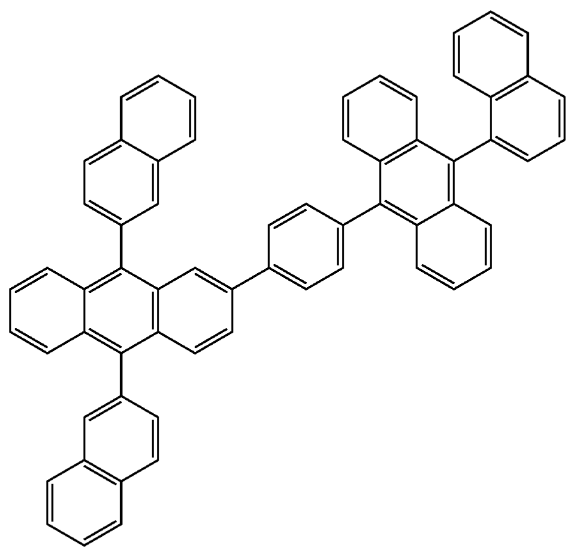
-continued
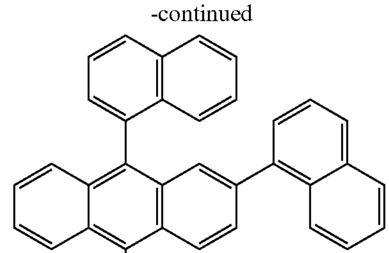
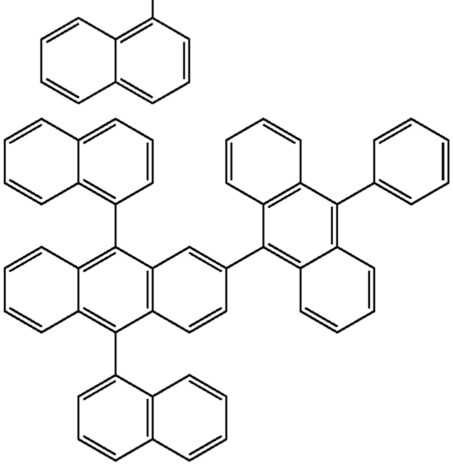
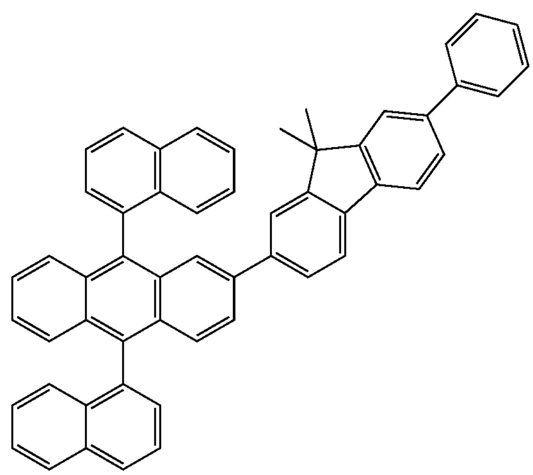
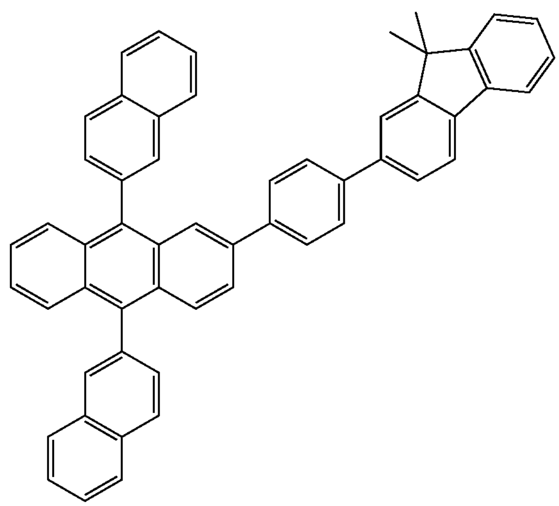

-continued
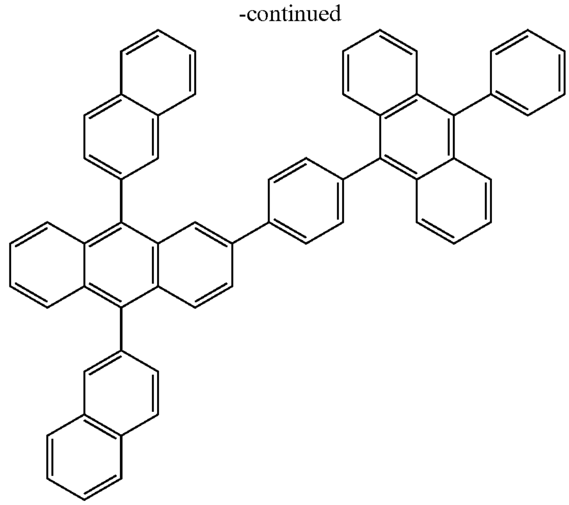
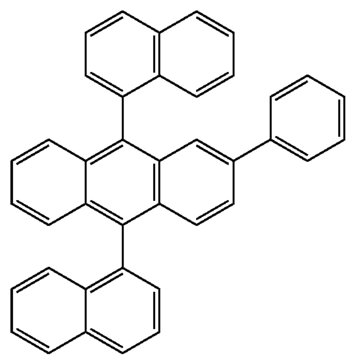
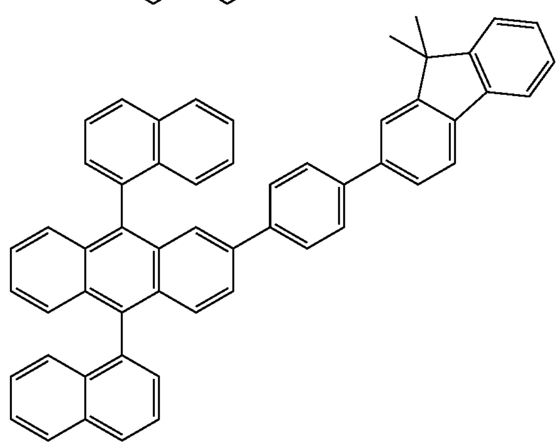
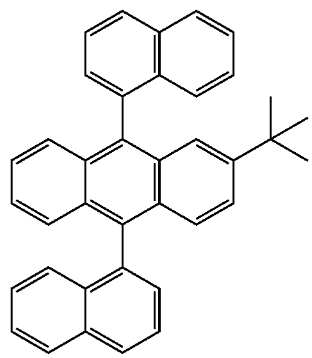
-continued
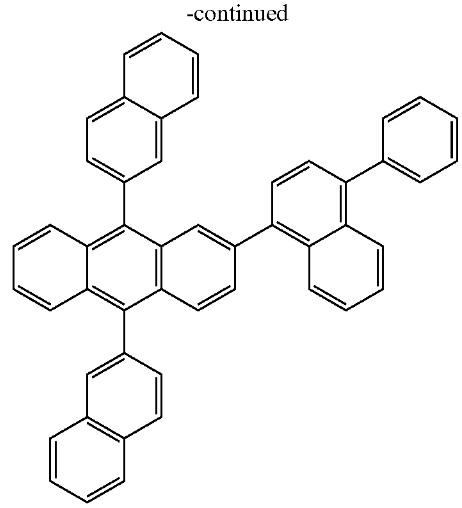
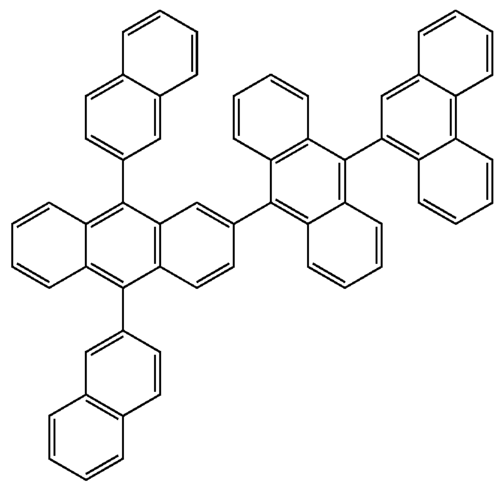
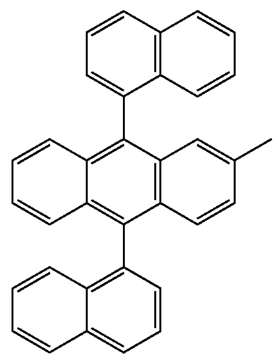
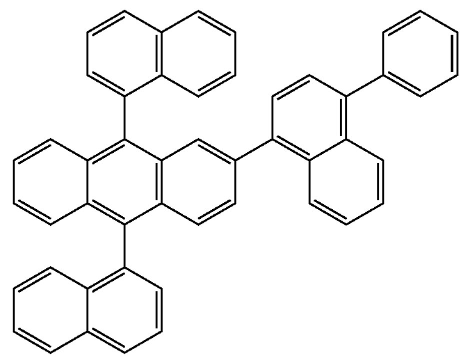

-continued
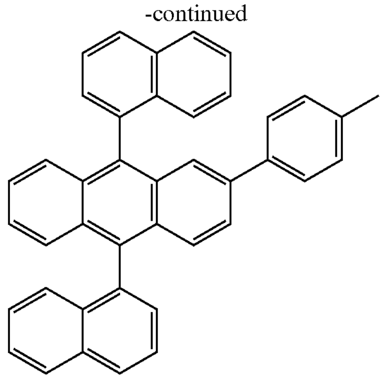
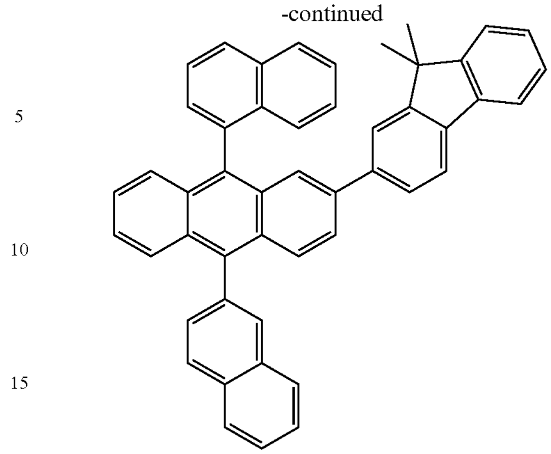
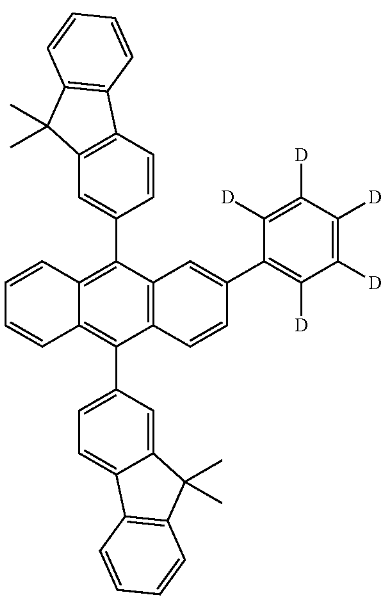
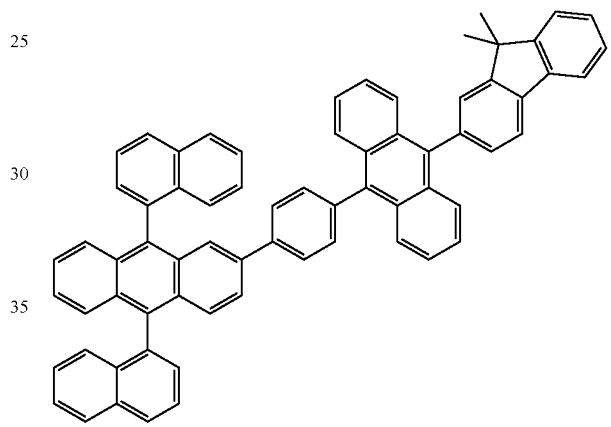
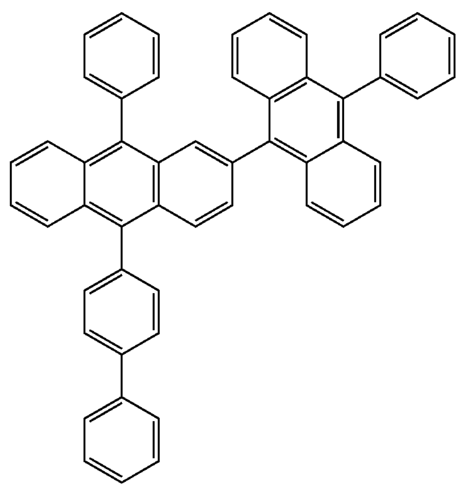
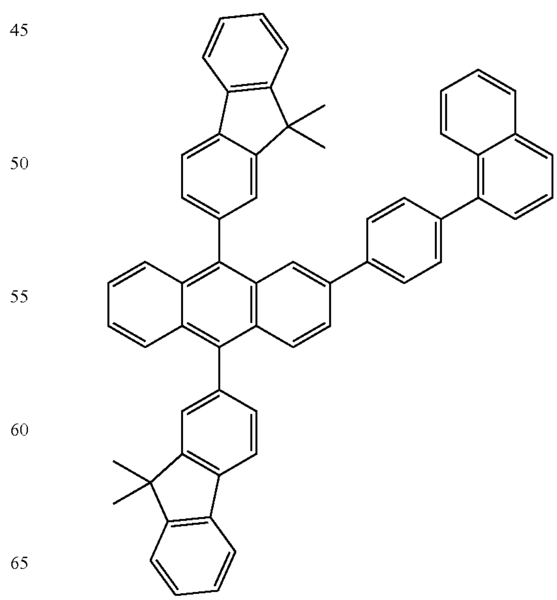

-continued
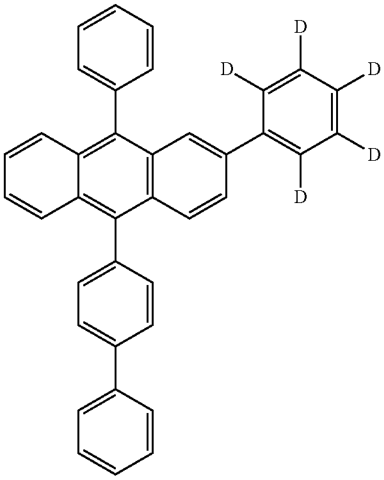
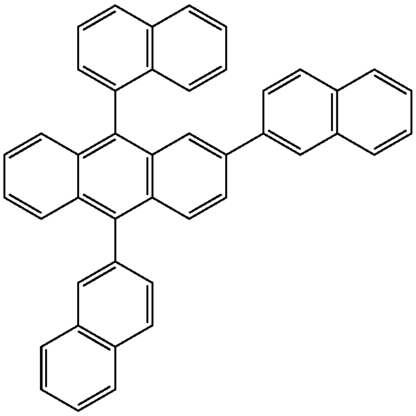
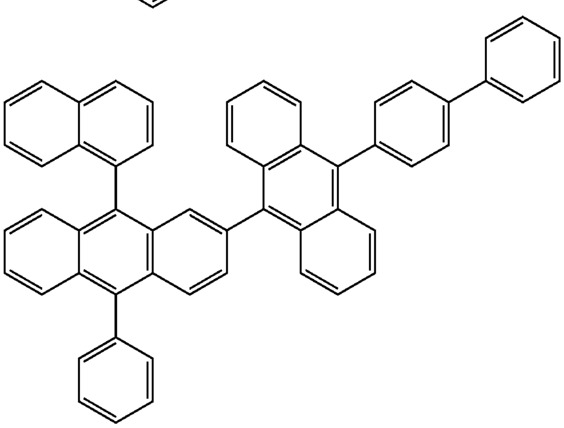
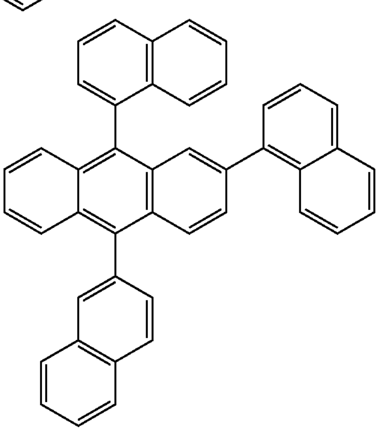
-continued
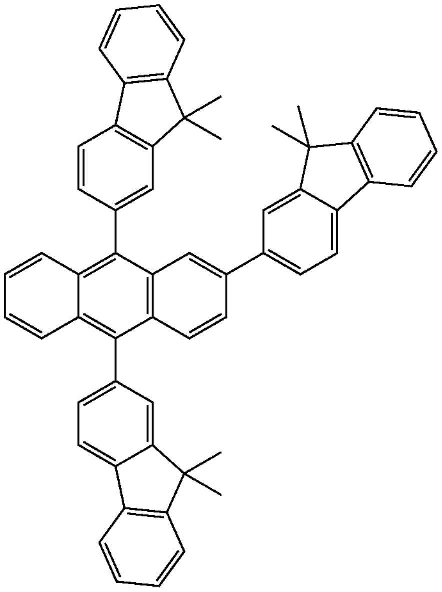
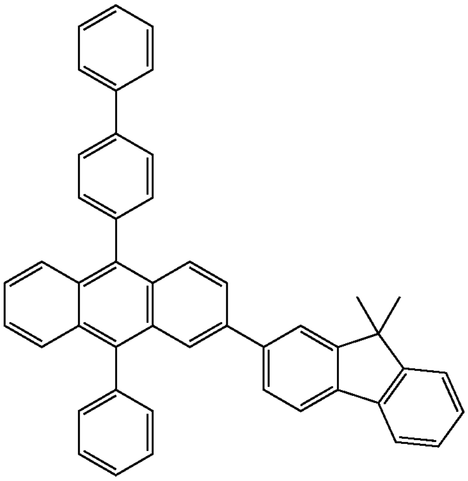
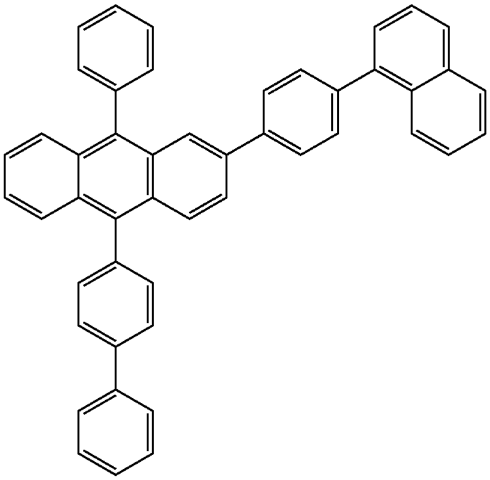

-continued
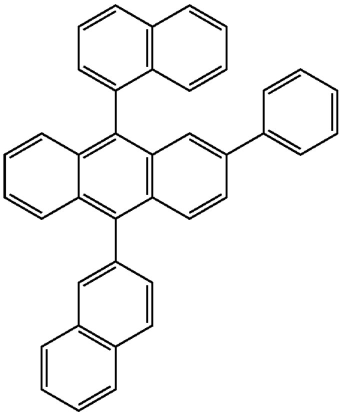
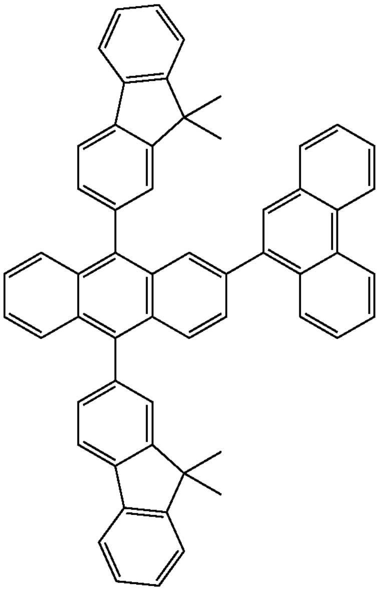
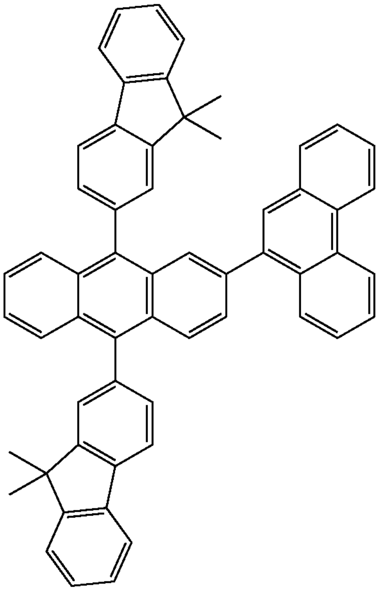
-continued
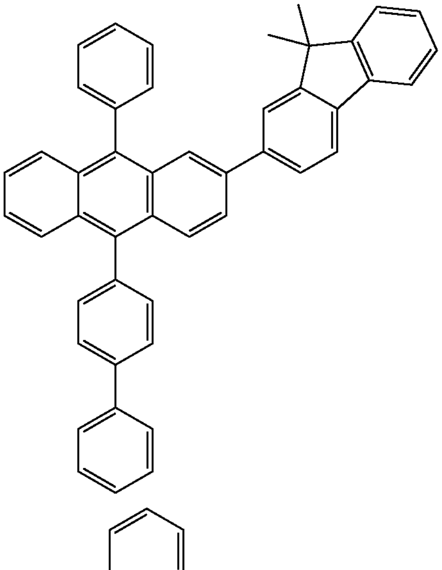
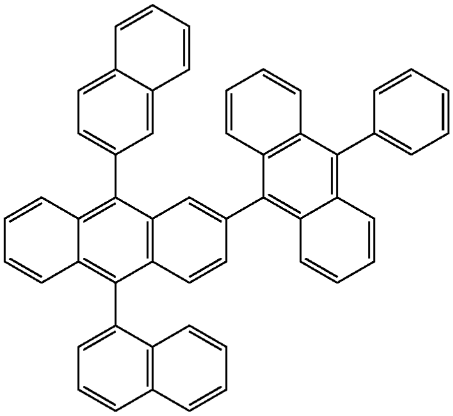
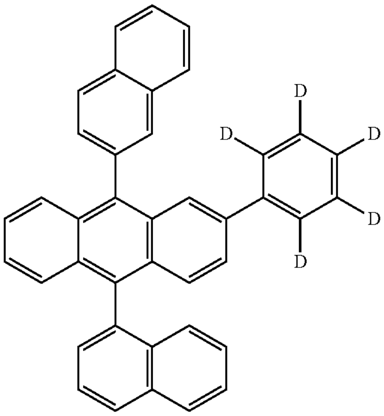
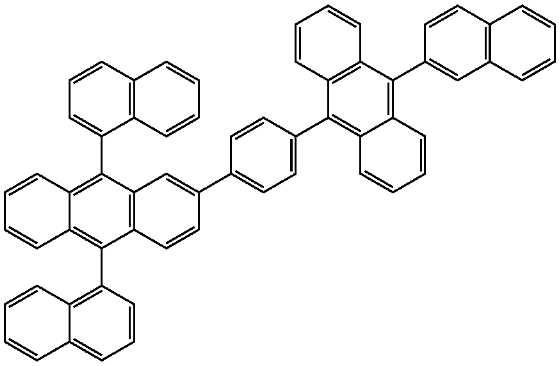

-continued
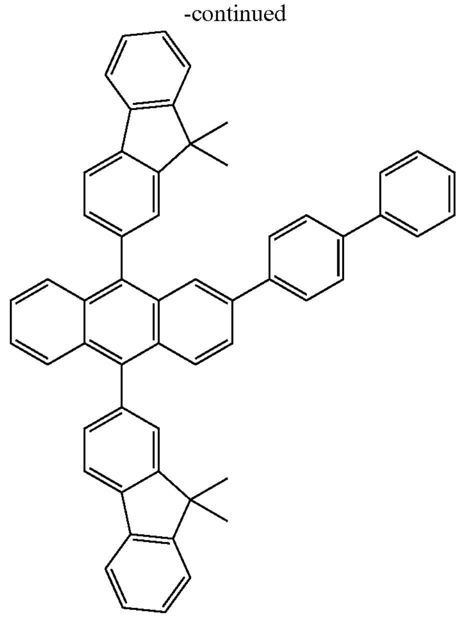
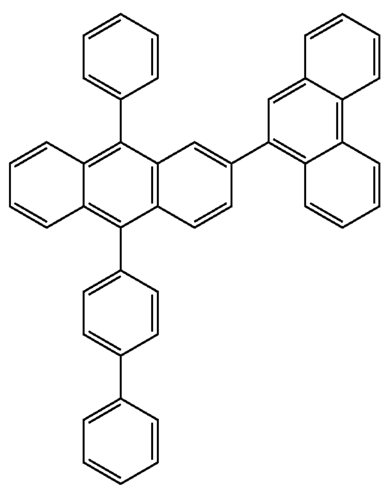
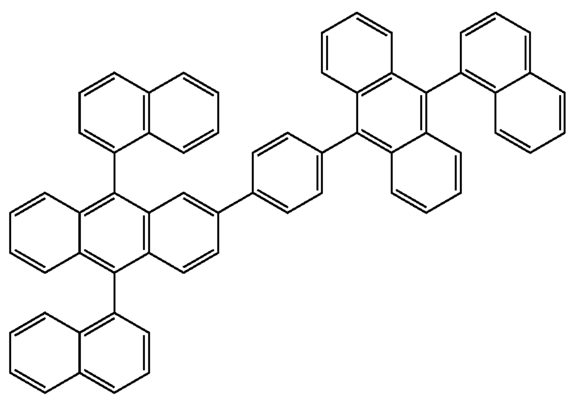
-continued
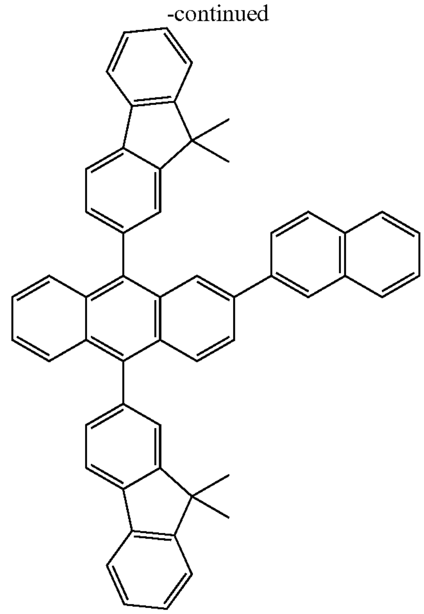
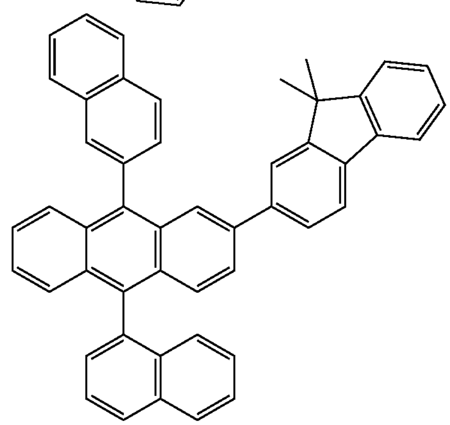
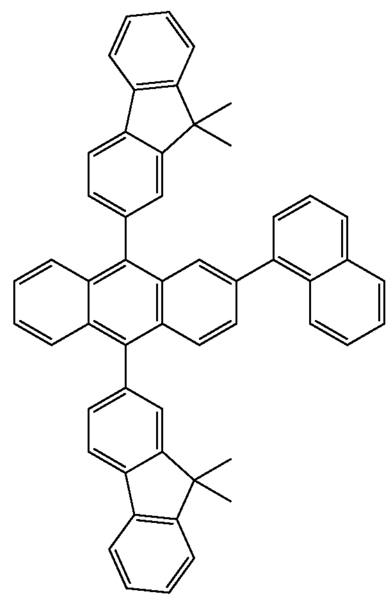

-continued
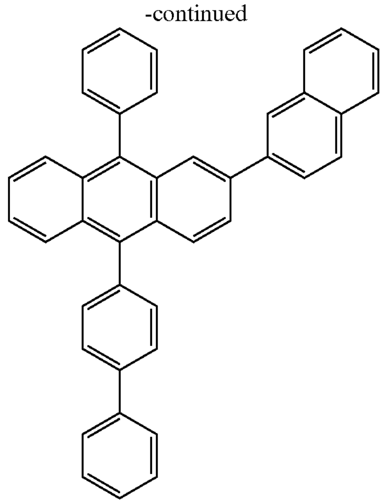
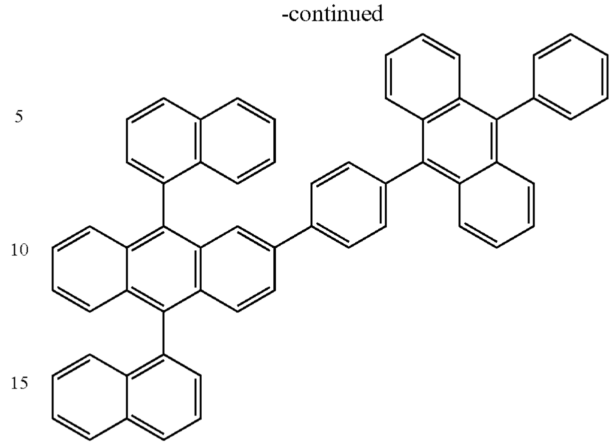
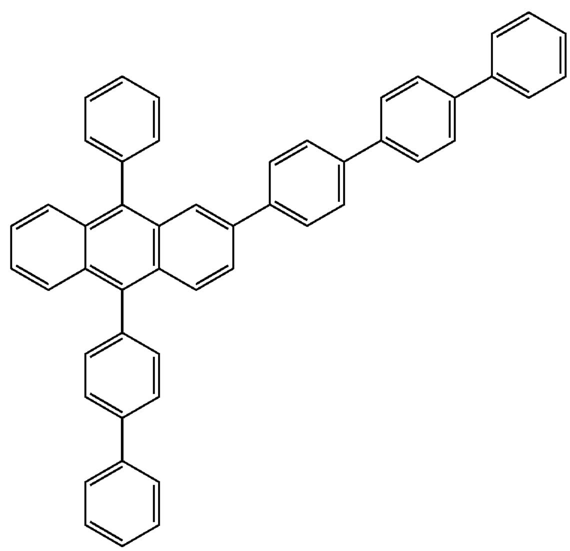
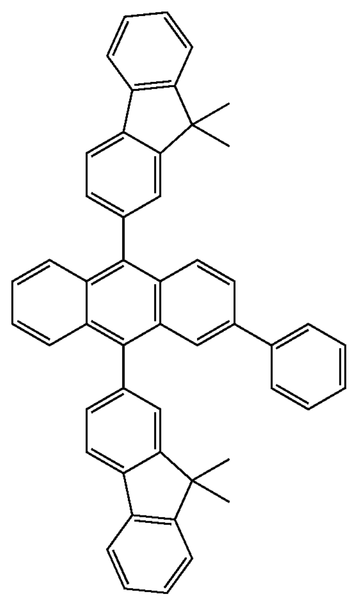
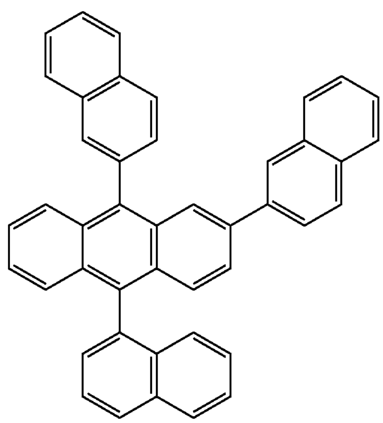
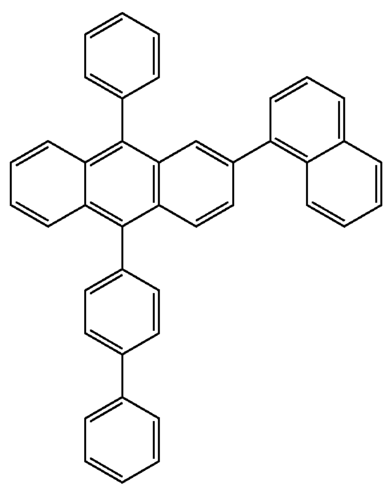
-continued -continued
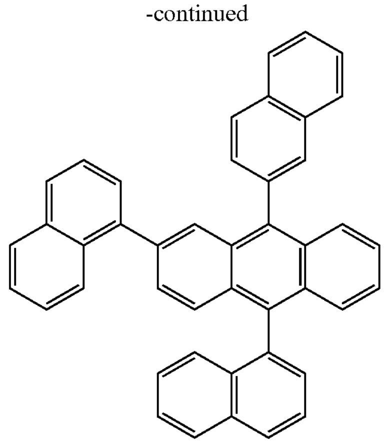
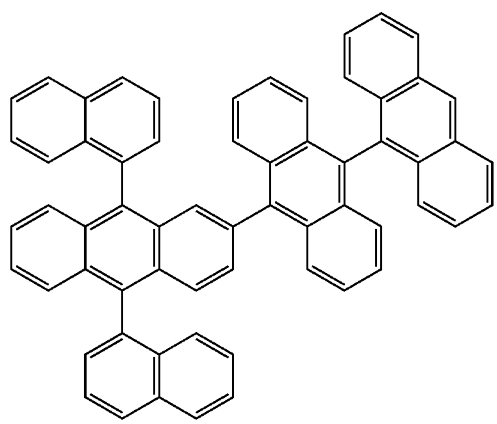
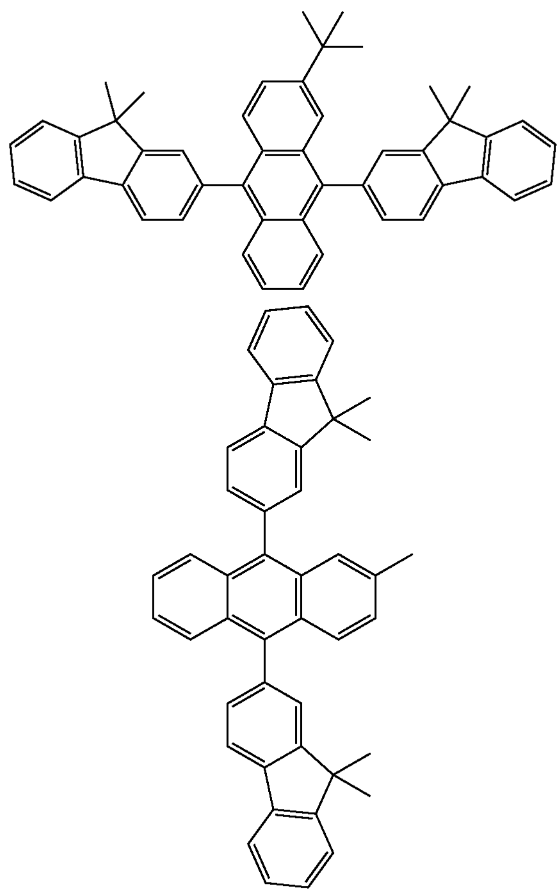
-continued
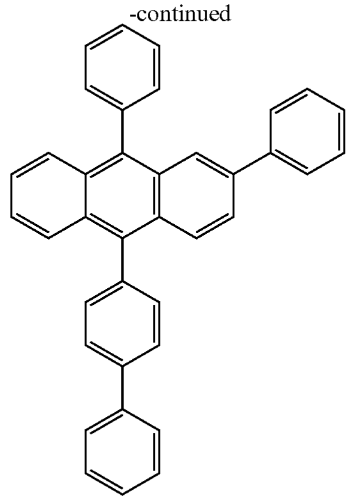
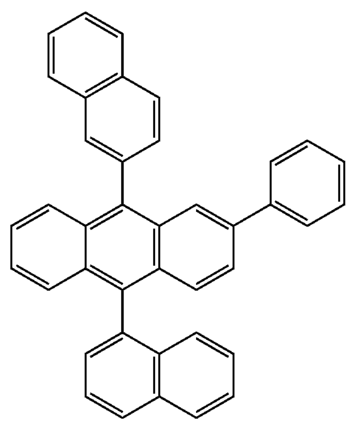
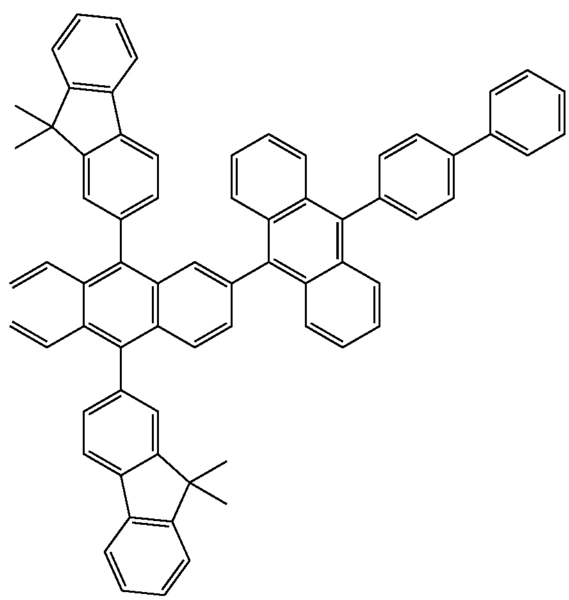

-continued
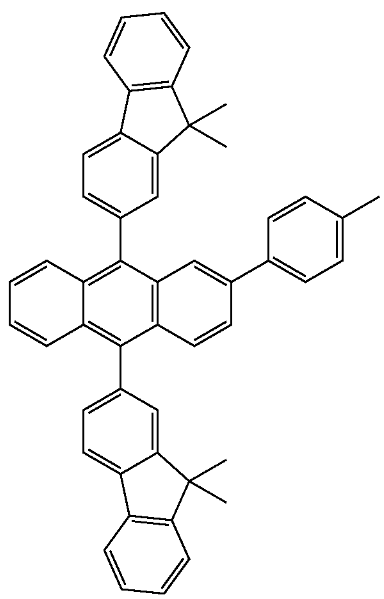
-continued
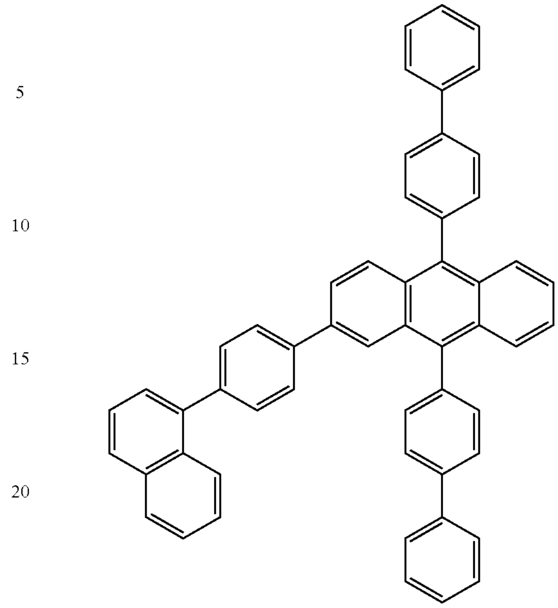
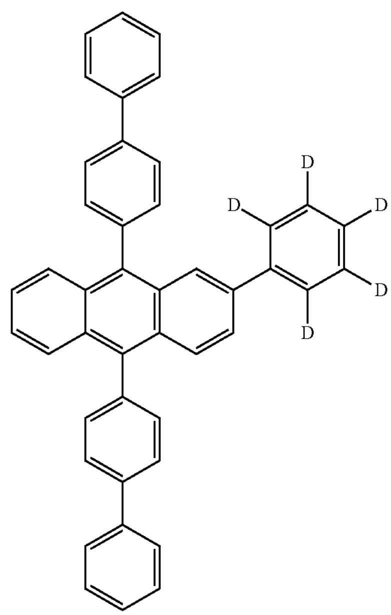
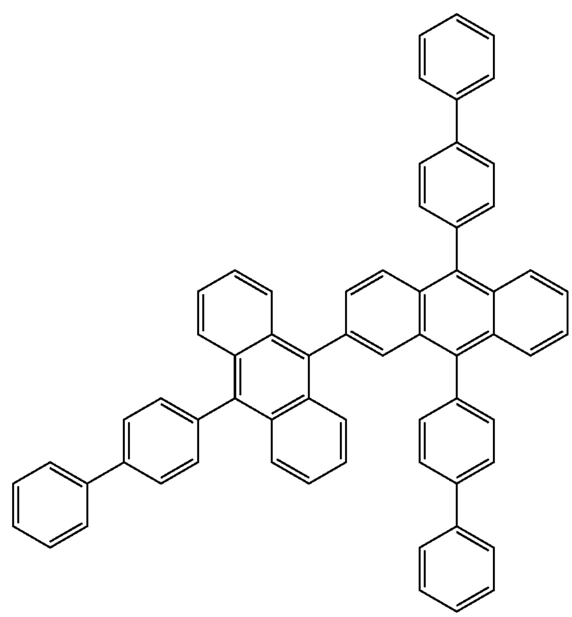

-continued
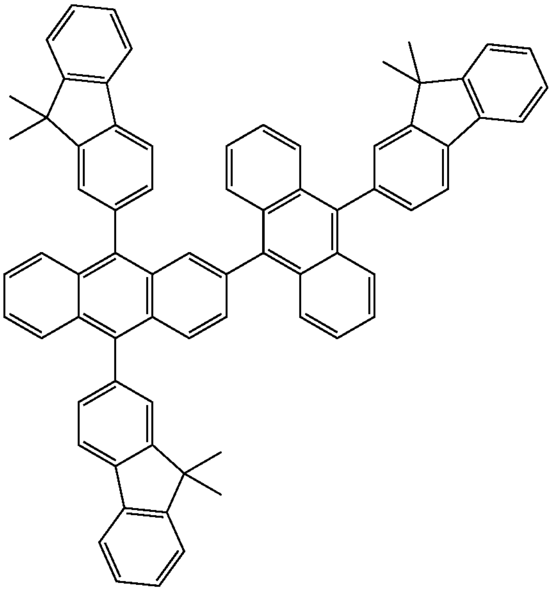
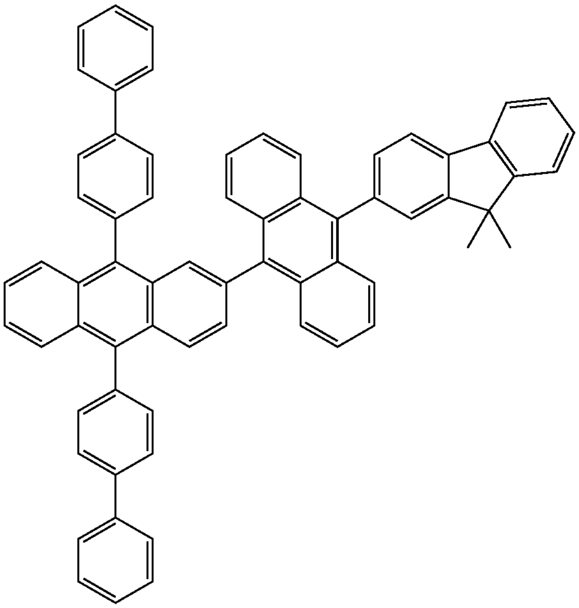
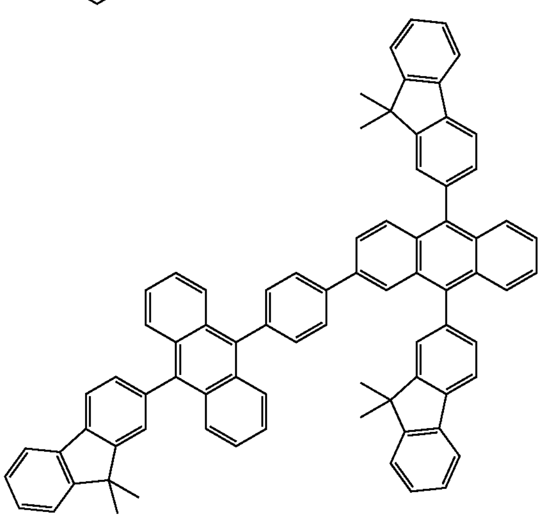
-continued
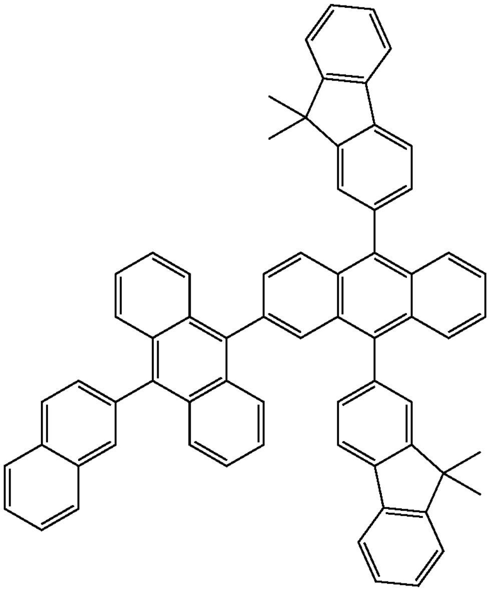
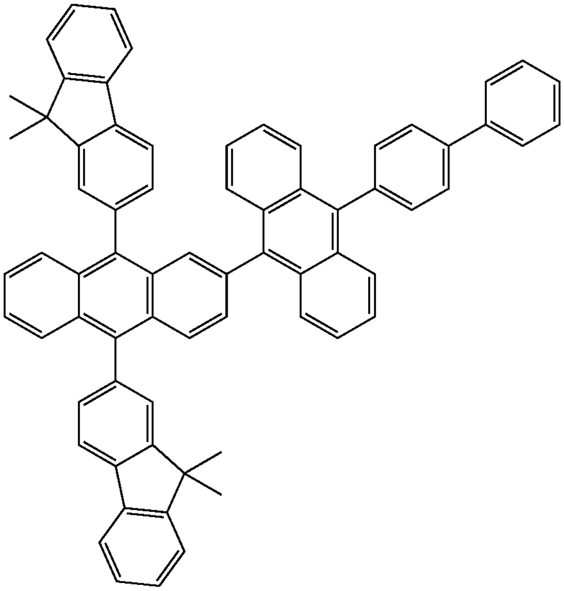

-continued
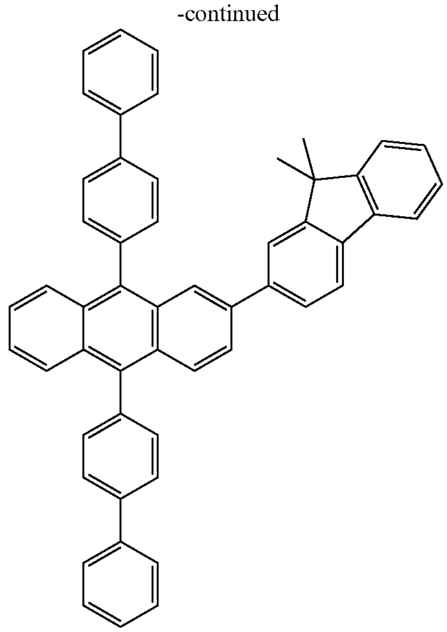
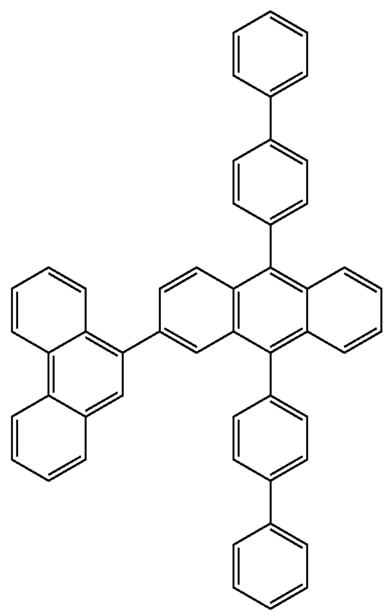
-continued
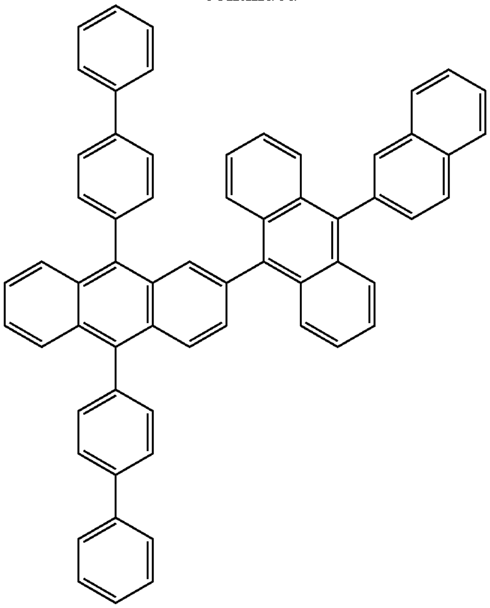
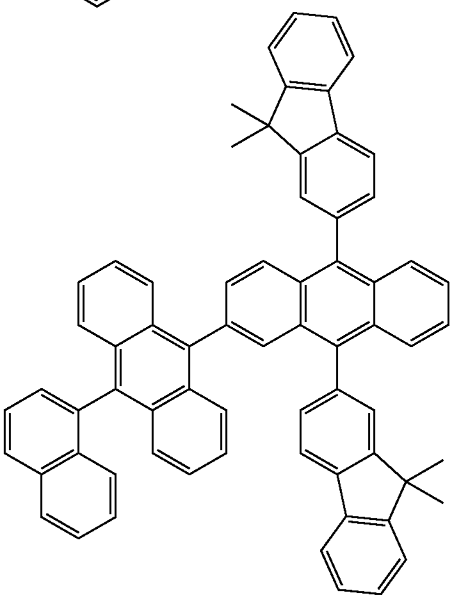
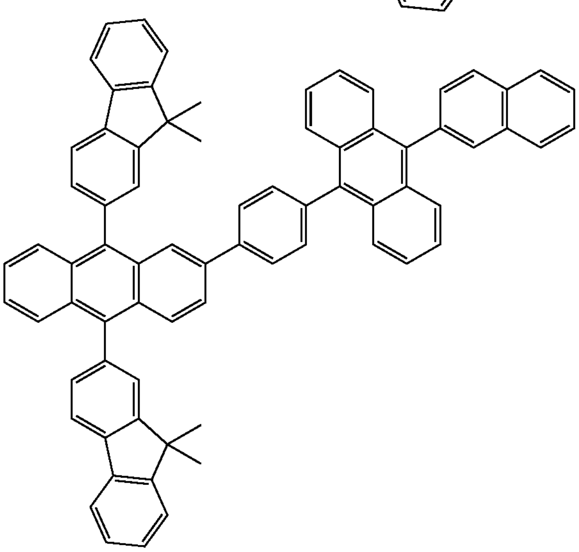

-continued
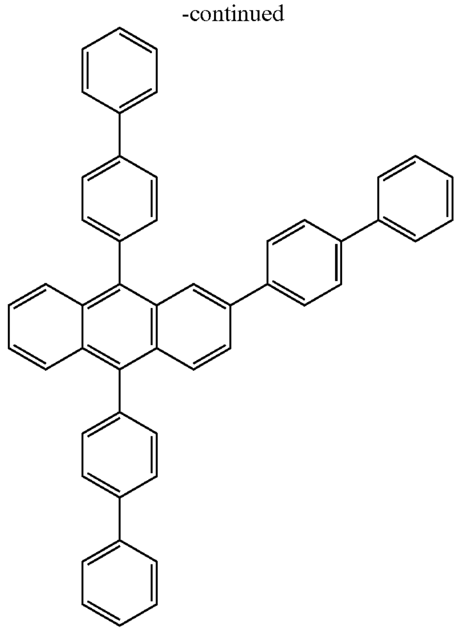
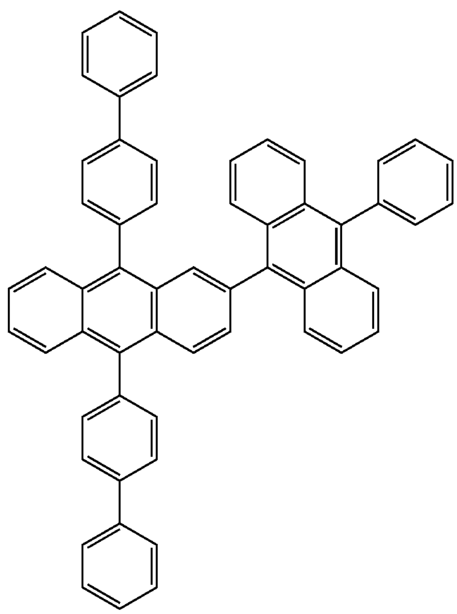
-continued
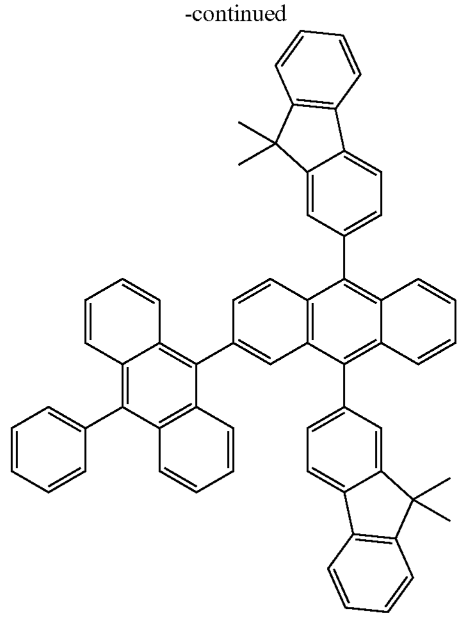
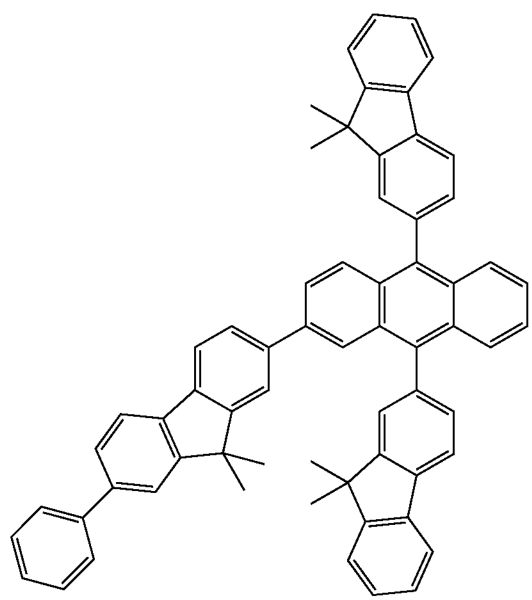

-continued
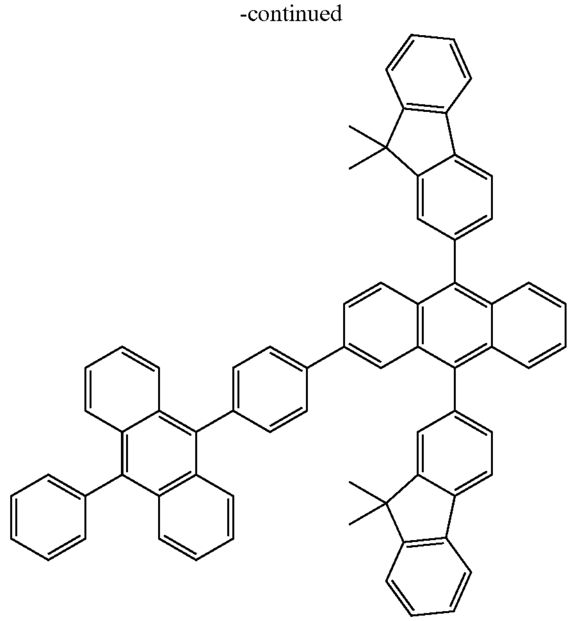
-continued
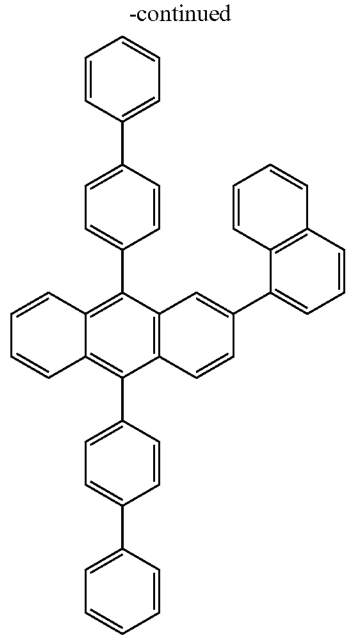
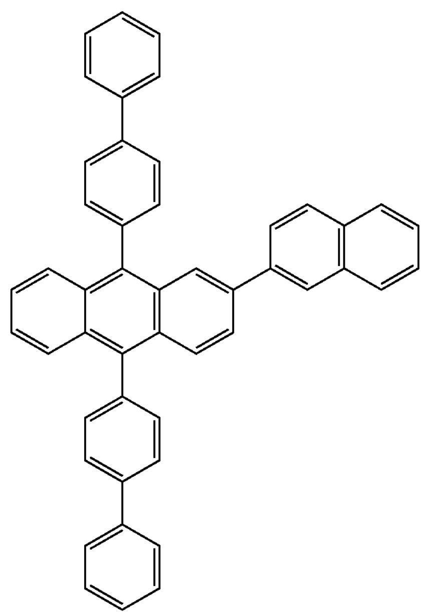
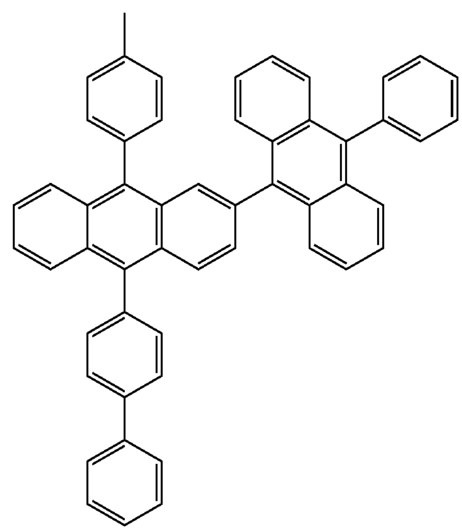

-continued
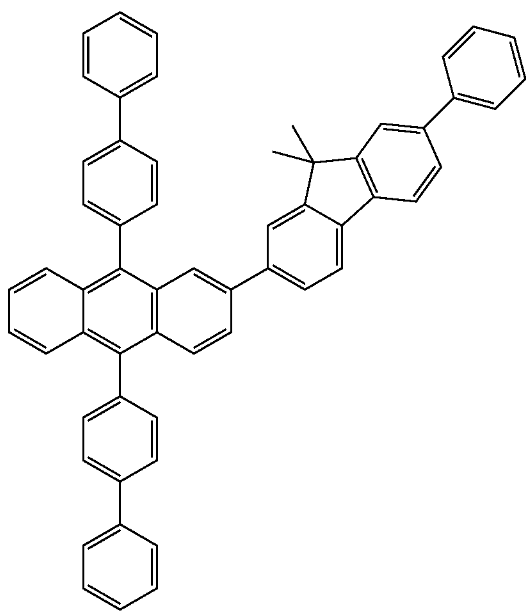
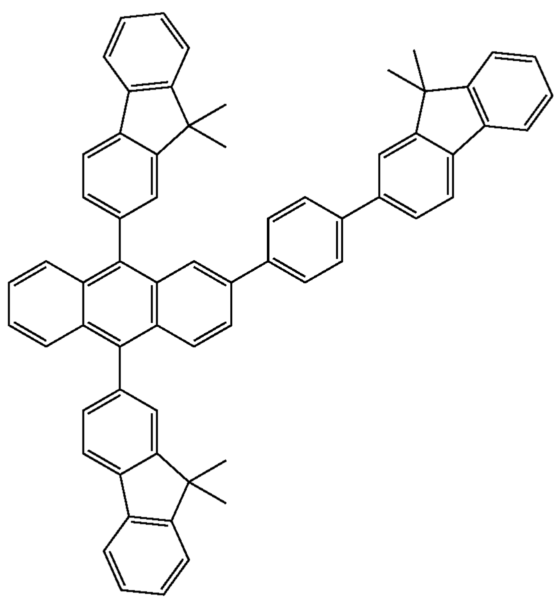
-continued
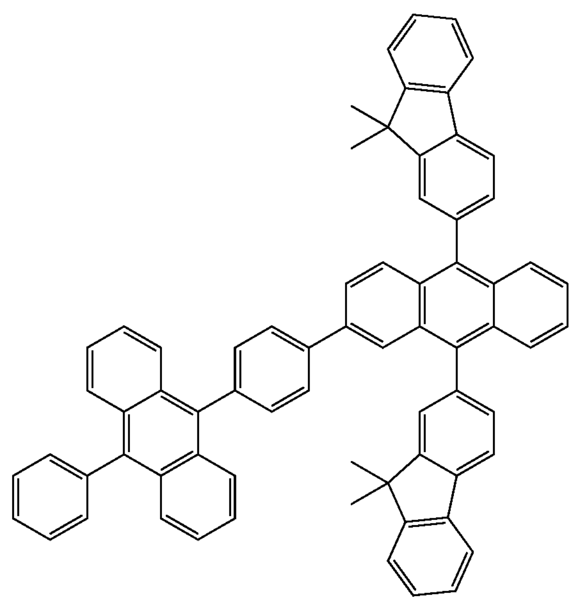
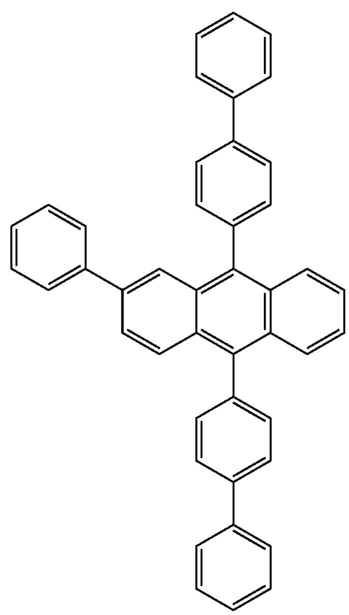

-continued
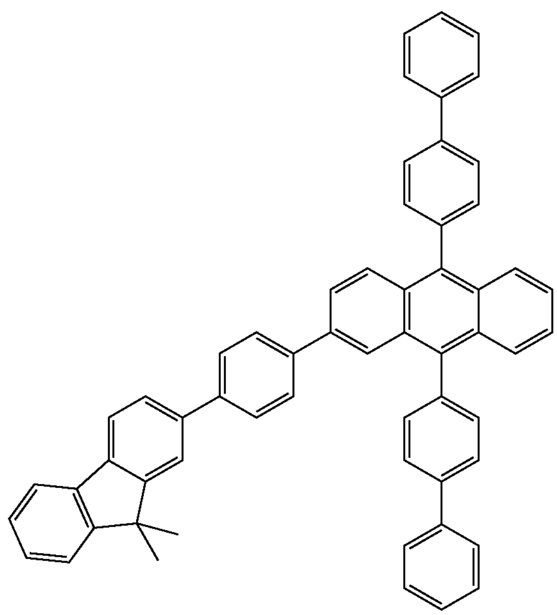
-continued
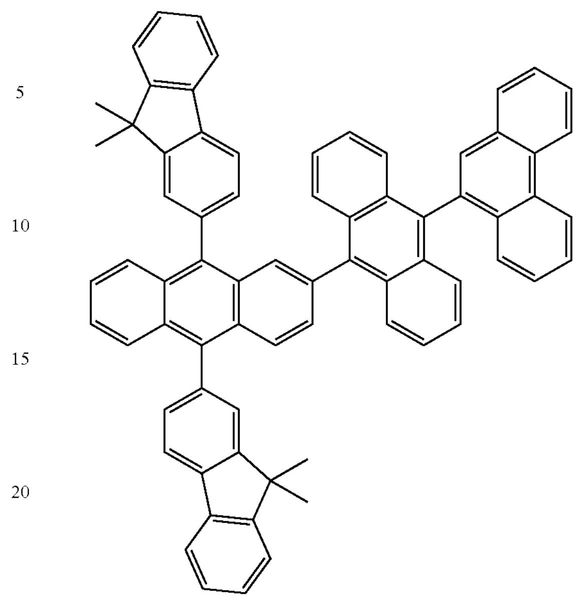
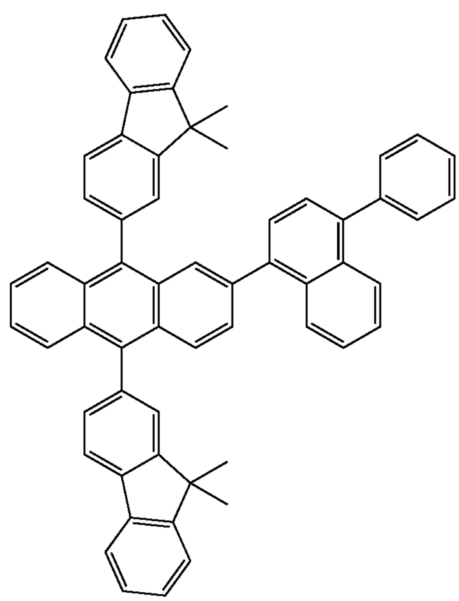
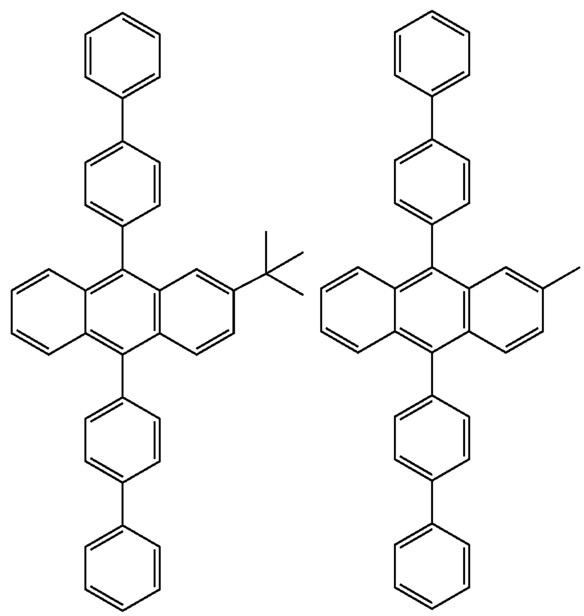

-continued
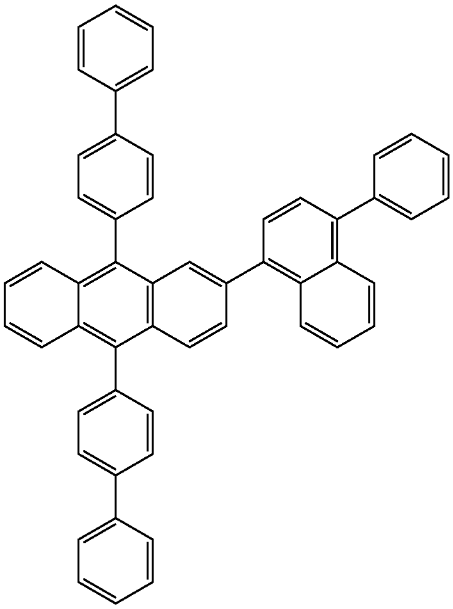
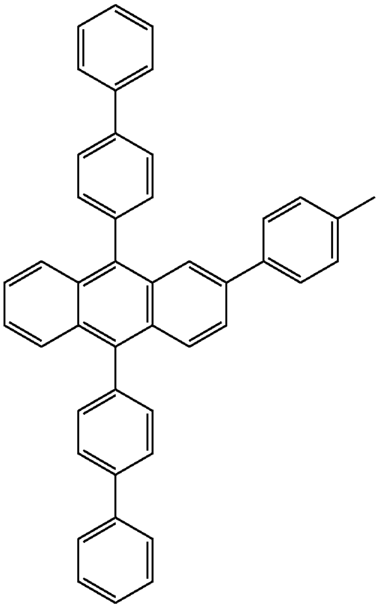
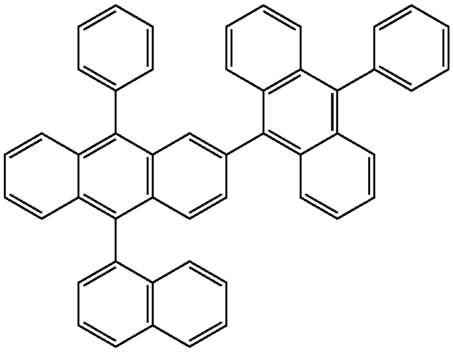
-continued
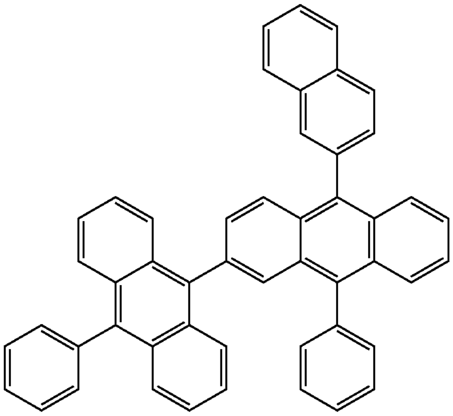
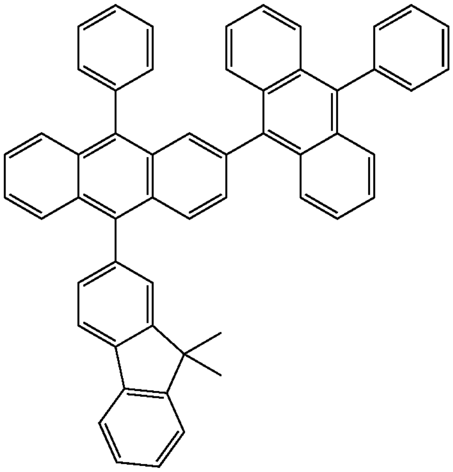
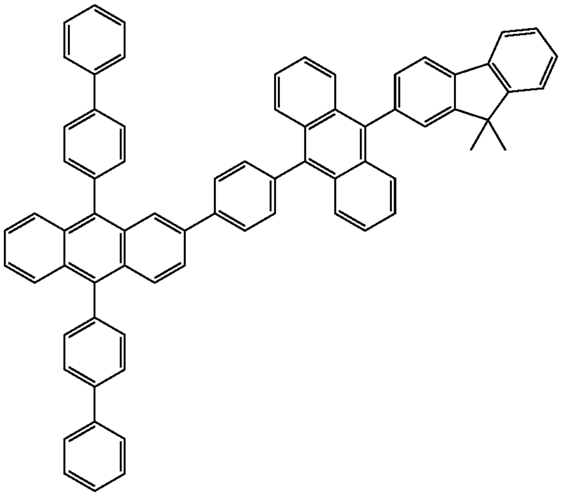

-continued
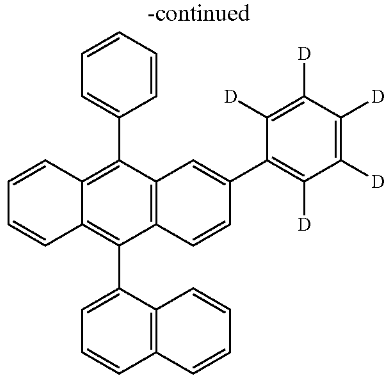
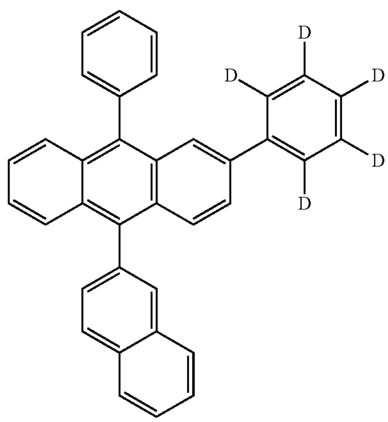
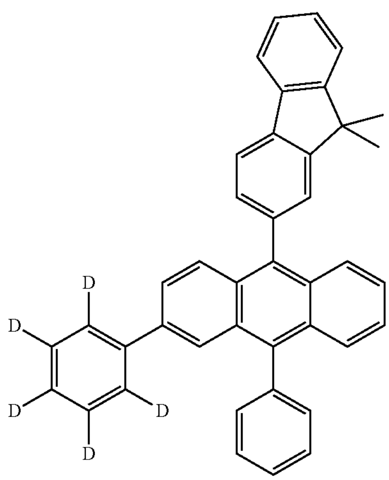
-continued
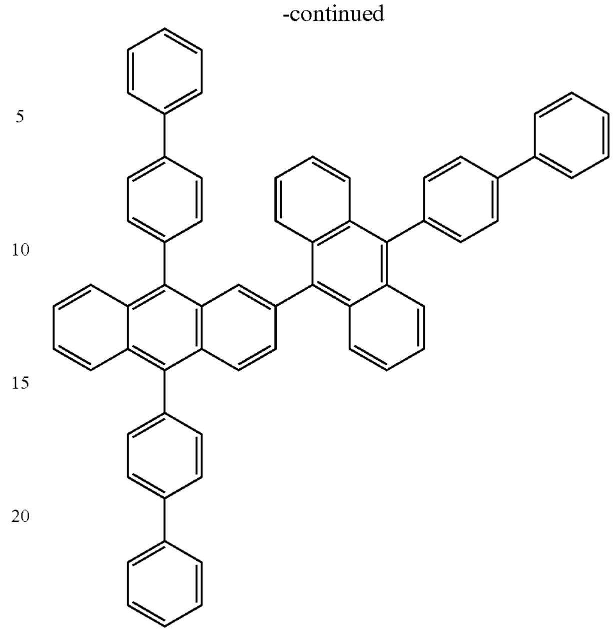
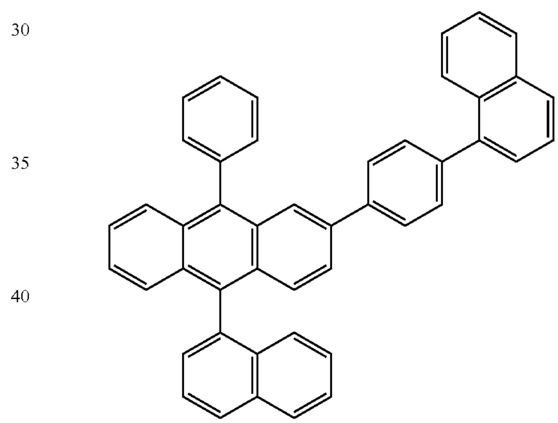
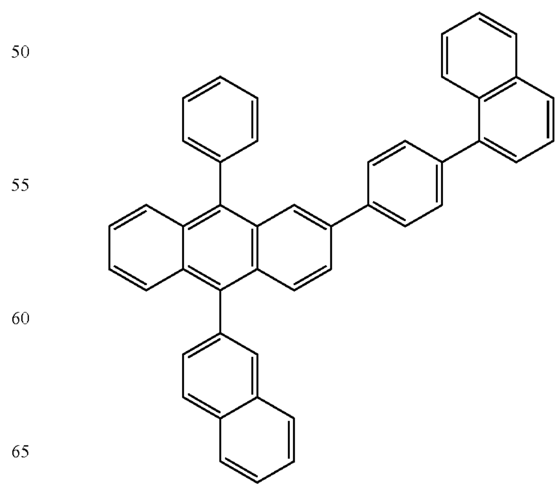

-continued
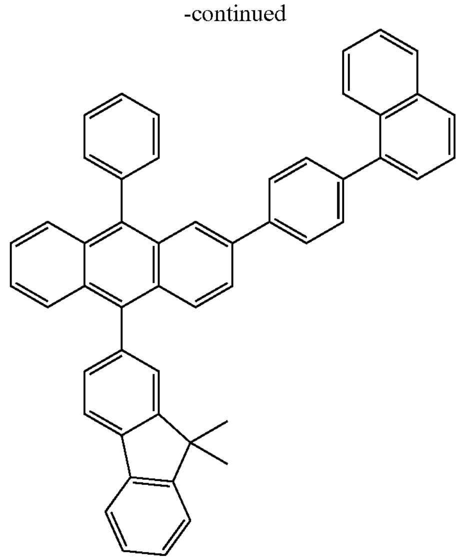
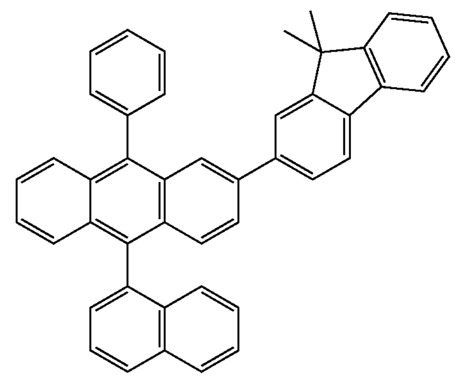
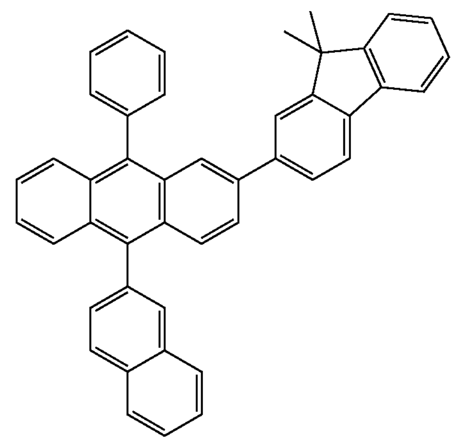
-continued
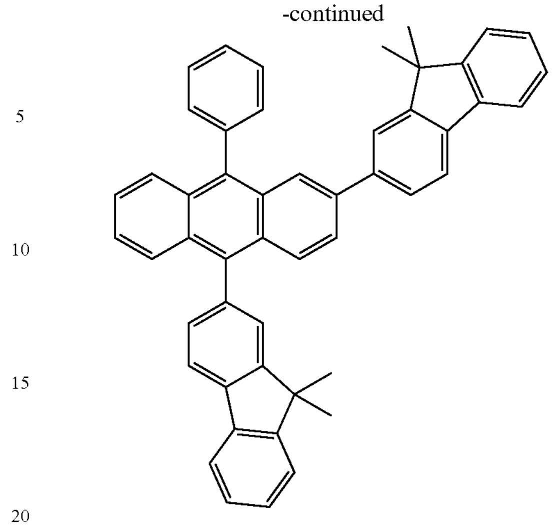
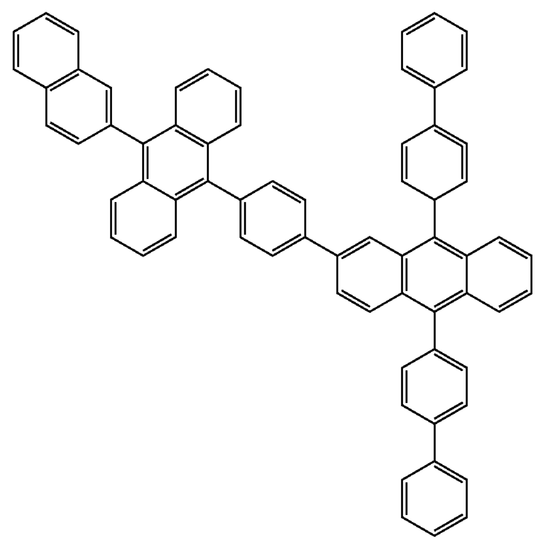
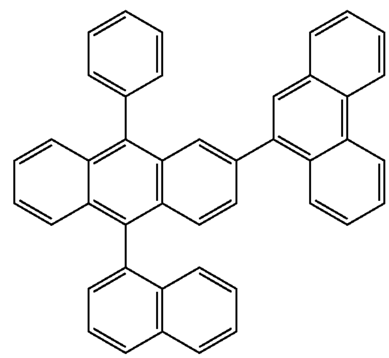

-continued
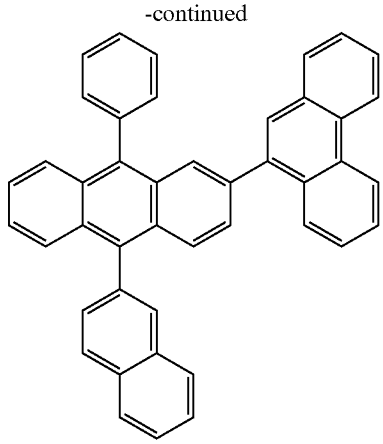
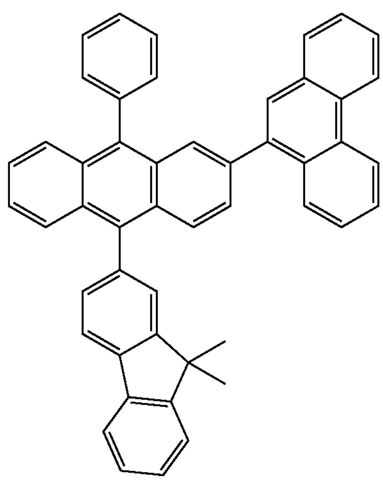
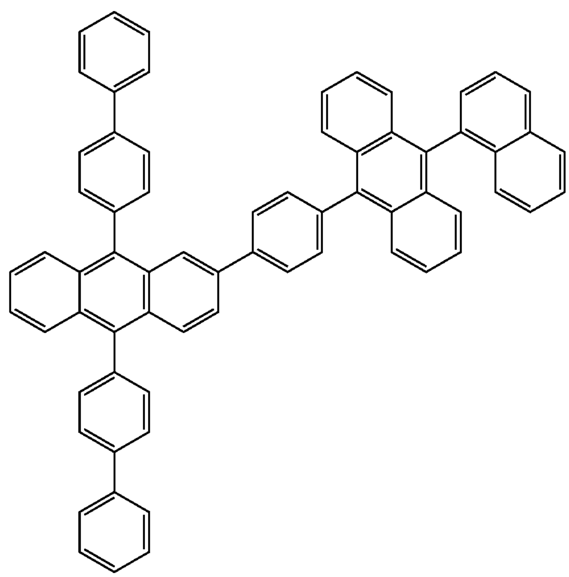
-continued
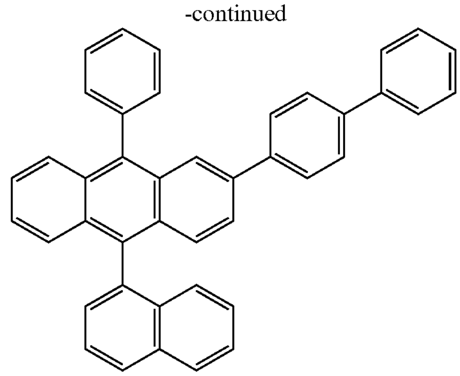
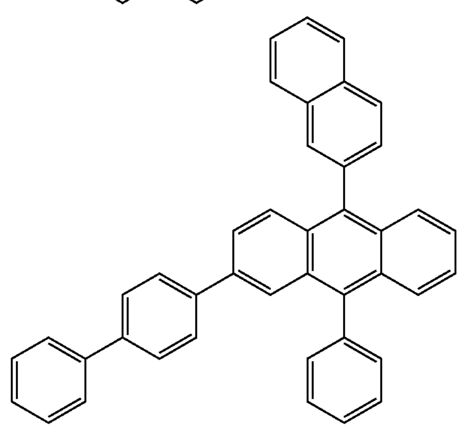
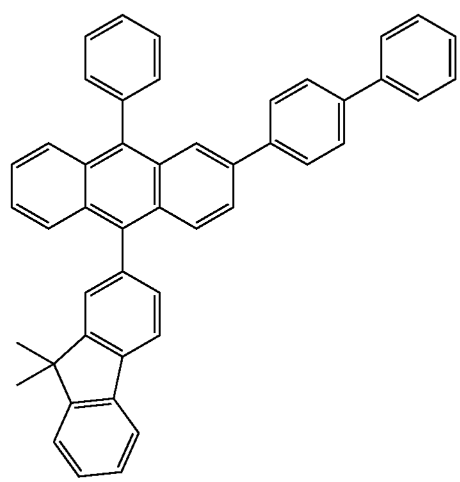
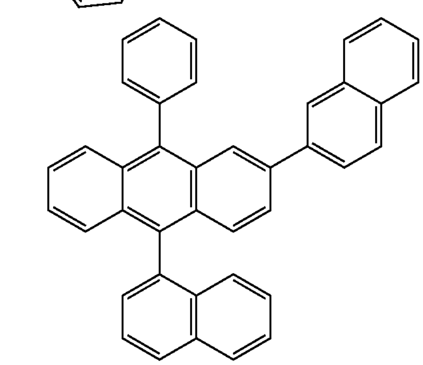

-continued
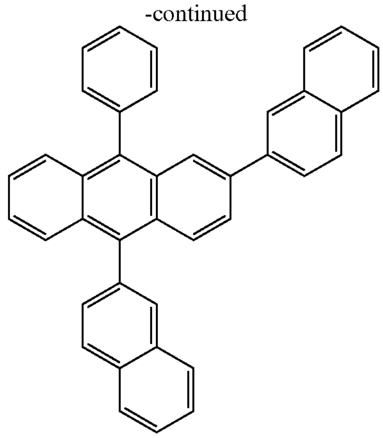
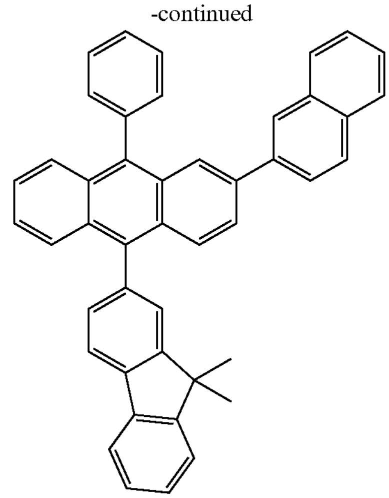
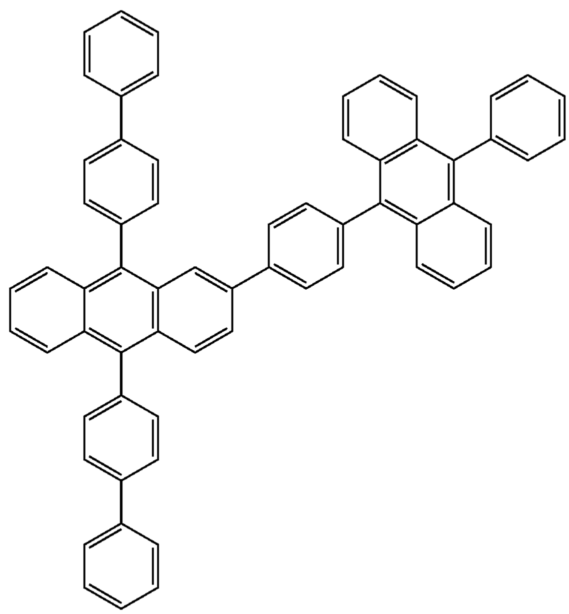
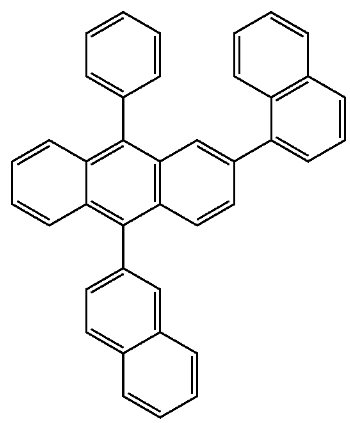
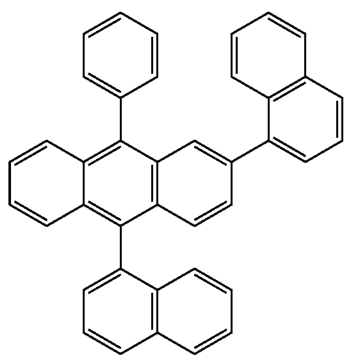
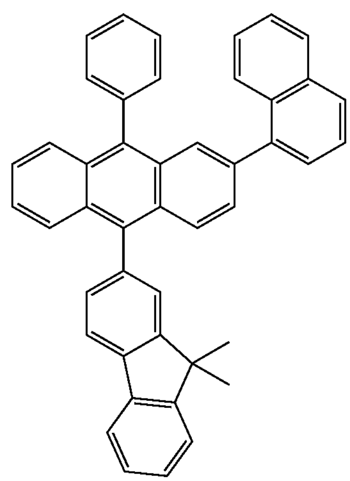
-continued

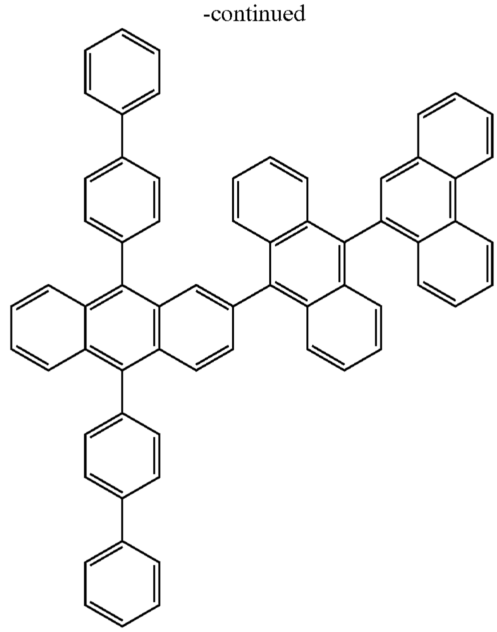
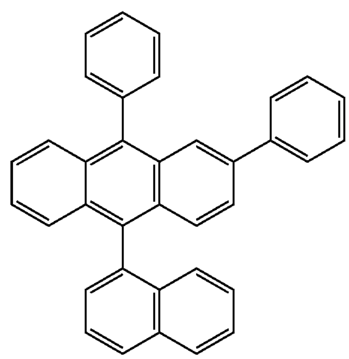
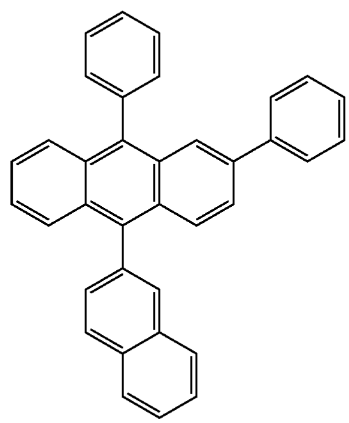
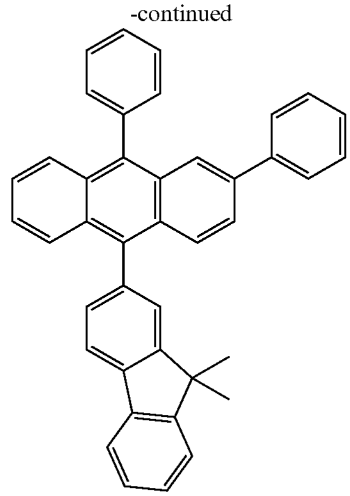
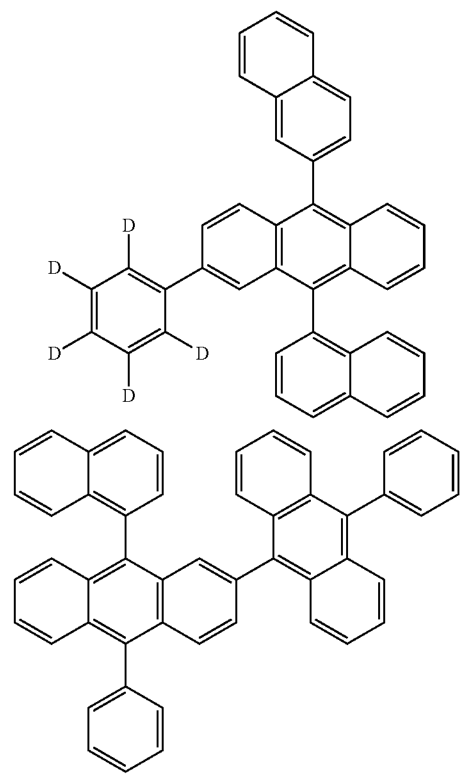
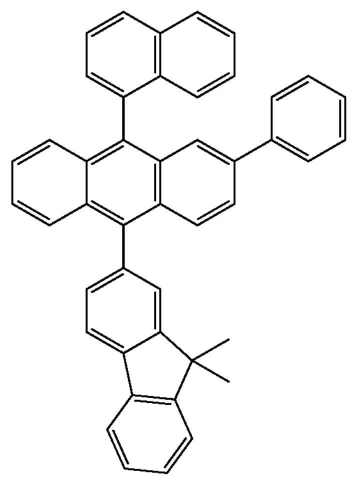

-continued
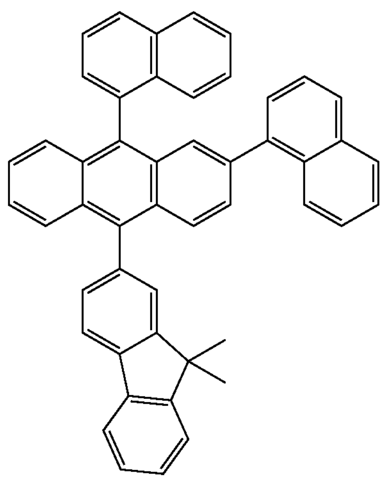
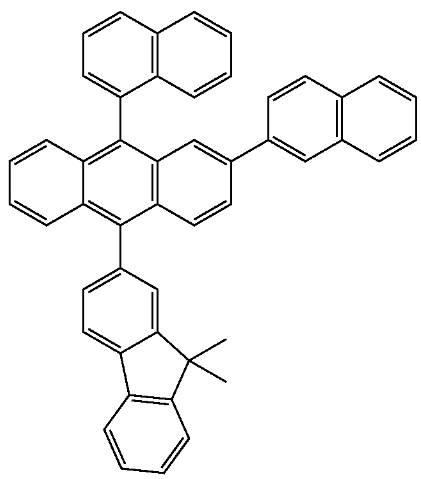
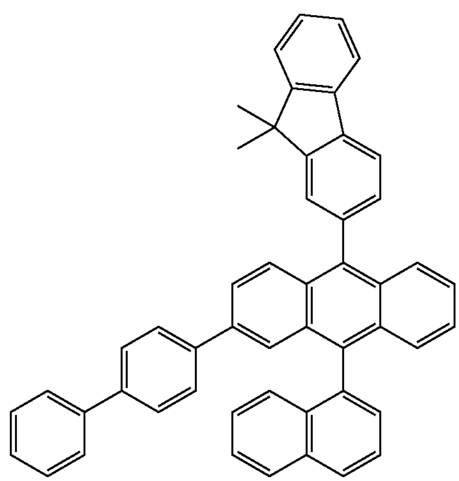
-continued
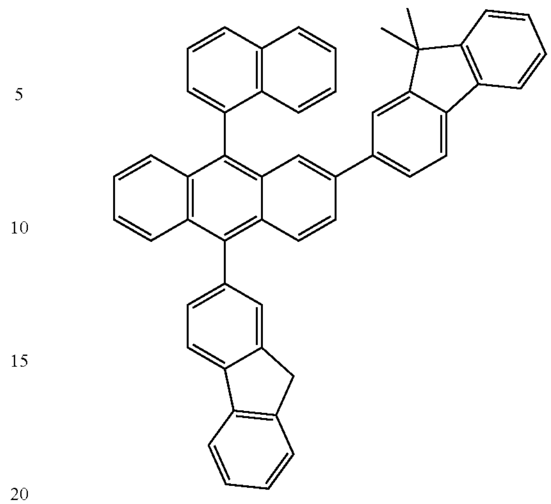
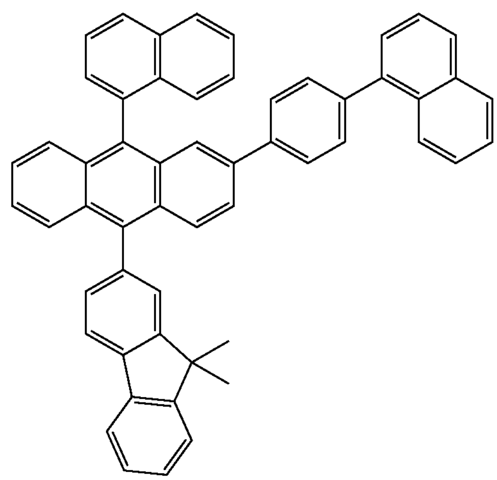
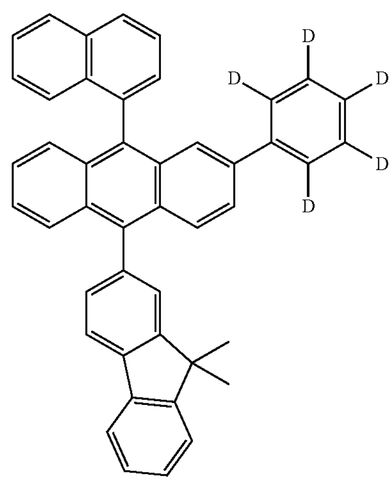

-continued
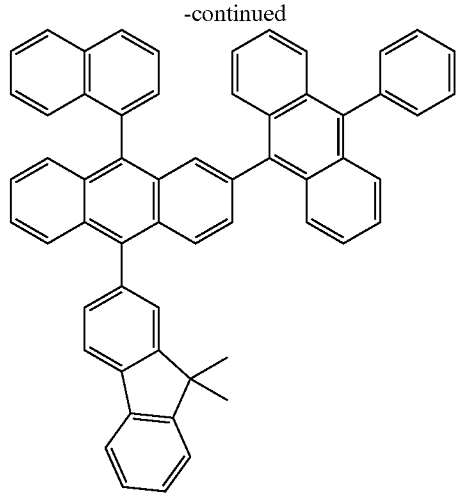
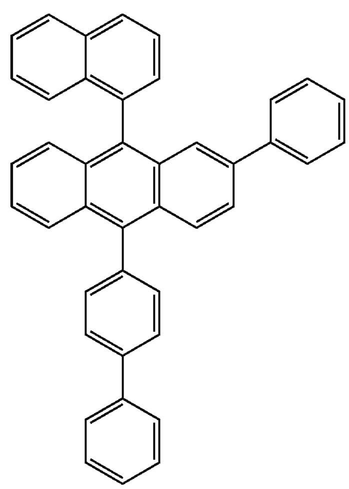
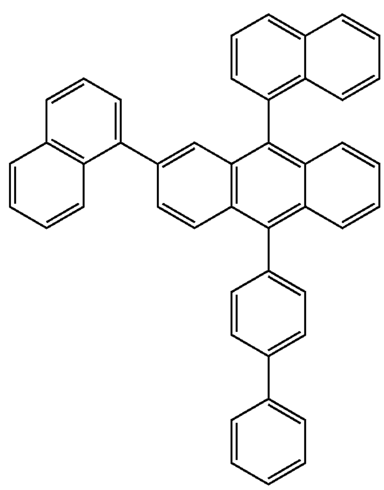
-continued
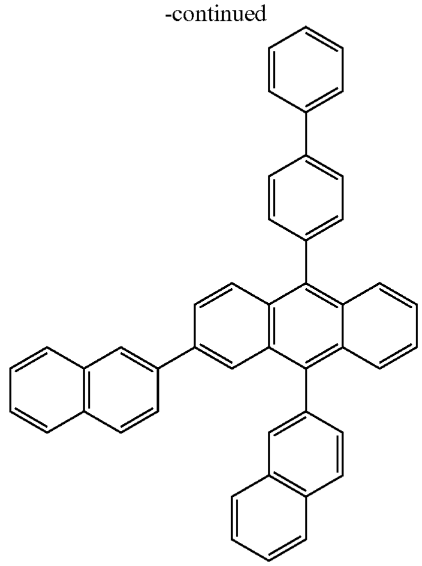
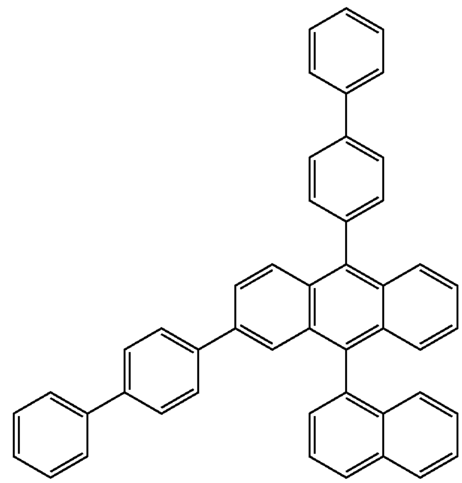
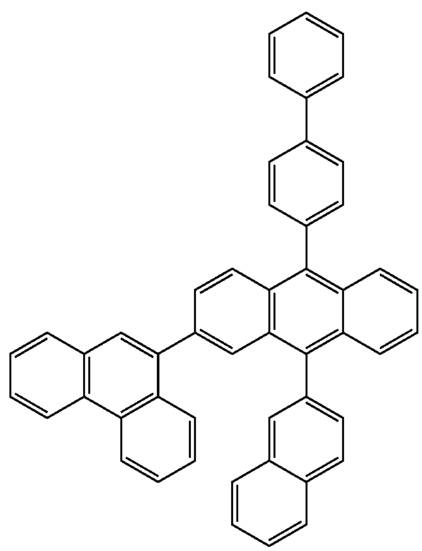

-continued
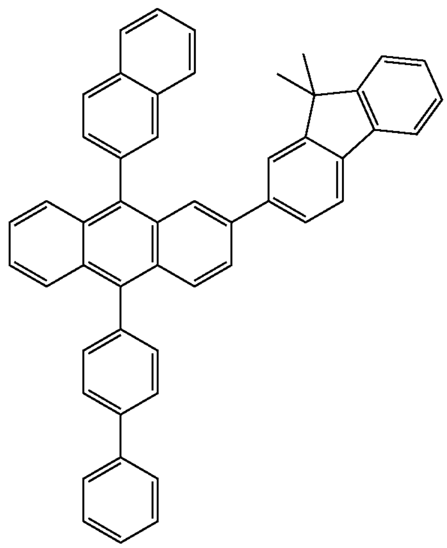
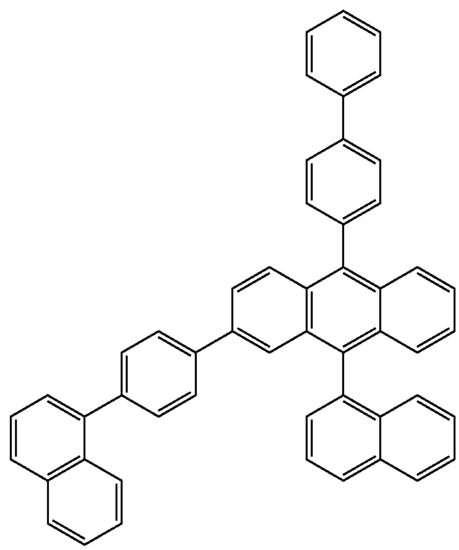
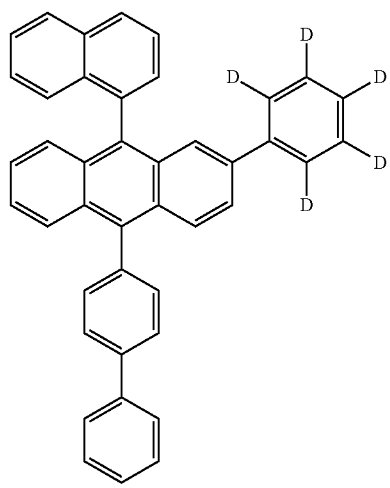
-continued
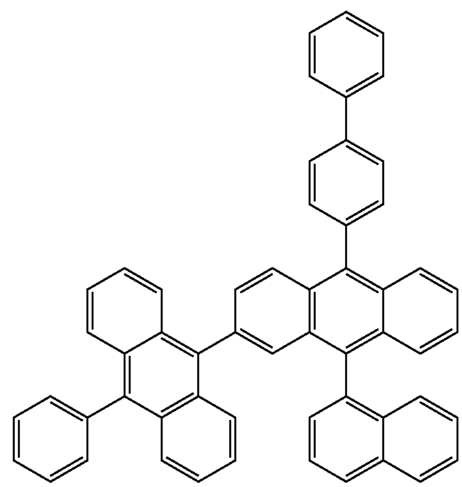
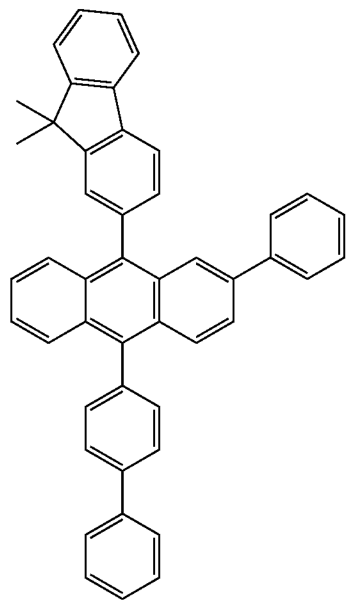
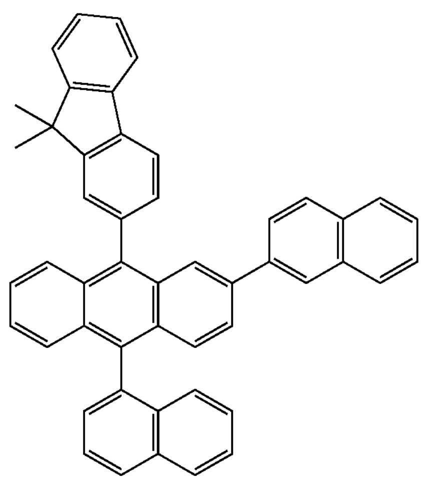

-continued
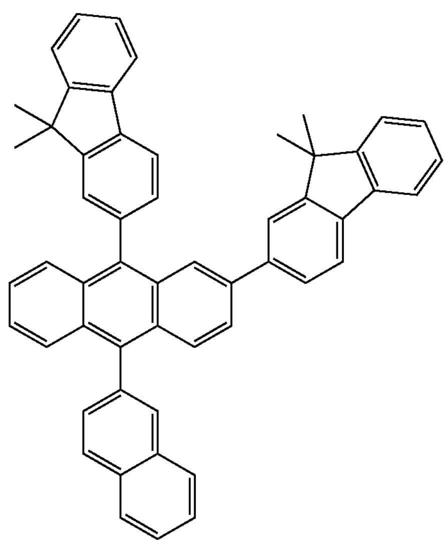
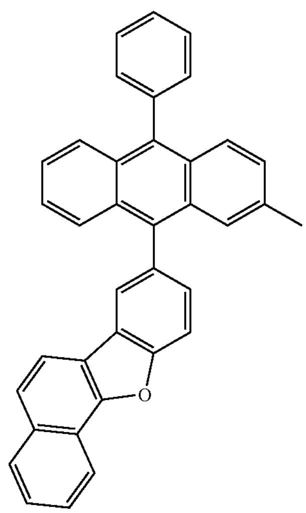
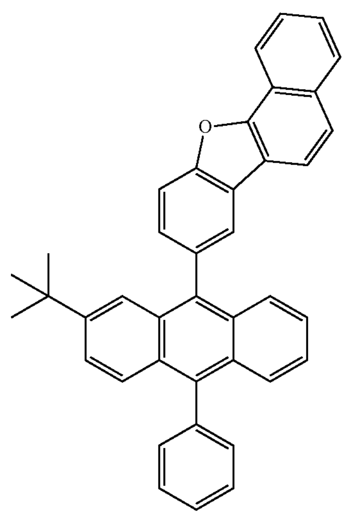
-continued
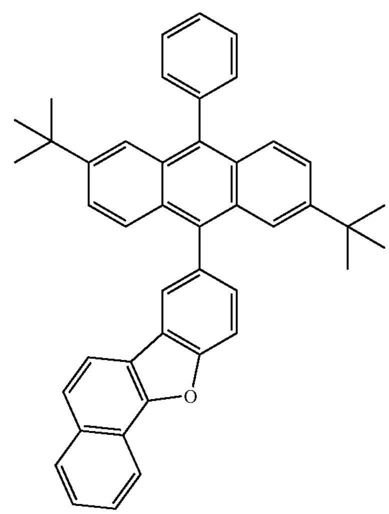
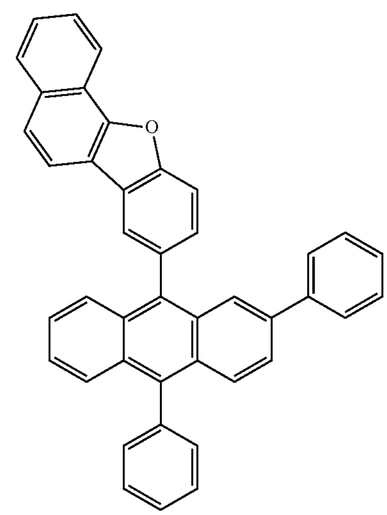
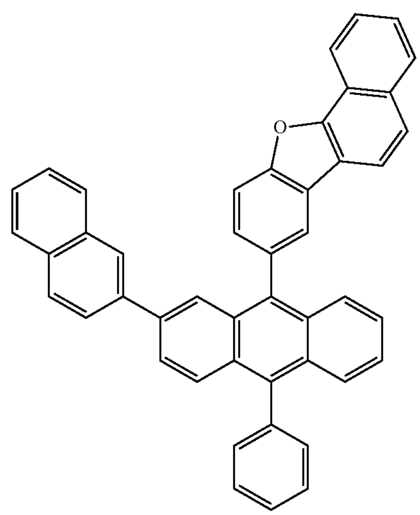

-continued
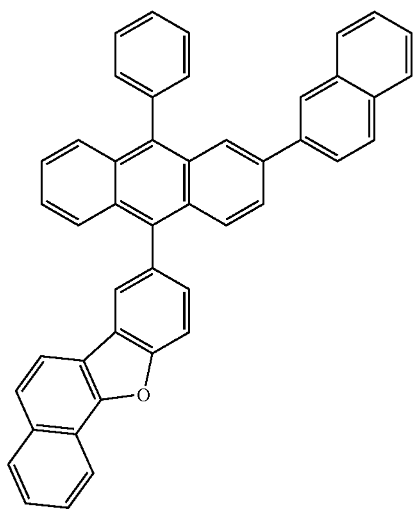
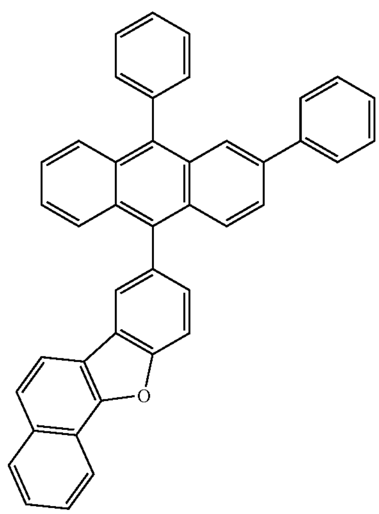
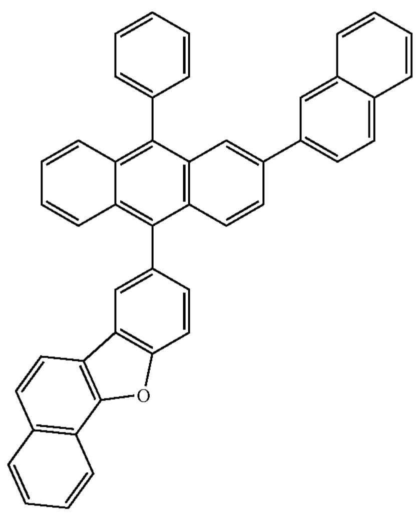
-continued
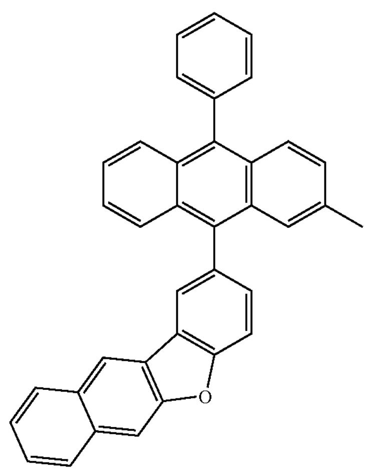
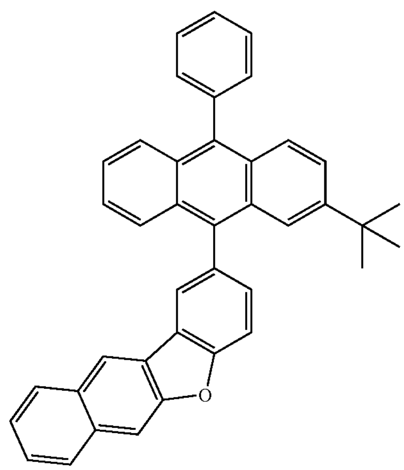
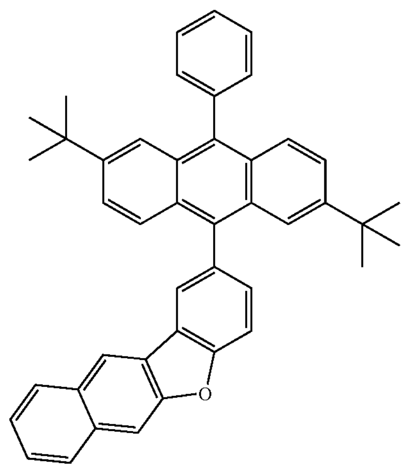

-continued

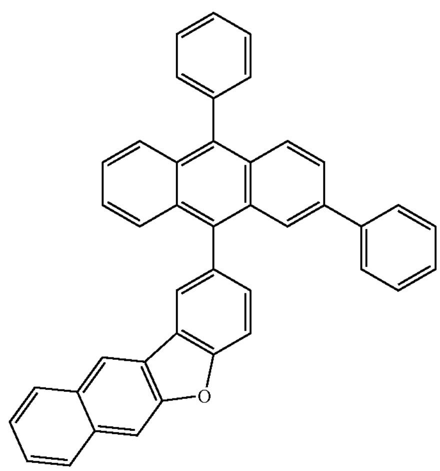

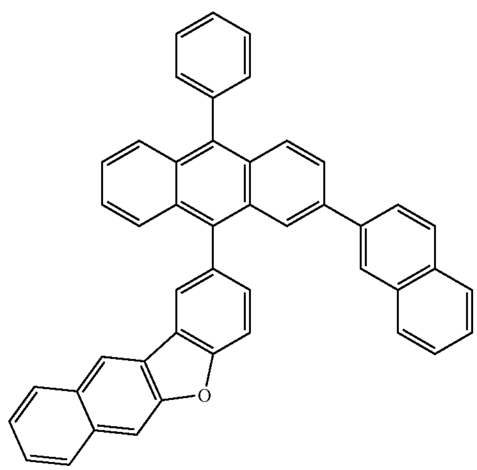

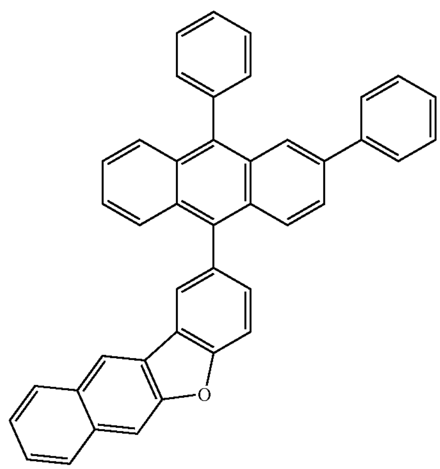

-continued

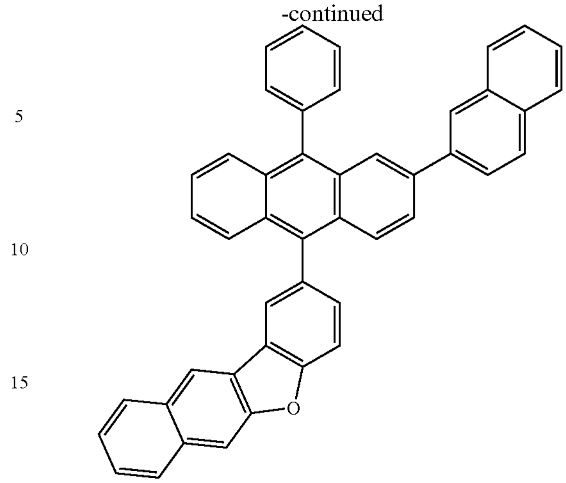

Compositions Including at Least One Organic Molecule According to the Invention

One aspect of the invention relates to a composition including at least one organic molecule according to the invention. One aspect of the invention relates to the use of this composition in optoelectronic devices, preferably OLEDs, in particular in an EML of said devices.

In the following, when describing the aforementioned composition, reference is in some cases made to the content of certain materials in the respective compositions in form of percentages. It is to be noted that, unless stated otherwise for specific embodiments, all percentages refer to weight percentages, which has the same meaning as percent by weight or % by weight ((weight/weight), (w/w), wt. %). It is understood that, when for example stating that the content of one or more organic molecules according to the invention in a specific composition is exemplarily 30%, this is to mean that the total weight of the one or more organic molecules according to the invention (i.e., of all of these molecules combined) is 30% by weight, i.e., accounts for 30% of the total weight of the respective composition. It is understood that, whenever a composition is specified by providing the preferred content of its components in % by weight, the total content of all components adds up to 100% by weight (i.e., the total weight of the composition).

When in the following describing the embodiments of the invention relating to a composition including at least one organic molecule according to the invention, reference will be made to energy transfer processes that may take place between components within these compositions when using said compositions in an optoelectronic device, preferably in an EML of an optoelectronic device, most preferably in an EML of an OLED. The person skilled in the art understands that such excitation energy transfer processes may enhance the emission efficiency when using the composition in an EML of an optoelectronic device.

When describing compositions including at least one organic molecule according to the present inventions, it will also be pointed out that certain materials "differ" from other materials. This is to mean the materials that "differ" from each other do not have the same chemical structure.

In One Embodiment, the Composition Includes or Consists of:

(a) one or more organic molecules according to the invention, and (b) one or more host materials $H^B$, which differ from the organic molecules of (a), and (c) optionally, one or more solvents.

In One Embodiment, the Composition Includes or Consists of:

(a) one or more organic molecules according to the invention, and (b) one or more host materials $H^B$, which differ from the organic molecules of (a), wherein the fraction of the host materials $H^B$ in % by weight in the composition is higher than the fraction of the organic molecules according to the invention in % by weight, preferably the fraction of the host materials $H^B$ in % by weight in the composition is more than two times higher than the fraction of the organic molecules according to the invention in % by weight.

In One Embodiment, the Composition Includes or Consists of:

(a) 0.1-30% by weight, preferably 0.8-15% by weight, in particular 1.5-5% by weight, of organic molecules according to the invention, and (b) TTA materials as host materials $H^B$ according to following Formula (4):

(4)

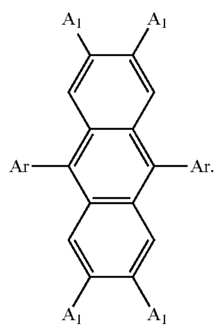

In One Embodiment, the Composition Includes or Consists of:

(a) organic molecules according to the invention, and (b) host material $H^B$, which differ from the organic molecules of (a), (c) TADF material $E^B$ and/or phosphorescence material $P^B$.

In One Embodiment, the Composition Includes or Consists of:

(a) 0.1-20% by weight, preferably 0.5-12% by weight, in particular 1-5% by weight of organic molecules according to the invention, and (b) 0-98.8% by weight, preferably 35-94% by weight, in particular 60-88% by weight of one or more host materials $H^B$, which differ from the organic molecules according to the invention, and (c) 0.1-20% by weight, preferably 0.5-10% by weight, in particular 1-3% by weight, of one or more phosphorescence materials $P^B$, which differ from the organic molecules of (a), and (d) 1-99.8% by weight, preferably 5-50% by weight, in particular 10-30% by weight, of one or more TADF materials $E^B$, which differ from the organic molecules of (a), and (e) 0-98.8% by weight, preferably 0-59% by weight, in particular 0-28% by weight of one or more solvents.

In a further aspect, the invention relates to an optoelectronic device including an organic molecule or a composition of the type described here, more particularly in the form of a device selected from the group consisting of organic light-emitting diode (OLED), light-emitting electrochemical cell, OLED sensor, more particularly gas and vapour sensors not hermetically externally shielded, organic diode, organic solar cell, organic transistor, organic field-effect transistor, organic laser, and down-conversion element.

In a preferred embodiment, the optoelectronic device is a device selected from the group consisting of an organic light emitting diode (OLED), a light emitting electrochemical cell (LEC), and a light-emitting transistor.

In one embodiment of the optoelectronic device of the invention, the organic molecule according to the invention E is used as emission material in a light-emitting layer EML.

In one embodiment of the optoelectronic device of the invention, the light-emitting layer EML consists of the composition according to the invention described here.

When the optoelectronic device is an OLED, it may, for example, have the following layer structure:

1. substrate
2. anode layer A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL
10. cathode layer, wherein the OLED includes each layer selected from the group of HIL, HTL, EBL, HBL, ETL, and EIL only optionally, different layers may be merged and the OLED may include more than one layer of each layer type defined above.

Furthermore, the optoelectronic device may, in one embodiment, include one or more protective layers protecting the device from damaging exposure to harmful species in the environment including, for example, moisture, vapor, and/or gases.

In one embodiment of the invention, the optoelectronic device is an OLED, with the following inverted layer structure:

1. substrate
2. cathode layer
3. electron injection layer, EIL
4. electron transport layer, ETL
5. hole blocking layer, HBL
6. emitting layer, B
7. electron blocking layer, EBL
8. hole transport layer, HTL
9. hole injection layer, HIL
10. anode layer A wherein the OLED includes each layer selected from the group of HIL, HTL, EBL, HBL, ETL, and EIL only optionally, different layers may be merged and the OLED may include more than one layer of each layer types defined above.

In one embodiment of the invention, the optoelectronic device is an OLED, which may have a stacked architecture. In this architecture, contrary to the typical arrangement in which the OLEDs are placed side by side, the individual units are stacked on top of each other. Blended light may be generated with OLEDs exhibiting a stacked architecture, in particular white light may be generated by stacking blue, green, and red OLEDs. Furthermore, the OLED exhibiting a stacked architecture may include a charge generation layer (CGL), which is typically located between two OLED subunits and typically consists of a n-doped and p-doped layer with the n-doped layer of one CGL being typically located closer to the anode layer.

In one embodiment of the invention, the optoelectronic device is an OLED, which includes two or more emission layers between anode and cathode. In particular, this so-called tandem OLED includes three emission layers, wherein one emission layer emits red light, one emission layer emits green light and one emission layer emits blue light, and optionally may include further layers such as charge generation layers, blocking or transporting layers between the individual emission layers. In a further embodiment, the emission layers are adjacently stacked. In a further embodiment, the tandem OLED includes a charge generation layer between each two emission layers.

In addition, adjacent emission layers or emission layers separated by a charge generation layer may be merged.

The substrate may be formed by any material or composition of materials. Most frequently, glass slides are used as substrates. Alternatively, thin metal layers (e.g., copper, gold, silver, or aluminum films) or plastic films or slides may be used. This may allow for a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. Preferably, the anode layer A includes a large content or even consists of transparent conductive oxides (TCOs). Such anode layer A may, for example, include indium tin oxide, aluminum zinc oxide, fluorine doped tin oxide, indium zinc oxide, PbO, SnO, zirconium oxide, molybdenum oxide, vanadium oxide, tungsten oxide, graphite, doped Si, doped Ge, doped GaAs, doped polyaniline, doped polypyrrole, and/or doped polythiophene.

The anode layer A (essentially) may consist of indium tin oxide (ITO)(e.g., $(In_2O_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may include poly-3,4-ethylenedioxy thiophene (PEDOT), polystyrene sulfonate (PSS), $MoO_2$, $V_2O_5$, CuPC, or CuI, in particular a mixture of PEDOT and PSS. The hole injection layer (HIL) may also prevent the diffusion of metals from the anode layer A into the hole transport layer (HTL). The HIL may, for example, include PEDOT:PSS (poly-3,4-ethylenedioxy thiophene: polystyrene sulfonate), PEDOT (poly-3,4-ethylenedioxy thiophene), mMTDATA (4,4',4"-trs [phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenylamino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile), and/or Spiro-NPD (N,N'-diphenyl-N,N'-bis-(1-naphthyl)-9,9'-spirobifluorene-2,7-diamine).

Adjacent to the anode layer A or the hole injection layer (HIL), a hole transport layer (HTL) is typically located. Herein, any hole transport compound may be used. For example, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). Preferably, hole transport compounds bear comparably high energy levels of their triplet states T1. For example, the hole transport layer (HTL) may include a star-shaped heterocycle such as tris(4-carbazol-9-ylphenyl) amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may include a p-doped layer, which may be composed of an inorganic or organic dopant in an organic hole-transporting matrix. Transition metal oxides such as vanadium oxide, molybdenum oxide or tungsten oxide may, for example, be used as inorganic dopant. Tetrafluorotetracyanoquinodimethane ($F_4$-TCNQ), copper-pentafluorobenzoate (Cu(I)pFBz) or transition metal complexes may, for example, be used as organic dopant.

The EBL may, for example, include mCP (1,3-bis(carbazol-9-yl)benzene), TCTA, 2-TNATA, mCBP (3,3-di(9H-carbazol-9-yl)biphenyl), tris-Pcz, CzSi(9-(4-tert-butylphenyl)-3,6-bis(triphenylsilyl)-9H-carbazole), and/or DCB (N,N'-dicarbazolyl-1,4-dimethylbenzene).

Adjacent to the hole transport layer (HTL), the light-emitting layer EML is typically located. The light-emitting layer EML includes at least one light emitting molecule. Particularly, the EML includes at least one light emitting molecule according to the invention E. In one embodiment, the light-emitting layer includes only the organic molecules according to the invention. Typically, the EML additionally includes one or more host materials H. For example, the host material H is selected from CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl] ether oxide), 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine), and/or TST (2,4,6-tris(9,9'-spirobifluoren-2-yl)-1,3,5-triazine). The host material H typically should be selected to exhibit first triplet (T1) and first singlet (S1) energy levels, which are energetically higher than the first triplet (T1) and first singlet (S1) energy levels of the organic molecule.

In one embodiment of the invention, the EML includes a so-called mixed-host system with at least one hole-dominant host and one electron-dominant host. In a particular embodiment, the EML includes exactly one light emitting organic molecule according to the invention and a mixed-host system including T2T as electron-dominant host and a host selected from CBP, mCP, mCBP, 9-[3-(dibenzofuran-2-yl) phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host. In a further embodiment the EML includes 50-80 1% by weight, preferably 60-75% by weight of a host selected from CBP, mCP, mCBP, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, and 9-[3,5-bis(2-dibenzothiophenyl)phenyl]-9H-carbazole; 10-45% by weight, preferably 15-30% by weight of T2T and 5-40% by weight, preferably 10-30% by weight of light emitting molecule according to the invention.

Adjacent to the light-emitting layer EML, an electron transport layer (ETL) may be located. Herein, any electron transporter may be used. Exemplarily, electron-poor compounds such as, e.g., benzimidazoles, pyridines, triazoles, oxadiazoles (e.g., 1,3,4-oxadiazole), phosphine oxides and sulfone, may be used. An electron transporter may also be a star-shaped heterocycle such as 1,3,5-tri(1-phenyl-1H-benzo[d]imidazol-2-yl)phenyl (TPBi). The ETL may include NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphine oxide), BPyTP2 (2,7-di(2,2'-bipyridin-5-yl)triphenylene), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene), and/or BTB (4,4'-bis-[2-(4,6-diphenyl-1,3,5-triazinyl)]-1,1'-biphenyl). Optionally, the ETL may be doped with materials such as Liq. The electron transport layer (ETL) may also block holes or a hole blocking layer (HBL) is introduced.

The HBL may, for example, include BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphine oxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluoren-2-yl)-1,3,5-triazine), and/or TCB/TCP (1,3,5-tris(N-carbazolyl)benzene/1,3,5-tris(carbazol)-9-yl) benzene).

Adjacent to the electron transport layer (ETL), a cathode layer C may be located. The cathode layer C may, for example, include or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) intransparent metals such as Mg, Ca, or Al. Alternatively or additionally, the cathode layer C may also include graphite and/or carbon nanotubes (CNTs). Alternatively, the cathode layer C may also consist of nanoscale silver wires.

An OLED may further, optionally, include a protection layer between the electron transport layer (ETL) and the cathode layer C (which may be designated as electron injection layer (EIL)). This layer may include lithium fluoride, cesium fluoride, silver, Liq (8-hydroxyquinolinolatolithium), $Li_2O$, $BaF_2$, MgO, and/or NaF.

Optionally, the electron transport layer (ETL) and/or a hole blocking layer (HBL) may also include one or more host compounds H.

In order to modify the emission spectrum and/or the absorption spectrum of the light-emitting layer EML further, the light-emitting layer EML may further include one or more further emitter molecules F. Such an emitter molecule F may be any emitter molecule known in the art. Preferably such an emitter molecule F is a molecule with a structure differing from the structure of the molecules according to the invention E. The emitter molecule F may optionally be a TADF emitter. Alternatively, the emitter molecule F may optionally be a fluorescent and/or phosphorescent emitter molecule which is able to shift the emission spectrum and/or the absorption spectrum of the light-emitting layer EML. Exemplarily, the triplet and/or singlet excitons may be transferred from the organic emitter molecule according to the invention to the emitter molecule F before relaxing to the ground state S0 by emitting light typically red-shifted in comparison to the light emitted by an organic molecule. Optionally, the emitter molecule F may also provoke two-photon effects (i.e., the absorption of two photons of half the energy of the absorption maximum).

Optionally, an optoelectronic device (e.g., an OLED) may, for example, be an essentially white optoelectronic device. For example, such a white optoelectronic device may include at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows:

| | |
|---|---|
| violet: | wavelength range of >380-420 nm; |
| deep blue: | wavelength range of >420-480 nm; |
| sky blue: | wavelength range of >480-500 nm; |
| green: | wavelength range of >500-560 nm; |
| yellow: | wavelength range of >560-580 nm; |
| orange: | wavelength range of >580-620 nm; |
| red: | wavelength range of >620-800 nm. |

With respect to emitter molecules, such colors refer to the emission maximum. Therefore, for example, a deep blue emitter has an emission maximum in the range of from >420 to 480 nm, a sky blue emitter has an emission maximum in the range of from >480 to 500 nm, a green emitter has an emission maximum in a range of from >500 to 560 nm, a red emitter has an emission maximum in a range of from >620 to 800 nm.

A deep blue emitter may preferably have an emission maximum of below 480 nm, more preferably below 470 nm, even more preferably below 465 nm or even below 460 nm. It will typically be above 420 nm, preferably above 430 nm, more preferably above 440 nm or even above 450 nm.

A green emitter has an emission maximum of below 560 nm, more preferably below 550 nm, even more preferably below 545 nm or even below 540 nm. It will typically be above 500 nm, more preferably above 510 nm, even more preferably above 515 nm or even above 520 nm.

Accordingly, a further aspect of the present invention relates to an OLED, which exhibits an external quantum efficiency at 1000 $cd/m^2$ of more than 8%, more preferably of more than 10%, more preferably of more than 13%, even more preferably of more than 15% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 $cd/m^2$ of more than 100 h, preferably more than 200 h, more preferably more than 400 h, even more preferably more than 750 h or even more than 1000 h. Accordingly, a further aspect of the present invention relates to an OLED, whose emission exhibits a CIEy color coordinate of less than 0.45, preferably less than 0.30, more preferably less than 0.20 or even more preferably less than 0.15 or even less than 0.10.

A further aspect of the present invention relates to an OLED, which emits light at a distinct color point. According to the present invention, the OLED emits light with a narrow emission band (small full width at half maximum (FWHM)). In one aspect, the OLED according to the invention emits light with a FWHM of the main emission peak of less than 0.25 eV, preferably less than 0.20 eV, more preferably less than 0.17 eV, even more preferably less than 0.15 eV or even less than 0.13 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g., UHD-TVs. Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

In a further embodiment of the invention, the composition has a photoluminescence quantum yield (PLQY) of more than 20%, preferably more than 30%, more preferably more than 35%, more preferably more than 40%, more preferably more than 45%, more preferably more than 50%, more preferably more than 55%, even more preferably more than 60% or even more than 70% at room temperature.

In a Further Embodiment of the Invention, the Composition Includes (a) an organic molecule according to any of claims 1 to 7, in particular in the form of an emitter, and (b) a host material, which differs from the organic molecule, and (c) optionally, a dye and/or a solvent.

in particular including at least a material selected from the group consisting of a TADF material and a phosphorescence material.

In a further embodiment of the invention, the composition contains 0.1-30% by weight, preferably 0.8-15% by weight, in particular 1.5-5% by weight, of the organic molecule.

In a further embodiment of the invention, the composition includes at least a material selected from the group consisting of a TADF material and a phosphorescence material.

In a further embodiment of the invention, the host material of the composition includes a structure represented by Formula 4

Formula 4

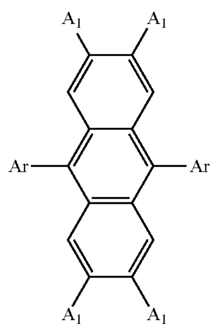

wherein each Ar is independently selected from the group consisting of $C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and $C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and each $A_1$ is independently selected from the group consisting of consisting of hydrogen;

deuterium;

$C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl;

$C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and $C_1$-$C_{40}$-(hetero)alkyl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

In a further aspect, the invention relates to a method for producing an optoelectronic component. In this case an organic molecule of the invention is used.

In a further aspect, the invention relates to a method for generating light at a wavelength range from 440 nm to 470 nm, including the steps of:

(i) providing an optoelectronic device including an organic molecule of the invention and (ii) applying an electrical current to said electroluminescent device.

The optoelectronic device, in particular the OLED according to the present invention can be fabricated by any means of vapor deposition and/or liquid processing. Accordingly, at least one layer is prepared by means of a sublimation process, prepared by means of an organic vapor phase deposition process, prepared by means of a carrier gas sublimation process, or solution processed or printed.

The methods used to fabricate the optoelectronic device, in particular the OLED according to the present invention are known in the art. The different layers are individually and successively deposited on a suitable substrate by means of subsequent deposition processes. The individual layers may be deposited using the same or differing deposition methods.

Vapor deposition processes, for example, include thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process, for example, include spin coating, dip coating and jet printing. Liquid processing may optionally be carried out in an inert atmosphere (e.g., in a nitrogen atmosphere) and the solvent may be completely or partially removed by means known in the state of the art.

In another aspect, the invention also refers to an organic light-emitting molecule including or consisting of a structure of Formula 100

Formula 100

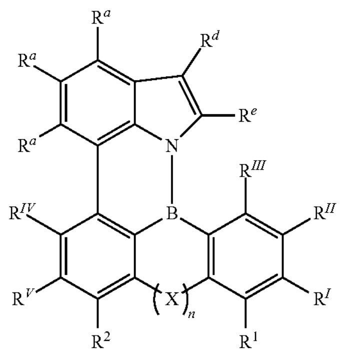

wherein n=0 or 1;

X is at each occurrence independently selected from the group consisting of a direct bond, $CR^3R_4$, $C{=}CR^3R^4$, C=O, $C{=}NR^3$, $NR^3$, O, $SiR^3R^4$, S, S(O), and $S(O)_2$;

$R^1$, $R_2$, $R_3$, $R_4$, $R^I$, $R^{II}$, $R^{III}$, $R^{IV}$, and $R^V$ are each independently selected from the group consisting of:

hydrogen; deuterium; $N(R^5)_2$; $OR^5$; $Si(R^5)_3$; $B(OR^5)_2$; $B(R^5)_2$; $OR^5$; $CF_3$; CN; F; Br; I;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$.

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$;

$R^d$ and $R^e$ are each independently selected from the group consisting of: hydrogen; deuterium; $CF_3$; CN; F; Br; I;

$C_1$-$C_{40}$-alkyl, which is optionally substituted with one or more substituents $R^a$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_6$-$C_{60}$-aryl, which is optionally substituted with one or more substituents $R^a$; and $C_2$-$C_{57}$-heteroaryl, which is optionally substituted with one or more substituents $R^a$;

$R^a$ is at each occurrence independently selected from the group consisting of: hydrogen; deuterium; $N(R^5)_2$; $OR^5$; $Si(R^5)_3$; $B(OR^5)_2$; $B(R^5)_2$; $OSO_2R^5$; $CF_3$; CN; F; Br; I;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C=O, C=S, C=Se, $C{=}NR^5$, $P({=}O)(R^5)$, SO, $SO_2$, $NR^5$, O, S, or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$;

$R^5$ is at each occurrence independently from each other selected from the group consisting of: hydrogen; deuterium; $N(R^6)_2$; $OR^6$; $Si(R^6)_3$; $B(OR^6)_2$; $B(R^6)_2$; $OSO_2R^6$; $CF_3$; CN; F; Br; I;

$C_1$-$C_{40}$-alkyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S, or $CONR^6$;

$C_1$-$C_{40}$-alkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S, or $CONR^6$;

$C_1$-$C_{40}$-thioalkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S, or $CONR^6$;

$C_2$-$C_{40}$-alkenyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^B)_2$, $Sn(R^6)_2$, $C{=}O$, $C{=}S$, $C{=}Se$, $C{=}NR^6$, $P({=}O)(R^6)$, SO, $SO_2$, $NR^6$, O, S, or $CONR^6$;

$C_2$-$C_{40}$-alkynyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S, or $CONR^6$;

$C_6$-$C_{60}$-aryl, which is optionally substituted with one or more substituents $R^6$; and $C_2$-$C_{57}$-heteroaryl, which is optionally substituted with one or more substituents $R^6$;

$R^6$ is at each occurrence independently from each other selected from the group consisting of: hydrogen; deuterium; OPh; $CF_3$; CN; F;

$C_1$-$C_5$-alkyl, wherein one or more hydrogen atoms are optionally, independently from each other substituted by deuterium, CN, $CF_3$, or F;

$C_1$-$C_5$-alkoxy, wherein one or more hydrogen atoms are optionally, independently from each other substituted by deuterium, CN, $CF_3$, or F;

$C_1$-$C_5$-thioalkoxy, wherein one or more hydrogen atoms are optionally, independently from each other substituted by deuterium, CN, $CF_3$, or F;

$C_2$-$C_5$-alkenyl, wherein one or more hydrogen atoms are optionally, independently from each other substituted by deuterium, CN, $CF_3$, or F;

$C_2$-$C_5$-alkynyl, wherein one or more hydrogen atoms are optionally, independently from each other substituted by deuterium, CN, $CF_3$, or F;

$C_6$-$C_{18}$-aryl, which is optionally substituted with one or more $C_1$-$C_5$-alkyl substituents;

$C_2$-$C_{17}$-heteroaryl, which is optionally substituted with one or more $C_1$-$C_5$-alkyl substituents;

$N(C_6$-$C_{18}$-aryl$)_2$;

$N(C_2$-$C_{17}$-heteroaryl$)_2$; and $N(C_2$-$C_{17}$-heteroaryl$)(C_6$-$C_{18}$-aryl);

wherein the substituents $R^a$, $R^d$, $R^e$, $R^5$, independently from each other, optionally form a mono- or polycyclic, aliphatic, aromatic, heteroaromatic and/or benzo-fused ring system with one or more other substituents $R^a$, $R^d$, $R^e$, and/or $R^5$; and wherein the substituents $R^1$, $R^2$, $R^3$, $R_4$, $R^5$, $R^I$, $R^{II}$, $R^{III}$, $R^{IV}$, $R^V$ independently from each other, optionally form a mono- or polycyclic, aliphatic, aromatic, heteroaromatic and/or benzo-fused ring system with one or more other substituents $R^1$, $R^2$, $R^3$, $R^4$, $R^5$, $R^I$, $R^{II}$, $R^{III}$, $R^{IV}$, and/or $R^V$.

EXAMPLES

General synthesis scheme I

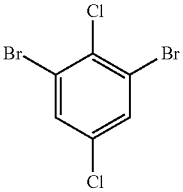

+

I-1

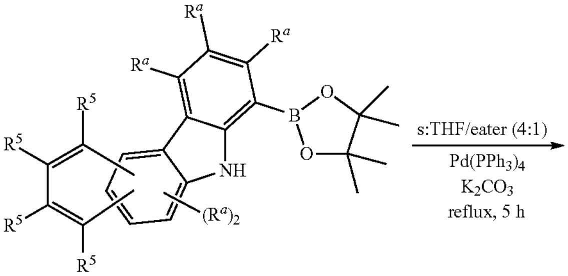

I-2

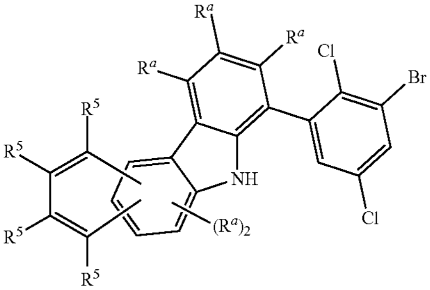

I-3

I-3 +

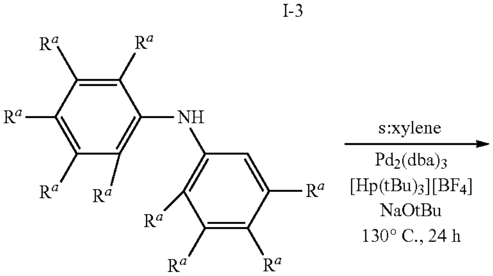

I-4

-continued

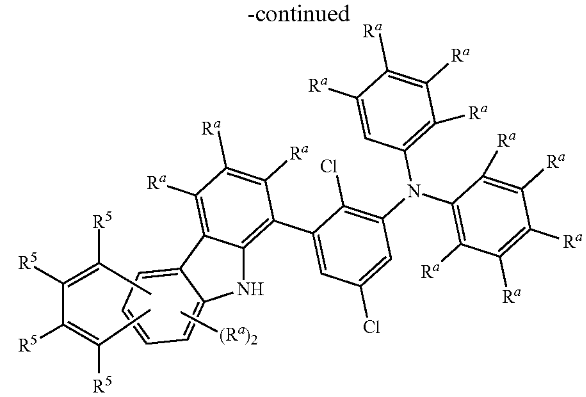

I-5

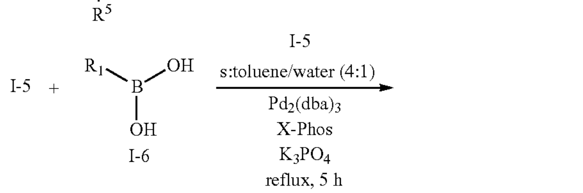

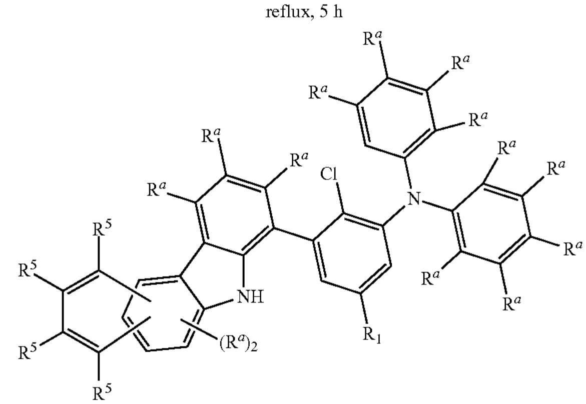

I-7

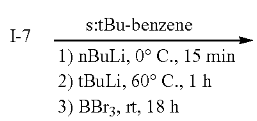

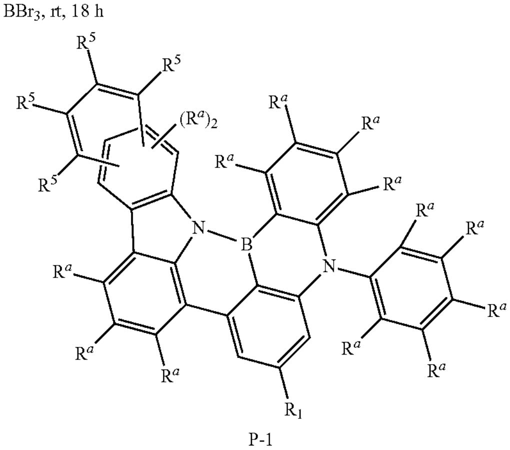

P-1

General Procedure for Synthesis

AAV1: A suspension of I-1 (1.3 equivalents), 1-2 (1.0 equivalent), tetrakis(triphenylphosphine)-palladium(0) (CAS-no. 14221-01-3, 0.05 equivalents) and $K_2CO_3$ (CAS-No. 584-08-7, 2.0 equivalents) in a mixture of toluene and water (4:1 by vol.) was stirred under reflux for 5 h. After cooling down to rt an aqueous workup was performed, followed by purification of the crude product through recrystallization or column chromatography. The desired compound 1-3 was obtained as a solid.

AAV2: A suspension of I-3 (1.0 equivalent), 1-4 (1.0 equivalent), tris(dibenzylideneacetone)-dipalladium(0) (CAS-No. 51364-51-3, 0.01 equivalent), tri-tert-butylphosphonium tetrafluoroborate (CAS-no. 131274-22-1, 0.04 equivalents) and sodium tert-butoxide (CAS-No. 865-48-5, 3.0 equivalents) in degassed xylene was stirred at 130° C. for 24 h. After cooling down to rt an aqueous workup was performed, followed by purification of the crude product through recrystallization or column chromatography. The desired compound I-5 was obtained as a solid.

AAV3: A suspension of I-5 (1.0 equivalent), 1-6 (1.25 equivalents), tris(dibenzylideneacetone)-dipalladium(0) (CAS-No. 51364-51-3, 0.01 equivalents), X-Phos (CAS-No. 564483-18-7, 0.04 equivalents) and $K_3PO_4$ (CAS-No. 7778-53-2, 3.5 equivalents) in a degassed mixture of toluene and water (4:1 by vol.) was stirred under reflux for 5 h. After cooling down to rt an aqueous workup was performed, followed by purification of the crude product through recrystallization or column chromatography. The desired compound 1-7 was obtained as a solid.

AAV4: At 0° C. a solution of I-7 in dry tert-butylbenzene (30 mL per 1 mmol I-7) was stirred with n-butyllithium (2.5 M in hexane, CAS-No. 109-72-8, 1.1 equivalents) for 15 min. Subsequently, tert-butyllithium (1.6 M in pentane, CAS-No. 594-19-4, 2.2 equivalents) were injected at 0° C., followed by stirring at 60° C. for 1 h. After completion of the lithiation, the mixture was cooled down to <−60° C., boron tribromide (99%, CAS-No. 10294-33-4, 1.5 equivalents) was injected and the mixture allowed to warm to rt. After stirring at rt for 18 h, the reaction was quenched with 5% $NH_3$(aq) and extracted with dichloromethane. The combined organic layers were dried over $MgSO_4$, filtered and concentrated. After purification through recrystallization or column chromatography, the target compound P-1 was obtained as a solid.

General synthesis scheme II

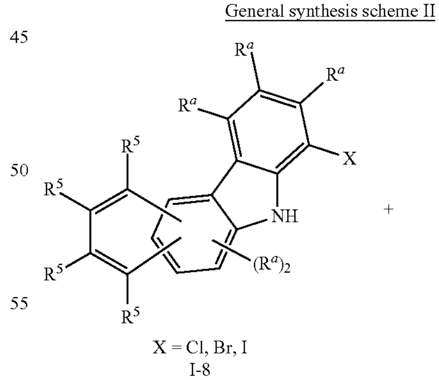

X = Cl, Br, I
I-8

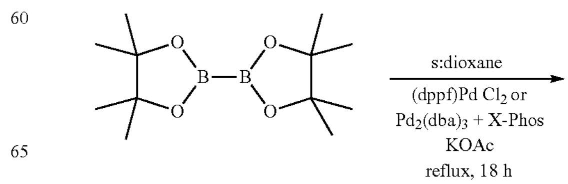

-continued

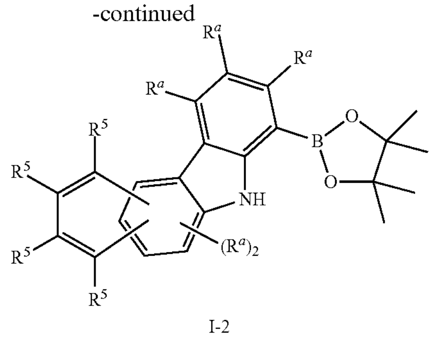

I-2

General Procedure for Synthesis

AAV-5:

A suspension of I-8 (1.0 equivalent), bis(pinacolato)diboron (CAS-No. 73183-34-3, 1.7 equivalents), [1,1'-bis(diphenylphosphino)ferrocene]palladium (II) dichloride (CAS-No. 72287-26-4, 0.02 equivalents) and potassium acetate (KOAc, CAS-No. 127-08-2, 4.5 equivalents) in degassed dioxane was stirred under reflux for 18 h. After cooling down to rt an aqueous workup was performed, followed by purification of the crude product through recrystallization or column chromatography. The desired compound 1-2 was obtained as a solid.

In some cases, Instead of [1,1'-bis(diphenylphosphino) ferrocene]palladium (II) dichloride, the combination of Tris (dibenzylideneacetone)-dipalladium(0)(CAS-No. 51364-51-3, 0.01 equivalents) and X-Phos (CAS-No. 564483-18-7, 0.04 equivalents) might be used as the catalyst.

General synthesis scheme III

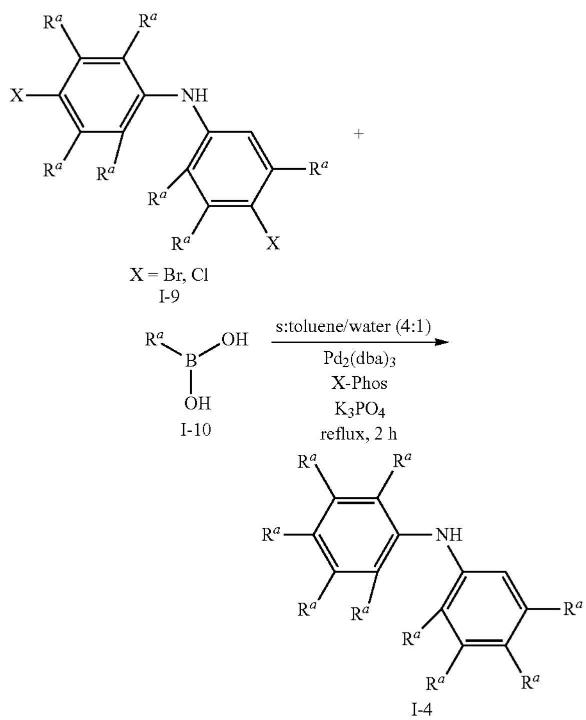

X = Br, Cl

I-9

I-10

I-4

1 General Procedure for Synthesis

AAV6: A suspension of I-9 (1.0 equivalent), 1-10 (2.2 equivalents), Tris(dibenzylideneacetone)-dipalladium(0) (CAS-No. 51364-51-3, 0.01 equivalents), X-Phos (CAS-No. 564483-18-7, 0.04 equivalents) and $K_3PO_4$ (CAS-No. 7778-53-2, 3.0 equivalents) in a degassed mixture of toluene and water (4:1 by vol.) was stirred under reflux for 2 h. After cooling down to rt an aqueous workup was performed, followed by purification of the crude product through recrystallization or column chromatography. The desired compound 1-4 was obtained as a solid.

Cyclic Voltammetry

Cyclic voltammograms are measured from solutions having concentration of $10^{-3}$ mol/L of the organic molecules in dichloromethane or a suitable solvent and a suitable supporting electrolyte (e.g., 0.1 mol/L of tetrabutylammonium hexafluorophosphate). The measurements are conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against a saturated calomel electrode (SCE).

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration are used. The Turbomole program package is used for all calculations.

Photophysical Measurements

Sample Pretreatment: Spin-Coating

Apparatus: Spin150, SPS euro.

The sample concentration is 10 mg/ml, dissolved in a suitable solvent.

Program: 1) 3 s at 400 U/min; 20 s at 1000 U/min at 1000 Upm/s. 3) 10 s at 4000 U/min at 1000 Upm/s. After coating, the films are tried at 70° C. for 1 min.

Photoluminescence Spectroscopy and Time-Correlated Single-Photon Counting (TCSPC)

Steady-state emission spectroscopy is measured by a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, pulse duration: 1.1 ns)

NanoLED 290 (wavelength: 294 nm, pulse duration: <1 ns)

SpectraLED 310 (wavelength: 314 nm)

SpectraLED 355 (wavelength: 355 nm).

Data analysis (exponential fit) is done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields Φ in % and CIE coordinates as x,y values.

PLOY is Determined Using the Following Protocol:

Quality assurance: Anthracene in ethanol (known concentration) is used as reference Excitation wavelength: the absorption maximum of the organic molecule is determined and the molecule is excited using this wavelength Measurement Quantum yields are measured, for sample, of solutions or films under nitrogen atmosphere. The yield is calculated using the equation:

$$\Phi_{PL} = \frac{n_{photon},\ \text{emited}}{n_{photon},\ \text{absorbed}} = \frac{\int \frac{\lambda}{hc}\left[Int_{emitted}^{sample}(\lambda) - Int_{absorbed}^{sample}(\lambda)\right]d\lambda}{\int \frac{\lambda}{hc}\left[Int_{emitted}^{reference}(\lambda) - Int_{absorbed}^{reference}(\lambda)\right]d\lambda}$$

wherein $n_{photon}$ denotes the photon count and Int. the intensity.

Production and Characterization of Optoelectronic Devices

Optoelectronic devices, such as OLED devices including organic molecules according to the invention can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT 95 to the time point, at which the measured luminance decreased to 95% of the initial luminance etc.

Accelerated lifetime measurements are performed (e.g., applying increased current densities). For example, LT80 values at 500 cd/m$^2$ are determined using the following equation:

$$LT80\left(500\frac{\text{cd}^2}{\text{m}^2}\right) = LT80(L_0)\left(\frac{L_0}{500\frac{\text{cd}^2}{\text{m}^2}}\right)^{1.6}$$

wherein $L_0$ denotes the initial luminance at the applied current density.

The values correspond to the average of several pixels (typically two to eight), the standard deviation between these pixels is given.

HPLC-MS

HPLC-MS analysis is performed on an HPLC by Agilent (1100 series) with MS-detector (Thermo LTQ XL).

Exemplary a typical HPLC method is as follows: a reverse phase column 4.6 mm×150 mm, particle size 3.5 μm from Agilent (ZORBAX Eclipse Plus 95 Å C18, 4.6×150 mm, 3.5 μm HPLC column) is used in the HPLC. The HPLC-MS measurements are performed at room temperature (rt(following gradients:

| Flow rate [ml/min] | Time [min] | A[%] | B[%] | C[%] |
|---|---|---|---|---|
| 2.5 | 0 | 40 | 50 | 10 |
| 2.5 | 5 | 40 | 50 | 10 |
| 2.5 | 25 | 10 | 20 | 70 |
| 2.5 | 35 | 10 | 20 | 70 |
| 2.5 | 35.01 | 40 | 50 | 10 |
| 2.5 | 40.01 | 40 | 50 | 10 |
| 2.5 | 41.01 | 40 | 50 | 10 |

Using the Following Solvent Mixtures:

| | | |
|---|---|---|
| Solvent A: | H2O (90%) | MeCN (10%) |
| Solvent B: | H2O (10%) | MeCN (90%) |
| Solvent C: | THF (50%) | MeCN (50%) |

An injection volume of 5 μL from a solution with a concentration of 0.5 mg/mL of the analyte is taken for the measurements.

Ionization of the probe is performed using an APCI (atmospheric pressure chemical ionization) source either in positive (APCI+) or negative (APCI−) ionization mode.

Example 1

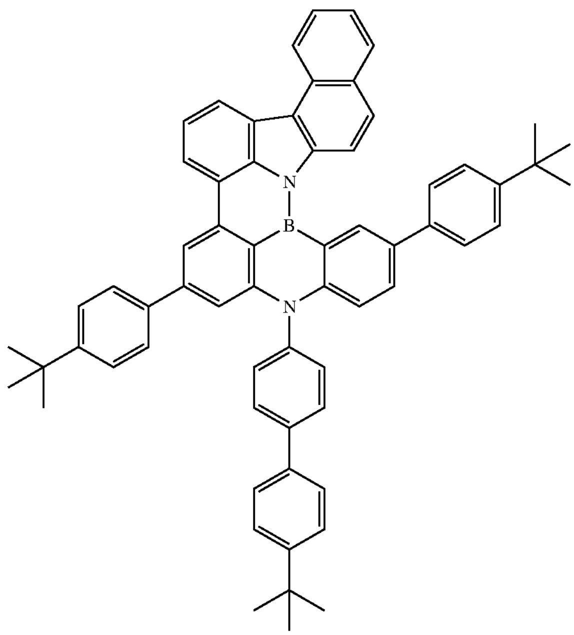 [SMILES: CC(C)(C)c1ccc(-c2ccc(N3c4ccc(-c5ccc(C(C)(C)C)cc5)cc4B4c5c(cc(-c6ccc(C(C)(C)C)cc6)cc53)-c3cccc5c6c7ccccc7ccc6n4c35)cc2)cc1]

Example 1 was Synthesized According to

AA V (44% yield), where starting materials 1-1 and 1-2 were represented by 1,3-dibromo-2,5-dichlorobenzene (CAS-no. 81067-41-6) and 8-(4,4,5,5-tetramethyl-1,3,2-dioxaborolan-2-yl)-7H-benzo[c]carbazole (CAS-no. 2259354-30-6) and where the latter might be synthesized according to AAV5 from 8-bromo-7H-benzo[c]carbazole (CAS-no. 1686099-80-8) in 80% yield;

AAV2 (39% yield), where 1-4 was represented by 4'-(1,1-dimethylethyl)-N-[4'-(1,1-dimethylethyl)[1,1'-biphenyl]-

4-yl]-[1,1'-biphenyl]-4-amine (CAS-no. 1078705-10-8) and where the latter might be synthesized according to AAV6 from bis(4-bromophenyl)amine (CAS-no. 16292-17-4) and 4-tert-butylbenzeneboronic acid (CAS-no. 123324-71-0) in 90% yield;

AAV3 (57% yield), where compound 1-6 was represented by 4-tert-butylbenzeneboronic acid (CAS-no. 123324-71-0);

and AAV4 (14% yield).

MS (LC-MS, APPI ion source): 866 m/z at rt: 8.8 min.

The emission maximum of example 1 (2% by weight in mCBP) is at 460 nm, the CIEx coordinate is 0.14 and the CIEy coordinate is 0.12. The photoluminescence quantum yield (PLQY) is 64%.

Additional Examples of Organic Molecules of the Invention

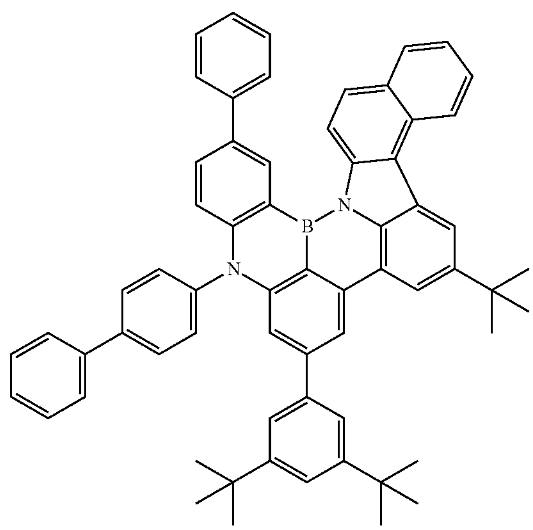

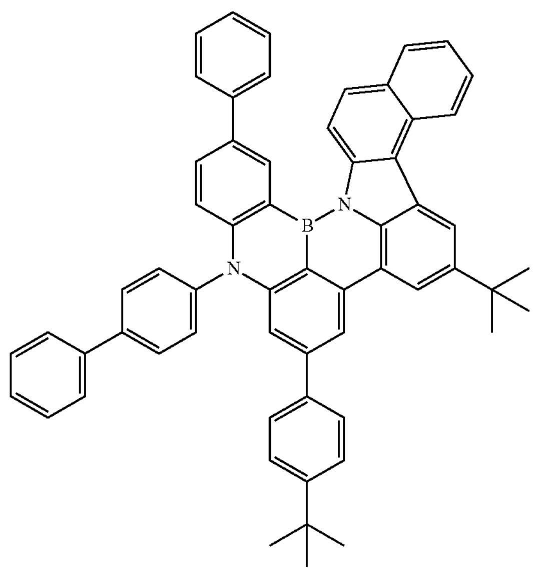

-continued

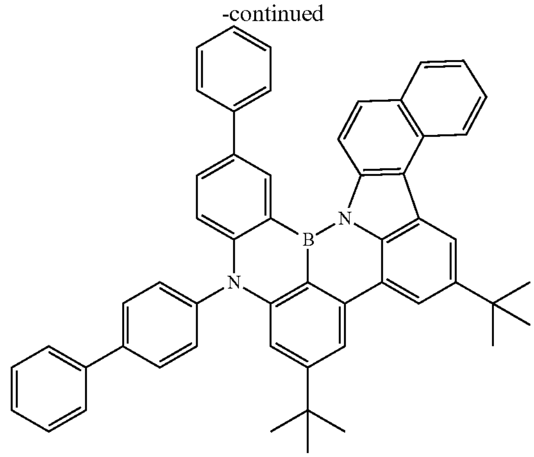

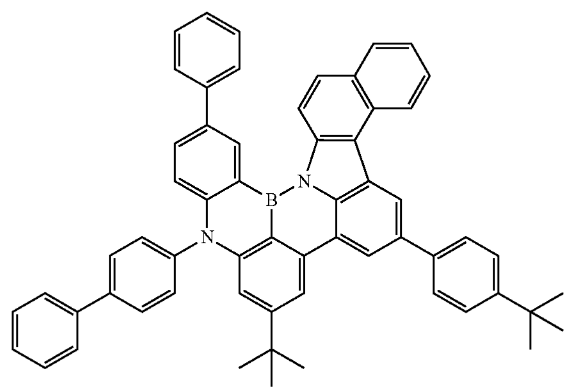

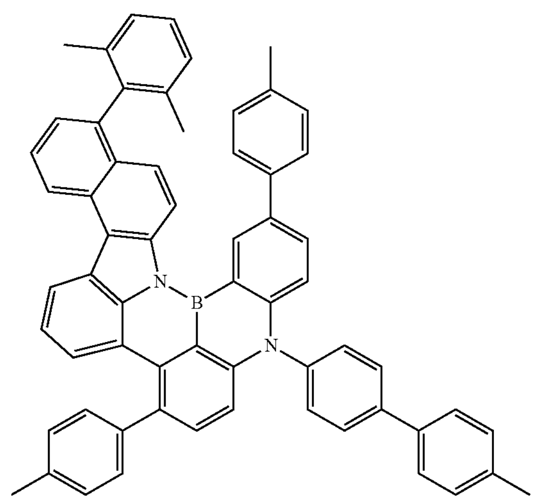

-continued
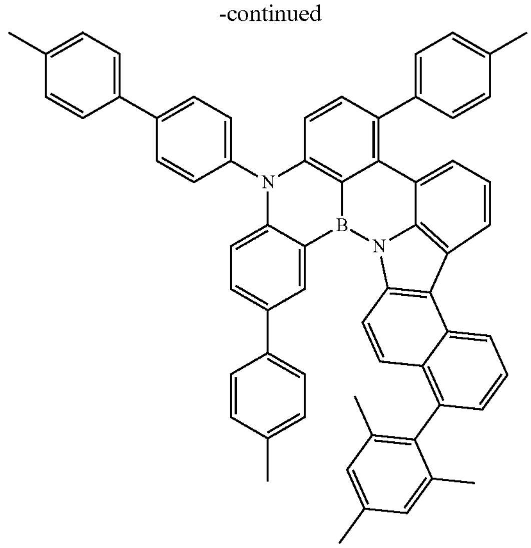
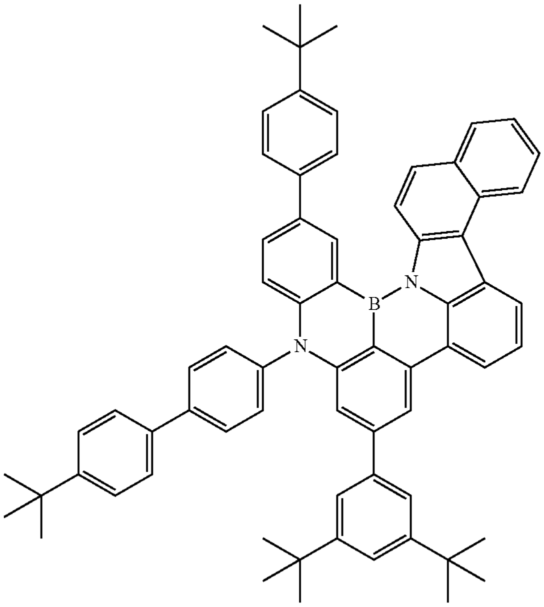
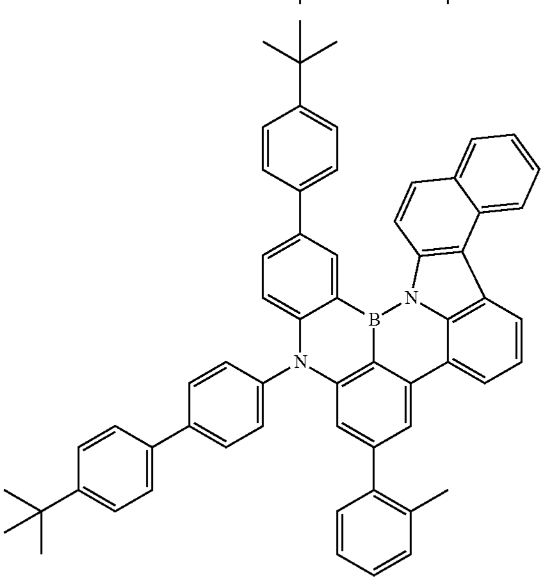
-continued
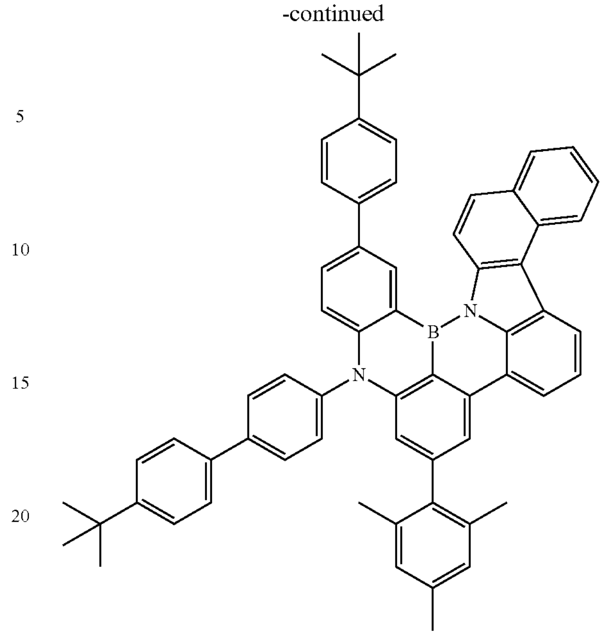
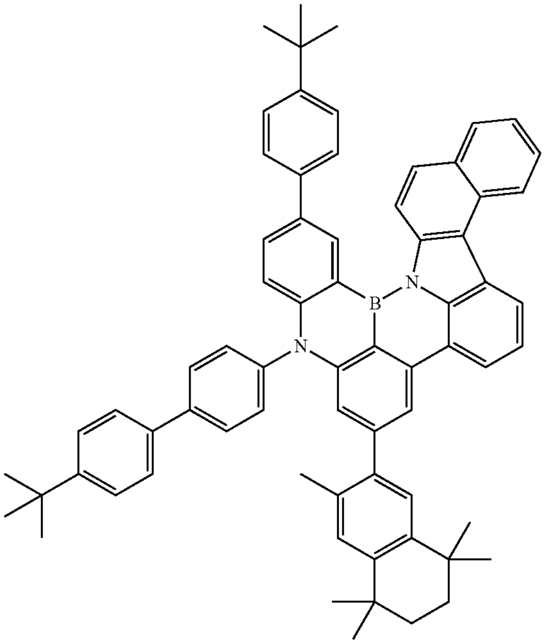

-continued
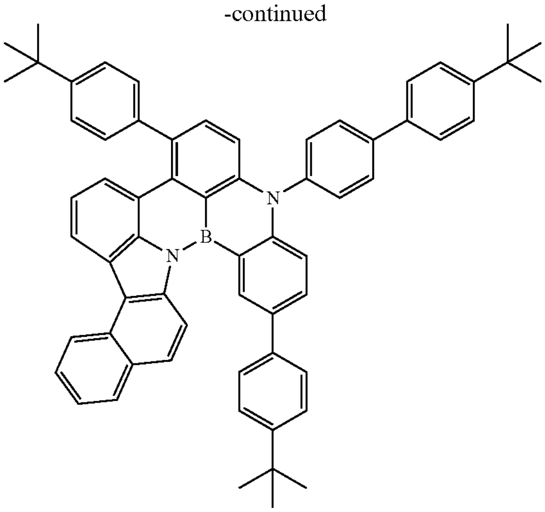
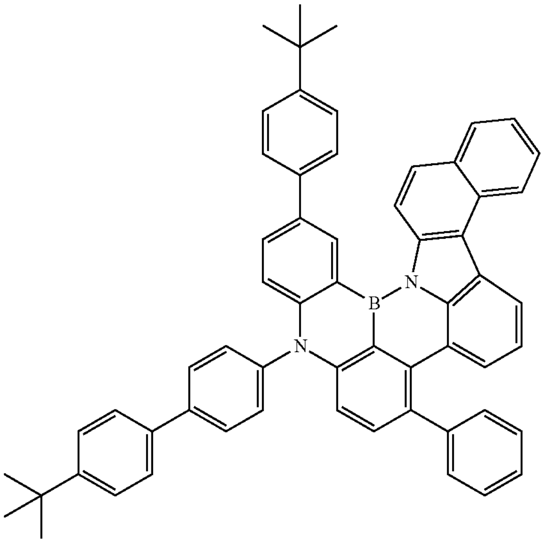
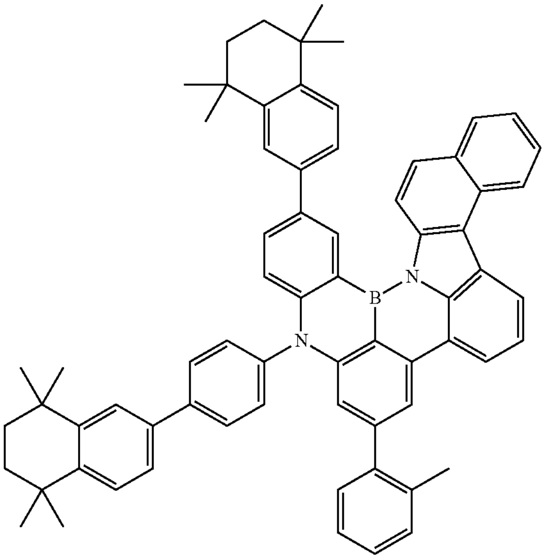
-continued
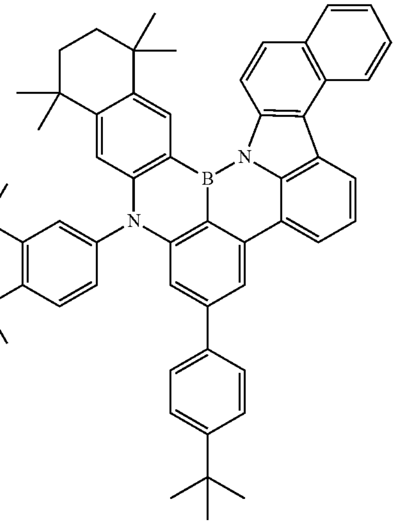
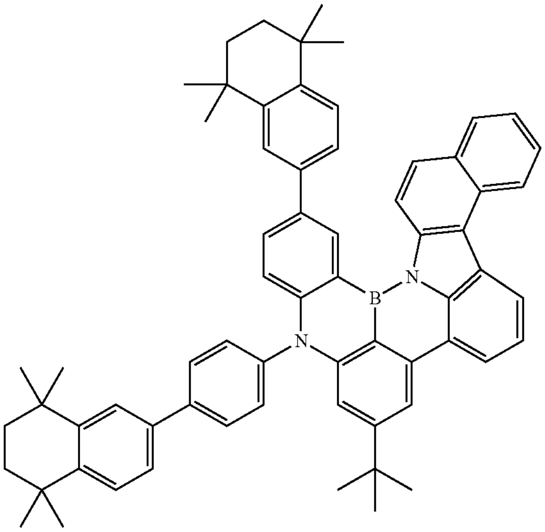
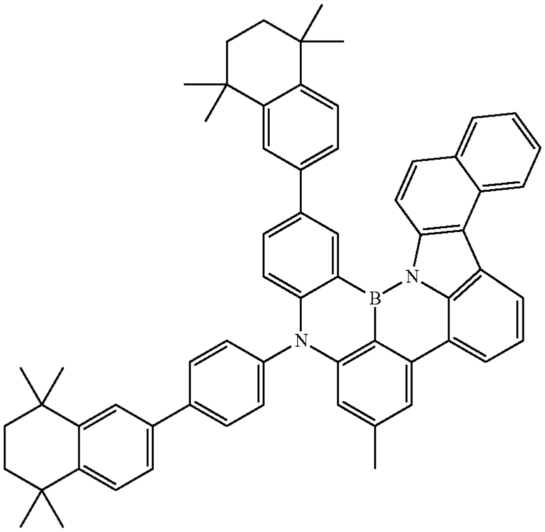

-continued
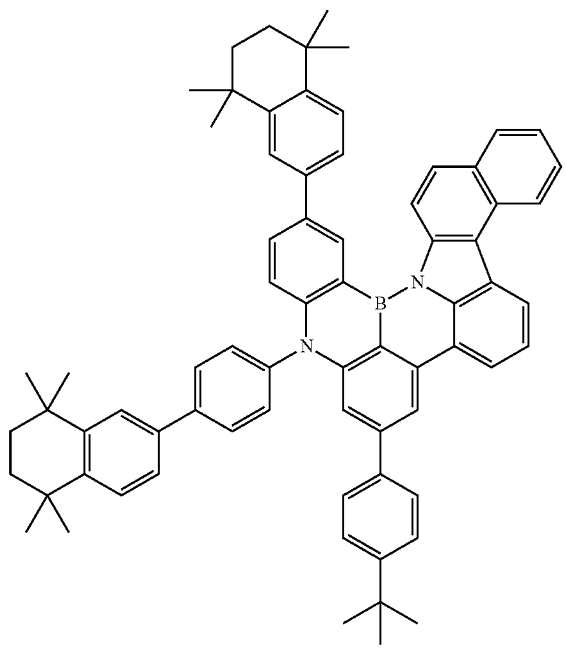
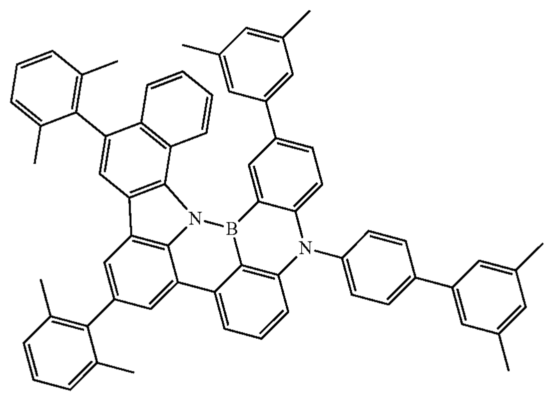
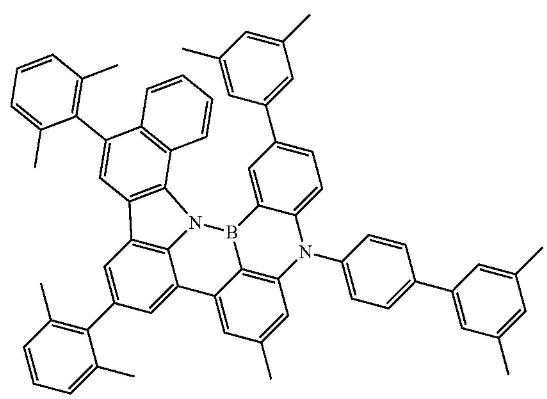
-continued
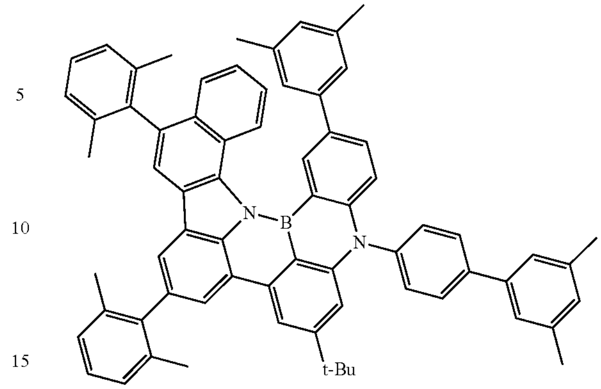
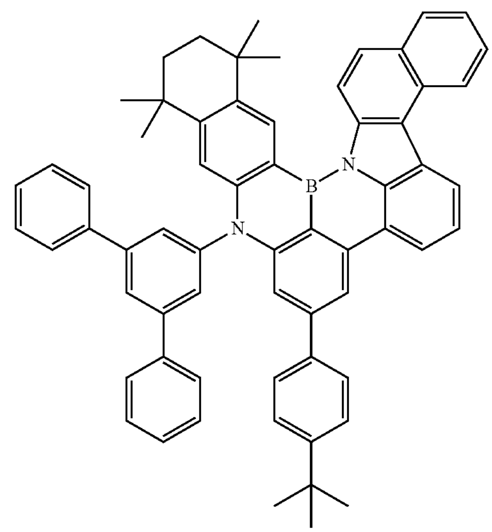

-continued
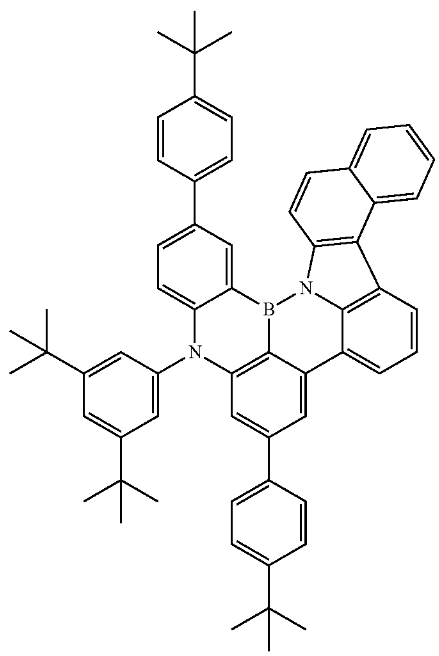
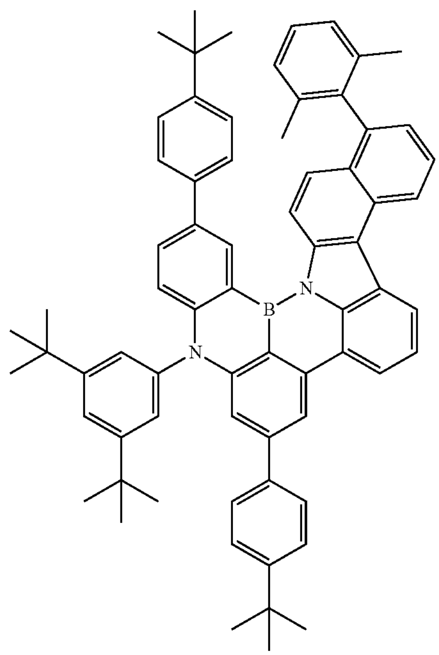
-continued
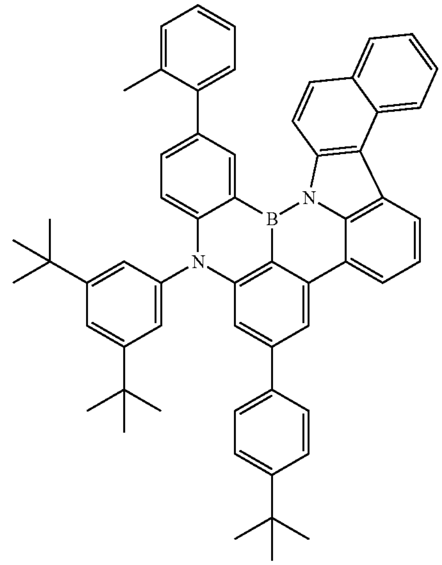
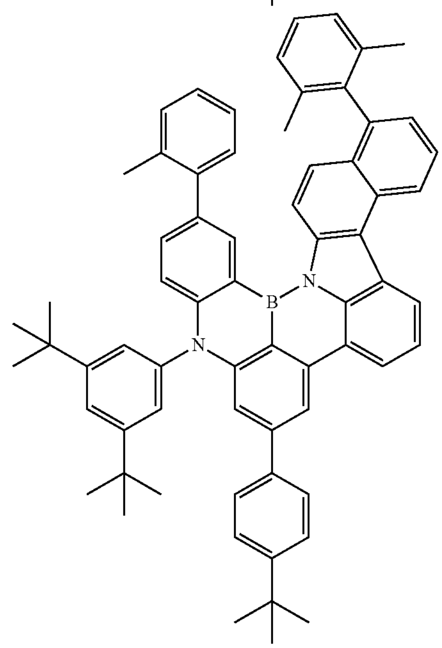
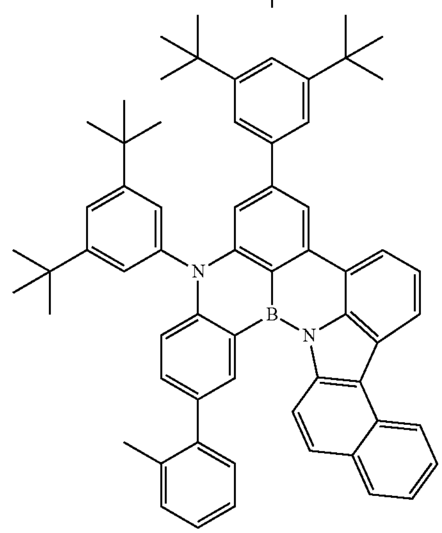

-continued
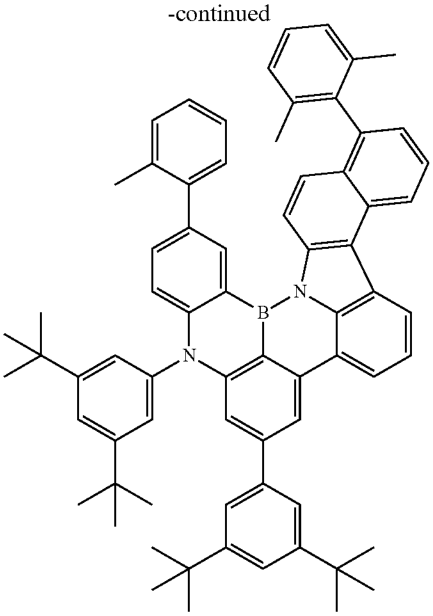
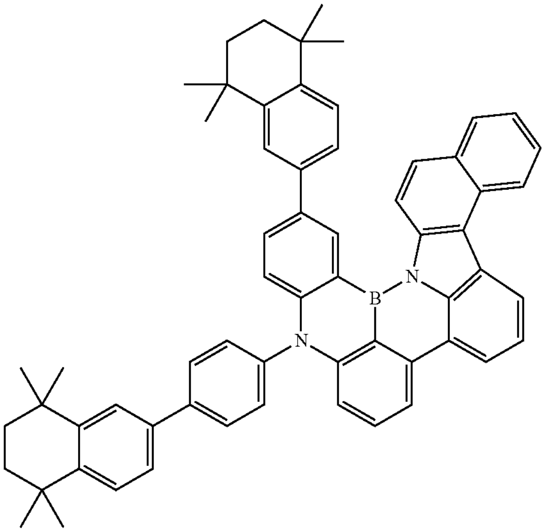
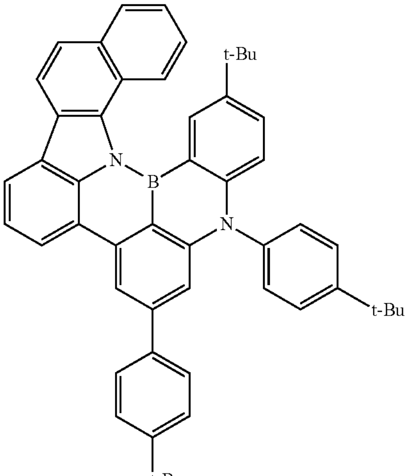
-continued
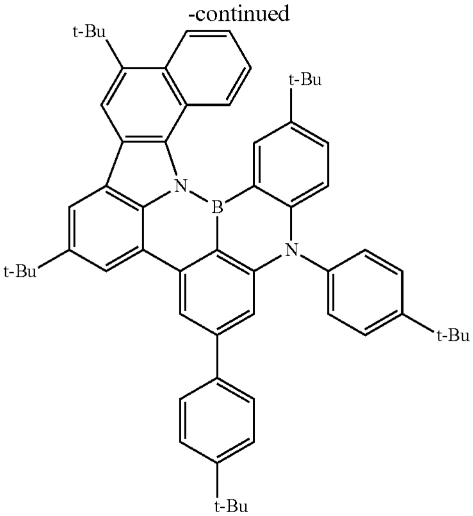
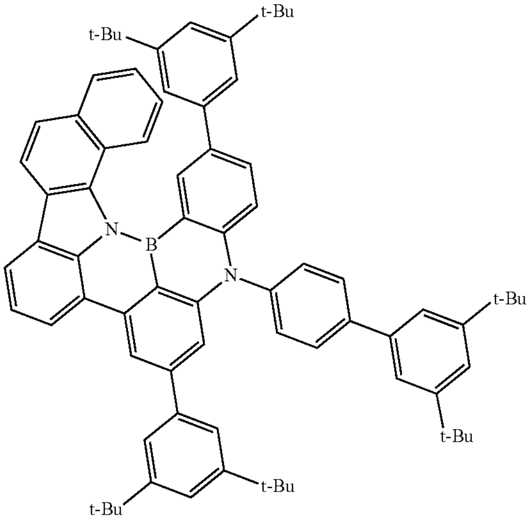
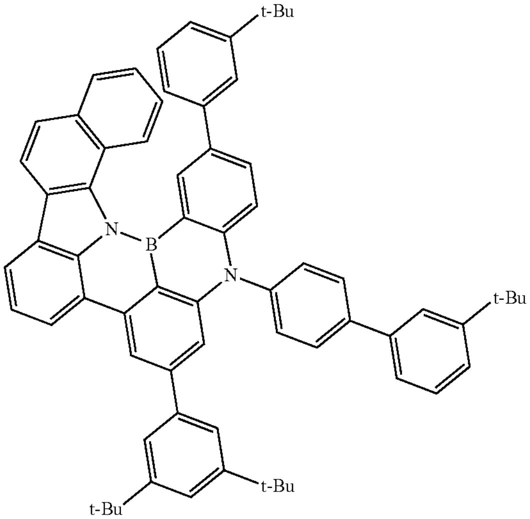

-continued
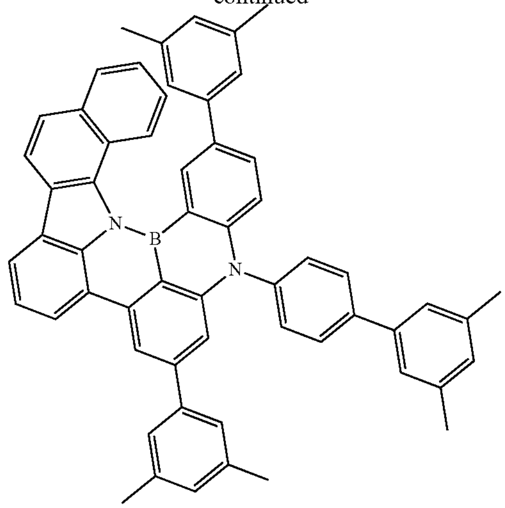
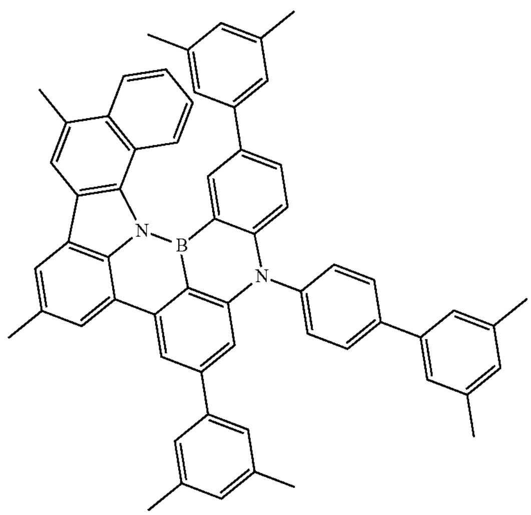
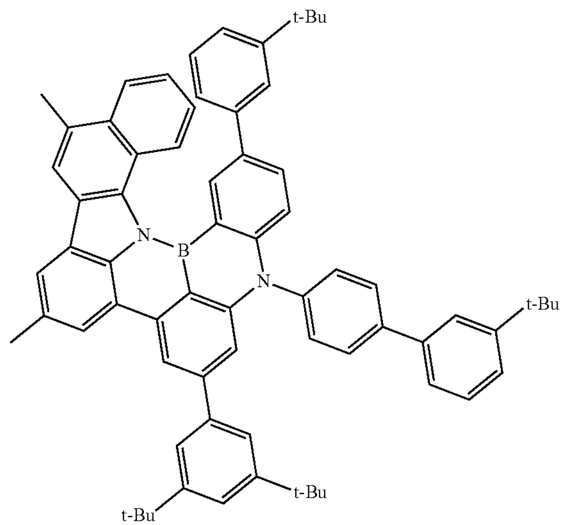
-continued
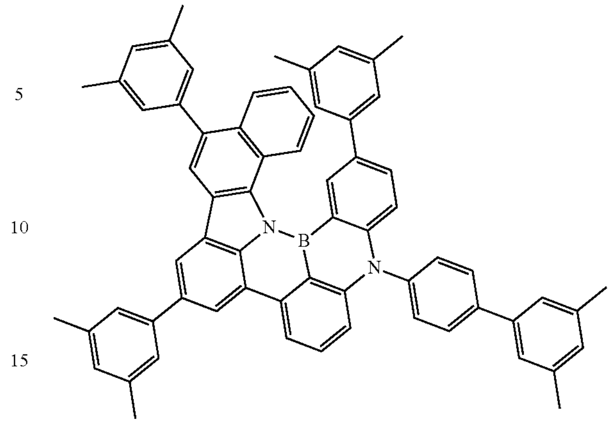
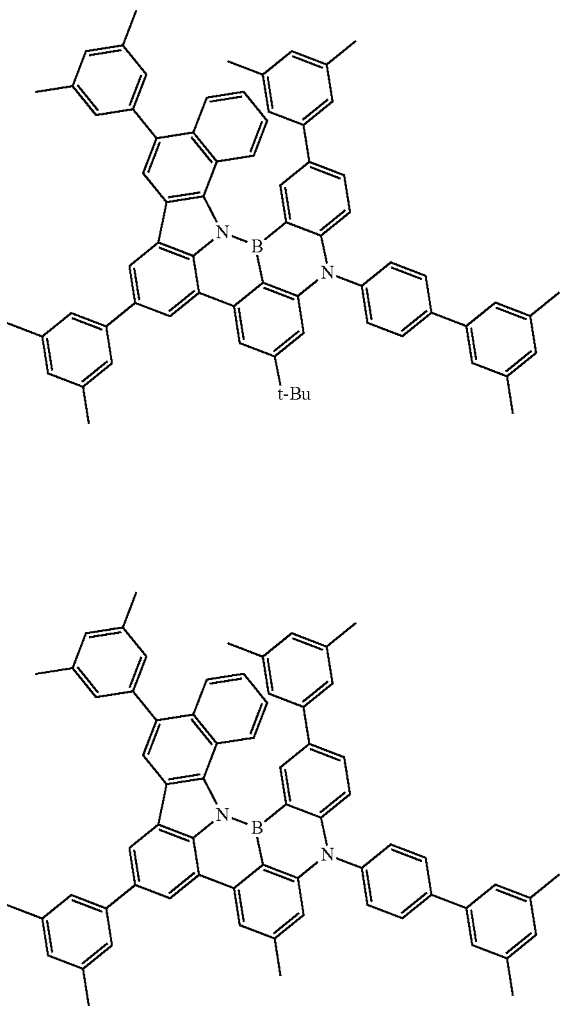
The invention claimed is:
1. An organic molecule, comprising a structure represented by any one selected from among Formula Ia to Ic Formula Ia

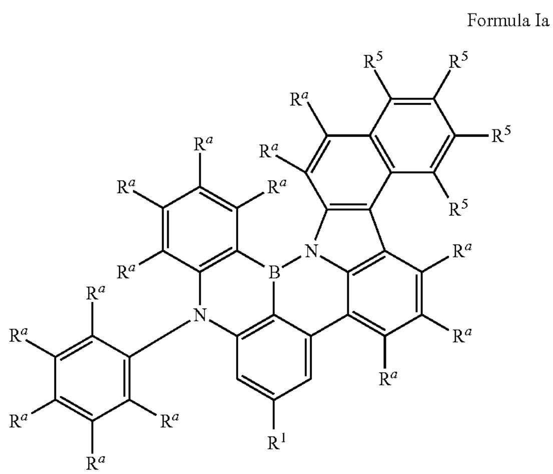

Formula Ib

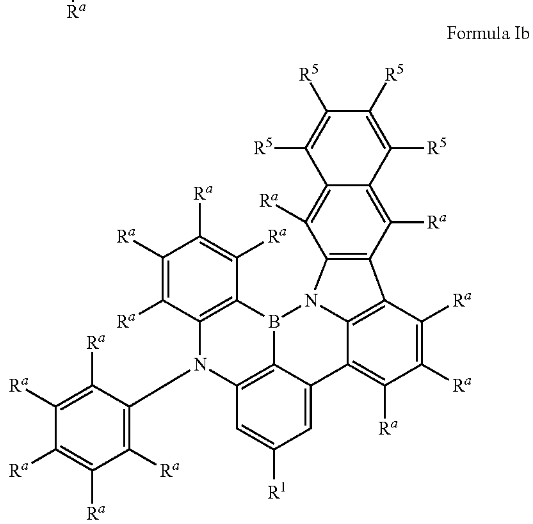

Formula Ic

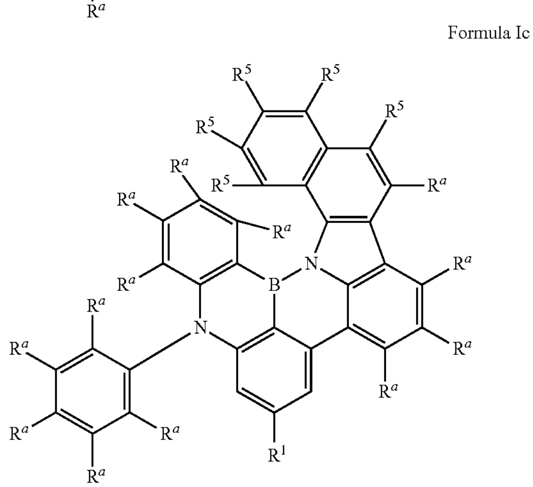

wherein:

$R^1$ is $C_6$-$C_{12}$-aryl, which is substituted with one or more $C_1$-$C_6$-alkyl substituents which optionally form a monocyclic aliphatic ring system;

$R^a$ is at each occurrence independently selected from the group consisting of: hydrogen; deuterium; $N(R^5)_2$; $OR^5$; $Si(R^5)_3$; $B(OR^5)_2$; $B(R^5)_2$; $OSO_2R^5$; $CF_3$; CN; F; Cl; Br; I;

$C_1$-$C_{40}$-alkyl, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S, or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S; or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S; or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S; or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, $C\equiv C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S; or $CONR^5$;

$C_6$-$C_{60}$-aryl, which is optionally substituted with one or more substituents $R^5$; and $C_2$-$C_{57}$-heteroaryl, which is optionally substituted with one or more substituents $R^5$;

$R^5$ is at each occurrence independently selected from the group consisting of: hydrogen; deuterium; $N(R^6)_2$; $OR^6$; $Si(R^6)_3$; $B(OR^6)_2$; $B(R^6)_2$; $OSO_2R^6$; $CF_3$; CN; F; Br; I;

$C_1$-$C_{40}$-alkyl, which is optionally substituted with one or more substituents $R^6$ and wherein one or more non-adjacent $CH_2$-groups are optionally substituted by $R^6C{=}CR^6$, $C\equiv C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S, or $CONR^6$;

$C_1$-$C_{40}$-alkoxy, which is optionally substituted with one or more substituents $R^6$ and wherein one or more non-adjacent $CH_2$-groups are optionally substituted by $R^6C{=}CR^6$, $C\equiv C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S, or $CONR^6$;

$C_1$-$C_{40}$-thioalkoxy, which is optionally substituted with one or more substituents $R^6$ and wherein one or more non-adjacent $CH_2$-groups are optionally substituted by $R^6C{=}CR^6$, $C{=}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S, or $CONR^6$;

$C_2$-$C_{40}$-alkenyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S, or $CONR^6$;

$C_2$-$C_{40}$-alkynyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S, or $CONR^6$;

$C_6$-$C_{60}$-aryl, which is optionally substituted with one or more substituents $R^6$; and $C_2$-$C_{57}$-heteroaryl, which is optionally substituted with one or more substituents $R^6$;

$R^6$ is at each occurrence independently selected from the group consisting of:

hydrogen; deuterium; OPh; $CF_3$; CN; F;

$C_1$-$C_5$-alkyl, wherein one or more hydrogen atoms are optionally, independently substituted by deuterium, CN, $CF_3$, or F;

$C_1$-$C_5$-alkoxy, wherein one or more hydrogen atoms are optionally, independently substituted by deuterium, CN, $CF_3$, or F;

$C_1$-$C_5$-thioalkoxy, wherein one or more hydrogen atoms are optionally, independently substituted by deuterium, CN, $CF_3$, or F;

$C_2$-$C_5$-alkenyl, wherein one or more hydrogen atoms are optionally, independently substituted by deuterium, CN, $CF_3$, or F;

$C_2$-$C_5$-alkynyl, wherein one or more hydrogen atoms are optionally, independently substituted by deuterium, CN, $CF_3$, or F;

$C_6$-$C_{18}$-aryl, which is optionally substituted with one or more $C_1$-$C_5$-alkyl substituents;

$C_2$-$C_{17}$-heteroaryl, which is optionally substituted with one or more $C_1$-$C_5$-alkyl substituents;

$N(C_6$-$C_{18}$-aryl$)_2$;

$N(C_2$-$C_{17}$-heteroaryl$)_2$; and $N(C_2$-$C_{17}$-heteroaryl$)(C_6$-$C_{18}$-aryl); and wherein optionally, any of the substituents $R^a$, $R^5$, and/or $R^6$ independently form a mono- or polycyclic, aliphatic, aromatic, heteroaromatic and/or benzo-fused ring system with one or more other substituents $R^a$, $R^5$ and/or $R^6$.

2. The organic molecule according to claim 1, wherein $R^1$ is phenyl, which is substituted with one or more substituents selected from the group consisting of methyl, $^i$propyl, and $^t$butyl.

3. The organic molecule according to claim 1, comprising a structure of Formula V Formula V

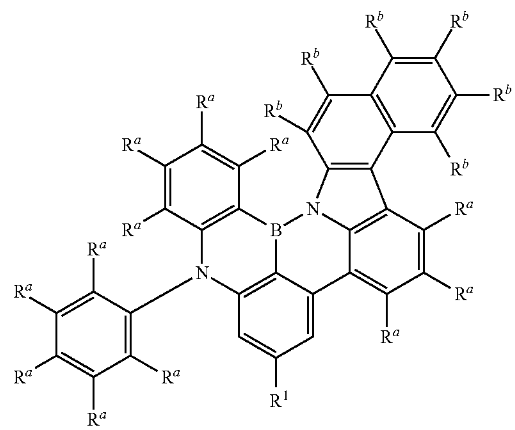

wherein:

$R^b$ is at each occurrence independently selected from the group consisting of:

hydrogen,

Me, $^i$Pr, $^t$Bu,

CN, $CF_3$,

Ph, which is optionally substituted with one or more substituents independently selected from the group consisting of Me, $^i$Pr, $^t$Bu, CN, $CF_3$, and Ph, pyridinyl, which is optionally substituted with one or more substituents independently selected from the group consisting of Me, $^i$Pr, Bu, CN, $CF_3$, and Ph, pyrimidinyl, which is optionally substituted with one or more substituents independently selected from the group consisting of Me, $^i$Pr, $^t$Bu, CN, $CF_3$, and Ph, carbazolyl, which is optionally substituted with one or more substituents independently selected from the group consisting of Me, $^i$Pr, Bu, CN, $CF_3$, and Ph, triazinyl, which is optionally substituted with one or more substituents independently selected from the group consisting of Me, $^i$Pr, $^t$Bu, CN, $CF_3$, and Ph, and $N(Ph)_2$.

4. A composition, comprising:

the organic molecule according to claim 1 as a luminescent emitter, and a host material, which differs from the organic molecule, and optionally, a dye and/or a solvent.

5. The composition according to claim 4, comprising 0.1-30% by weight of the organic molecule, based on a total weight, 100 wt %, of the composition.

6. The composition according to claim 4, wherein the host material comprises a structure represented by Formula 4

Formula 4

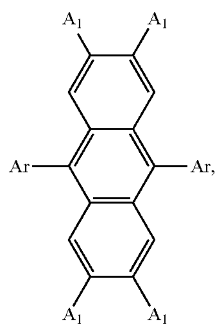

and wherein each Ar is independently selected from the group consisting of $C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and $C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and each $A_1$ is independently selected from the group consisting of consisting of hydrogen;

deuterium;

$C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl;

$C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and $C_1$-$C_{40}$-(hetero)alkyl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

7. An optoelectronic device, comprising the organic molecule according to claim 1 as a luminescent emitter.

8. The optoelectronic device according to claim 7, wherein the optoelectronic device is at least one selected from the group consisting of:

organic diodes, organic light-emitting diodes (OLEDs), light-emitting electrochemical cells, OLED-sensors, organic solar cells, organic transistors, organic field-effect transistors, organic lasers, and down-conversion elements.

9. The optoelectronic device according to claim 7, further comprising:

a host material comprising a structure represented by Formula 4

Formula 4

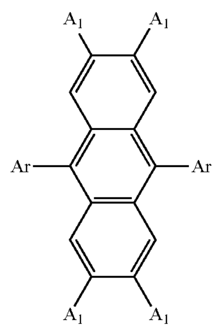

wherein each Ar is independently selected from the group consisting of $C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and $C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and each $A_1$ is independently selected from the group consisting of consisting of hydrogen;

deuterium;

$C_6$-$C_{60}$-aryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl;

$C_3$-$C_{57}$-heteroaryl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl; and $C_1$-$C_{40}$-(hetero)alkyl, which is optionally substituted with one or more residues selected from the group consisting of $C_6$-$C_{60}$-aryl, $C_3$-$C_{57}$-heteroaryl, halogen, and $C_1$-$C_{40}$-(hetero)alkyl.

10. The optoelectronic device according to claim 7, comprising:

a substrate;

an anode, and a cathode, wherein the anode or the cathode is on the substrate; and a light-emitting layer between the anode and the cathode and comprising the organic molecule.

11. A method for generating light of a wavelength from 440 nm to 470 nm, the method comprising applying an electrical current to the optoelectronic device according to claim 7 to generate light.

12. The composition according to claim 4, further comprising at least a material selected from the group consisting of a thermally activated delayed fluorescence material and a phosphorescence material.

13. The composition according to claim 4, comprising 0.8-15% by weight of the organic molecule, based on a total weight, 100 wt %, of the composition.

14. The composition according to claim 4, comprising 1.5-5% by weight of the organic molecule, based on a total weight, 100 wt %, of the composition.

15. An optoelectronic device, comprising the composition according to claim 4 or a layer formed of the composition.

16. The optoelectronic device according to claim 15, comprising:

a substrate;

an anode, and a cathode, wherein the anode or the cathode is on the substrate; and a light-emitting layer between the anode and the cathode and comprising the composition or the layer formed of the composition.

17. The organic molecule according to claim 1, comprising a structure of Formula Va Formula Va

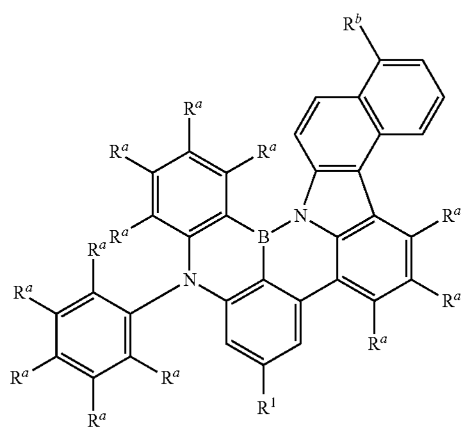

wherein, $R^b$ is selected from the group consisting of:

Me, $^i$Pr, $^t$Bu,

CN, $CF_3$,

Ph, which is optionally substituted with one or more substituents independently selected from the group consisting of Me, $^i$Pr, $^t$Bu, CN, $CF_3$, and Ph, pyridinyl, which is optionally substituted with one or more substituents independently selected from the group consisting of Me, $^i$Pr, Bu, CN, $CF_3$, and Ph, pyrimidinyl, which is optionally substituted with one or more substituents independently selected from the group consisting of Me, $^i$Pr, $^t$Bu, CN, $CF_3$, and Ph, carbazolyl, which is optionally substituted with one or more substituents independently selected from the group consisting of Me, $^i$Pr, $^t$Bu, CN, $CF_3$, and Ph, triazinyl, which is optionally substituted with one or more substituents independently selected from the group consisting of Me, Pr, $^t$Bu, CN, $CF_3$, and Ph, and $N(Ph)_2$.

* * * * *